United States Patent
Kelly

(10) Patent No.: US 12,007,575 B2
(45) Date of Patent: Jun. 11, 2024

(54) NEAR-EYE DISPLAY SYSTEM

(71) Applicant: PANAMORPH, INC., Colorado Springs, CO (US)

(72) Inventor: Shawn L. Kelly, Colorado Springs, CO (US)

(73) Assignee: PANAMORPH, INC., Colorado Springs, CO (US)

(*) Notice: Subject to any disclaimer, the term of this patent is extended or adjusted under 35 U.S.C. 154(b) by 53 days.

(21) Appl. No.: 18/092,282

(22) Filed: Dec. 31, 2022

(65) Prior Publication Data
US 2023/0141961 A1   May 11, 2023

Related U.S. Application Data

(63) Continuation of application No. PCT/US2022/032576, filed on Jun. 7, 2022.
(Continued)

(51) Int. Cl.
*G02B 27/01* (2006.01)
*F21V 8/00* (2006.01)
(Continued)

(52) U.S. Cl.
CPC ....... *G02B 27/0179* (2013.01); *G02B 6/0055* (2013.01); *G02B 17/0856* (2013.01);
(Continued)

(58) Field of Classification Search
CPC ............ G02B 27/0179; G02B 27/0093; G02B 27/0172; G02B 6/0055; G02B 17/0856;
(Continued)

(56) References Cited

U.S. PATENT DOCUMENTS 3,781,091 A   12/1973 Ferguson
3,940,203 A   2/1976 La Russa
(Continued)

FOREIGN PATENT DOCUMENTS

CN   108107579 B   2/2021
CN   108319015 B   2/2023
(Continued)

OTHER PUBLICATIONS

US 10,261,323 B2, 04/2019, Hua et al. (withdrawn)
(Continued)

*Primary Examiner* — William R Alexander
(74) *Attorney, Agent, or Firm* — Kurt L. VanVoorhies

(57) ABSTRACT

An optical subsystem of a near-eye display system provides for projecting light of a virtual image of image content to an eye location, and provides for collecting light of the virtual image onto an exit pupil on a surface proximate to an outer surface of an eye when at the eye location. A subpupil modulator within an aperture in cooperation with the optical subsystem provides for forming a plurality of subpupils within the exit pupil, provides for less than all of the light of the virtual image associated with one or more less than all of the plurality of subpupils to be projected to the eye location, and provides for individually and independently controlling an intensity of the light through each activated subpupil to a level less than a maximum level of intensity.

33 Claims, 38 Drawing Sheets

Related U.S. Application Data

(60) Provisional application No. 63/197,777, filed on Jun. 7, 2021, provisional application No. 63/222,978, filed on Jul. 17, 2021.

(51) Int. Cl.

| | | |
|---|---|---|
| *G02B 17/08* | (2006.01) | |
| *G02B 26/10* | (2006.01) | |
| *G02B 27/00* | (2006.01) | |
| *G06F 3/01* | (2006.01) | |
| *G09G 3/00* | (2006.01) | |
| *H04N 23/20* | (2023.01) | |
| *H04N 23/56* | (2023.01) | |
| *G09G 3/02* | (2006.01) | |
| *H01L 25/075* | (2006.01) | |

(52) U.S. Cl.
CPC ....... *G02B 17/086* (2013.01); *G02B 17/0896* (2013.01); *G02B 26/10* (2013.01); *G02B 26/105* (2013.01); *G02B 27/0093* (2013.01); *G02B 27/0172* (2013.01); *G06F 3/013* (2013.01); *G09G 3/002* (2013.01); *H04N 23/20* (2023.01); *H04N 23/56* (2023.01); *G02B 2027/0125* (2013.01); *G02B 2027/0138* (2013.01); *G02B 2027/0187* (2013.01); *G09G 3/02* (2013.01); *G09G 2330/021* (2013.01); *G09G 2354/00* (2013.01); *H01L 25/0753* (2013.01)

(58) Field of Classification Search
CPC .. G02B 17/086; G02B 17/0896; G02B 26/10; G02B 26/105; G02B 2027/0125; G02B 2027/0138; G02B 2027/0187; G06F 3/013; G09G 3/002; G09G 3/02; G09G 2330/021; G09G 2354/00; H04N 23/20; H04N 23/56; H01L 25/0753
USPC ......................................................... 359/630
See application file for complete search history.

(56) References Cited

U.S. PATENT DOCUMENTS

| | | | |
|---|---|---|---|
| 3,940,204 | A | 2/1976 | Withrington |
| 4,575,722 | A | 3/1986 | Anderson |
| 4,840,455 | A | 6/1989 | Kempf |
| 4,968,117 | A | 11/1990 | Chern et al. |
| 5,035,474 | A | 7/1991 | Moss et al. |
| 5,093,567 | A | 3/1992 | Staveley |
| 5,124,821 | A | 6/1992 | Antier et al. |
| 5,178,636 | A | 1/1993 | Silverman |
| 5,227,915 | A | 7/1993 | Grossinger et al. |
| 5,260,828 | A | 11/1993 | Londono et al. |
| 5,285,314 | A | 2/1994 | Futhey |
| 5,313,326 | A | 5/1994 | Ramsbottom |
| 5,341,242 | A | 8/1994 | Gilboa et al. |
| 5,392,158 | A | 2/1995 | Tosaki |
| 5,406,415 | A | 4/1995 | Kelly |
| 5,644,436 | A | 7/1997 | Togino et al. |
| 5,673,146 | A | 9/1997 | Kelly |
| 5,701,132 | A | 12/1997 | Kollin et al. |
| 5,706,137 | A | 1/1998 | Kelly |
| 5,706,139 | A | 1/1998 | Kelly |
| 5,808,800 | A | 9/1998 | Handschy |
| 5,861,994 | A | 1/1999 | Kelly |
| 5,969,871 | A | 10/1999 | Tidwell et al. |
| 5,986,803 | A | 11/1999 | Kelly |
| 6,067,190 | A | 5/2000 | Kelly |
| 6,094,242 | A | 7/2000 | Yamanaka |
| 6,157,352 | A | 12/2000 | Kollin et al. |
| 6,239,908 | B1 | 5/2001 | Kelly |
| 6,396,461 | B1 | 5/2002 | Lewis et al. |
| RE39,643 | E | 5/2007 | Kelly |
| 7,401,920 | B1* | 7/2008 | Kranz ................ G02B 27/0093 382/117 |
| 7,456,805 | B2 | 11/2008 | Ouderkirk et al. |
| 9,720,232 | B2 | 8/2017 | Hua et al. |
| 10,210,844 | B2 | 2/2019 | Kollin et al. |
| 10,241,328 | B2* | 3/2019 | Urey ................. G02B 27/0093 |
| 10,267,970 | B2 | 4/2019 | Jones, Jr. et al. |
| 10,275,024 | B1* | 4/2019 | Simmons ................ G06F 3/013 |
| 10,444,419 | B2 | 10/2019 | Bhargava et al. |
| 10,444,507 | B2 | 10/2019 | Urey |
| 10,444,508 | B2 | 10/2019 | Urey et al. |
| 10,481,317 | B2 | 11/2019 | Peroz et al. |
| 10,571,696 | B2 | 2/2020 | Urey et al. |
| 10,598,932 | B1 | 3/2020 | Marshall |
| 10,598,939 | B2 | 3/2020 | Hua et al. |
| 10,606,080 | B2 | 3/2020 | Hua et al. |
| 10,613,328 | B2 | 4/2020 | Hua et al. |
| 10,627,559 | B2 | 4/2020 | Curtis et al. |
| 10,627,565 | B1 | 4/2020 | Trail |
| 10,684,684 | B1* | 6/2020 | Simmons ............ G02B 26/0816 |
| 10,712,569 | B2 | 7/2020 | Jiang et al. |
| 10,712,576 | B1 | 7/2020 | Mceldowney |
| 10,725,223 | B2 | 7/2020 | Schowengerdt et al. |
| 10,732,407 | B1 | 8/2020 | Wood et al. |
| 10,732,415 | B2 | 8/2020 | Amitai |
| 10,823,894 | B2 | 11/2020 | Peroz et al. |
| 10,969,592 | B2 | 4/2021 | Hua et al. |
| 10,983,263 | B2 | 4/2021 | Kleinman et al. |
| 11,016,292 | B2 | 5/2021 | Schuck, III et al. |
| 11,022,784 | B1 | 6/2021 | Wheelwright et al. |
| 11,181,746 | B2 | 11/2021 | Hua et al. |
| 11,196,976 | B2 | 12/2021 | Heshmat Dehkordi |
| 11,221,494 | B2 | 1/2022 | Noui et al. |
| 11,287,657 | B2 | 3/2022 | Klug |
| 11,353,711 | B1 | 6/2022 | Freeman et al. |
| 11,493,773 | B2 | 11/2022 | Kelly |
| 11,614,631 | B1 | 3/2023 | Noui et al. |
| 11,663,942 | B1 | 5/2023 | Kelly |
| 11,681,150 | B2 | 6/2023 | Kelly |
| 11,733,532 | B2 | 8/2023 | Kelly |
| 2003/0202259 | A1 | 10/2003 | Nishimae et al. |
| 2010/0097671 | A1 | 4/2010 | Leister |
| 2010/0149073 | A1 | 6/2010 | Chaum et al. |
| 2011/0285968 | A1 | 11/2011 | Huang |
| 2012/0081800 | A1 | 4/2012 | Cheng et al. |
| 2012/0280956 | A1* | 11/2012 | Yamamoto ......... G02B 27/0172 345/204 |
| 2012/0320342 | A1 | 12/2012 | Richards et al. |
| 2014/0266987 | A1 | 9/2014 | Magyari |
| 2014/0306878 | A1 | 10/2014 | Bhakta |
| 2015/0035744 | A1 | 2/2015 | Robbins et al. |
| 2016/0033771 | A1 | 2/2016 | Tremblay et al. |
| 2016/0116748 | A1 | 4/2016 | Carollo et al. |
| 2016/0209656 | A1* | 7/2016 | Urey ................. G02B 27/0093 |
| 2016/0223987 | A1 | 8/2016 | Park et al. |
| 2016/0327789 | A1 | 11/2016 | Klug et al. |
| 2017/0038579 | A1 | 2/2017 | Yeoh et al. |
| 2017/0078652 | A1 | 3/2017 | Hua et al. |
| 2017/0082858 | A1 | 3/2017 | Klug et al. |
| 2017/0255012 | A1 | 9/2017 | Tam et al. |
| 2017/0255013 | A1 | 9/2017 | Tam et al. |
| 2017/0262054 | A1 | 9/2017 | Lanman et al. |
| 2018/0003962 | A1 | 1/2018 | Urey et al. |
| 2018/0003981 | A1 | 1/2018 | Urey |
| 2018/0007255 | A1 | 1/2018 | Tang |
| 2018/0039052 | A1 | 2/2018 | Khan et al. |
| 2018/0052276 | A1 | 2/2018 | Klienman et al. |
| 2018/0101020 | A1 | 4/2018 | Gollier et al. |
| 2018/0120579 | A1 | 5/2018 | Gollier et al. |
| 2018/0149862 | A1 | 5/2018 | Kessler et al. |
| 2018/0246336 | A1 | 8/2018 | Greenberg |
| 2018/0267309 | A1 | 9/2018 | Klug et al. |
| 2018/0284441 | A1 | 10/2018 | Cobb |
| 2019/0064526 | A1 | 2/2019 | Connor |
| 2019/0265494 | A1 | 8/2019 | Takagi et al. |
| 2020/0049995 | A1 | 2/2020 | Urey et al. |
| 2020/0073123 | A1 | 3/2020 | Martinez et al. |
| 2020/0169725 | A1 | 5/2020 | Hua et al. |

(56) References Cited

U.S. PATENT DOCUMENTS

| | | |
|---|---|---|
| 2020/0183174 A1 | 6/2020 | Noui et al. |
| 2020/0209459 A1 | 7/2020 | Curtis et al. |
| 2020/0284967 A1 | 9/2020 | Schowengerdt et al. |
| 2020/0293108 A1 | 9/2020 | Georgiou et al. |
| 2020/0301147 A1 | 9/2020 | Klug |
| 2020/0348528 A1 | 11/2020 | Jamali et al. |
| 2020/0355918 A1 | 11/2020 | Klug et al. |
| 2020/0409156 A1 | 12/2020 | Sissom et al. |
| 2021/0041949 A1 | 2/2021 | Pace et al. |
| 2021/0048668 A1 | 2/2021 | Klug |
| 2021/0063749 A1 | 3/2021 | Takeda et al. |
| 2021/0072543 A1 | 3/2021 | Peng et al. |
| 2021/0084269 A1 | 3/2021 | Geng |
| 2021/0109363 A1 | 4/2021 | Lyubarsky |
| 2021/0199970 A1 | 7/2021 | Huang et al. |
| 2021/0223462 A1 | 7/2021 | Liu et al. |
| 2021/0231947 A1 | 7/2021 | Schuck, III et al. |
| 2021/0239971 A1 | 8/2021 | Georgiou et al. |
| 2021/0294103 A1 | 9/2021 | Klug et al. |
| 2021/0294105 A1 | 9/2021 | He et al. |
| 2021/0314553 A1 | 10/2021 | Teng et al. |
| 2021/0373330 A1 | 12/2021 | Urey et al. |
| 2021/0382307 A1 | 12/2021 | Sluka et al. |
| 2022/0050299 A1 | 2/2022 | Hua et al. |
| 2022/0099975 A1 | 3/2022 | Schultz et al. |
| 2023/0384584 A1 | 11/2023 | Kelly |

FOREIGN PATENT DOCUMENTS

| | | |
|---|---|---|
| JP | 08098214 A | 4/1996 |
| WO | 2016105282 A2 | 6/2016 |
| WO | 20220170287 A2 | 8/2022 |

OTHER PUBLICATIONS

US 10,261,326 B2, 04/2019, Hua et al. (withdrawn)
US 10,935,795 B2, 03/2021, Hua et al. (withdrawn)
USPTO Notice of Allowance in U.S. Appl. No. 18/092,280 including: Examiner interview summary, List of References cited by examiner; Search information; Issue information; Lists of References cited by applicant and considered by examiner; Examiner's search strategy and results; and Bibliographic Data Sheet, Apr. 17, 2023, 271 pages.
USPTO Notice of Allowance in U.S. Appl. No. 18/052,971 including: Examiner Interview Summary, List of References cited by examiner; Issue information; Search information; Bibliographic Data Sheet; Lists of References cited by applicant and considered by examiner; and Examiner's search strategy and results; Apr. 26, 2023, 161 pages.
Wong, Timothy; Yun, Zhisheng; Ambur, Gregg; Etter, Jo; "Folded optics with birrefringent reflective polarizers," Proc. SPIE, 1035, Digital Optical Technologies 2017, 102250E (Jun. 26, 2017); doi: 10.1117/12.2270266, 8 pp.
Feit, Anna Maria; Williams, Shane; Toledo, Arturo; Paradiso, Ann; Kulkarni, Harish; Kane, Shaun; Morris, Meredith Ringel; "Toward Everyday Gaze Input: Accuracy and Precision of Eye Tracking and Implications for Design," ACM, Proceedings of CHI 2017, DOI: 10.1145/3025453.3025599, May 2017, 22 pp.
Farnsworth, Bryn, Ph.D.; "What is Eye Tracking and How Does it Work?," IMOTIONS, Apr. 2, 2019, 9 pp., downloaded on Mar. 16, 2021 from https://imotions.com/blog/eye-tracking-work/.
Cheng, Dewen; Wang, Yongtian; Hua, Hong; and Talha, M. M.; "Design of an optical see-through head-mounted display with a low f-number and large field of view using a freeform prism," Applied Optics, vol. 48, No. 14, May 10, 2009, pp. 2655-2668.
Hua, Hong; "Sunglass-like displays become a reality with free-form optical technology", SPIE Digital Library,Aug. 20, 2012, 4 pp.
Ling et al.; "16. The Simple Magnifier," University Physics Volumne 3, OpenStax, Rice University, Sep. 29, 2016, downloaded on May 27, 2021 from https://opentextbc.ca/universityphysicsv3openstax/chapter/the-simple- magnifier/.
Greivenkamp, John E.; "Section 4: Imaging and Paraxial Optics", OPTI-201/202 Geometical and Intstrumental Optics, 2018, downloaded on Mar. 16, 2021 from https://wp.optics.arizona.edu/jgreivenkamp/wp-content/uploads/sites/11/2019/01/201-202-04-Imaging-and-Paraxial-Optics.pdf.
Lin, Tiegang; Zhan, Tao; Zou, Junyu; Fan, Fan; and Wu, Shin-Tson, "Maxwellian near-eye display with an expanded eyebox," Optics Express, vol. 26/21, Dec. 2020, pp. 38616-38625.
Greivenkamp, John E.; "Section 4: Imaging and Paraxial Optics", OPTI-201/202 [Geometical and Intstrumental] Geometrical and Instrumental Optics, 2018, downloaded on Mar. 16, 2021 from https://wp.optics.arizona.edu/jgreivenkamp/wp-content/uploads/sites/11/2019/01/201-202-04-Imaging-and-Paraxial-Optics.pdf.
USPTO Notice of Allowance in U.S. Appl. No. 18/052,971 including: List of References cited by examiner; Search information; Issue information; Lists of References cited by applicant and considered by examiner; Examiner's search strategy and results; and Bibliographic Data Sheet, Jan. 17, 2023, 160 pages.
USPTO Notice of Allowance in U.S. Appl. No. 17/805,863 including: Examiner interview summary, List of References cited by examiner; Search information; Issue information; Lists of References cited by applicant and[2]_considered by examiner; Examiner's search strategy and results; and Bibliographic Data Sheet, Sep. 19, 202[3] 2, 109 pages.
USPTO Notice of Allowance in U.S. Appl. No. 17/805,863 including: Examiner interview summary, List of References cited by examiner; Search information; Issue information; Lists of References cited by applicant and considered by examiner; Examiner's search strategy and results; and Bibliographic Data Sheet, Sep. 19, 2022, 109 pages.
USPTO Notice of Allowance in U.S. Appl. No. 17/805,863 including: Examiner interview summary, List of References cited by examiner; Search information; Issue information; Lists of References cited by applicant and2considered by examiner; Examiner's search strategy and results; and Bibliographic Data Sheet, Sep. 19, 2023, 109 pages.
Kelly, Shawn L., "Next Generation Wearable VR Displays using Modulated Subpupil Lighting", Dec. 9, 2022, 9 pp., available at https://www.panamorph.com/wp-content/uploads/2022/12/Next-Generation-Wearable-VR-Displays-using-Modulated-Subpupil-Lighting-White-Paper.pdf.
International Preliminary Report On Patentabilty (Chapter II of the PCT) of International Preliminary Examination Authority IPEA/US in International Application No. PCT/US2022/032576, Aug. 9, 2023, including associated communications and Examiner's search strategy and results, 50 pages.
International Search Report and Written Opinion of International Searching Authority ISA/EP in International Application No. PCT/US2022/032576, Oct. 5, 2022, 12 pages.
International Search Report and Written Opinion of International Searching Authority ISA/EP in International Application No. PCT/US2022/032576, Dec. 22, 2022, 23 pages.
USPTO Notice of Allowance in U.S. Appl. No. 18/092,281 including: Examiner Interview Summary Record, Issue information; Search information; Bibliographic Data Sheet; and Examiner's Search Strategy and Results, Jun. 12, 2023, 33 pages.
USPTO Non-Final Office Communication in U.S. Appl. No. 18/092,281 including: Office Action Summary, Detailed Action, List of References cited by examiner; Index of Claims; Search Notes; Bibliographic Data Sheet; Lists of References cited by applicant and considered by examiner; and Examiner's Search History; May 16, 2023, 60 pages.

* cited by examiner

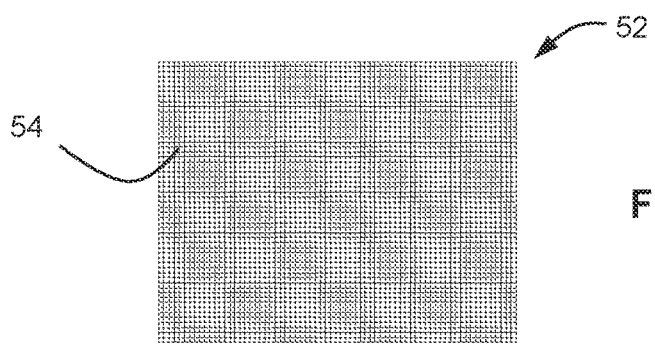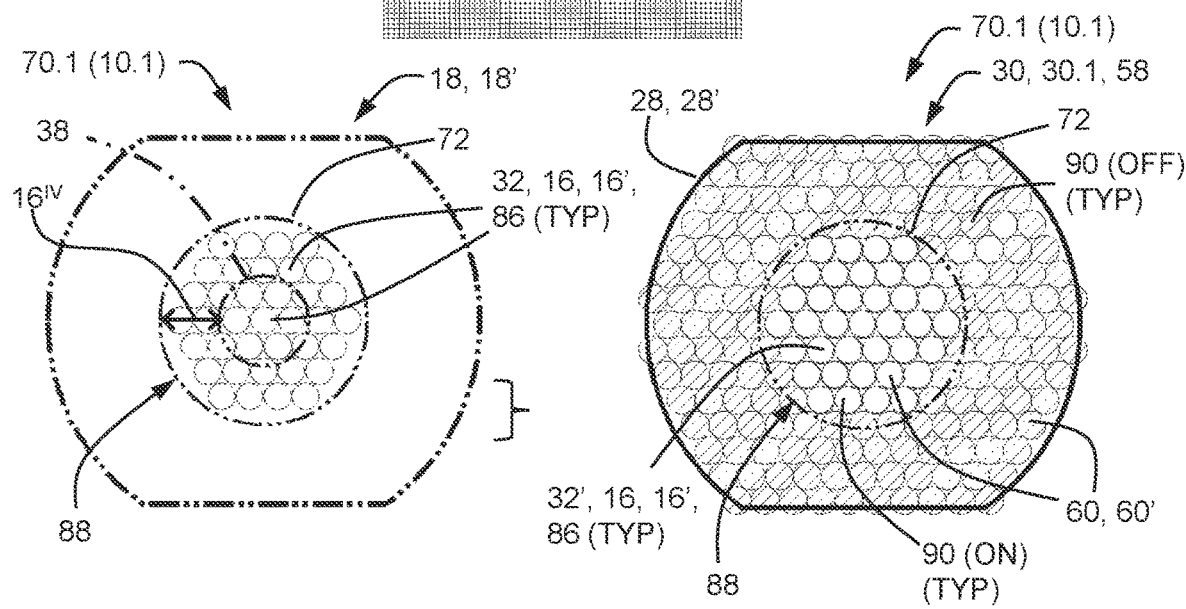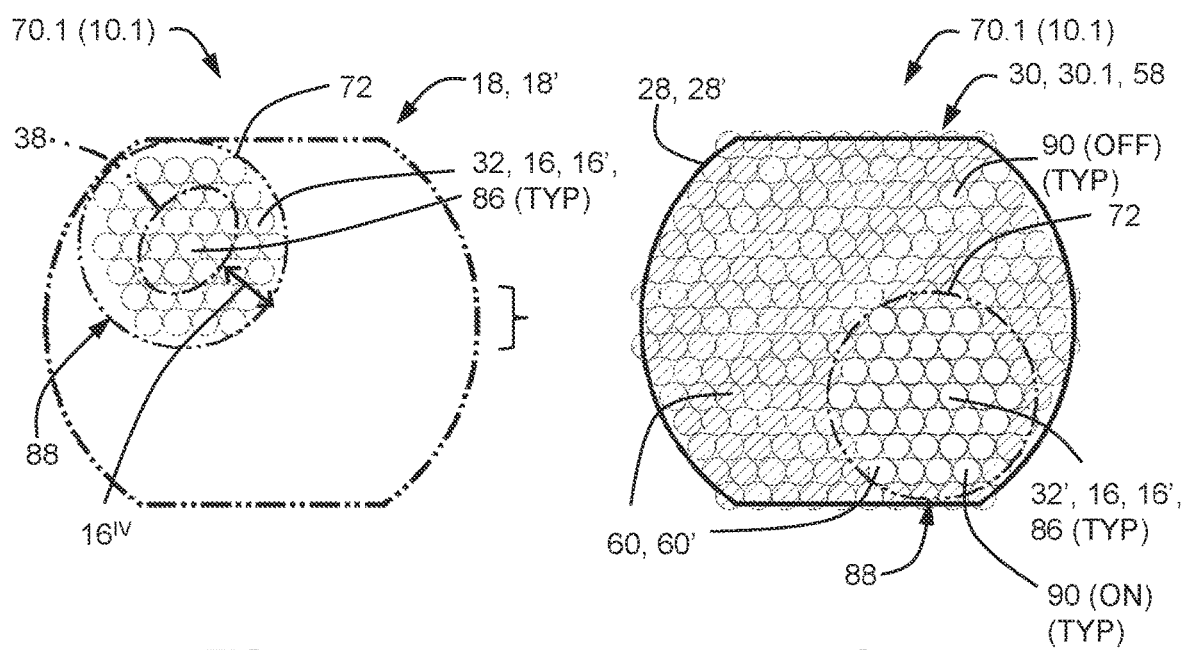

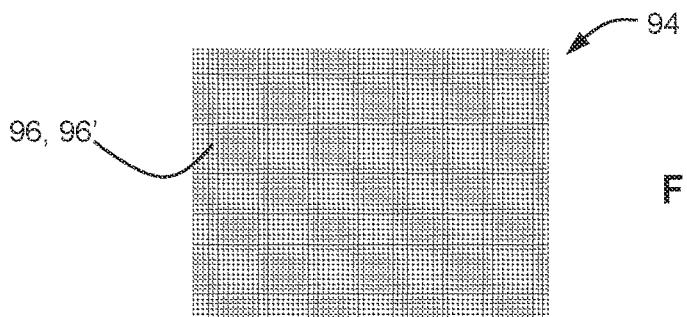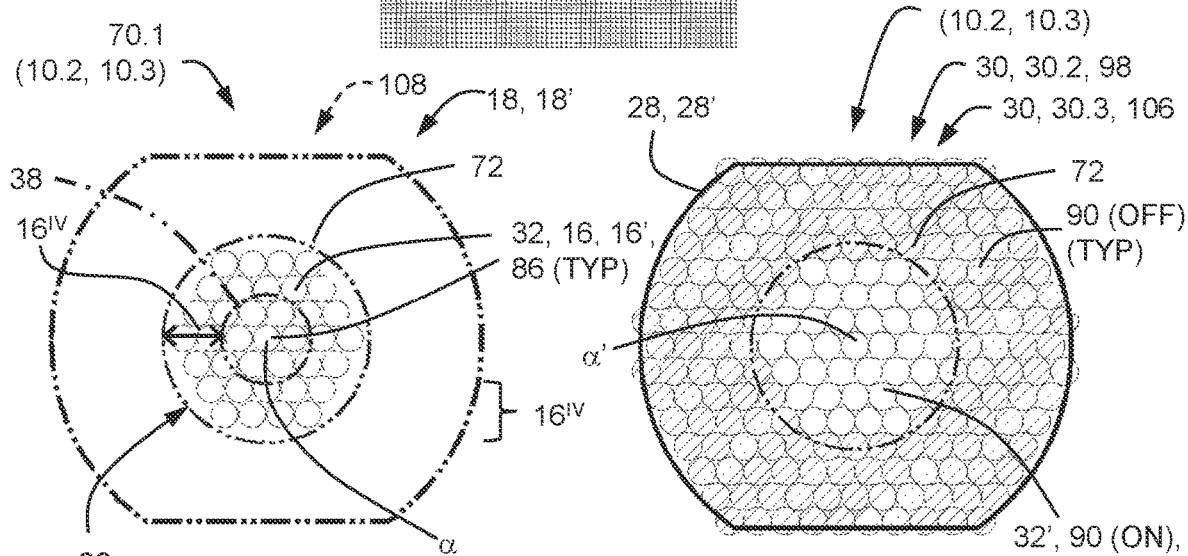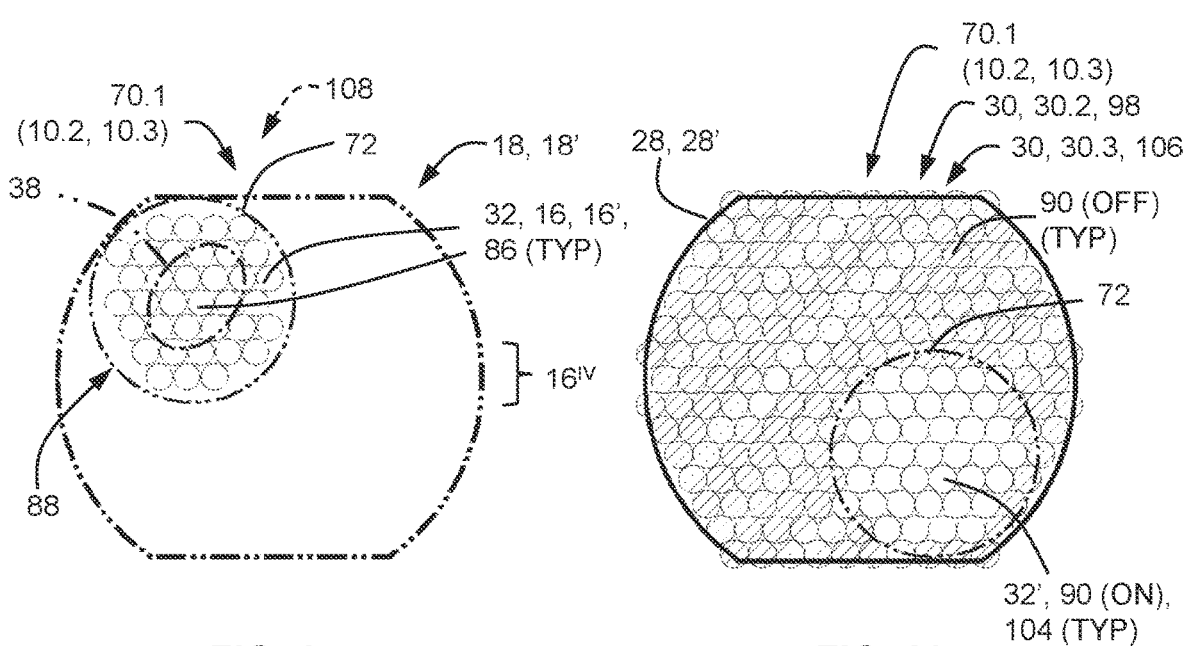

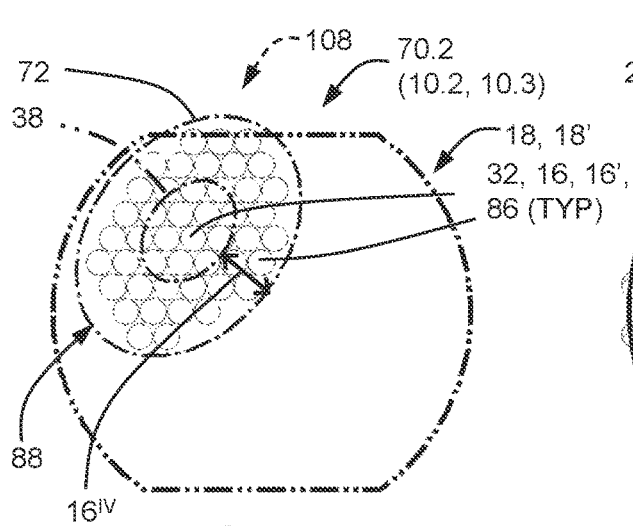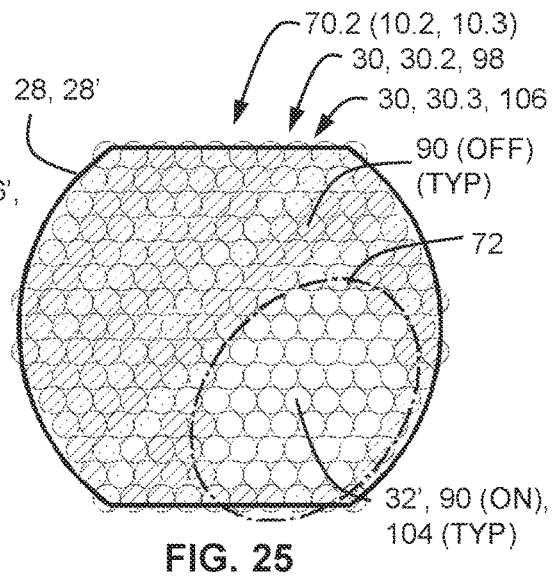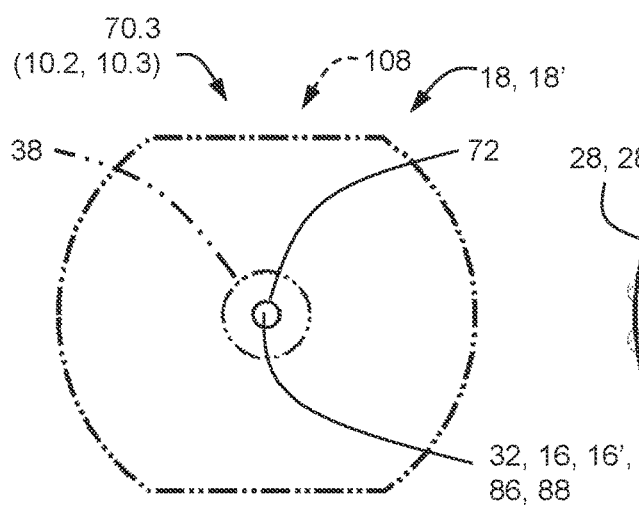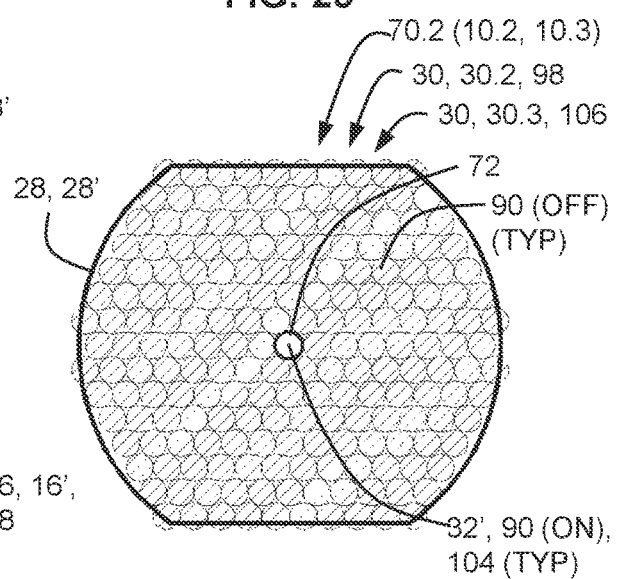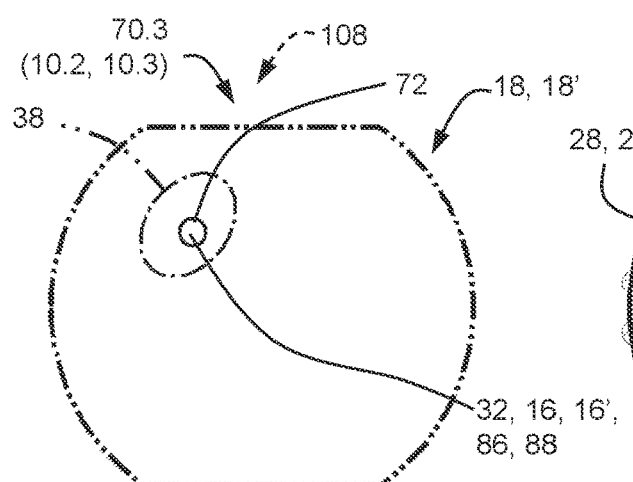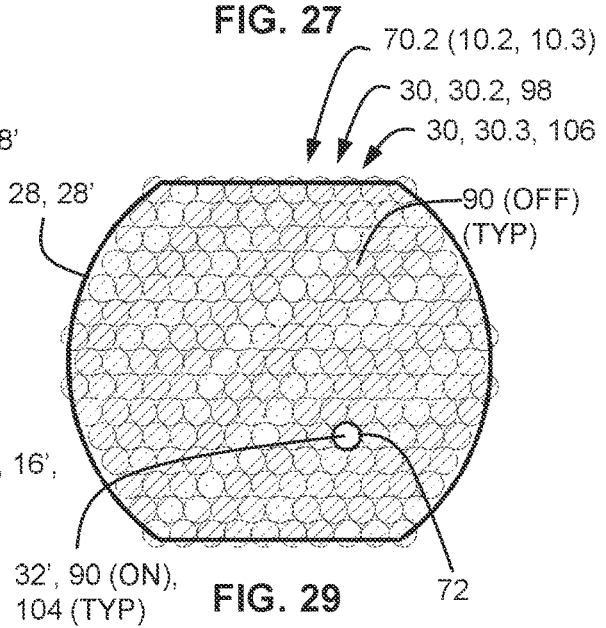

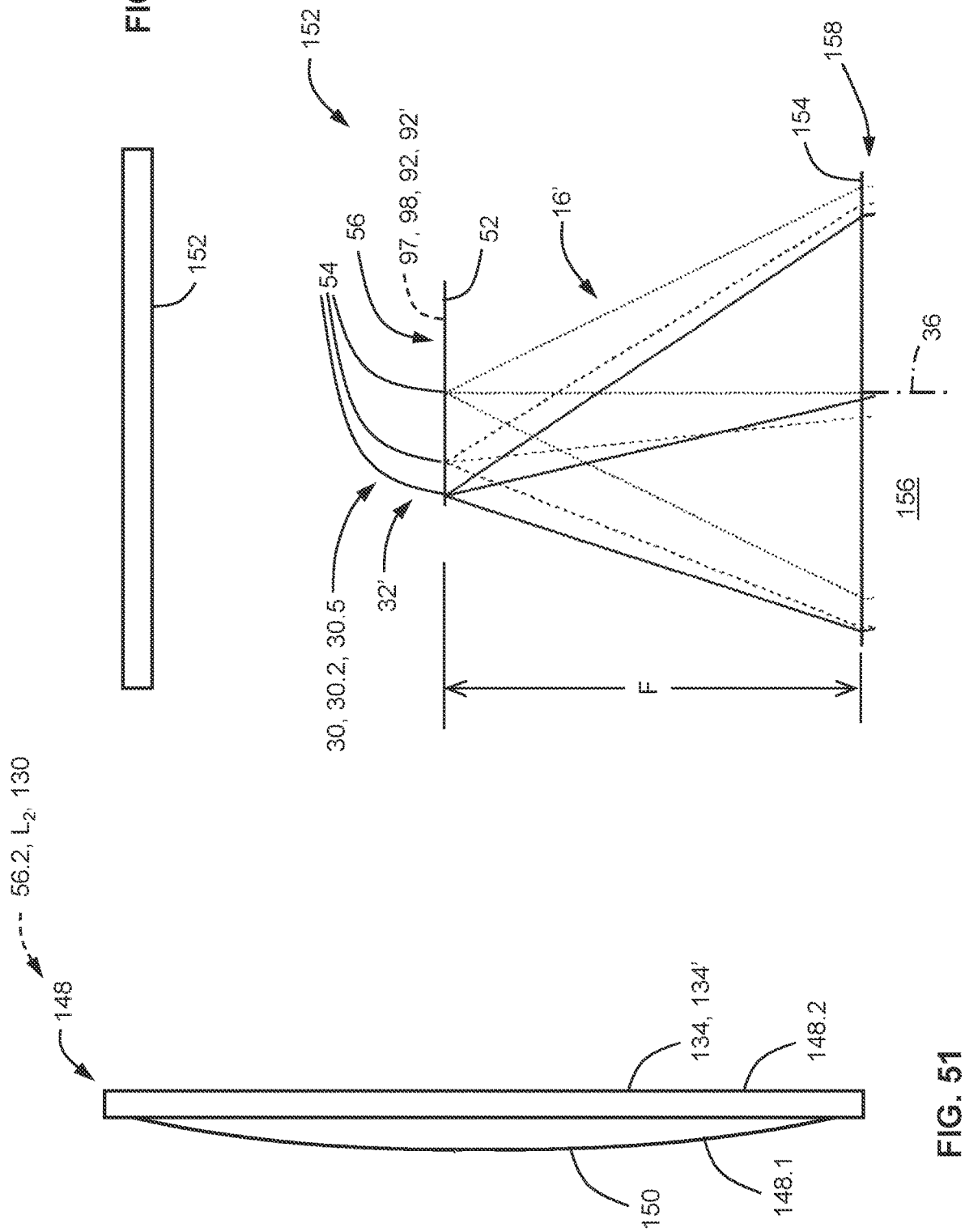

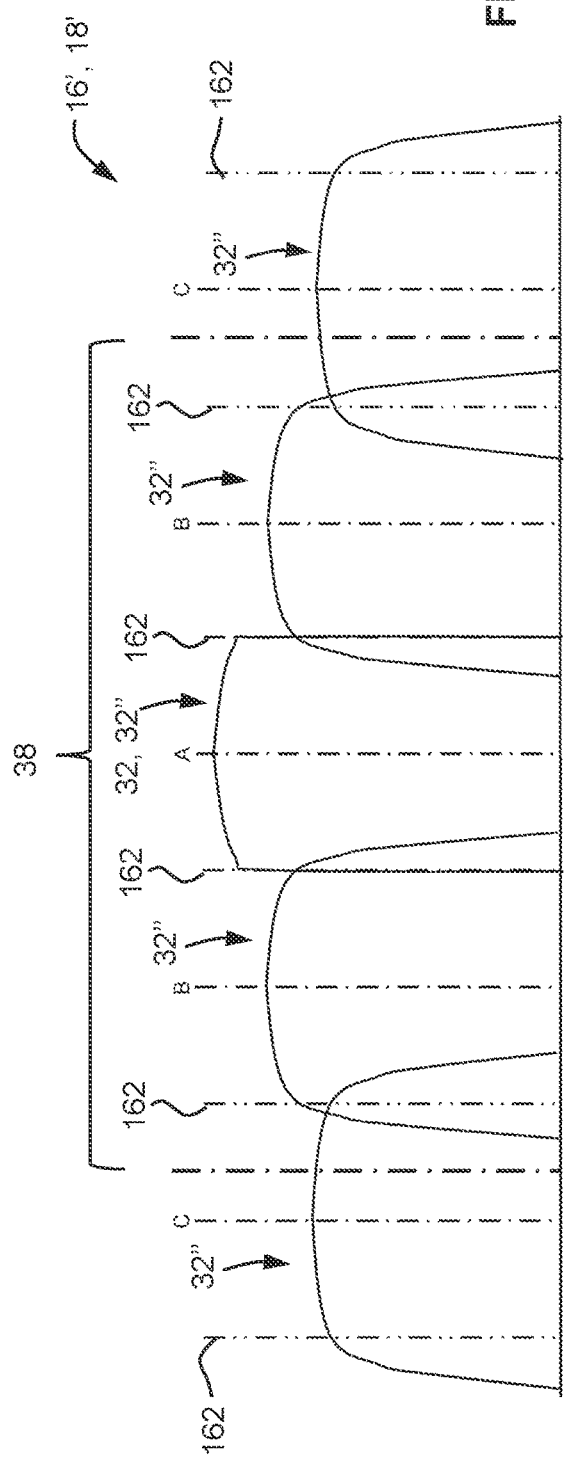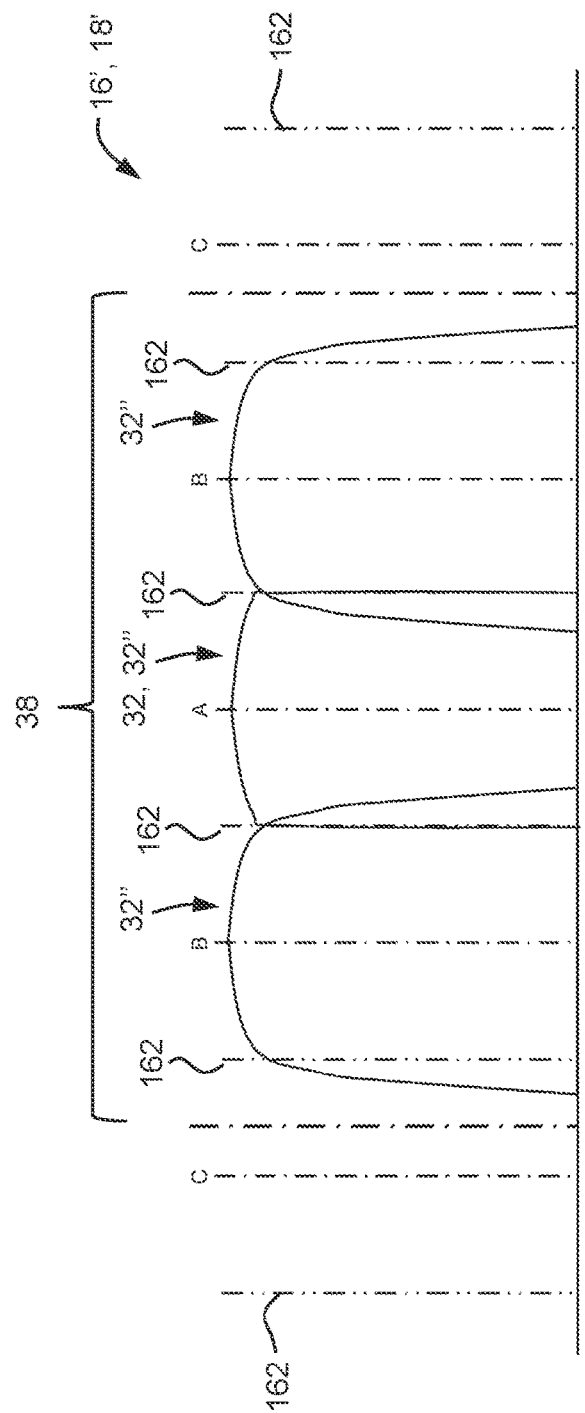

NEAR-EYE DISPLAY SYSTEM

CROSS-REFERENCE TO RELATED APPLICATIONS

The instant application is a continuation of International Application No. PCT/US2022/032576 filed on 7 Jun. 2022, which claims benefit of prior U.S. Provisional Application Ser. No. 63/197,777 filed on 7 Jun. 2021, and claims benefit of prior U.S. Provisional Application Ser. No. 63/222,978 filed on 17 Jul. 2021. Each of the above-identified applications is incorporated herein by reference in its entirety.

BRIEF DESCRIPTION OF THE DRAWINGS

In the accompanying drawings:

FIG. 3 illustrates a plan view of the flat-panel two-dimensional image-display array of light-emitting image-display pixels of the first aspect of the near-eye display system illustrated in FIGS. 1 and 2;

FIG. 4 illustrates a plan view of an aperture stop and a two-dimensional modulation array that respectively define an entrance pupil and an associated plurality of modulated subpupils of the first-aspect near-eye display system illustrated in FIGS. 1 and 2, with the two-dimensional modulation array controlled so as to provide for a first aspect of an associated active subpupil region (ASR) in cooperation with an eye pupil of the user being centered on the optical axis of the associated optical subsystem;

FIG. 5 illustrates a plan view of an exit pupil and associated active exit subpupils associated with the aperture stop and the two-dimensional modulation array of the first-aspect near-eye display system illustrated in FIGS. 1 and 2, for the active subpupil region (ASR) illustrated in FIG. 4;

FIG. 6 illustrates a plan view of the aperture stop and two-dimensional modulation array of the first-aspect near-eye display system illustrated in FIGS. 1 and 2, with the two-dimensional modulation array controlled so as to provide for the first aspect of an associated active subpupil region (ASR) in cooperation with an eye pupil of the user being rotated upwards and to the left relative to the optical axis of the associated optical subsystem;

FIG. 7 illustrates a plan view of an exit pupil and associated active exit subpupils associated with the aperture stop and the two-dimensional modulation array of the first-aspect near-eye display system illustrated in FIGS. 1 and 2, for the active subpupil region (ASR) illustrated in FIG. 6;

FIG. 20 illustrates a plan view of the flat-panel two-dimensional image-display array of light-modulating image-display pixels of the second and third aspects of the near-eye display system illustrated in FIGS. 16-19, 44, 45 and 47;

FIG. 21 illustrates a plan view of an aperture stop and a two-dimensional modulation array that respectively define an entrance pupil and an associated plurality of modulated subpupils of each of the second- and third-aspect near-eye display systems illustrated in FIGS. 16-19, 44, 45 and 47, with the two-dimensional modulation array controlled so as to provide for the first aspect of an associated active subpupil region (ASR) in cooperation with an eye pupil of the user being centered on the optical axis of the associated optical subsystem;

FIG. 22 illustrates a plan view of an exit pupil and associated active exit subpupils associated with the aperture stop and a two-dimensional modulation array of each of the second- and third-aspect near-eye display systems illustrated in FIGS. 16-19, 44, 45 and 47, for the active subpupil region (ASR) illustrated in FIG. 21;

FIG. 23 illustrates a plan view of the aperture stop and two-dimensional modulation array of each of the second- and third-aspect near-eye display systems illustrated in FIGS. 16-19, 44, 45 and 47, with the two-dimensional modulation array controlled so as to provide for the first aspect of an associated active subpupil region (ASR) in cooperation with an eye pupil of the user being rotated upwards and to the left relative to the optical axis of the associated optical subsystem;

FIG. 24 illustrates a plan view of an exit pupil and associated active exit subpupils associated with the aperture stop and a two-dimensional modulation array of each of the second- and third-aspect near-eye display systems illustrated in FIGS. 16-19, 44, 45 and 47, for the active subpupil region (ASR) illustrated in FIG. 23;

FIG. 25 illustrates a plan view of the aperture stop and two-dimensional modulation array of each of the second- and third-aspect near-eye display systems illustrated in FIGS. 16-19, 44, 45 and 47, with the two-dimensional modulation array controlled so as to provide for a second aspect of an associated active subpupil region (ASR) in cooperation with an eye pupil of the user being rotated upwards and to the left relative to the optical axis of the associated optical subsystem;

FIG. 26 illustrates a plan view of an exit pupil and associated active exit subpupils associated with the aperture stop and two-dimensional modulation array of each of the second- and third-aspect near-eye display systems illustrated in FIGS. 16-19, 44 and 45, for the active subpupil region (ASR) illustrated in FIG. 25;

FIG. 27 illustrates a plan view of the aperture stop and two-dimensional modulation array of each of the second- and third-aspect near-eye display systems illustrated in FIGS. 16-19, 44 and 45, with the two-dimensional modulation array controlled so as to provide for a third aspect of an associated active subpupil region (ASR) in cooperation with an eye pupil of the user being centered on the optical axis of the associated optical subsystem;

FIG. 28 illustrates a plan view of an exit pupil and associated active exit subpupil associated with the aperture stop and two-dimensional modulation array of each of the second- and third-aspect near-eye display systems illustrated in FIGS. 16-19, 44 and 45, for the active subpupil region (ASR) illustrated in FIG. 27;

FIG. 29 illustrates a plan view of the aperture stop and two-dimensional modulation array of each of the second- and third-aspect near-eye display systems illustrated in FIGS. 16-19, 44 and 45, with the two-dimensional modulation array controlled so as to provide for the third aspect of an associated active subpupil region (ASR) in cooperation with an eye pupil of the user being rotated upwards and to the left relative to the optical axis of the associated optical subsystem;

FIG. 30 illustrates a plan view of an exit pupil and associated active exit subpupil associated with the aperture stop and two-dimensional modulation array of each of the second- and third-aspect near-eye display systems illustrated in FIGS. 16-19, 44 and 45, for the active subpupil region (ASR) illustrated in FIG. 29;

FIG. 51 illustrates an embodiment of a hybrid magnifier lens of a near-eye display system;

FIG. 52 illustrates a schematic block diagram of a waveguide projector light source;

FIG. 53 illustrates a model of the waveguide projector illustrated in FIG. 52, incorporating a planar light source array in cooperation with a condenser lens, further illustrating the propagation of light rays from the planar light source array to and through the condenser lens;

FIG. 64 illustrates a hypothetical intensity profile of a plurality of the subpupils illustrated in FIG. 60, responsive to control in accordance the second aspect of the process for controlling the subpupil modulator;

FIG. 65 illustrates a hypothetical intensity profile of a plurality of the subpupils illustrated in FIG. 60, responsive to control in accordance the third aspect of the process for controlling the subpupil modulator;

DETAILED DESCRIPTION

Figure 1:
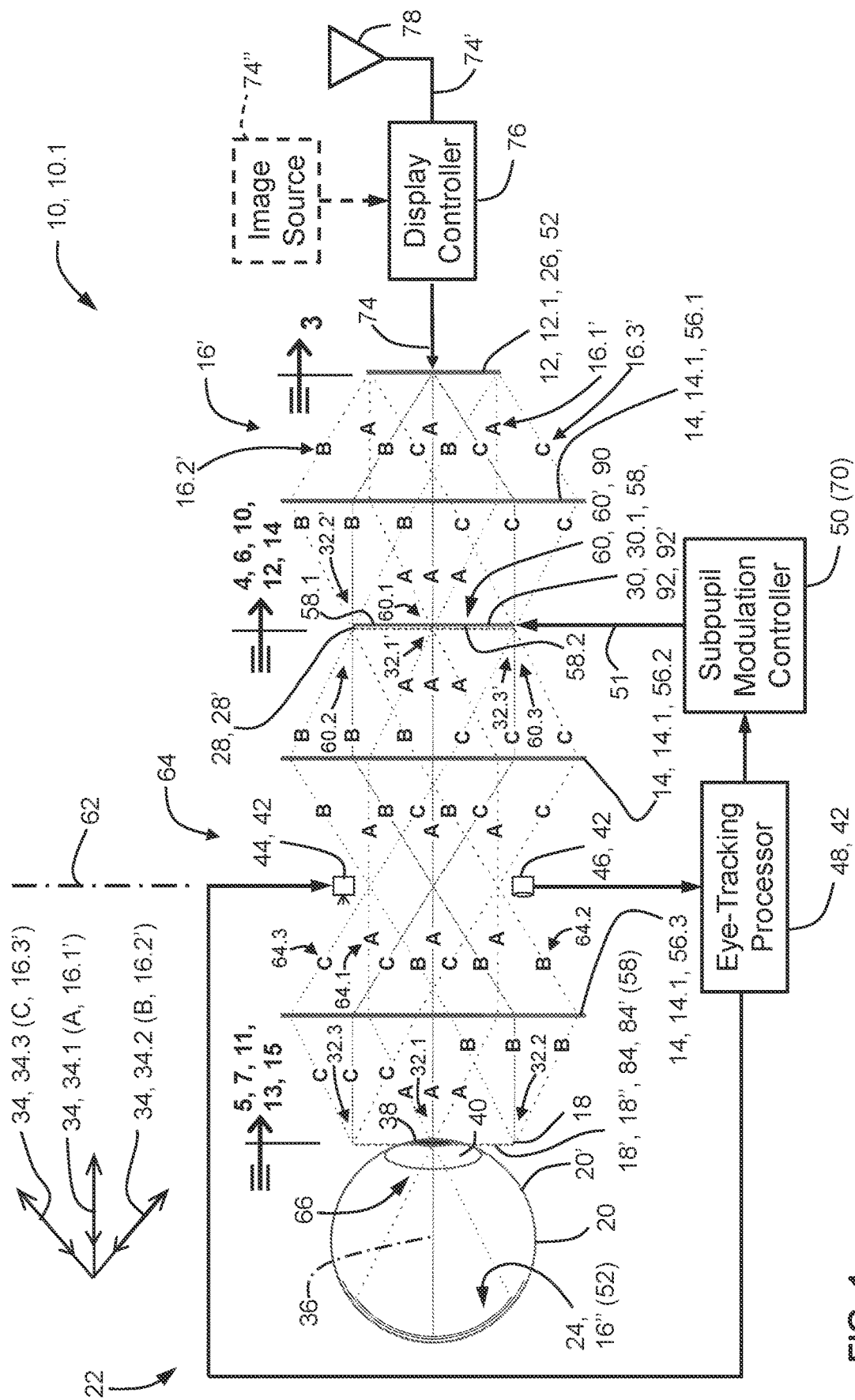
FIG. 1 illustrates a schematic block diagram of a first aspect of a near-eye display system incorporating a flat-panel two-dimensional image-display array of light-emitting image-display pixels.
Figure 58:
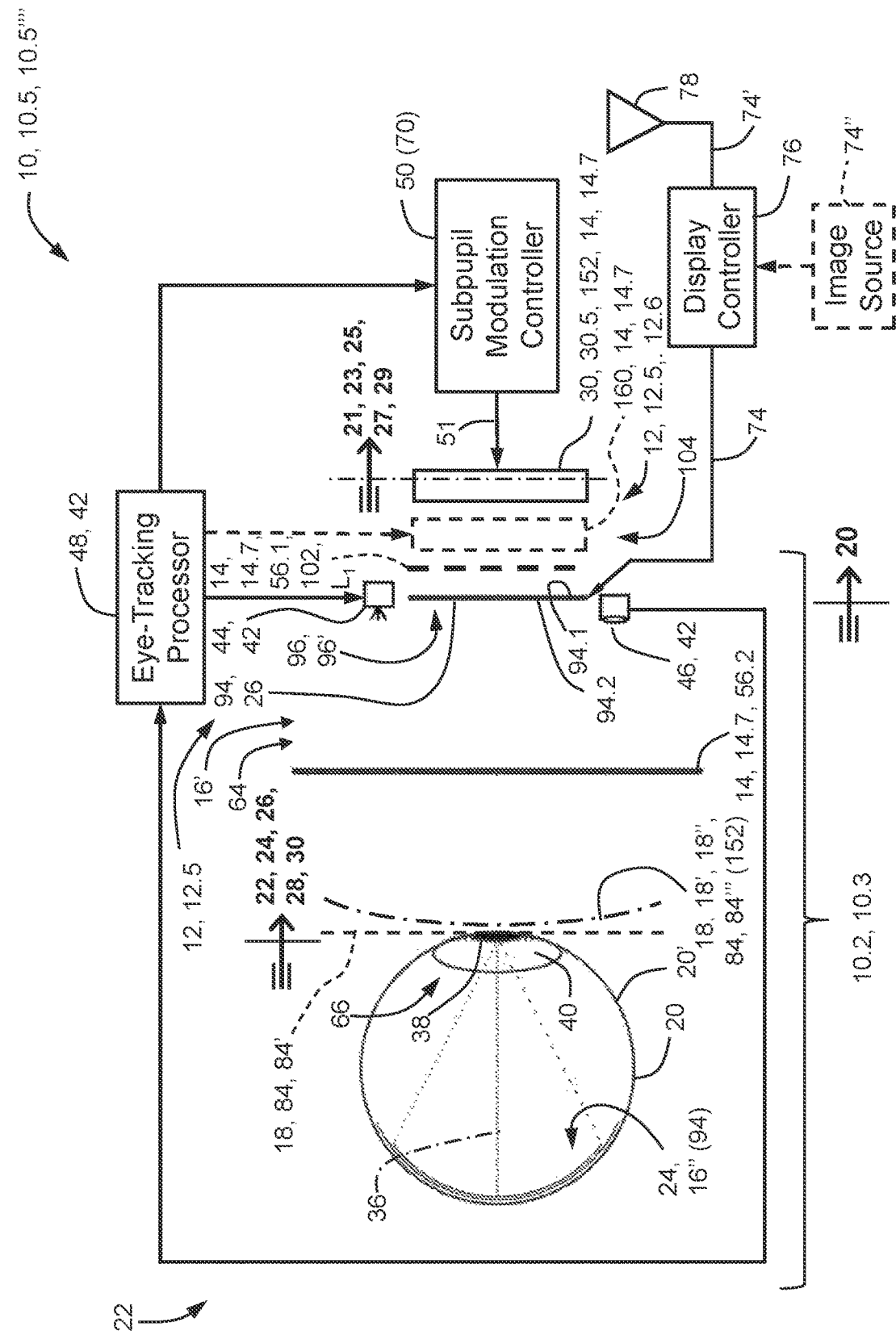
FIG. 58 illustrates a general, fourth embodiment of a fifth aspect of a near-eye display system incorporating a waveguide projector light source that defines an array of modulated subpupils thereof, similar to that illustrated in FIGS. 54, 56 and 57, incorporating a seventh aspect of an optical subsystem comprising a modified second-aspect optical subsystem for which the combination of the controllable light source and conditioner lens thereof is replaced with a waveguide projector, further illustrating the incorporation of one or both of an optional conditioner lens and an optional varifocal lens.

Referring to FIGS. 1-58, a near-eye display system 10 incorporates an image generator 12 that, in cooperation with an associated optical subsystem 14, provides for projecting light 16' of an image 16 generated by the image generator 12 onto an exit pupil 18 of the optical subsystem 14, into the eye 20 of a user 22, and as a real image 16" onto the retina 24 of the eye 20 for viewing by the user 22, wherein the exit pupil 18 of the optical subsystem 14 is located proximate to the front surface 20' of the eye 20, the real image 16" is associated with a magnified, apparently distant virtual image 16''' of a two-dimensional array 26 of the image generator 12 that is the object of the image 16, and the exit pupil 18 comprises an image of an aperture stop 28 within, or associated with, the optical subsystem 14, wherein the aperture stop 28 acts as an associated entrance pupil 28' and provides for constraining the lateral extent of the associated field of light 16' therewithin. The real image 16" is projected onto the onto the retina 24 of the eye 20 without vignetting by the optical subsystem 14, independent of the rotation of the user's eye 20 as a result of that rotation providing for directing the center of the fovea of the eye 20 to any location on the real image 16".

The near-eye display system 10 further incorporates a subpupil modulator 30 that is imaged by the optical subsystem 14 as an associated exit-pupil image 18' within the surface 18" of the exit pupil 18. The subpupil modulator 30 provides defining one or more exit subpupils 32 within the exit pupil 18, and provides for individually controlling the transmission of light 16' through each of the one or more exit subpupils 32 and onto, or into, the eye 20. Each of the exit subpupils 32 is associated with light 16' of the image 16 propagating along a corresponding particular direction 34 at an associated angle relative to the optical axis 36 of the associated optical subsystem 14, but otherwise contains light 16' from each and every point of the image 16 from which light 16' emanates at that associated angle. For example, light 16.1' (also designated by "A" in FIG. 1) associated with a first gaze direction 34.1—that is generally along the optical axis 36 of the associated optical subsystem 14—is imaged through a corresponding first exit subpupil 32.1 that is also along the optical axis 36. Furthermore, light 16.2' (also designated by "B" in FIG. 1) associated with a second gaze direction 34.2—that has a first angular offset from the optical axis 36—is imaged through a corresponding second exit subpupil 32.2 that has a corresponding first lateral offset from the optical axis 36. Yet further, light 16.3' (also designated by "C" in FIG. 1) associated with a third gaze direction 34.3—that has a second angular offset from the optical axis 36—is imaged through a corresponding third exit subpupil 32.3 that has a corresponding second lateral offset from the optical axis 36.

The light 16' of the image 16 is received by the eye 20 through an eye pupil 38 thereof, the opening of which is controlled by the iris 40, and the angular orientation of which, along with that of the eye 20, is responsive to the gaze direction 34 of the user 22. Although the transverse extent of the exit pupil 18 is sufficiently large to provide for light 16' of the image 16 to be viewed over a range of gaze directions 34, 34.1, 34.2, 34.3, for a particular gaze direction 34, 34.1, 34.2, 34.3, only that portion of the light 16' that is within the boundary of the edge of the eye pupil 38 will reach the retina 24 to be perceived as the image 16 by the user 22. The projected transverse location and projected shape of the eye pupil 38 is responsive to the associated gaze direction 34, 34.1, 34.2, 34.3 of that eye 20, ranging from a circular shape with no transverse offset relative to the optical axis 36 associated with the first gaze direction 34.1 when gazing along the optical axis 36, to an elliptical shape with an associated transverse offset relative to the optical axis 36 associated with other gaze directions 34, 34.2, 34.3. Light 16' that is outside the edge of the eye pupil 38 will be backscattered by the surrounding tissue of the eye 20 or face of the user 22, thereby increasing ambient light which may reflect or scatter from components of the display system into the eye 20 that can otherwise degrade the quality of the image 16 being intentionally viewed by the user 22. Accordingly, the near-eye display system 10 incorporates an eye-tracking subsystem 42 comprising an infrared illuminator 44 and an associated infrared-responsive camera 46 in cooperation with an associated eye-tracking processor 48 that provides for tracking at least the lateral location of the eye pupil 38 responsive to an image of the infrared light from the infrared illuminator 44 that is scattered by the iris 40 and received by the associated infrared-responsive camera 46, and processed by the eye-tracking processor 48 to identify the edge of the eye pupil 38 and estimate the transverse location and transverse extent thereof, which is then communicated to a subpupil modulation controller 50 that generates an associated subpupil modulation control signal 51 that provides for controlling the activation of the associated modulated subpupils 32' of the associated subpupil modulator 30 so as to activate one or more modulated subpupils 32' that provide for light 16' of the image 16 to be received by the retina 24 of the eye 20 of the user 22, and so as to provide for deactivating the remaining portion of the exit pupil 18 so as to prevent propagation of light 16' therethrough, and thereby limit otherwise associated backscattering of light 16' off the eye 20 or face of the user 22.

For example, in one set of embodiments, the eye-tracking subsystem 42 in configured in accordance with one or more of the following Internet websites from the group consisting of https://pupil-labs.com/products/core/; https://www.tobiipro.com/product-listing/hardware/; https://imotions.com/biosensor/eye-tracking-vr/; https://www.ergoneers.com/en/hardware/eye-tracking/; https://www.adhawkmicrosystems.com/eye-tracking/; and https://www.eye-square.com/en/headmounted-eye-tracking/. In one set of embodiments, for which the near-eye display system 10 provides for displaying an image 16 to each eye 20 of the user 22, a single eye-tracking subsystem 42 may be incorporated into the near-eye display system 10 to provide for tracking for one of the eyes 20 of the user 22, with the resulting tracking information provided to the subpupil modulation controller 50 for the other eye 20, based upon the assumption that the eye pupils 38 of both eyes 20 generally track to the same location in the image 16.

Referring to FIGS. 1-15, and to FIG. 3 in particular, in accordance with a first aspect 10.1 of a near-eye display system 10, 10.1, an associated first aspect image generator 12, 12.1 comprises a flat-panel two-dimensional image-display array 52 of light-emitting image-display pixels 54, each of which generates and emits, or transmits,—over a range of directions—the light 16' of the image 16 from a corresponding point thereof. The light-emitting image-display pixels 54 can be embodied in various ways, for example, in one set of embodiments, as light-emitting-diode (LED) elements, and in another set of embodiments, as backlit liquid-crystal-display (LCD) elements. Referring to FIGS. 1, 2, 8 and 9, an associated first-aspect optical subsystem 14, 14.1 of the first-aspect near-eye display system 10, 10.1 comprises a plurality of—for example, three—dioptric-power optical elements 56, 56.1, 56.2, 56.3, for example, respective first 56.1', $L_1$, second 56.2', $L_2$, and third 56.3', $L_3$ convergent magnifier lenses, located along the associated optical axis 36.

The first dioptric-power optical element 56, 56.1, 56.1', $L_1$ is located between the flat-panel two-dimensional image-display array 52 and an associated flat-panel two-dimensional modulation array 58 of an associated first-aspect subpupil modulator 30, 30.1 of the first-aspect near-eye display system 10, 10.1, with the first dioptric-power optical element 56, 56.1, 56.1', $L_1$ separated by one focal length $f_1$ from each of a first side 58.1 of the flat-panel two-dimensional modulation array 58 and the subpupil modulator 30, 30.1, so that light 16' emitted from each light-emitting image-display pixel 54 of the flat-panel two-dimensional image-display array 52 at a particular angle is focused onto a corresponding particular transverse location on the flat-panel two-dimensional modulation array 58. The flat-panel two-dimensional modulation array 58 is located at or near the location of the aperture stop 28, wherein light 16' from each of the light-emitting image-display pixels 54 passes through the entirety of the aperture stop 28, or in other words, each location within the aperture stop 28 receives a component of light 16' from each and every light-emitting image-display pixel 54 of the flat-panel two-dimensional image-display array 52, i.e. each point on the associated image 16 that is generated by the image generator 12, 12.1.

The flat-panel two-dimensional modulation array 58 incorporates a plurality of light-modulating pixels 60, for example, an array of liquid crystal pixels 60', wherein the intensity modulation of each light-modulating pixel 60 is independently controlled by the subpupil modulation controller 50 responsive to a measure by the eye-tracking subsystem 42 of the location of the eye pupil 38 relative to the exit pupil 18. For example, in one set of embodiments, the light-modulating pixels 60 are controlled to one of two states, an ON state that provides for enabling, and an OFF state that provide for blocking, the transmission of light 16' therethrough.

The second 56, 56.2, 56.2', L₂ and third 56, 56.3, 56.3', L₃ dioptric-power optical elements—for example, corresponding second 56.2', L₂ and third 56.3', L₃ convergent magnifier lenses—of the optical subsystem 14, 14.1 are located between a second side 58.2 of the flat-panel two-dimensional modulation array 58 and the exit pupil 18 of the optical subsystem 14, 14.1, and together provide for forming an image at the exit pupil 18 of both the subpupil modulator 30, 30.1/flat-panel two-dimensional modulation array 58 and the associated aperture stop 28. For example, referring to FIG. 2, in accordance with one set of embodiments, a second convergent magnifier lens 56.2', L₂ located one focal length $f_2$ from the subpupil modulator 30, 30.1/flat-panel two-dimensional modulation array 58 provides for transforming light 16' emanating from each location on the subpupil modulator 30, 30.1/flat-panel two-dimensional modulation array 58 to a corresponding beam 64 of light 16' propagating at a corresponding angle relative to the optical axis 36; and a third convergent magnifier lens 56.3', L₃ located between the exit pupil 18 and the rear focal plane 62 of the second convergent magnifier lens 56.2', L₂, one focal length $f_3$ from each, provides for transforming each beam 64 of light 16' from second convergent magnifier lens 56.2', L₂ propagating at a particular angle relative to the optical axis 36 to a corresponding spot within the exit pupil 18. Furthermore, the first 56.1', L₁, second 56.2', L₂, and third 56.3', L₃ convergent magnifier lenses, in combination with the lens 66 of the eye 20, provide for forming the real image 16" of the image generator 12, 12.1/flat-panel two-dimensional modulation array 58 on the retina 24 of the eye 20, wherein the third convergent magnifier lens 56.3', L₃ provides for adjusting the focus and for adjusting the apparent distance of the virtual image 16''' associated with the real image 16" that is formed on the retina 24 of the eye 20.

For example, light 16.1' from each of the light-emitting image-display pixels 54 of the flat-panel two-dimensional image-display array 52 emitted in a direction that is substantially parallel with the optical axis 36 of the optical subsystem 14, 14.1, i.e. associated with the first gaze direction 34.1, is focused by the first dioptric-power optical element 56, 56.1, 56.1', L₁ onto a first set of light-modulating pixels 60.1 of the subpupil modulator 30, 30.1 at a central location thereof associated with a first modulated subpupil 32.1', wherein the control state (i.e. ON or OFF) of the first set of light-modulating pixels 60.1 controls whether or not that light 16.1' can propagate therethrough to become transformed to a first beam 64.1 of light 16.1' (also designated by "A" in FIG. 1) by the second dioptric-power optical element 56, 56.2, 56.2', L₂, and then be focused by the third dioptric-power optical element 56, 56.3, 56.3', L₃ to form the corresponding first exit subpupil 32.1 at a corresponding first location 68.1 at the exit pupil 18, wherein the control state of the first set of light-modulating pixels 60.1 is controlled by the subpupil modulation controller 50 responsive to whether the location of the eye pupil 38—as determined by the eye-tracking subsystem 42—is either aligned with, or sufficiently close to, infra, the first exit subpupil 32.1.

Furthermore, light 16.2' from each of the light-emitting image-display pixels 54 of the flat-panel two-dimensional image-display array 52 emitted in a direction associated with the second gaze direction 34.2, is focused by the first dioptric-power optical element 56, 56.1, 56.1', L₁ onto a second set of light-modulating pixels 60.2 of the subpupil modulator 30, 30.1 at a first relatively offset location thereof associated with a second modulated subpupil 32.2', wherein the control state (i.e. ON or OFF) of the second set of light-modulating pixels 60.2 controls whether or not that light 16.2' can propagate therethrough to become transformed to a second beam 64.2 of light 16.2' (also designated by "B" in FIG. 1) by the second dioptric-power optical element 56, 56.2, 56.2', L₂, and then be focused by the third dioptric-power optical element 56, 56.3, 56.3', L₃ to form the corresponding second exit subpupil 32.2 at a corresponding second location 68.2 at the exit pupil 18, wherein the control state of the second set of light-modulating pixels 60.2 is controlled by the subpupil modulation controller 50 responsive to whether the location of the eye pupil 38—as determined by the eye-tracking subsystem 42—is either aligned with, or sufficiently close to, infra, the second exit subpupil 32.2.

Yet further, light 16.3' from each of the light-emitting image-display pixels 54 of the flat-panel two-dimensional image-display array 52 emitted in a direction associated with the third gaze direction 34.3, is focused by the first dioptric-power optical element 56, 56.1, 56.1', L₁ onto a third set of light-modulating pixels 60.3 of the subpupil modulator 30, 30.1 at a second relatively offset location thereof associated with a third modulated subpupil 32.3', wherein the control state (i.e. ON or OFF) of the third set of light-modulating pixels 60.3 controls whether or not that light 16.3' can propagate therethrough to become transformed to a third beam 64.3 of light 16.2' (also designated by "C" in FIG. 1) by the second dioptric-power optical element 56, 56.2, 56.2', L₂, and then be focused by the third dioptric-power optical element 56, 56.3, 56.3', L₃ to form the corresponding third exit subpupil 32.3 at a corresponding third location 68.3 at the exit pupil 18, wherein the control state of the third set of light-modulating pixels 60.3 is controlled by the subpupil modulation controller 50 responsive to whether the location of the eye pupil 38—as determined by the eye-tracking subsystem 42—is either aligned with, or sufficiently close to, infra, the third exit subpupil 32.3.

Referring to FIGS. 4-7 and 11-14, the subpupil modulator 30, 30.1 is controlled by the subpupil modulation controller 50 in accordance with a subpupil modulation scheme 70 that provides for identifying an Active Subpupil Region (ASR) 72 of the subpupil modulator 30, 30.1 responsive to the location, size, and possibly the shape, of the eye pupil 38 as determined by the eye-tracking subsystem 42, and responsive thereto, that generates a subpupil modulation control signal 51 that provides for activating a subset of modulated subpupils 32' within the Active Subpupil Region (ASR) 72 (i.e. by controlling to an ON state), and that provides for deactivating the remainder of the modulated subpupils 32' of the subpupil modulator 30, 30.1 (i.e. by controlling to an OFF state), so as to provide for blocking light 16' of the image 16 that is outside the Active Subpupil Region (ASR) 72 from reaching the eye 20.

Referring to FIGS. 4-7, in accordance with a first aspect 70.1 of a subpupil modulation scheme 70, 70.1, the Active Subpupil Region (ASR) 72 is set to a fixed size and shape that is sufficiently large so as to surround the eye pupil 38 regardless of the orientation of the eye 20, and regardless of the associated state of the iris 40, with accommodation for the largest anticipated lateral extent of the eye pupil 38 and accommodation of possible error in the determination of the location, size and/or shape of the eye pupil 38 by the eye-tracking subsystem 42, so as to mitigate against a potential uneven vignetting by an edge of the eye pupil 38 that might otherwise result if the edge of the eye pupil 38 were to not be fully illuminated by an associated exit subpupil 32, for example, as might otherwise result from a misalignment between the eye pupil 38 and the Active Subpupil Region (ASR) 72 that could otherwise cause a spatial transition of the edge of the eye pupil 38 from an active subpupil 32 inside the Active Subpupil Region (ASR) 72 to an inactive subpupil 32 outside the Active Subpupil Region (ASR) 72 for example, as a result of relative motion between the eye pupil 38 and the Active Subpupil Region (ASR) 72. The location of the Active Subpupil Region (ASR) 72 is continuously updated responsive to the eye-tracking subsystem 42, at a rate of update sufficient to accommodate rotations of the eye 20 by the user 22 so that the exit subpupils 32 surrounding and within the eye pupil 38 are maintained in an active state. Referring to FIGS. 4 and 5, for the eye 22 of the user 22 rotated for viewing in the first gaze direction 34.1 as illustrated in FIG. 5, and as a result, a detection by the eye-tracking subsystem 42 of the eye pupil 38 being centered on the optical axis 36, the associated Active Subpupil Region (ASR) 72 determined by the subpupil modulation controller 50 is concentric both with the eye pupil 38 and with the optical axis 36, with a diameter sufficiently greater than that of the eye pupil 38 so that the eye pupil 38 will be fully illuminated by active exit subpupils 32, wherein, as illustrated in FIG. 4, the light-modulating pixels 60 and associated modulated subpupils 32' within the Active Subpupil Region (ASR) 72 are activated by the subpupil modulator 30, 30.1, and the remaining modulated subpupils 32' intersecting or outside of the boundary of the Active Subpupil Region (ASR) 72 are deactivated, resulting in the image 16 being presented to the eye 20 via only the activated exit subpupils 32 that are associated with the activated modulated subpupils 32', as illustrated in FIG. 5. Referring to FIGS. 6 and 7, for the eye 22 of the user 22 rotated up and to the left as illustrated in FIG. 7, and as a result, a detection by the eye-tracking subsystem 42 of an elliptically-shaped eye pupil 38 located up and to the left of the associated optical axis 36, in accordance with the first-aspect subpupil modulation scheme 70, 70.1, the associated Active Subpupil Region (ASR) 72 determined by the subpupil modulation controller 50 is centered about the offset eye pupil 38, but with the same diameter as illustrated in FIGS. 4 and 5, wherein, as illustrated in FIG. 6, the light-modulating pixels 60 and associated modulated subpupils 32' within the Active Subpupil Region (ASR) 72 are activated by the subpupil modulator 30, 30.1, and the remaining modulated subpupils 32' intersecting or outside of the boundary of the Active Subpupil Region (ASR) 72 are deactivated, resulting in the image 16 being presented to the eye 20 via only the activated exit subpupils 32 that are associated with the activated modulated subpupils 32' that are aligned with the eye pupil 38, as illustrated in FIG. 7. Accordingly, notwithstanding the resulting mitigation against uneven vignetting by the eye pupil 38, the first-aspect subpupil modulation scheme 70, 70.1 results in the illumination of a portion of the eye 20 surrounding the eye pupil 38 with extraneous light $16^{iv}$ that is then reflected or scattered by the front surface 20' of the eye 20 rather than being imaged onto the retina 24.

Figure 2:
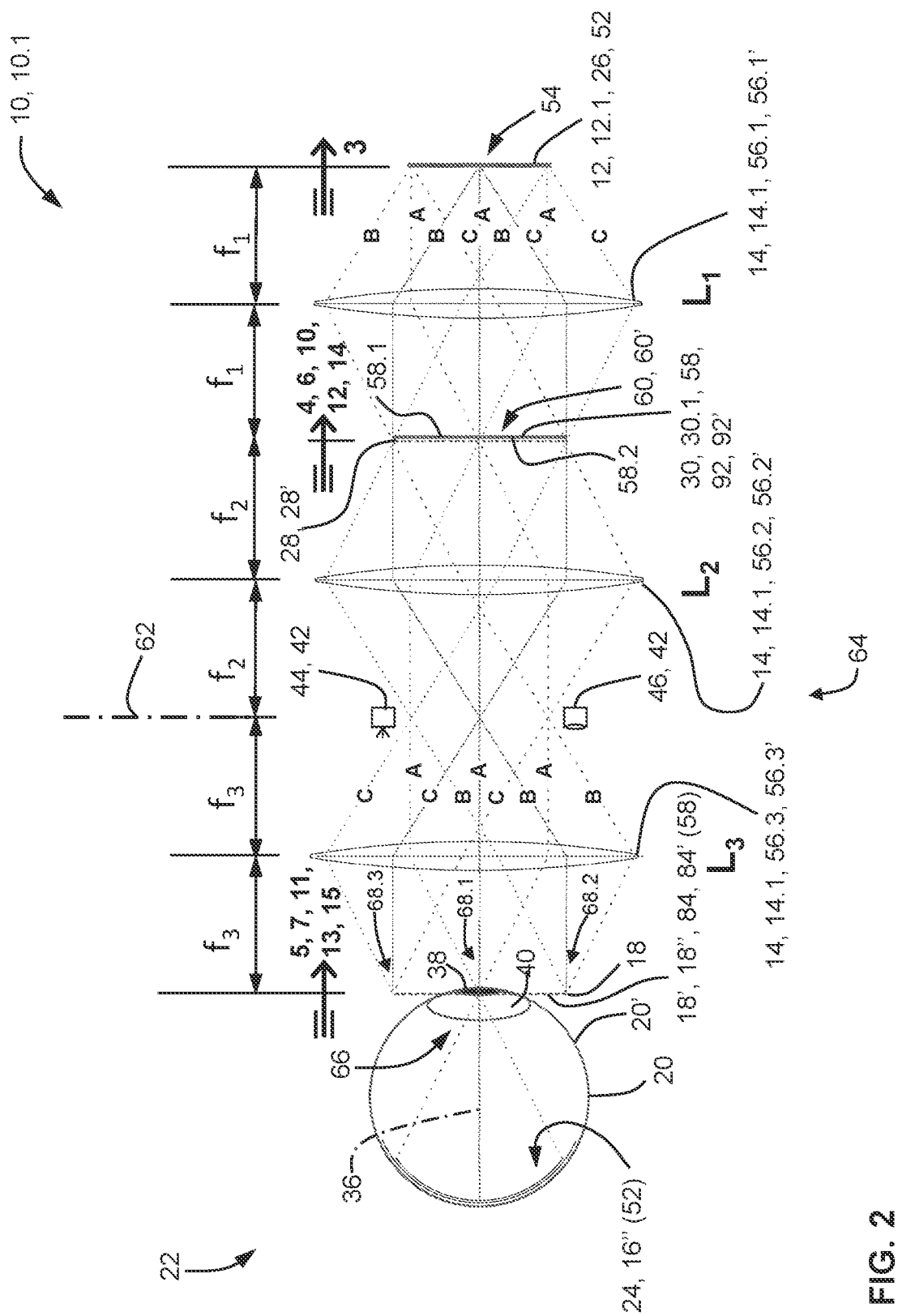
FIG. 2 illustrates a schematic diagram of the first aspect of the near-eye display system illustrated in FIG. 1, illustrating an embodiment of a first aspect of an associated optical subsystem incorporating a plurality of lenses, absent the associated processor and controller elements.
Figure 8:
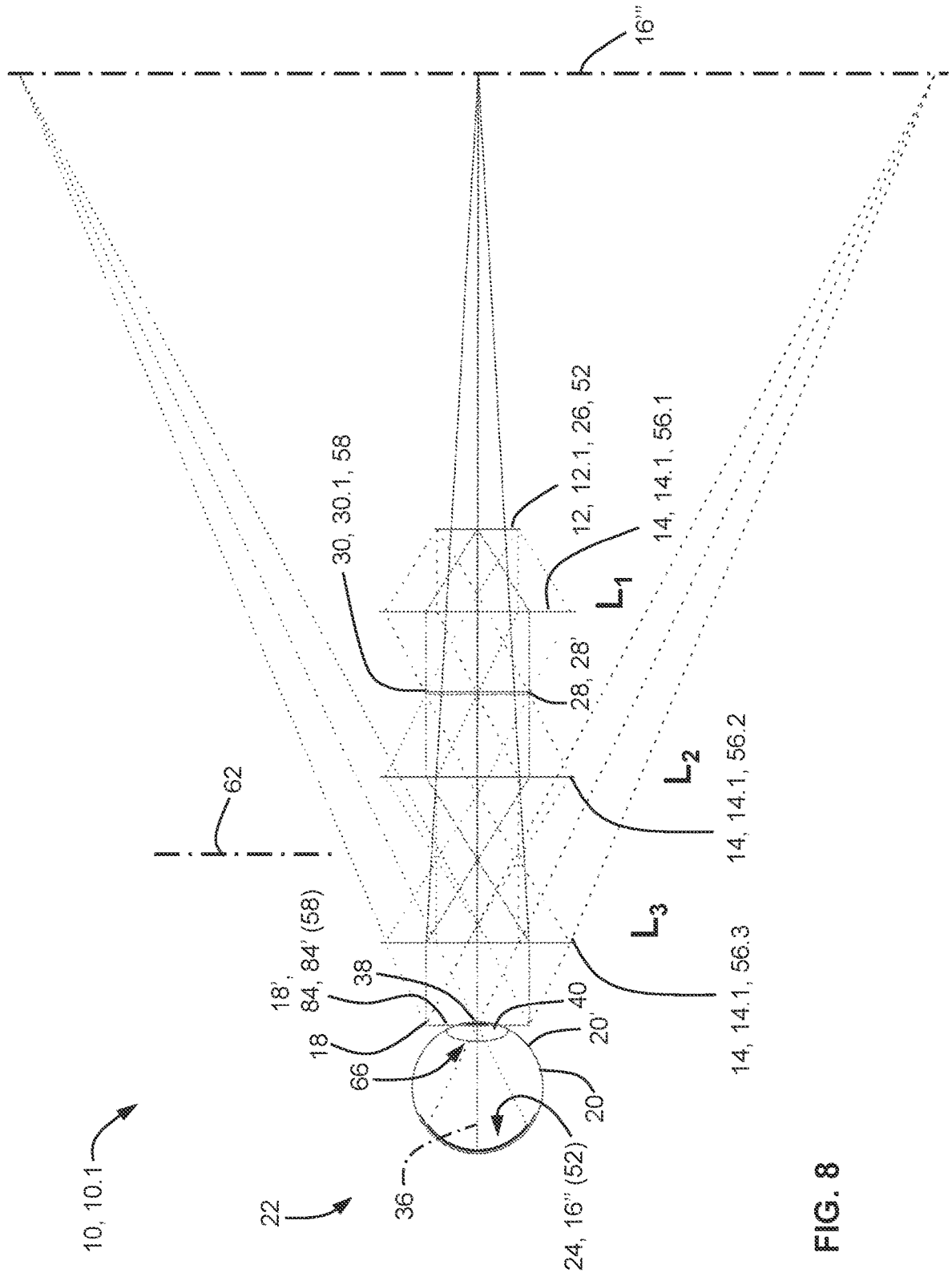
FIG. 8 illustrates angular magnification provided for by an embodiment of the first aspect of the near-eye display system illustrated in FIGS. 1 and 2.

With the first 56.1', $L_1$, second 56.2', $L_2$, and third 56.3', $L_3$ convergent magnifier lenses positioned as illustrated in FIG. 2, a virtual image of the flat-panel two-dimensional image-display array 52 by the first convergent magnifier lens 56.1', $L_1$ is located at infinity, which becomes the object of the second convergent magnifier lens 56.2', $L_2$, the image of which is then located at the rear focal plane 62 of the second convergent magnifier lens 56.2', $L_2$, which becomes the object of the third convergent magnifier lens 56.3', $L_3$, the virtual image $16'''$ of which is then located at infinity, which is projected onto the retina 24 of the eye 20 for perception thereof by the user 22. Referring to FIG. 8, the location of the third convergent magnifier lens 56.3', $L_3$ can be adjusted to provide for an angularly-magnified virtual image $16'''$ located at a comfortable viewing distance.

During operation of the first-aspect near-eye display system 10, 10.1, an electronic image signal 74 is output from an associated display controller 76 to the flat-panel two-dimensional image-display array 52 for generating the image 16 thereupon, the light 16' therefrom of which illuminates, and, as described hereinabove, is subsequently processed by, the associated subpupil modulator 30, 30.1, wherein the electronic image signal 74 is either based upon a signal 74' received via an associated wireless communication link 78, or is generated from a local image source 74", for example, either from a stored memory or from a camera.

Figure 9:
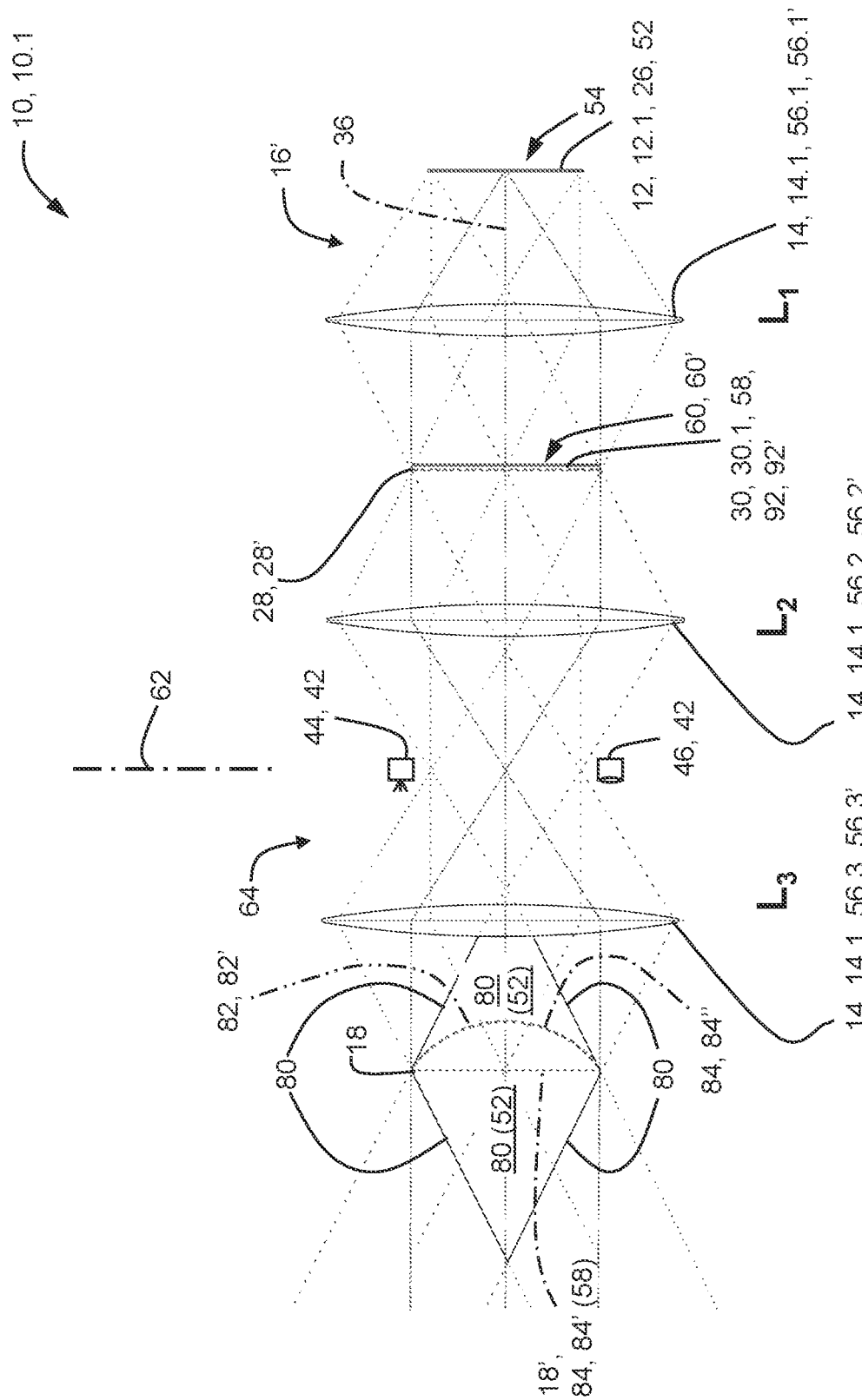
FIG. 9 illustrates a longitudinal cross section of an associated volumetric visual environment of the first aspect of the near-eye display system illustrated in FIGS. 1, 2 and 8, along the optical axis of the associated optical subsystem.

Referring to FIG. 9, the near-eye display system 10, 10.1 provides for a volumetric visual environment (VVE) 80 between the user 22 and the image generator 12 that is sufficiently large to enable the eye 20, when positioned at a comfortable distance from the image generator 12, to receive unvignetted light 16' from the entirety of the associated virtual image $16'''$ regardless of the gaze direction 34 of the eye 20 toward different points on that virtual image $16'''$, so as to provide for a relatively large angular field of view provided by the virtual image $16'''$ of the image generator 12, particularly in support of greater perceived immersion in that associated virtual environment. The full volumetric visual environment (VVE) 80—also referred to as the "eye box"—can be adequately represented by a geometric surface construct 82 within that volumetric visual environment (VVE) 80 as a result of the distance from the eye 20 to the image generator 12 being relatively fixed when the near-eye display system 10, 10.1 is attached to the user 22, wherein the exit subpupils 32—located on an associated subpupil surface 84 within the exit pupil 18—are located on, and constitute portions of, that geometric surface construct 82, with each exit subpupil 32 being formed as a real image of a corresponding modulated subpupil 32' formed by the subpupil modulator 30, 30.1.

In view of the volumetric visual environment (VVE) 80 providing for unvignetted viewing of the entire virtual image $16'''$, any location within the volumetric visual environment (VVE) 80, including therefore any location on the associated subpupil surface 84 within or of the volumetric visual environment (VVE) 80, and therefore any exit subpupil 32 itself, will pass rays of light 16' from the entirety of the associated image 16 of the associated image generator 12, 12.1. Accordingly, for each point on the image generator 12, and for each exit pupil 18, there is at least one optical ray that can be geometrically traced therebetween, and that would therefore also extend through each corresponding modulated subpupil 32', because each exit subpupil 32 is an image of a corresponding modulated subpupil 32'. Accordingly, each light-modulating pixel 60 associated with a corresponding modulated subpupil 32' represents a location in the optical subsystem 14, 14.1 for either receiving light 16' from the entirety of the image generator 12 or from which light propagating in reverse would flood the entirety of the image generator 12.

The unvignetted virtual image $16'''$ visible through any particular exit subpupil 32 is referred to herein as a component image 86, with all component images 86 perceived by the eye 20 at any given time—including those visually persisting—being referred to herein as the associated composite image 88. For example, in the special case when the eye 20 receives light 16' from only one exit subpupil 32, the associated composite image 88 will be given by the component image 86 as seen through that exit subpupil 32.

Each of the light-modulating pixels 60 of the flat-panel two-dimensional modulation array 58 is referred to herein generally as a modulation element 90, which is located on an associated modulation surface 92. Generally, the modulation of light 16' through a given modulation element 90 refers to any means of partially or fully restricting the intensity of the component image 86 as perceived by the eye 20 through the exit subpupil 32 corresponding to that modulation element 90 such as, for example, modulation or redirection of light 16' incident thereon, or, for example, in respect of the second through fourth aspects of the near-eye display system 10, 10.2, 10.3, 10.3, infra, modulation of light emanating from an associated modulation location. Any exit subpupil 32 for which the associated light throughput is most limited or restricted, i.e. for which the associated modulation element 90 is in an OFF state, is referred to herein as having been deactivated, to being in a state of deactivation, or to being deactivated, whereas any lesser restriction that provides for a subsequent increase in the intensity of the component image 86 through the associated exit subpupil 32 as perceived by the eye 20, up to and including the minimum level of restriction possible, is referred to herein as an "activation" of that exit subpupil 32, resulting in that exit subpupil 32 as having been activated, to being in a state of activation, or to being activated.

Whereas a real image 16" of the image generator 12, 12.1 is formed on the retina 24 of the eye 20, that real image 16" is perceived as a magnified virtual image 16''' generally appearing some comfortable distance from the user to minimize eye strain. As illustrated in FIG. 8, the optical rays passing through the volumetric visual environment (VVE) 80 toward the eye 20 can be geometrically traced backwards without regard to the optical subsystem 14, 14.1 to locate the apparent location of the virtual image 16'''.

The volumetric visual environment (VVE) 80 is the entire volume for which light 16' from the entire image 16 passes through at any location therewithin, with the exit pupil 18 of the optical subsystem 14, 14.1 being one possible associated aperture thereof, albeit the largest possible such aperture. Accordingly, if the eye pupil 38 is located anywhere within that volumetric visual environment (VVE) 80, then the user 22 will be able to see the entire image 16. The near-eye display system 10 has an exit pupil 18 which, by definition, represents an image of the aperture stop 28, beyond which light is restricted.

Figure 11:
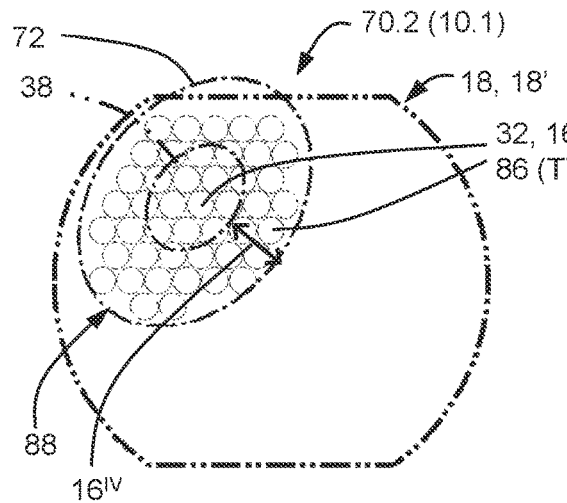
FIG. 11 illustrates a plan view of an exit pupil and associated active exit subpupils associated with the aperture stop and two-dimensional modulation array of the first-aspect near-eye display system illustrated in FIGS. 1, 2, 8 and 9, for the active subpupil region (ASR) illustrated in FIG. 10.
Figure 10:
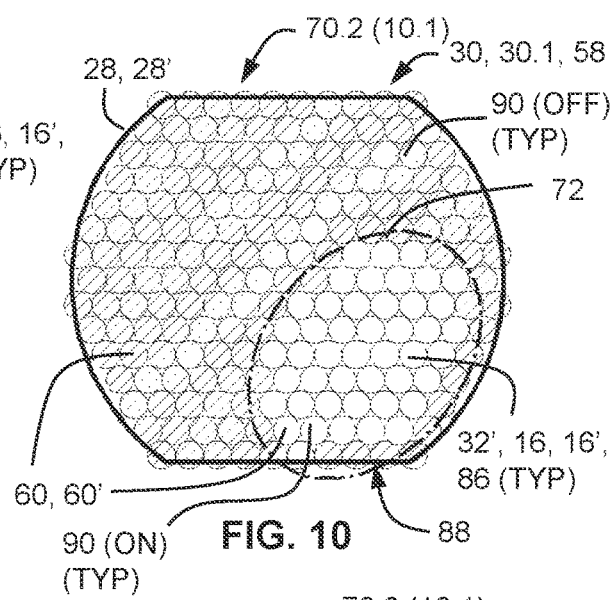
FIG. 10 illustrates a plan view of the aperture stop and two-dimensional modulation array of the first-aspect near-eye display system illustrated in FIGS. 1, 2, 8 and 9, with the two-dimensional modulation array controlled so as to provide for a second aspect of an associated active subpupil region (ASR) in cooperation with an eye pupil of the user being rotated upwards and to the left relative to the optical axis of the associated optical subsystem.

Referring to FIGS. 10 and 11, in accordance with a second aspect 70.2 of a subpupil modulation scheme 70, 70.2, the Active Subpupil Region (ASR) 72 is set to a variable size and shape that is adapted to be sufficiently large so as to surround the eye pupil 38 regardless of the orientation of the eye 20, and regardless of the associated state of the iris 40, which—the same as for the first-aspect subpupil modulation scheme 70, 70.1, but accompanied by a lesser amount of extraneous light 16$^{iv}$—also provides for mitigating against a potential uneven vignetting by an edge of the eye pupil 38 that might otherwise result if the edge of the eye pupil 38 were to not be fully illuminated by an associated set of active exit subpupils 32. The location, size and shape of the Active Subpupil Region (ASR) 72 is continuously updated responsive to the eye-tracking subsystem 42, at a rate of update sufficient to accommodate rotations of the eye 20 by the user 22, so that the exit subpupils 32 within and surrounding the eye pupil 38 are maintained in an active state. Similar to that illustrated in FIGS. 4 and 5, if the eye 22 of the user 22 is rotated for viewing in the first gaze direction 34.1 as illustrated in FIG. 5, the resulting associated Active Subpupil Region (ASR) 72 as determined by the subpupil modulation controller 50 is also concentric both with the eye pupil 38 and with the optical axis 36, but with a relatively smaller diameter—relative to that associated with the first-aspect subpupil modulation scheme 70, 70.1—that is sufficiently large to account for possible error in the determination of the location, size and/or shape of the eye pupil 38 by the eye-tracking subsystem 42. Referring again to FIGS. 10 and 11, for the eye 22 of the user 22 rotated up and to the left as illustrated in FIG. 11, and as a result, a detection by the eye-tracking subsystem 42 of an elliptically-shaped eye pupil 38 located up and to the left of the associated optical axis 36, in accordance with the second-aspect subpupil modulation scheme 70, 70.2, the associated Active Subpupil Region (ASR) 72 as determined by the subpupil modulation controller 50 is centered about the offset eye pupil 38, but elliptically shaped, similar that of the eye pupil 38, wherein, as illustrated in FIG. 10, the light-modulating pixels 60 and associated modulated subpupils 32' within the Active Subpupil Region (ASR) 72 are activated by the subpupil modulator 30, 30.1, and the remaining modulated subpupils 32' intersecting or outside of the boundary of the Active Subpupil Region (ASR) 72 are deactivated, resulting in the image 16 being presented to the eye 20 via only the activated exit subpupils 32 that are associated with the activated modulated subpupils 32' that are aligned with the eye pupil 38 of the near-eye display system 10 and within the Active Subpupil Region (ASR) 72, as illustrated in FIG. 11. Accordingly, as a result of the Active Subpupil Region (ASR) 72 being dynamically sized and shaped responsive to the size and shape of the eye pupil 38 as determined by the eye-tracking subsystem 42, the size and shape of the Active Subpupil Region (ASR) 72 can more closely match that of the eye pupil 38 while still mitigating against uneven vignetting by the edge of the eye pupil 38, which—in comparison with the first-aspect subpupil modulation scheme 70, 70.1—results in a relatively lesser amount of illumination of the portion of the eye 20 surrounding the eye pupil 38, and a corresponding relatively lesser amount of extraneous light 16$^{iv}$ that is then reflected or scattered by the front surface 20' of the eye 20 rather than being imaged onto the retina 24.

In accordance with a third aspect 70.3 of a subpupil modulation scheme 70, 70.3, rather than making the Active Subpupil Region (ASR) 72 so large as to avoid a spatial transition of the edge of the eye pupil 38 from an active to an inactive exit subpupil 32, instead the Active Subpupil Region (ASR) 72 is constrained to a size that is smaller than that of the eye pupil 38, and aligned with the center of the eye pupil 38 so as to prevent vignetting that could otherwise result with the presence of such a spatial transition. Accordingly, the third-aspect subpupil modulation scheme 70, 70.3 substantially eliminates an illumination of the portion of the eye 20 surrounding the eye pupil 38 with extraneous light 16$^{iv}$ that would otherwise be reflected or scattered by the front surface 20' of the eye 20 rather than being imaged onto the retina 24. Furthermore, a relatively smaller Active Subpupil Region (ASR) 72 provides for improving the perceived quality of the image 16 by decreasing the effective aperture size through which the light 16' passes into the eye 20, thereby decreasing the impact of aperture-size-related optical aberrations, which increases the clarity of the image 16, which is particularly effective in a near-eye display system 10, 10.1 that provides for a large field-of-view together with relatively high magnification. Taken to the extreme—and similar to a pinhole camera—the smallest Active Subpupil Region (ASR) 72 would comprise a single exit subpupil 32 corresponding to a corresponding single modulation element 90 that is continuously identified to best align with the center of the eye pupil 38.

Figure 13:
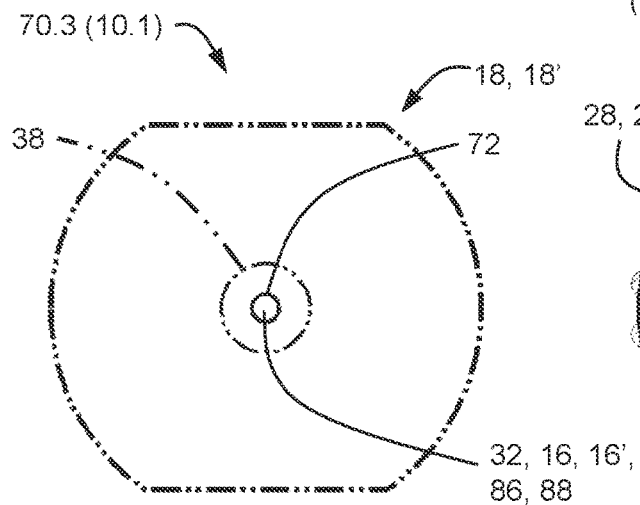
FIG. 13 illustrates a plan view of an exit pupil and associated active exit subpupil associated with the aperture stop and two-dimensional modulation array of the first-aspect near-eye display system illustrated in FIGS. 1, 2, 8 and 9, for the active subpupil region (ASR) illustrated in FIG. 12.
Figure 12:
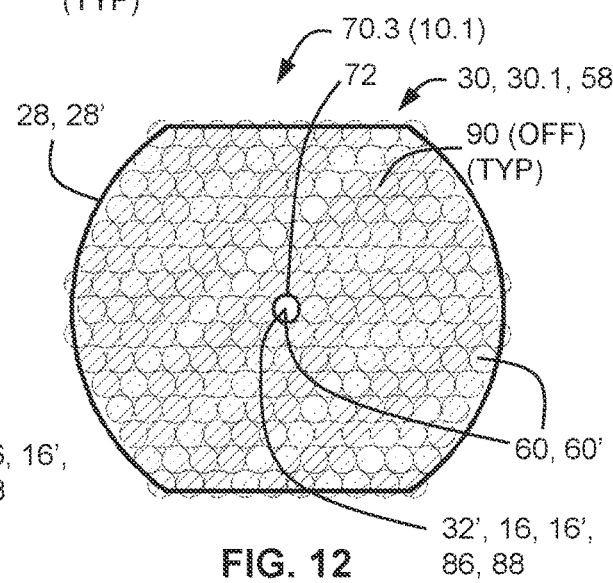
FIG. 12 illustrates a plan view of the aperture stop and two-dimensional modulation array of the first-aspect near-eye display system illustrated in FIGS. 1, 2, 8 and 9, with the two-dimensional modulation array controlled so as to provide for a third aspect of an associated active subpupil region (ASR) in cooperation with an eye pupil of the user being centered on the optical axis of the associated optical subsystem.
Figure 15:
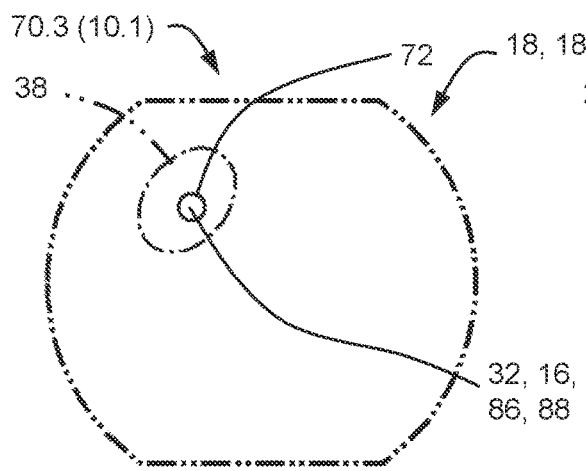
FIG. 15 illustrates a plan view of an exit pupil and associated active exit subpupil associated with the aperture stop and two-dimensional modulation array of the first-aspect near-eye display system illustrated in FIGS. 1, 2 and 9, for the active subpupil region (ASR) illustrated in FIG. 14.
Figure 14:
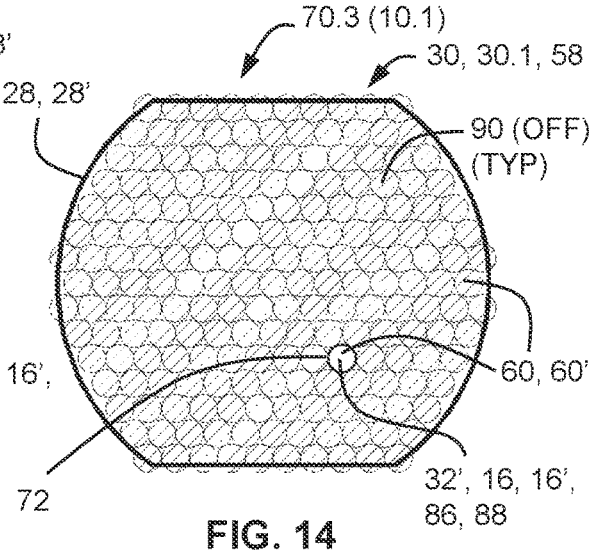
FIG. 14 illustrates a plan view of the aperture stop and two-dimensional modulation array of the first-aspect near-eye display system illustrated in FIGS. 1, 2, 8 and 9, with the two-dimensional modulation array controlled so as to provide for the third aspect of an associated active subpupil region (ASR) in cooperation with an eye pupil of the user being rotated upwards and to the left relative to the optical axis of the associated optical subsystem.

For example, referring to FIGS. 12 through 15, based upon an estimate from the eye-tracking subsystem 42 of the location of the center of the eye pupil 38, the subpupil modulation controller 50 identifies and activates the modulated subpupil 32'—i.e. the associated light-modulating pixel 60—of an associated Active Subpupil Region (ASR) 72, associated with the exit subpupil 32 that is most-closely aligned with the eye pupil 38, and deactivates the remaining modulated subpupils 32'/light-modulating pixels 60 of the subpupil modulator 30, 30.1/flat-panel two-dimensional modulation array 58. The location of the Active Subpupil Region (ASR) 72 is continuously updated responsive to the eye-tracking subsystem 42, at a rate of update sufficient to accommodate rotations of the eye 20 by the user 22 so that only the one or more exit subpupils 32 having corresponding one or more projected transverse locations within transverse projection of the eye pupil 38 are maintained in an active state. Referring to FIGS. 12 and 13, for the eye 22 of the user 22 rotated for viewing in the first gaze direction 34.1 as illustrated in FIG. 13, and as a result, a detection by the eye-tracking subsystem 42 of the eye pupil 38 being centered on the optical axis 36, the associated Active Subpupil Region (ASR) 72 determined by the subpupil modulation controller 50 is concentric both with the eye pupil 38 and with the optical axis 36, and, in one set of embodiments, limited in size so as to encompass a corresponding single exit subpupil 32, wherein, as illustrated in FIG. 12, the light-modulating pixel 60 and associated modulated subpupil 32' within the Active Subpupil Region (ASR) 72 is activated by the subpupil modulator 30, 30.1, and the remaining modulated subpupils 32' outside the boundary of the Active Subpupil Region (ASR) 72 are deactivated, resulting in the image 16 being presented to the eye 20 via only the activated exit subpupil 32 associated with the activated modulated subpupil 32', as illustrated in FIG. 13. Referring to FIGS. 14 and 15, for the eye 22 of the user 22 rotated up and to the left as illustrated in FIG. 15, and as a result, a detection by the eye-tracking subsystem 42 of an elliptically-shaped eye pupil 38 located up and to the left of the associated optical axis 36, in accordance with the third-aspect subpupil modulation scheme 70, 70.3, the associated Active Subpupil Region (ASR) 72 determined by the subpupil modulation controller 50 is located—for example, centered—within the offset eye pupil 38, wherein, as illustrated in FIG. 14, the light-modulating pixel 60 and associated modulated subpupil 32' within the Active Subpupil Region (ASR) 72 is activated by the subpupil modulator 30, 30.1, and the remaining modulated subpupils 32' outside the boundary of the Active Subpupil Region (ASR) 72 are deactivated, resulting in the image 16 being presented to the eye 20 via only the activated exit subpupil 32 associated with the activated modulated subpupil 32', as illustrated in FIG. 15.

A number of practical considerations may impose a lower limit to the size of the Active Subpupil Region (ASR) 72 used in the third-aspect subpupil modulation scheme 70, 70.3. First, if the associated modulation surface 92 incorporates an array of relatively-small modulation elements 90, then there can be an increased complexity in the electronic manufacturing and addressing of the correspondingly large number of such elements corresponding to the exit subpupils 32 of the entire subpupil surface 84. Second, a relatively smaller modulation element 90 such as a light-modulating pixel 60—or a light-source element, infra,—contained in array may be interleaved with relatively large gaps therebetween that provide for supporting electronic components and circuitry through which no light is generated or passes, leading to discontinuities in the associated subpupil surface 84 that is otherwise ideally associated with a relatively more continuous volumetric visual environment (VVE) 80. Third, there is a practical limit to how much light 16' a single modulation element 90 can either pass—or generate, infra,—per unit area of that modulation element 90, which under some circumstances could potentially otherwise limit the perceived intensity of the image 16 from that single modulation element 90 to a level less than desirable. Fourth, in respect of the fourth aspect of the near-eye display system 10.4, infra, there are practical limits to both the minimal size and minimal light per unit area that can be generated by an associated light-source spot provided by a modulated light beam. Finally, the effects of diffraction and scattering associated with relatively-small modulation elements 90 may act to increase the effective size of the Active Subpupil Region (ASR) 72.

Notwithstanding these practical considerations, an Active Subpupil Region (ASR) 72 smaller than the eye pupil 38 can provide for improved image quality in a near-eye display system 10 with a relatively-large field of view and a relatively-high magnification, the latter of which can provide for utilizing a relatively-smaller image generator 12, 12.1, relative to that provided for by the use of a relatively-larger Active Subpupil Region (ASR) 72. Even if the Active Subpupil Region (ASR) 72 were to not be maintained entirely within the eye pupil 38 during momentary situations such as rapid eye rotation, manual user adjustments or bumping the near-eye display system 10, the resultant image 16 will simply show some level of vignetting during those situations before returning to an unvignetted mode of operation after settling to a more stable environment.

If the size of the Active Subpupil Region (ASR) 72 is smaller than the minimal size of the eye pupil 38, then the iris 40 of the eye 20 will be ineffectual in its normal biological function of modifying image intensity changes through a biological change in the diameter of the eye pupil 38. This functionality can be replaced by adjusting overall transmission through the Active Subpupil Region (ASR) 72 responsive to a restriction of the modulation range of all active modulation elements 90 by the subpupil modulation controller 50 in accordance with the overall brightness of the image content as indicated by polling either samples, or the entirety, of the pixel intensity values of the associated electronic image being displayed. For example, this modulation range can be based upon a model of the biological pupillary response to light, for example, based upon experimentally measuring the size of the eye pupil 38 in response to the amount of light to which the eye 20 is exposed. Furthermore, the third-aspect subpupil modulation scheme 70, 70.3 can further provide for a calibration mode by which the eye pupil 38 is flooded with light—for example, in cooperation with an Active Subpupil Region (ASR) 72 that exceeds the size of the eye pupil 38—for example, as provided for by either the first 70.1 or second 70.2 subpupil modulation schemes 70, supra,—and utilizing measurements from the eye-tracking subsystem 42 of the size of the eye pupil 38 for various test images with various levels of brightness of the associated illumination, and then limiting the maximum brightness of the light 16' of the image 16 to a level that resulted in the smallest diameter eye pupil 38 during the calibration mode, so as to provide for each user 22 a brightness response that is customized to their particular physiology.

Figure 31:
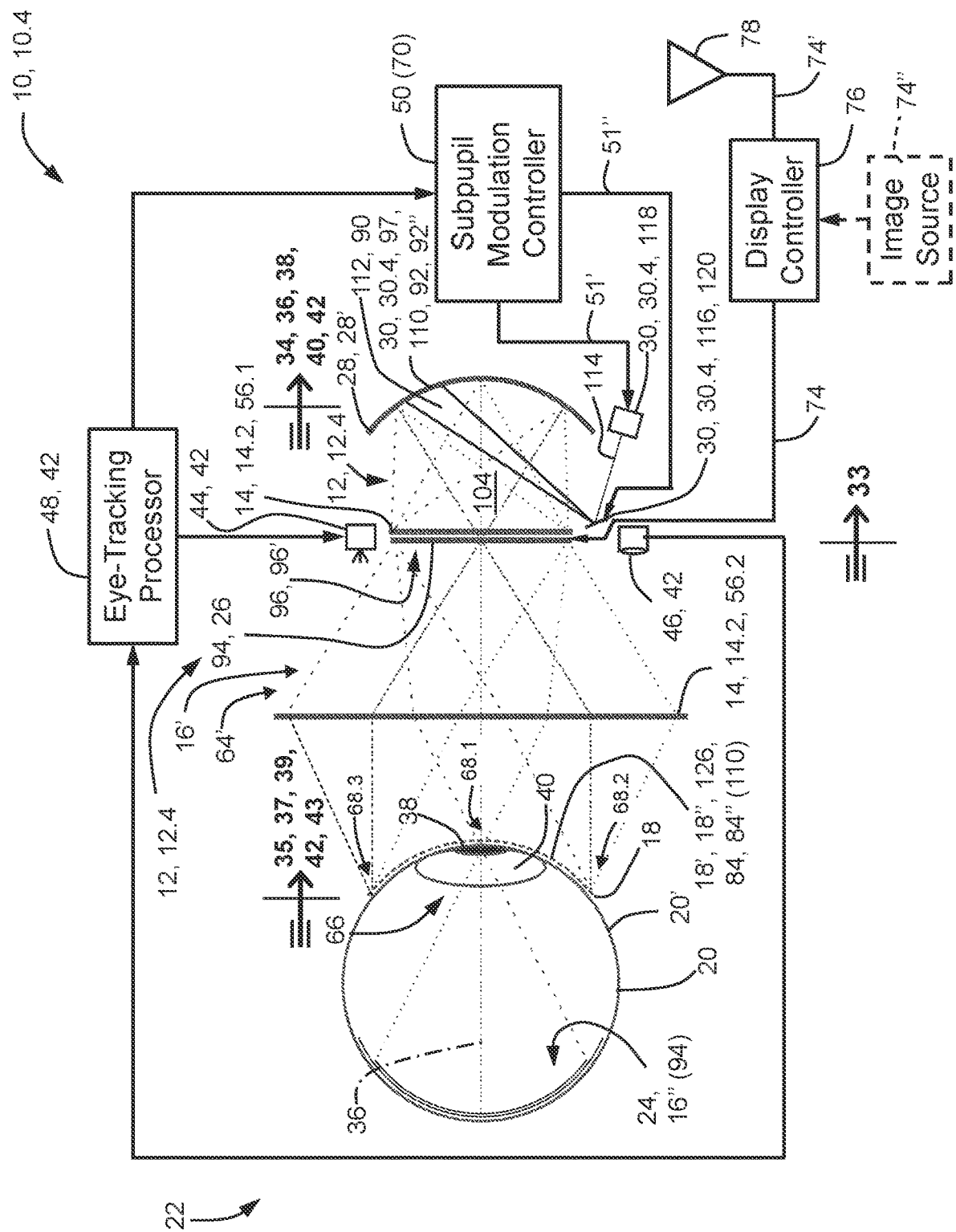
FIG. 31 illustrates a schematic block diagram of a fourth aspect of a near-eye display system incorporating a scanned beam of light in cooperation with a curved light-redirecting surface that together define an associated modulated subpupil of the fourth-aspect near-eye display system, in cooperation with a separate flat-panel array of light-modulating image-display pixels.
Figure 32:
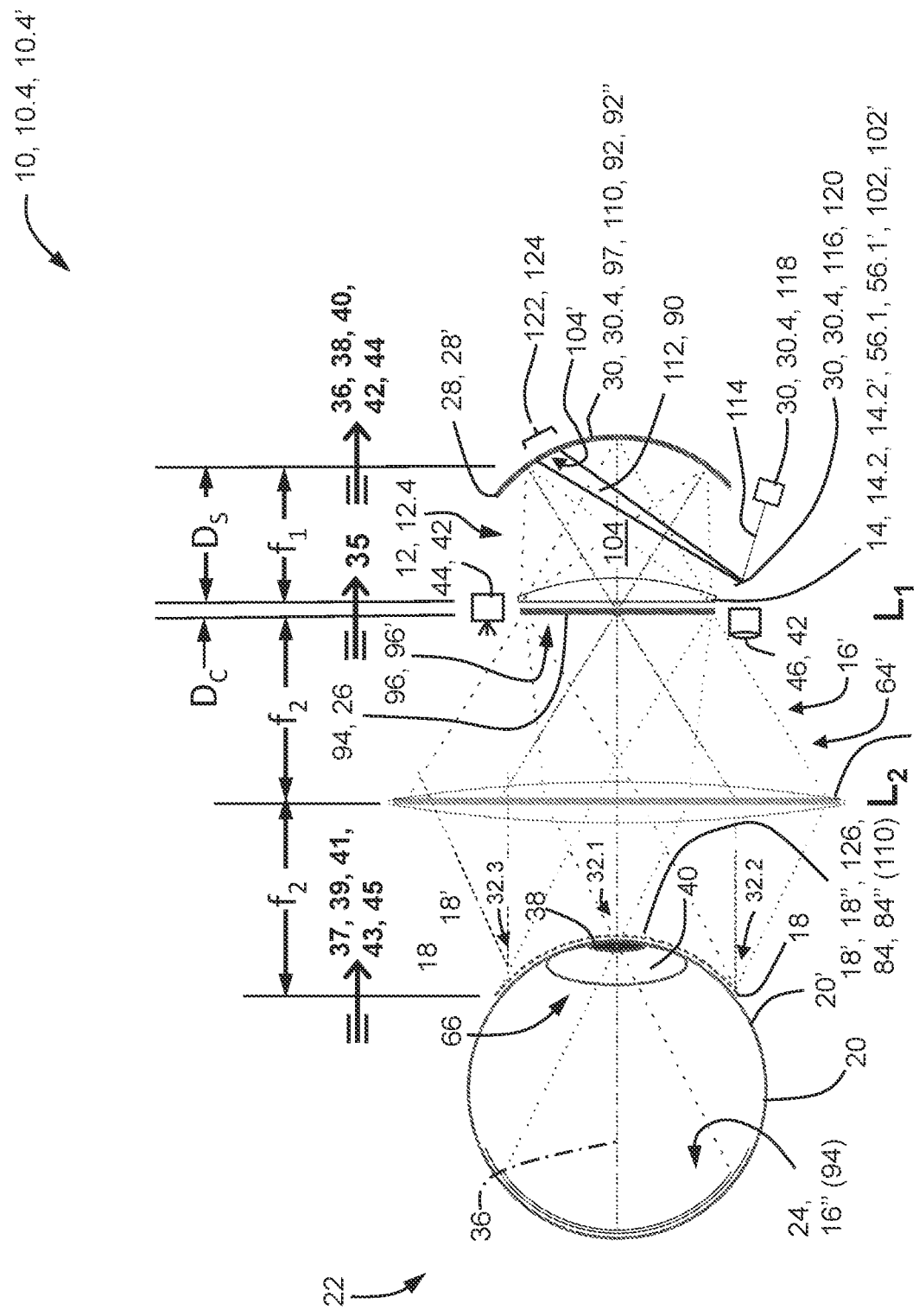
FIG. 32 illustrates a schematic diagram of a portion of a first embodiment of the fourth aspect of the near-eye display system illustrated in FIG. 31, illustrating the first embodiment of the second aspect of an associated optical subsystem incorporating a plurality of lenses, absent the associated processor and controller elements.
Figure 33:
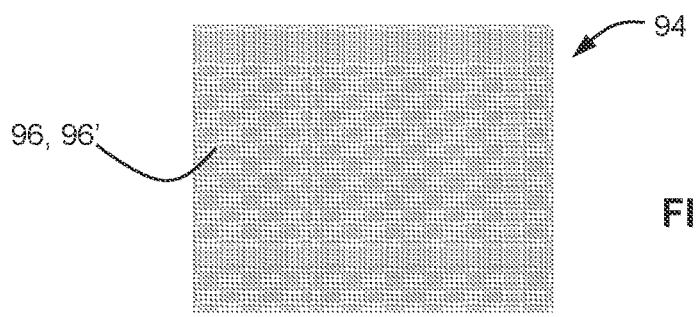
FIG. 33 illustrates a plan view of the flat-panel two-dimensional image-display array of light-modulating image-display pixels of the fourth aspect of the near-eye display system illustrated in FIGS. 31 and 32.

Referring to FIGS. 16-19, 31, and 32, in accordance with second 10.2, third 10.3 and fourth 10.4 aspects of a near-eye display system 10, 10.2, 10.3, 10.4, an associated second-aspect image generator 12, 12.2 comprises a flat-panel two-dimensional image-display modulation array 94 of light-modulating image-display pixels 96—for example, liquid-crystal light-modulating image-display pixels 96', for example, as illustrated in FIGS. 20 and 33—in cooperation with a controllable light source 97 that provides for illuminating the entirety of the flat-panel two-dimensional image-display modulation array 94 from a controllable location, the latter of which provides for defining the associated modulated subpupil 32'.

Referring to FIGS. 16, 17 and 20-30, in accordance with the second aspect 10.2 of the near-eye display system 10, 10.2, and an associated first embodiment 10.2' thereof, the controllable light source 97 is provided for by a flat-panel two-dimensional light-source array 98 of associated light-source elements 100—for example, light-emitting-diode elements 100', or fiber-optic illuminator elements 100",—with a conditioner lens 102, $L_1$ interposed between a first side 94.1 of the flat-panel two-dimensional image-display modulation array 94 and the flat-panel two-dimensional light-source array 98, for example, a plano-convex conditioner lens 102', $L_1$, with the planar surface 102.1' thereof abutting the first side 94.1 of the flat-panel two-dimensional image-display modulation array 94 and located one focal length $f_1$ from the flat-panel two-dimensional light-source array 98. The second-aspect near-eye display system 10, 10.2 incorporates an associated second-aspect optical subsystem 14, 14.2 comprising the conditioner lens 102, 102', $L_1$ in combination with a second dioptric-power optical element 56, 56.2, 56.2', $L_2$, for example, in accordance with a first embodiment of the second-aspect optical subsystem 14, 14.2, 14.2', a second convergent magnifier lens 56.2', $L_2$, each of which shares a common optical axis 36.

Further in accordance with the second-aspect near-eye display system 10, 10.2, 10.2', the flat-panel two-dimensional light-source array 98 constitutes an associated second-aspect subpupil modulator 30, 30.2, wherein each associated light-source element 100, 100', 100" constitutes the associated modulation element 90 of the second-aspect near-eye display system 10, 10.2, 10.2' so as to provide for controlling an associated modulated subpupil 32'. Each light-source element 100, 100', 100" of the flat-panel two-dimensional light-source array 98 illuminates the entirety of the flat-panel two-dimensional image-display modulation array 94 from a particular direction, and along a corresponding angle, associated with the location of that light-source element 100, 100', 100" within the flat-panel two-dimensional light-source array 98. Accordingly, with the flat-panel two-dimensional light-source array 98 located one focal length $f_1$ from the flat-panel two-dimensional image-display modulation array 94, the light 104 generated by each light-source element 100, 100', 100", and subsequently intensity-modulated by the flat-panel two-dimensional image-display modulation array 94, is transformed into a corresponding beam 64 of light 16' propagating at a corresponding angle relative to the optical axis 36.

During operation of the second-aspect near-eye display system 10, 10.2, 10.2', an electronic image signal 74 is output from an associated display controller 76 to the flat-panel two-dimensional image-display modulation array 94 that in turn modulates the light 104 from the flat-panel two-dimensional light-source array 98 so as to provide for generating the image 16 therefrom, the light 16' thereof of which propagates as one or more beams 64 of light 16', each of which is associated with a corresponding activated light-source element 100, 100', 100"—if activated—propagating at a corresponding angle relative to the optical axis 36, wherein the electronic image signal 74 is either based upon a signal 74' received via an associated wireless communication link 78, or is generated from a local image source 74", for example, either from a stored memory or from a camera.

The second dioptric-power optical element 56, 56.2, 56.2', $L_2$ in cooperation with the conditioner lens 102, 102', $L_1$ provide for forming an image of both the subpupil modulator 30, 30.2/flat-panel two-dimensional light-source array 98 and the associated aperture stop 28, at the exit pupil 18 located proximate to the front surface 20' of the eye 20 and associated with a corresponding planar subpupil surface 84. For example, referring to FIGS. 16 and 17, in accordance with one set of embodiments, the second convergent magnifier lens 56.2', $L_2$ is located one focal length $f_2$ from the image generator 12, 12.2/flat-panel two-dimensional image-display modulation array 94—i.e. from the second side 94.2 of the flat-panel two-dimensional display-modulation array 94—and provides for transforming each beam 64 of light 16'—propagating at a corresponding angle relative to the optical axis 36—to a corresponding exit subpupil 32, associated with the corresponding light-source element 100, 100', 100" of the flat-panel two-dimensional light-source array 98, acting in cooperation with the entirety of the flat-panel two-dimensional image-display modulation array 94, as the corresponding associated modulated subpupil 32'. Furthermore, the second convergent magnifier lens 56.2', $L_2$, in combination with the lens 66 of the eye 20, provide for forming the real image 16" of the image generator 12, 12.2/flat-panel two-dimensional image-display modulation array 94 on the retina 24 of the eye 20, wherein the second convergent magnifier lens 56.2', $L_2$ provides for adjusting focus and for adjusting the apparent distance of the virtual image 16''' associated with the real image 16" that is formed on the retina 24 of the eye 22.

For example, light 104 from an active—if activated—first light-source element 100.1 at a central location of the flat-panel two-dimensional light-source array 98 illuminates the entirety of the flat-panel two-dimensional image-display modulation array 94 and, in cooperation with transformation by the conditioner lens 102, 102', $L_1$, is transformed to a corresponding first beam 64.1 of light 16.1', and then be focused by the second convergent magnifier lens 56.2', $L_2$ to form the corresponding first exit subpupil 32.1 at a corresponding first location 68.1 at the exit pupil 18, wherein the control state of the first light-source element 100.1 is controlled by the subpupil modulation controller 50 responsive to whether the location of the eye pupil 38—as determined by the eye-tracking subsystem 42—is either aligned with, or sufficiently close to, infra, the first exit subpupil 32.1, wherein the control state (i.e. ON or OFF) of the first light-source element 100.1 controls whether or not light 104 from the first light-source element 100.1 can illuminate the corresponding first exit subpupil 32.1. If the eye pupil 38 is either aligned with, or sufficiently close to, infra, the first exit subpupil 32.1, then the first light-source element 100.1 is activated by the subpupil modulation controller 50 so as to cause the entirety of the image 16 from the perspective of the first exit subpupil 32.1 to be presented to the eye 20 by the second-aspect near-eye display system 10, 10.2, 10.2'. Otherwise, if the eye pupil 38 is not either aligned with, nor sufficiently close to, infra, the first exit subpupil 32.1, then the first light-source element 100.1 is deactivated so that the first exit subpupil 32.1 is void of light 16.1'.

Furthermore, light 104 from an active—if activated—second light-source element 100.2 at a first relatively offset location of the flat-panel two-dimensional light-source array 98 illuminates the entirety of the flat-panel two-dimensional image-display modulation array 94 and, in cooperation with transformation by the conditioner lens 102, 102', $L_1$, is transformed to a corresponding second beam 64.2 of light 16.2', and then be focused by the second convergent magnifier lens 56.2', $L_2$ to form the corresponding second exit subpupil 32.2 at a corresponding second location 68.2 at the exit pupil 18, wherein the control state of the second light-source element 100.2 is controlled by the subpupil modulation controller 50 responsive to whether the location of the eye pupil 38—as determined by the eye-tracking subsystem 42—is either aligned with, or sufficiently close to, infra, the second exit subpupil 32.2, wherein the control state (i.e. ON or OFF) of the second light-source element 100.2 controls whether or not light 104 from the second light-source element 100.2 can illuminate the corresponding second exit subpupil 32.2. If the eye pupil 38 is either aligned with, or sufficiently close to, infra, the second exit subpupil 32.2, then the second light-source element 100.2 is activated by the subpupil modulation controller 50 so as to cause the entirety of the image 16 from the perspective of the second exit subpupil 32.2 to be presented to the eye 20 by the second-aspect near-eye display system 10, 10.2, 10.2'. Otherwise, if the eye pupil 38 is not either aligned with, nor sufficiently close to, infra, the second exit subpupil 32.2, then the second light-source element 100.2 is deactivated so that the second exit subpupil 32.2 is void of light 16.2'.

Yet further, light 104 from an active—if activated—third light-source element 100.3 at a second relatively offset location of the flat-panel two-dimensional light-source array 98 illuminates the entirety of the flat-panel two-dimensional image-display modulation array 94 and, in cooperation with transformation by the conditioner lens 102, 102', $L_1$, is transformed to a corresponding third beam 64.3 of light 16.3', and then be focused by the second convergent magnifier lens 56.2', $L_2$ to form the corresponding third exit subpupil 32.3 at a corresponding third location 68.3 at the exit pupil 18, wherein the control state of the third light-source element 100.3 is controlled by the subpupil modulation controller 50 responsive to whether the location of the eye pupil 38—as determined by the eye-tracking subsystem 42—is either aligned with, or sufficiently close to, infra, the third exit subpupil 32.3, wherein the control state (i.e. ON or OFF) of the third light-source element 100.3 controls whether or not light 104 from the third light-source element 100.3 can illuminate the corresponding third exit subpupil 32.3. If the eye pupil 38 is either aligned with, or sufficiently close to, infra, the third exit subpupil 32.3, then the third light-source element 100.3 is activated by the subpupil modulation controller 50 so as to cause the entirety of the image 16 from the perspective of the third exit subpupil 32.3 to be presented to the eye 20 by the second-aspect near-eye display system 10, 10.2, 10.2'. Otherwise, if the eye pupil 38 is not either aligned with, nor sufficiently close to, infra, the third exit subpupil 32.3, then the third light-source element 100.3 is deactivated so that the third exit subpupil 32.3 is void of light 16.3'.

Referring again to FIG. 9, if the modulation surface 92 of the near-eye display system 10, 10.1, 10.2, 10.2' is implemented as a flat structure at the aperture stop 28 of the associated optical subsystem 14, 14.1, 14.2, then the surface underlying the associated exit pupil 18 formed as the image of the associated planar modulation surface 92, 92' will also be flat, i.e. a planar subpupil surface 84, 84', for example, as illustrated in FIG. 9 by the vertical dashed line bounded by the exit pupil 18. However, the image of any modulation surface 92 that is formed by the associated optical subsystem 14 within the associated volumetric visual environment (VVE) 80 can also serve to modulate light 16' through the image of that modulation surface 92. Accordingly, and alternatively, referring also to FIGS. 18 and 19, a concave-curved subpupil surface 84, 84'' may be formed as the image of a corresponding curved modulation surface 92, 92'''—for example, with the latter formed as a curved two-dimensional light-source array 106 of light-source elements 100 on, or associated with, an underlying concave-curved surface 107—wherein the curvature of the curved modulation surface 92, 92'' may be configured so that the resulting concave-curved subpupil surface 84, 84'' substantially conforms to the curvature of the front surface 20' of the eye 20, thereby providing for the axial distance from the eye pupil 38 to the associated concave-curved subpupil surface 84, 84'' to be substantially invariant with respect to rotation of the eye 20, so as to provide for visibility of exit subpupils 32 in their entirety without vignetting regardless of the rotation of the eye 20. Accordingly, positioning the exit subpupil 32 sufficiently close to the eye pupil 38 provides for all rays forming the component image 86 through that exit subpupil 32 to pass through the eye pupil 38 without vignetting. Otherwise, as the axial distance between the eye pupil 38 and a given exit subpupil 32 increases, the periphery of the component image 86 through that exit subpupil 32 is susceptible to eventually becoming increasingly vignetted by the edge of the eye pupil 38.

Referring again to FIG. 9, in accordance with the first- and second-aspect near-eye display system 10, 10.1, 10.2, 10.2', for a range of rotations of the eye 20, the eye pupil 38 traces a concave geometric surface construct 82, 82', so that for either a flat-panel two-dimensional modulation array 58 of light-modulating pixels 60, or a flat-panel two-dimensional light-source array 98 of light-source elements 100, respectively,—wherein the flat nature thereof is compatible with typical electronic device manufacturing approaches,—that provide for associated planar subpupil surfaces 84, 84' of the associated exit subpupils 32, the distance between the associated exit subpupil 32 and the eye pupil 38 will change as the eye 20 rotates, thereby increasing the prospect of vignetting of the associated component images 86 as that distance increases, wherein the concavity of the concave geometric surface construct 82, 82' is from the point of view, and with respect to, the associated eye 20 of the user 22.

Referring to FIGS. 18-30, the third aspect 10.3 of the near-eye display system 10, 10.3, and an associated first embodiment 10.3' thereof, is substantially the same as the second-aspect near-eye display system 10, 10.2, 10.2', supra, except that an associated third-aspect image generator 12, 12.3 incorporates a controllable light source 97 that incorporates a curved two-dimensional light-source array 106 of light-source elements 100, 100', 100'', instead of a flat-panel two-dimensional light-source array 98, which provides for an associated curved modulation surface 92, 92''. With the subpupil surface 84 being an image of the modulation surface 92, this results in a corresponding associated concave-curved subpupil surface 84, 84'' that, referring to FIG. 9, conforms to a concave geometric surface construct 82, 82' defined by the front surface 20' of the eye 20 over a range of rotations, which provides for minimizing the variation in axial distance between the eye pupil 38 and any active exit subpupil 32 over a range of possible rotations of the eye 20.

Figure 19:
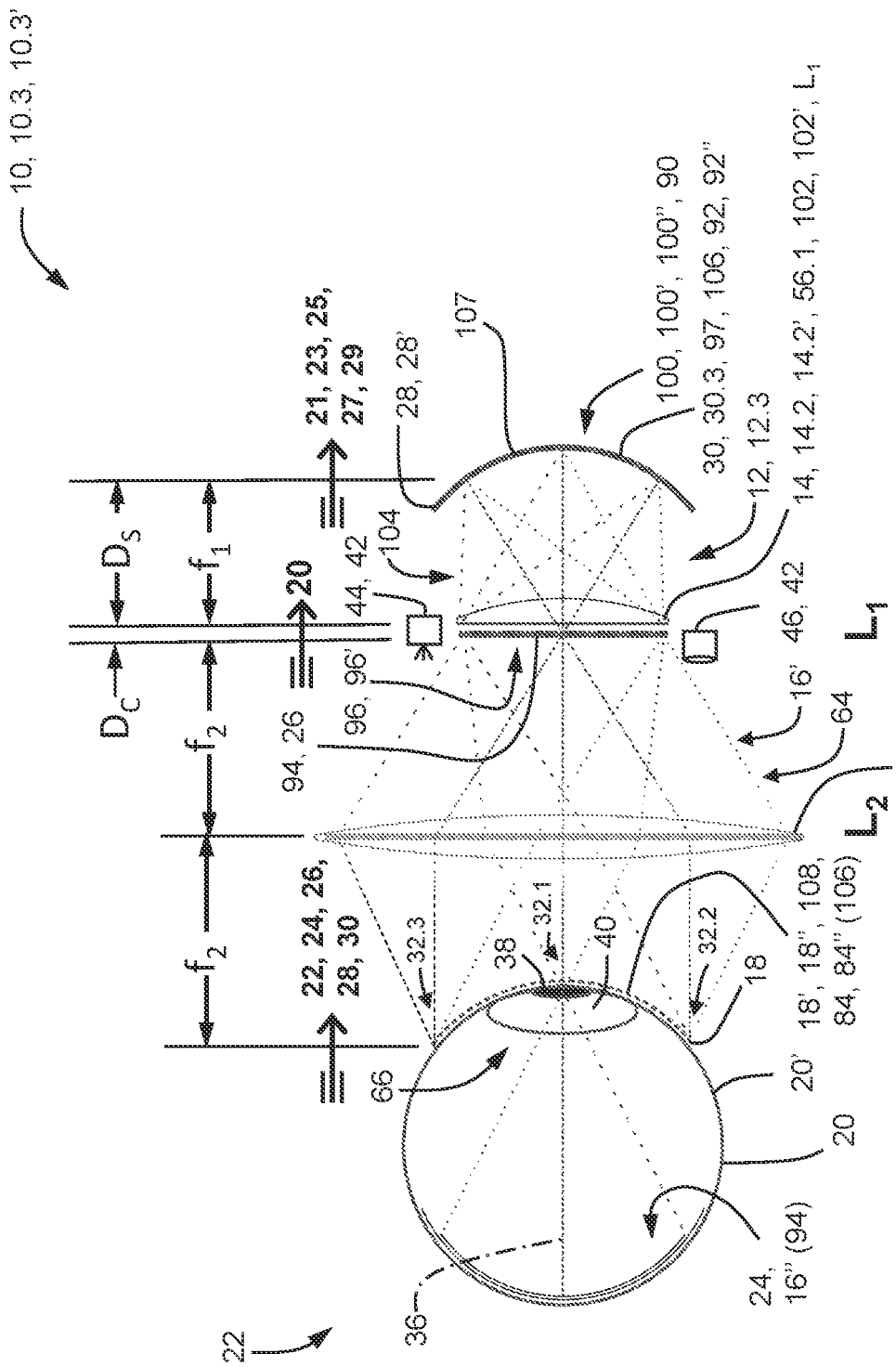
FIG. 19 illustrates a schematic diagram of a portion of a first embodiment of the third aspect of the near-eye display system illustrated in FIG. 18, illustrating the first embodiment of the second aspect of an associated optical subsystem incorporating a plurality of lenses, absent the associated processor and controller elements.

Referring to FIG. 19, in accordance with one set of embodiments, the relatively outboard light-source elements 100, 100.2, 100.3 are located one focal length $f_1$ from the associated first dioptric-power optical element 56, 56.1, 56.1', $L_1$.

For example, the curved two-dimensional light-source array 106 of light-source elements 100, 100', 100" may be embodied by either a curved array of independently controllable light sources, such as light-emitting diodes; or of a flat array of such light-emitting diodes, with the light from each light-emitting diode coupled to one or more entrances of one or more associated optical light pipes, the corresponding exits of which are coupled to form an associated light-source element 100, 100', 100" that is operatively coupled to, or a part of, an underlying concave-curved surface 107 of curved two-dimensional light-source array 106, so that the exits of these light pipes collectively form the light-source elements 100, 100', 100" of the curved two-dimensional light-source array 106.

Further in accordance with the third-aspect near-eye display system 10, 10.3, 10.3', the curved two-dimensional light-source array 106 constitutes an associated third-aspect subpupil modulator 30, 30.3, wherein each associated light-source element 100, 100', 100" constitutes the associated modulation element 90, similar to that of the second-aspect near-eye display system 10, 10.2, 10.2' so as to provide for controlling an associated modulated subpupil 32', but on an underlying concave-curved surface 107. Each light-source element 100, 100', 100" of the curved two-dimensional light-source array 106 illuminates the entirety of the flat-panel two-dimensional image-display modulation array 94 from a particular direction, and along a corresponding angle, associated with the location of that light-source element 100, 100', 100" within the curved two-dimensional light-source array 106. Accordingly, with the curved two-dimensional light-source array 106 located one focal length $f_1$ from the flat-panel two-dimensional image-display modulation array 94, the light 104 generated by each light-source element 100, 100', 100", and subsequently intensity-modulated by the flat-panel two-dimensional image-display modulation array 94, is transformed into a corresponding beam 64 of light 16' propagating at a corresponding angle relative to the optical axis 36.

The second dioptric-power optical element 56, 56.2, 56.2', $L_2$ in cooperation with the conditioner lens 102, 102', $L_1$ provide for forming a curved subpupil array image 108 of both the subpupil modulator 30, 30.3/curved two-dimensional light-source array 106 and the associated aperture stop 28, at the exit pupil 18 located proximate to the front surface 20' of the eye 20 and associated with the corresponding concave-curved subpupil surface 84, 84".

The light 104 originating from each light-source elements 100, 100', 100" is independently controlled, e.g. ON or OFF, by the subpupil modulation controller 50 responsive to the eye-tracking subsystem 42 in the same manner as described hereinabove for the second-aspect near-eye display system 10, 10.2, 10.2'.

Referring to FIGS. 21-30, the second- and third-aspect subpupil modulators 30, 30.2, 30.3 are controlled by the subpupil modulation controller 50 in accordance with a subpupil modulation scheme 70 that provides for identifying an Active Subpupil Region (ASR) 72 of the subpupil modulator 30, 30.2, 30.3 responsive to the location, size, and possibly the shape, of the eye pupil 38 as determined by the eye-tracking subsystem 42, and responsive thereto, that generates a subpupil modulation control signal 51 that provides for activating a subset of modulated subpupils 32' within the Active Subpupil Region (ASR) 72 (i.e. by controlling to an ON state) by activating the corresponding associated light-source elements 100, 100', 100", so as to generate light 104 therefrom; and that provides for deactivating the remainder of the modulated subpupils 32' of the subpupil modulator 30, 30.2, 30.3 (i.e. by controlling to an OFF state), by deactivating the corresponding associated light-source elements 100, 100', 100", so as to not generate light 104 therefrom. In comparison with the first-aspect near-eye display system 10, 10.1, for which the powering of the light-emitting image-display pixels 54 of the entire flat-panel two-dimensional image-display array 52 is independent of which exit subpupils 32 are activated, for the second- and third-aspect near-eye display systems 10, 10.2, 10.2', 10.3, 10.3', only light-source elements 100, 100', 100" associated with active exit subpupils 32 are powered, and the associated flat-panel two-dimensional image-display modulation array 94 consumes only a negligible amount of power, which together therefor provides a substantial reduction in power consumption relative to that of the first-aspect near-eye display system 10, 10.1.

Referring to FIGS. 21-23, in accordance with the first aspect 70.1 of the subpupil modulation scheme 70, 70.1, the Active Subpupil Region (ASR) 72 is set to a fixed size and shape that is sufficiently large so as to surround the eye pupil 38 regardless of the orientation of the eye 20, and regardless of the associated state of the iris 40, with accommodation for the largest anticipated lateral extent of the eye pupil 38 and accommodation of possible error in the determination of the location, size and/or shape of the eye pupil 38 by the eye-tracking subsystem 42, so as to mitigate against a potential uneven vignetting by an edge of the eye pupil 38 that might otherwise result if the edge of the eye pupil 38 were to not be fully illuminated by an associated exit subpupil 32, for example, as might otherwise result from a misalignment between the eye pupil 38 and the Active Subpupil Region (ASR) 72 that could otherwise cause a spatial transition of the edge of the eye pupil 38 from an active subpupil 32 inside the Active Subpupil Region (ASR) 72 to an inactive subpupil 32 outside the Active Subpupil Region (ASR) 72, for example, as a result of relative motion between the eye pupil 38 and the Active Subpupil Region (ASR) 72. The location of the Active Subpupil Region (ASR) 72 is continuously updated responsive to the eye-tracking subsystem 42, at a rate of update sufficient to accommodate rotations of the eye 20 by the user 22 so that the exit subpupils 32 surrounding and within the eye pupil 38 are maintained in an active state. Referring to FIGS. 21 and 22, for the eye 22 of the user 22 rotated for viewing in the first gaze direction 34.1 as illustrated in FIG. 22, and as a result, a detection by the eye-tracking subsystem 42 of the eye pupil 38 being centered on the optical axis 36, the associated Active Subpupil Region (ASR) 72 determined by the subpupil modulation controller 50 is concentric both with the eye pupil 38 and with the optical axis 36, with a diameter sufficiently greater than that of the eye pupil 38 so that the eye pupil 38 will be fully illuminated by active exit subpupils 32, wherein, as illustrated in FIG. 21, the light-source elements 100, 100', 100" and associated modulated subpupils 32' within the Active Subpupil Region (ASR) 72 are activated by the subpupil modulator 30, 30.2, 30.3, and the remaining modulated subpupils 32' intersecting or outside of the boundary of the Active Subpupil Region (ASR) 72 are deactivated so as to thereby not consume power, resulting in the image 16 being presented to the eye 20 via only the activated exit subpupils 32 that are associated with the activated modulated subpupils 32', as illustrated in FIG.

22. Referring to FIGS. 23 and 24, for the eye 22 of the user 22 rotated up and to the left as illustrated in FIG. 24, and as a result, a detection by the eye-tracking subsystem 42 of an elliptically-shaped eye pupil 38 located up and to the left of the associated optical axis 36, in accordance with the first-aspect subpupil modulation scheme 70, 70.1, the associated Active Subpupil Region (ASR) 72 determined by the subpupil modulation controller 50 is centered about the offset eye pupil 38, but with the same diameter as illustrated in FIGS. 21 and 22, wherein, as illustrated in FIG. 23, the light-source elements 100, 100', 100" and associated modulated subpupils 32' within the Active Subpupil Region (ASR) 72 are activated by the subpupil modulator 30, 30.2, 30.3, and the remaining modulated subpupils 32' intersecting or outside of the boundary of the Active Subpupil Region (ASR) 72 are deactivated so as to thereby not consume power, resulting in the image 16 being presented to the eye 20 via only the activated exit subpupils 32 that are associated with the activated modulated subpupils 32' that are aligned with the eye pupil 38, as illustrated in FIG. 24. Accordingly, notwithstanding the resulting mitigation against uneven vignetting by the eye pupil 38, the first-aspect subpupil modulation scheme 70, 70.1 results in the illumination of a portion of the eye 20 surrounding the eye pupil 38 with extraneous light $16^{iv}$ that is then reflected or scattered by the front surface 20' of the eye 20 rather than being imaged onto the retina 24, although with benefit from a substantial reduction in electrical power consumption compared with that required by the first-aspect near-eye display system 10, 10.1 to power the entire flat-panel two-dimensional image-display array 52 of light-emitting image-display pixels 54.

Referring to FIGS. 25 and 26, in accordance with the second aspect 70.2 of the subpupil modulation scheme 70, 70.2, the Active Subpupil Region (ASR) 72 is set to a variable size and shape that is adapted to be sufficiently large so as to surround the eye pupil 38 regardless of the orientation of the eye 20, and regardless of the associated state of the iris 40, which—the same as for the first-aspect subpupil modulation scheme 70, 70.1, but accompanied by a lesser amount of extraneous light $16^{iv}$—also provides for mitigating against a potential uneven vignetting by an edge of the eye pupil 38 that might otherwise result if the edge of the eye pupil 38 were to not be fully illuminated by an associated exit subpupil 32. The location, size and shape of the Active Subpupil Region (ASR) 72 is continuously updated responsive to the eye-tracking subsystem 42, at a rate of update sufficient to accommodate rotations of the eye 20 by the user 22 so that the exit subpupils 32 surrounding the eye pupil 38 are maintained in an active state. Similar to that illustrated in FIGS. 21 and 22, if the eye 22 of the user 22 is rotated for viewing in the first gaze direction 34.1 as illustrated in FIG. 22, the resulting associated Active Subpupil Region (ASR) 72 determined by the subpupil modulation controller 50 is also concentric both with the eye pupil 38 and with the optical axis 36, but with a relatively smaller diameter— relative to that associated with the first-aspect subpupil modulation scheme 70, 70.1—that is sufficiently large to account for possible error in the determination of the location, size and/or shape of the eye pupil 38 by the eye-tracking subsystem 42. Referring to FIGS. 25 and 26, for the eye 22 of the user 22 rotated up and to the left as illustrated in FIG. 26, and as a result, a detection by the eye-tracking subsystem 42 of an elliptically-shaped eye pupil 38 located up and to the left of the associated optical axis 36, in accordance with the second-aspect subpupil modulation scheme 70, 70.2, the associated Active Subpupil Region (ASR) 72 determined by the subpupil modulation controller 50 is centered about the offset eye pupil 38, but elliptically shaped, similar that of the eye pupil 38, wherein, as illustrated in FIG. 25, the light-source elements 100, 100', 100" and associated modulated subpupils 32' within the Active Subpupil Region (ASR) 72 are activated by the subpupil modulator 30, 30.2, 30.3, and the remaining modulated subpupils 32' intersecting or outside of the boundary of the Active Subpupil Region (ASR) 72 are deactivated, resulting in the image 16 being presented to the eye 20 via only the activated exit subpupils 32 that are associated with the activated modulated subpupils 32' that are aligned with the eye pupil 38, as illustrated in FIG. 26. Accordingly, as a result of the Active Subpupil Region (ASR) 72 being dynamically sized and shaped responsive to the size and shape of the eye pupil 38 as determined by the eye-tracking subsystem 42, the size and shape of the Active Subpupil Region (ASR) 72 can more closely match that of the eye pupil 38 while still mitigating against uneven vignetting by the edge of the eye pupil 38, which—in comparison with the first-aspect subpupil modulation scheme 70, 70.1—results in a relatively lesser amount of illumination of the portion of the eye 20 surrounding the eye pupil 38 with extraneous light $16^{iv}$ that is then reflected or scattered by the front surface 20' of the eye 20 rather than being imaged onto the retina 24, and thereby also provides a benefit from a substantial reduction in electrical power consumption compared with that required by the first-aspect near-eye display system 10, 10.1 to power the entire flat-panel two-dimensional image-display array 52 of light-emitting image-display pixels 54; and, to a lesser extent, compared with that of the first-aspect subpupil modulation scheme 70, 70.1, although to a lesser extent.

The first- and second-aspect subpupil modulation schemes 70, 70.1, 70.2, supra, may each be configured to dynamically adapt the size and/or shape of the Active Subpupil Region (ASR) 72 to that of the eye pupil 38, so as to provide for reducing the amount of extraneous light $16^{iv}$ reflected or scattered by the front surface 20' of the eye 20, or, in the case of the second- or third-aspect near-eye display systems 10, 10.2, 10.2', 10.3, 10.3', so as to provide for further reducing the associated amount of electrical power consumption. The diameter of the eye pupil 38 is controlled by the iris 40 of the eye 20 within a typical range of 2 millimeters to 8 millimeters, depending upon, and responsive to, changes in the brightness of the image 16, wherein the relatively-smallest diameter of the eye pupil 38 results from the relatively-highest perceived intensity of the image 16, which, in respect of the second- or third-aspect near-eye display systems 10, 10.2, 10.2', 10.3, 10.3', provides the greatest opportunity for power savings if the Active Subpupil Region (ASR) 72 diameter is reduced responsive to detection by the eye-tracking subsystem 42 of the size and/or shape of the eye pupil 38.

In accordance with the third aspect 70.3 of the subpupil modulation scheme 70, 70.3, rather than making the Active Subpupil Region (ASR) 72 so large as to avoid a spatial transition of the edge of the eye pupil 38 from an active to an inactive exit subpupil 32, instead, the Active Subpupil Region (ASR) 72 is constrained to a size that is smaller than that of the eye pupil 38, and is aligned with the center of the eye pupil 38, so as to prevent vignetting that could otherwise result from a spatial transition straddling edge of the eye pupil 38. Accordingly, the third-aspect subpupil modulation scheme 70, 70.3 substantially eliminates the illumination of the portion of the eye 20 surrounding the eye pupil 38 with extraneous light $16^{iv}$ that would otherwise be reflected or scattered by the front surface 20' of the eye 20 rather than being imaged onto the retina 24. Furthermore, a relatively smaller Active Subpupil Region (ASR) 72 provides for improving the perceived quality of the image 16 by decreasing the effective aperture size through which the light 16' passes into the eye 20, thereby decreasing the impact of aperture-size-related optical aberrations, which increases clarity of the image 16, which is particularly effective in a near-eye display system 10, 10.2, 10.2', 10.3, 10.3' that provides for a relatively-large field-of-view together with relatively-high magnification. Referring to FIGS. 27 through 29, based upon an estimate from the eye-tracking subsystem 42 of the location of the center of the eye pupil 38, the subpupil modulation controller 50 identifies and activates the modulated subpupil 32'—i.e. the associated light-source element 100, 100', 100"—of an associated Active Subpupil Region (ASR) 72, associated with the exit subpupil 32 that is most-closely aligned with the eye pupil 38, and deactivates the remaining modulated subpupils 32'/light-source elements 100, 100', 100" of the subpupil modulator 30, 30.2, 30.3/flat-panel 98 or curved 106 two-dimensional light-source array. The location of the Active Subpupil Region (ASR) 72 is continuously updated responsive to the eye-tracking subsystem 42, at a rate of update sufficient to accommodate rotations of the eye 20 by the user 22, so that the exit subpupils 32 having corresponding one or more projected transverse locations so as to be located entirely within transverse projection of the eye pupil 38, are maintained in an active state. Referring to FIGS. 26 and 28, for the eye 22 of the user 22 rotated for viewing in the first gaze direction 34.1 as illustrated in FIG. 28, and as a result, a detection by the eye-tracking subsystem 42 of the eye pupil 38 being centered on the optical axis 36, the associated Active Subpupil Region (ASR) 72 determined by the subpupil modulation controller 50 is concentric both with the eye pupil 38 and with the optical axis 36, and, in one set of embodiments, limited in size so as to encompass a corresponding single exit subpupil 32, wherein, as illustrated in FIG. 27, the light-source element 100, 100', 100" and associated modulated subpupil 32' within the Active Subpupil Region (ASR) 72 is activated by the subpupil modulator 30, 30.2, 30.3, and the remaining modulated subpupils 32' outside the boundary of the Active Subpupil Region (ASR) 72 are deactivated, resulting in the image 16 being presented to the eye 20 via only the activated exit subpupil 32 associated with the activated modulated subpupil 32', as illustrated in FIG. 28, and thereby also provides a benefit from a substantial reduction in electrical power consumption compared with that required by the first-aspect near-eye display system 10, 10.1 to power the entire flat-panel two-dimensional image-display array 52 of light-emitting image-display pixels 54, and, to a lesser extent, compared with that of the first- and second-aspect subpupil modulation schemes 70, 70.1, 70.2. Referring to FIGS. 29 and 30, for the eye 22 of the user 22 rotated up and to the left as illustrated in FIG. 30, and as a result, a detection by the eye-tracking subsystem 42 of an elliptically-shaped eye pupil 38 located up and to the left of the associated optical axis 36, in accordance with the third-aspect subpupil modulation scheme 70, 70.3, the associated Active Subpupil Region (ASR) 72 determined by the subpupil modulation controller 50 is located—for example, centered—within the offset eye pupil 38, wherein, as illustrated in FIG. 29, the light-source element 100, 100', 100" and associated modulated subpupil 32' within the Active Subpupil Region (ASR) 72 is activated by the subpupil modulator 30, 30.2, 30.3, and the remaining modulated subpupils 32' outside the boundary of the Active Subpupil Region (ASR) 72 are deactivated, resulting in the image 16 being presented to the eye 20 via only the activated exit subpupil 32 associated with the activated modulated subpupil 32', as illustrated in FIG. 30, and thereby also provides a benefit from a substantial reduction in electrical power consumption compared with that required by the first-aspect near-eye display system 10, 10.1 to power the entire flat-panel two-dimensional image-display array 52 of light-emitting image-display pixels 54, and, to a lesser extent, compared with that of the first- and second-aspect subpupil modulation schemes 70, 70.1, 70.2.

The subpupil modulation schemes 70, 70.1, 70.2, 70.3 may be adapted to accommodate errors—by the eye-tracking subsystem 42—in estimates of the position and/or size of the eye pupil 38, or errors in the position of the eye pupil 38 relative to the associated subpupil surface 84 and associated one or more exit subpupils 32, for example, which may result from a lag in the detection and determination of those parameters, or a lag in the implementation by the subpupil modulation controller 50 of changes to the Active Subpupil Region (ASR) 72 responsive to those parameters. For example, these errors may occur, or be accentuated, as a result of either rapid eye movement or a mechanical misalignment of the near-eye display system 10, 10.1, 10.2, 10.2', 10.3, 10.3' relative to the eye 20, for example, as a result of manual adjustment or a physical bumping that may be optionally reported to the subpupil modulation controller 50 by an optional accelerometer incorporated in the near-eye display system 10, 10.1, 10.2, 10.2', 10.3, 10.3'. For example, responsive to the detection of a condition—for example, rapid eye movement or a physical bumping of the near-eye display system 10, 10.1, 10.2, 10.2', 10.3, 10.3'—associated with prospective eye-tracking errors, the subpupil modulation controller 50 can provide for increasing the size of the Active Subpupil Region (ASR) 72 to accommodate the associated uncertainty in the location of the eye pupil 38 relative to the associated exit subpupil surface 84 and associated one or more exit subpupils 32. Accordingly, the size, shape and location of the Active Subpupil Region (ASR) 72 implemented by the subpupil modulation schemes 70, 70.1, 70.2, 70.3 can be dynamically modified during such events to compensate for such temporary prospective errors, and then later reduced in size to either, or both, reduce the reflection or scattering extraneous light 16', or reduce electrical power consumption, after the situation has stabilized.

The first- and second-aspect subpupil modulators 30, 30.2, 30.3, supra, each generate an associated array of discrete, spatially adjacent exit subpupils 32 on a subpupil surface 84, where each exit subpupil 32 is an image of an associated corresponding modulation element 90 within a corresponding array of modulation elements 90, the physical implementation of which typically includes boundary regions between adjacent modulation elements 90 that, for example, incorporate, or provide for, associated electronic circuitry, the edges of a light pipes, or other structures that result in a physically discontinuous modulation surface 92, and a resulting similarly discontinuous array of corresponding associated exit subpupils 32 at the subpupil surface 84, which causes, within the subpupil surface 84, a grid-like pattern of darkness between active exit subpupils 32.

For a subpupil surface 84 that does not conform to the concave geometric surface construct 82, 82', supra, the effect of this grid-like patterns on the uniform perceived brightness of the composite image 88 increases with axial separation of the eye pupil 38 from the associated exit subpupil 32 as a result of a rotation of the eye 20. This effect can be somewhat mitigated by blurring the image of adjacent exit subpupils 32—for example, by increasing the sizes thereof,—or by implementing other means of reducing spatial structures in the image of the exit subpupils 32, however, a relative increase in the size of the exit subpupil 32 may not otherwise be desirable. The fixed spatial organization of the array of exit subpupils 32 resulting from the fixed spatial organization of the corresponding array of modulation elements 90 results in a corresponding relatively-fixed location of any individual exit subpupil 32 on the subpupil surface 84.

Referring to FIGS. 31-43, the fourth aspect 10.4 of the near-eye display system 10, 10.4, and an associated first embodiment 10.4' thereof, is substantially the same as the third-aspect near-eye display system 10, 10.3, 10.3', supra, except that an associated fourth-aspect image generator 12, 12.4 incorporates a controllable light source 97 that incorporates a curved light-redirecting surface 110 in cooperation with a modulated scanned beam of light 112 that is generated by scanning—in two dimensions—a beam of light 114 with a light-beam scanner 116 to generate the light 104 to illuminate the associated flat-panel two-dimensional image-display modulation array 94 of light-modulating image-display pixels 96, for example, the latter of which is illustrated in FIG. 33, which also provides for an associated curved modulation surface 92, 92", but without utilizing a set of individual light-source elements 100, 100', 100" of the curved two-dimensional light-source array 106. The modulated scanned beam of light 112 is generated by an intensity-modulatable light-beam source 118 that illuminates a light-beam-directing element 120—for example, an electromechanically actuated mirror, holographic element, or diffractive element—of the light-beam scanner 116, wherein the light-beam source 118, and the light-beam scanner 116 are each operatively coupled to, and under control of, the subpupil modulation controller 50 that provides for controlling the activation and intensity of the light-beam source 118 responsive to a light-beam-magnitude subpupil modulation control signal 51', and that provides for controlling the location of the modulated scanned beam of light 112 on the curved light-redirecting surface 110 responsive to a light-beam-position subpupil modulation control signal 51", so as to collectively provide for both temporal and angular modulation of the modulated scanned beam of light 112, respectively. Accordingly, the modulated scanned beam of light 112 in cooperation with the curved light-redirecting surface 110—including the underlying light-beam source 118 and light-beam scanner 116 under control of the subpupil modulation controller 50—constitute a fourth-aspect subpupil modulator 30, 30.4 associated with the fourth-aspect near-eye display system 10, 10.4, 10.4', with the underlying curved light-redirecting surface 110 constituting an associated curved modulation surface 92, 92". The same as for the third-aspect near-eye display system 10, 10.3, 10.3', with the subpupil surface 84 being an image of the modulation surface 92, this results in a corresponding associated concave-curved subpupil surface 84, 84" that conforms to the concave geometric surface construct 82, 82' (illustrated in FIG. 9) defined by the front surface 20' of the eye 20 over a range of rotations, which provides for minimizing the variation in axial distance between the eye pupil 38 and any active exit subpupil 32 over a range of possible rotations of the eye 20.

The region 122 of the curved light-redirecting surface 110 over which the modulated scanned beam of light 112 is scanned constitutes—in the context of the fourth-aspect near-eye display system 10, 10.3, 10.3'—an effective light source 124 that can be continuous over an arbitrary shape, of an arbitrary size, at an arbitrary location, and with an arbitrary intensity profile, and which is associated with a corresponding single modulated subpupil 32', wherein the light 104 redirected from the curved light-redirecting surface 110 is transformed by the conditioner lens 102, 102', $L_1$ into a corresponding beam 64' of light 16' that propagates in a direction that is responsive to the location of the region 122 on the curved light-redirecting surface 110 from which the light 104 originates, in association with a corresponding single exit subpupil 32. The curved light-redirecting surface 110 provides for redirecting and redistributing—for example, by scattering or diffraction, or a combination thereof—the light 104 of the modulated scanned beam of light 112 with a sufficient diversity of scattering angles therefrom so as to provide for illuminating the entirety of the flat-panel two-dimensional image-display modulation array 94 from every location on the curved light-redirecting surface 110 that can be associated with an associated modulated subpupil 32' and the exit subpupil 32, while also providing for forming an image of the associated effective light source 124 on the concave-curved subpupil surface 84, 84" as an associated curved subpupil image 126.

At any given time, when actuated, the beam of light 114 from the light-beam source 118 as directed by the light-beam-directing element 120 of the light-beam scanner 116 inherently forms a light spot 104' within the region 122 of the curved light-redirecting surface 110, which may be steered to any location on the curved light-redirecting surface 110 responsive to angular modulation of the light-beam scanner 116. The ultimate shape and size of the resulting effective light source 124 are provided for by rapidly angularly modulating or "scanning" the light spot 104' along an associated path within the region 122 of the curved light-redirecting surface 110 corresponding to the associated Active Subpupil Region (ASR) 72, wherein, as a result of persistence of the eye 20, the rapid and repetitive scanning of the light spot 104' along the associated path—similar to the working of a vector-based graphical display—gives the appearance of a relatively continuously filled effective light source 124. In one set of embodiments, either the light-beam source 118, or of the associated beam of light 114, may be intensity modulated during the scanning process to provide for controlling the resulting intensity, or the associated intensity profile, of the effective light source 124.

Notwithstanding that the light-beam scanner 116 and light-beam-directing element 120 are illustrated in FIGS. 31 and 32 at an off-axis location relative to the optical axis 36 of the associated optical subsystem 14, 14.2 so as to not obstruct the illumination of the flat-panel two-dimensional image-display modulation array 94 from the curved light-redirecting surface 110, alternatively, the light-beam scanner 116 and light-beam-directing element 120 could be used in cooperation with a beam splitter to provide for on-axis illumination of the curved light-redirecting surface 110.

Referring also to FIG. 32, in accordance with one set of embodiments, the relatively outboard region of the curved light-redirecting surface 110 is located one focal length $f_1$ from the associated first dioptric-power optical element 56, 56.1, 56.1', $L_1$/conditioner lens 102, 102', $L_1$. The second dioptric-power optical element 56, 56.2, 56.2', $L_2$ in cooperation with the conditioner lens 102, 102', $L_1$ provide for forming the curved subpupil image 126 of both the subpupil modulator 30, 30.4/curved light-redirecting surface 110 and the associated aperture stop 28, at the exit pupil 18 located proximate to the front surface 20' of the eye 20 and associated with the corresponding concave-curved subpupil surface 84, 84". For example, the curved light-redirecting surface 110 may comprise, but is not limited to, a light-scattering surface, a holographic surface, a diffractive surface, or a combination thereof.

The light 104 originating from the region 122 of the curved light-redirecting surface 110 is controlled by the subpupil modulation controller 50 responsive to the eye-tracking subsystem 42, depending upon the associated subpupil modulation scheme 70. In comparison with the first-, second- and third-aspect near-eye display systems 10, 10.1, 10.2, 10.2', 10.3, 10.3', the fourth-aspect near-eye display system 10, 10.4, 10.4' provides for more precisely positioning and sizing an associated single exit subpupil 32 that forms the associated composite image 88, without the presence of a grid-like pattern of darkness within the associated curved subpupil image 126.

Referring to FIGS. 34-43, the fourth-aspect subpupil modulator 30, 30.4 is controlled by the subpupil modulation controller 50 in accordance with a subpupil modulation scheme 70 that provides for identifying an Active Subpupil Region (ASR) 72 of the subpupil modulator 30, 30.4 responsive to the location, size, and possibly the shape, of the eye pupil 38 as determined by the eye-tracking subsystem 42, and that provides for scanning the region 122 of the curved light-redirecting surface 110 so as to form the effective light source 124 associated with a corresponding modulated subpupil 32' within the Active Subpupil Region (ASR) 72 so as to generate light 104 therefrom; and for not illuminating the remaining portion of the curved light-redirecting surface 110 with the modulated scanned beam of light 112 so as to not generate light 104 therefrom. In comparison with the first-aspect near-eye display system 10, 10.1, for which the powering of the light-emitting image-display pixels 54 of the entire flat-panel two-dimensional image-display array 52 is independent of which exit subpupils 32 are activated, and in comparison with the second- and third-aspect near-eye display systems 10, 10.2, 10.2', 10.3, 10.3', for which a light-source element 100 is illuminated in association with each active exit subpupil 32, in accordance with the fourth-aspect near-eye display system 10, 10.4, 10.4', only the light-beam source 118 and light-beam scanner 116 are powered, and the associated flat-panel two-dimensional image-display modulation array 94 consumes only a negligible amount of power, which therefor provides a substantial reduction in power consumption relative to that of the first-aspect, and possibly also the second- and third-aspect, near-eye display systems 10, 10.1, 10.2, 10.2', 10.3, 10.3'.

Figure 35:
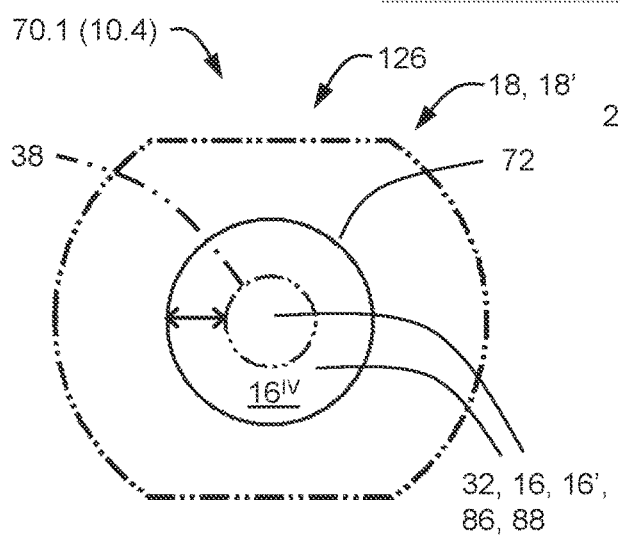
FIG. 35 illustrates a plan view of an exit pupil and associated exit subpupil associated with the aperture stop and the scanned beam of light redirected from the curved light-redirecting surface of the fourth aspect of the near-eye display system illustrated in FIGS. 31, 32 and 46, for the active subpupil region (ASR) illustrated in FIG. 34.
Figure 34:
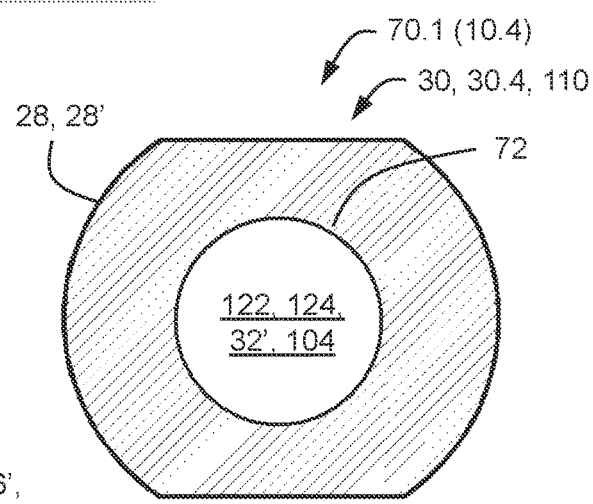
FIG. 34 illustrates a plan view of an aperture stop and the scanned beam of light redirected from the curved light-redirecting surface that respectively define an entrance pupil and a modulated subpupil of the fourth aspect of the near-eye display system illustrated in FIGS. 31, 32 and 46, with the scanned beam of light controlled so as to provide for the first aspect of an associated active subpupil region (ASR) in cooperation with an eye pupil of the user being centered on the optical axis of the associated optical subsystem.
Figure 37:
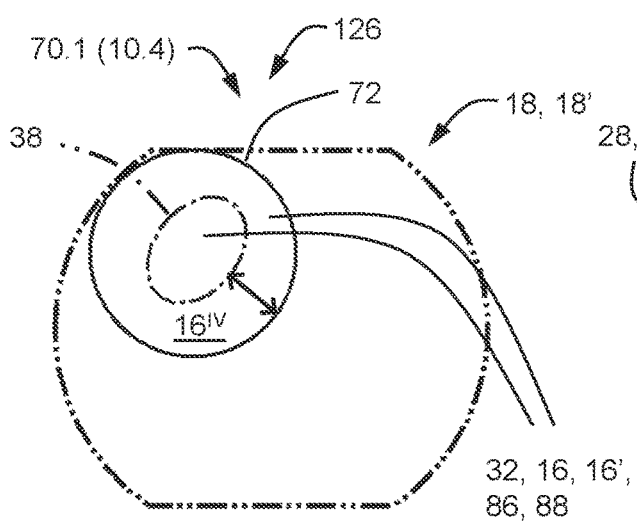
FIG. 37 illustrates a plan view of an exit pupil and associated exit subpupil associated with the aperture stop and the scanned beam of light redirected from the curved light-redirecting surface of the fourth aspect of the near-eye display system illustrated in FIGS. 31, 32 and 46, for the active subpupil region (ASR) illustrated in FIG. 36.
Figure 36:
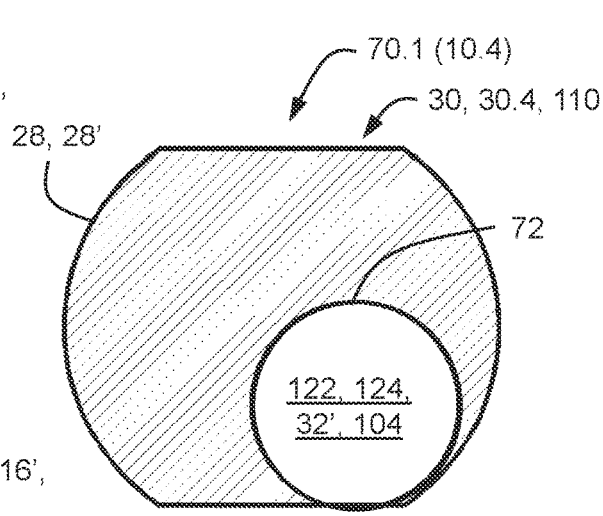
FIG. 36 illustrates a plan view of an aperture stop and the scanned beam of light redirected from the curved light-redirecting surface that respectively define an entrance pupil and a modulated subpupil of the fourth aspect of the near-eye display system illustrated in FIGS. 31, 32 and 46, with the scanned beam of light controlled so as to provide for the first aspect of an associated active subpupil region (ASR) in cooperation with an eye pupil of the user being rotated upwards and to the left relative to the optical axis of the associated optical subsystem.
Figure 39:
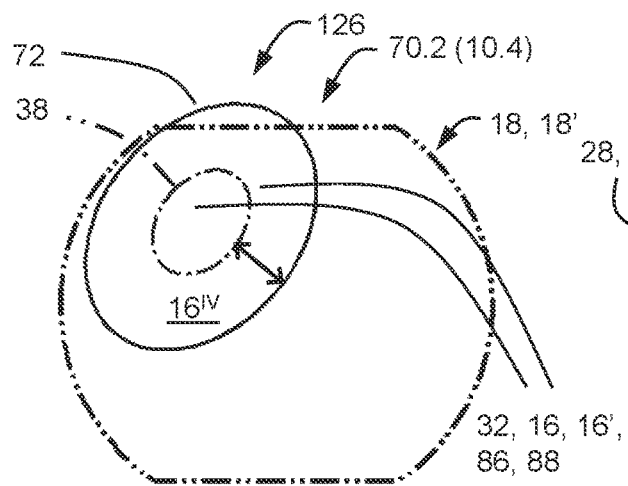
FIG. 39 illustrates a plan view of an exit pupil and associated exit subpupil associated with the aperture stop and the scanned beam of light redirected from the curved light-redirecting surface of the fourth aspect of the near-eye display system illustrated in FIGS. 31, 32 and 46, for the active subpupil region (ASR) illustrated in FIG. 38.
Figure 38:
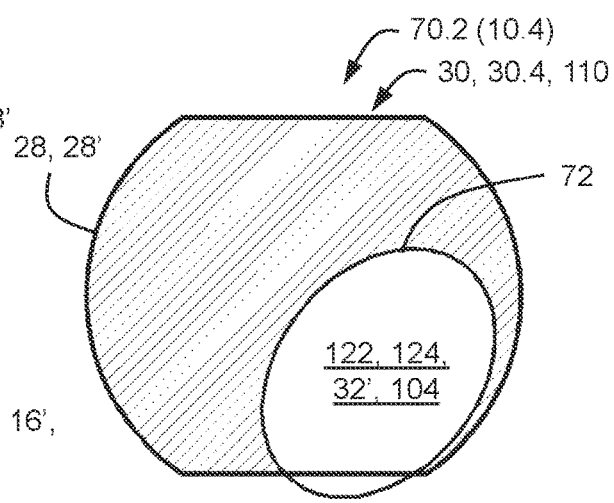
FIG. 38 illustrates a plan view of an aperture stop and the scanned beam of light redirected from the curved light-redirecting surface that respectively define an entrance pupil and a modulated subpupil of the fourth aspect of the near-eye display system illustrated in FIGS. 31, 32 and 46, with the scanned beam of light controlled so as to provide for a second aspect of an associated active subpupil region (ASR) in cooperation with an eye pupil of the user being rotated upwards and to the left relative to the optical axis of the associated optical subsystem.

Referring to FIGS. 34-37, in accordance with the first aspect 70.1 of the subpupil modulation scheme 70, 70.1, the Active Subpupil Region (ASR) 72 is set to a fixed size and shape that is sufficiently large so as to surround the eye pupil 38 regardless of the orientation of the eye 20, and regardless of the associated state of the iris 40, with accommodation for the largest anticipated lateral extent of the eye pupil 38 and accommodation of possible error in the determination of the location, size and/or shape of the eye pupil 38 by the eye-tracking subsystem 42, so as to mitigate against a potential uneven vignetting by an edge of the eye pupil 38 that might otherwise result if the edge of the eye pupil 38 were to not be fully illuminated by an associated exit subpupil 32, for example, as might otherwise result from a misalignment between the eye pupil 38 and the Active Subpupil Region (ASR) 72 that could otherwise cause a spatial transition of the edge of the eye pupil 38 from an active subpupil 32 inside the Active Subpupil Region (ASR) 72 to an inactive subpupil 32 outside the Active Subpupil Region (ASR) 72 as a result of relative motion between the eye pupil 38 and the Active Subpupil Region (ASR) 72. The location of the Active Subpupil Region (ASR) 72 is continuously updated responsive to the eye-tracking subsystem 42, at a rate of update sufficient to accommodate rotations of the eye 20 by the user 22 so as to provide for the active-state exit subpupil 32 to continuously surround the eye pupil 38. Referring to FIGS. 34 and 35, for the eye 22 of the user 22 rotated for viewing in the first gaze direction 34.1 as illustrated in FIG. 35, and as a result, a detection by the eye-tracking subsystem 42 of the eye pupil 38 being centered on the optical axis 36, the associated Active Subpupil Region (ASR) 72 determined by the subpupil modulation controller 50 is concentric both with the eye pupil 38 and with the optical axis 36, with a diameter sufficiently greater than that of the eye pupil 38 so that the eye pupil 38 will be fully illuminated by the active-state exit subpupil 32, wherein, as illustrated in FIG. 34, the modulated scanned beam of light 112 of the associated subpupil modulator 30, 30.4 is scanned so as to form—in the region 122 of the curved light-redirecting surface 110—an effective light source 124 and associated modulated subpupil 32' that spans the Active Subpupil Region (ASR) 72; and a remaining portion of the curved light-redirecting surface 110 is not illuminated, so as to present the image 16 to the eye 20 via a single exit subpupil 32 that fills the associated Active Subpupil Region (ASR) 72, as illustrated in FIG. 35. Referring to FIGS. 36 and 37, for the eye 22 of the user 22 rotated up and to the left as illustrated in FIG. 37, and as a result, a detection by the eye-tracking subsystem 42 of an elliptically-shaped eye pupil 38 located up and to the left of the associated optical axis 36, in accordance with the first-aspect subpupil modulation scheme 70, 70.1, the associated Active Subpupil Region (ASR) 72 determined by the subpupil modulation controller 50 is centered about the offset eye pupil 38, but with the same diameter as illustrated in FIGS. 34 and 35, wherein, as illustrated in FIG. 36, the modulated scanned beam of light 112 of the associated subpupil modulator 30, 30.4 is scanned so as to form—in the region 122 of the curved light-redirecting surface 110—an effective light source 124 and associated modulated subpupil 32' that spans the Active Subpupil Region (ASR) 72; and a remaining portion of the curved light-redirecting surface 110 is not illuminated, so as to present the image 16 to the eye 20 via a single exit subpupil 32 that fills the associated Active Subpupil Region (ASR) 72 that is aligned with the eye pupil 38, as illustrated in FIG. 37. Accordingly, notwithstanding the resulting mitigation against uneven vignetting by the eye pupil 38, the first-aspect subpupil modulation scheme 70, 70.1 results in the illumination of a portion of the eye 20 surrounding the eye pupil 38 with extraneous light $16^{iv}$ that is then reflected, or scattered, by the front surface 20' of the eye 20 rather than being imaged onto the retina 24, and thereby also provides a benefit from a substantial reduction in electrical power consumption compared with that required by the first-aspect near-eye display system 10, 10.1 to power the entire flat-panel two-dimensional image-display array 52 of light-emitting image-display pixels 54, Referring to FIGS. 38 and 39, in accordance with the second aspect 70.2 of the subpupil modulation scheme 70, 70.2, the Active Subpupil Region (ASR) 72 is set to a variable size and shape that is adapted to be sufficiently large so as to surround the eye pupil 38 regardless of the orientation of the eye 20, and regardless of the associated state of the iris 40, which—the same as for the first-aspect subpupil modulation scheme 70, 70.1, but accompanied by a lesser amount of extraneous light $16^{iv}$—also provides for mitigating against a potential uneven vignetting by an edge of the eye pupil 38 that might otherwise result if the edge of the eye pupil 38 were to not be fully illuminated by an associated exit subpupil 32. The location, size and shape of the Active Subpupil Region (ASR) 72 is continuously updated responsive to the eye-tracking subsystem 42, at a rate of update sufficient to accommodate rotations of the eye 20 by the user 22 so as to provide for the active-state exit subpupil 32 to continuously surround the eye pupil 38. Similar to that illustrated in FIGS. 34 and 35, if the eye 22 of the user 22 is rotated for viewing in the first gaze direction 34.1 as illustrated in FIG. 35, the resulting associated Active Subpupil Region (ASR) 72 determined by the subpupil modulation controller 50 is also concentric both with the eye pupil 38 and with the optical axis 36, but with a relatively smaller diameter—relative to that associated with the first-aspect subpupil modulation scheme 70, 70.1—that is sufficiently large to account for possible error in the determination of the location, size and/or shape of the eye pupil 38 by the eye-tracking subsystem 42. Referring to FIGS. 38 and 39, for the eye 22 of the user 22 rotated up and to the left as illustrated in FIG. 39, and as a result, a detection by the eye-tracking subsystem 42 of an elliptically-shaped eye pupil 38 located up and to the left of the associated optical axis 36, in accordance with the second-aspect subpupil modulation scheme 70, 70.2, the associated Active Subpupil Region (ASR) 72 determined by the subpupil modulation controller 50 is centered about the offset eye pupil 38, but elliptically shaped, similar that of the eye pupil 38, wherein, as illustrated in FIG. 38, the modulated scanned beam of light 112 of the associated subpupil modulator 30, 30.4 is scanned so as to form—in the region 122 of the curved light-redirecting surface 110—an effective light source 124 and associated modulated subpupil 32' that spans the Active Subpupil Region (ASR) 72; and a remaining portion of the curved light-redirecting surface 110 is not illuminated, so as to present the image 16 to the eye 20 via a single exit subpupil 32 that fills the associated Active Subpupil Region (ASR) 72 that is aligned with the eye pupil 38, as illustrated in FIG. 39. Accordingly, as a result of the Active Subpupil Region (ASR) 72 being dynamically sized and shaped responsive to the size and shape of the eye pupil 38 as determined by the eye-tracking subsystem 42, the size and shape of the Active Subpupil Region (ASR) 72 can more closely match that of the eye pupil 38 while still mitigating against uneven vignetting by the edge of the eye pupil 38, which—in comparison with the first-aspect subpupil modulation scheme 70, 70.1—results in a relatively lesser amount of illumination of the portion of the eye 20 surrounding the eye pupil 38 with extraneous light $16^{iv}$ that is then reflected or scattered by the front surface 20' of the eye 20 rather than being imaged onto the retina 24, and thereby also provides a benefit from a substantial reduction in electrical power consumption compared with that required by the first-aspect near-eye display system 10, 10.1 to power the entire flat-panel two-dimensional image-display array 52 of light-emitting image-display pixels 54, and, to a lesser extent, compared with that of the first-aspect subpupil modulation scheme 70, 70.1.

The first- and second-aspect subpupil modulation schemes 70, 70.1, 70.2, supra, may each be configured to dynamically adapt the size and/or shape of the Active Subpupil Region (ASR) 72 to that of the eye pupil 38, so as to provide for reducing the amount of extraneous light $16^{iv}$ reflected or scattered by the front surface 20' of the eye 20. The diameter of the eye pupil 38 is controlled by the iris 40 of the eye 20 within the typical range of 2 millimeters to 8 millimeters, depending upon, and responsive to, changes in the brightness of the image 16, wherein the relatively-smallest diameter of the eye pupil 38 results from the relatively-highest perceived intensity of the image 16.

Figure 41:
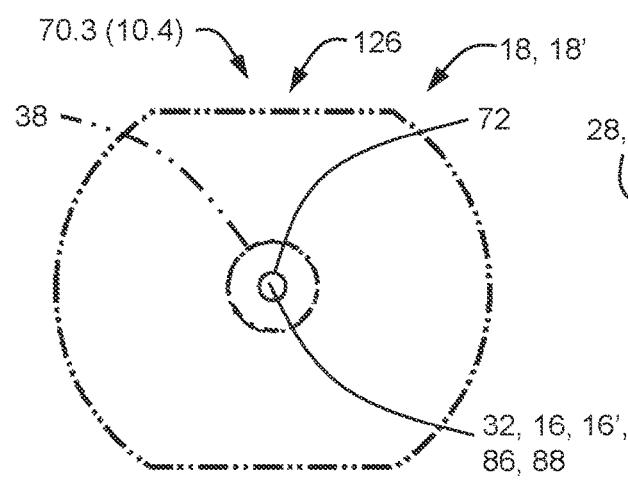
FIG. 41 illustrates a plan view of an exit pupil and associated exit subpupil associated with the aperture stop and the scanned beam of light redirected from the curved light-redirecting surface of the fourth aspect of the near-eye display system illustrated in FIGS. 31, 32 and 46, for the active subpupil region (ASR) illustrated in FIG. 40.
Figure 40:
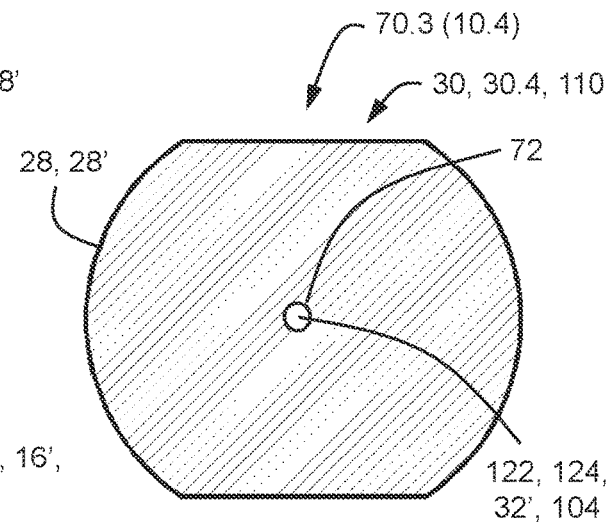
FIG. 40 illustrates a plan view of an aperture stop and the scanned beam of light redirected from the curved light-redirecting surface that respectively define an entrance pupil and a modulated subpupil of the fourth aspect of the near-eye display system illustrated in FIGS. 31, 32 and 46, with the scanned beam of light controlled so as to provide for a third aspect of an associated active subpupil region (ASR) in cooperation with an eye pupil of the user being centered on the optical axis of the associated optical subsystem.
Figure 43:
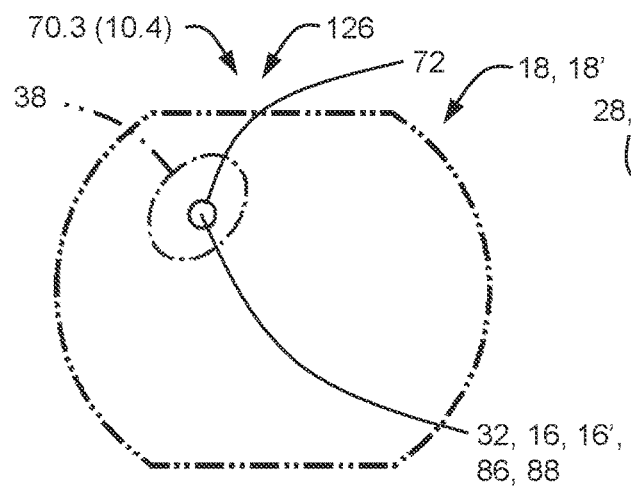
FIG. 43 illustrates a plan view of an exit pupil and associated exit subpupil associated with the aperture stop and the scanned beam of light redirected from the curved light-redirecting surface of the fourth aspect of the near-eye display system illustrated in FIGS. 31, 32 and 46, for the active subpupil region (ASR) illustrated in FIG. 42.
Figure 42:
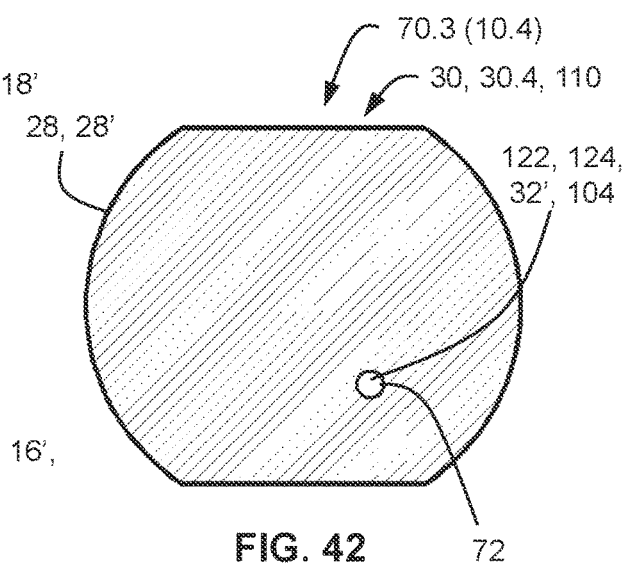
FIG. 42 illustrates a plan view of an aperture stop and the scanned beam of light redirected from the curved light-redirecting surface that respectively define an entrance pupil and a modulated subpupil of the fourth aspect of the near-eye display system illustrated in FIGS. 31, 32 and 46, with the scanned beam of light controlled so as to provide for the third aspect of an associated active subpupil region (ASR) in cooperation with an eye pupil of the user being rotated upwards and to the left relative to the optical axis of the associated optical subsystem.

In accordance with the third aspect 70.3 of the subpupil modulation scheme 70, 70.3, rather than making the Active Subpupil Region (ASR) 72 so large as to avoid a spatial transition of the edge of the eye pupil 38 from an active to an inactive exit subpupil 32, instead the Active Subpupil Region (ASR) 72 is constrained to a size that is smaller than that of the eye pupil 38 and aligned with the center of the eye pupil 38 so as to prevent vignetting that could otherwise result with the presence of such a spatial transition. Accordingly, the third-aspect subpupil modulation scheme 70, 70.3 substantially eliminates the illumination of the portion of the eye 20 surrounding the eye pupil 38 with extraneous light $16^{iv}$ that would otherwise be reflected or scattered by the front surface 20' of the eye 20 rather than being imaged onto the retina 24. Furthermore, a relatively smaller Active Subpupil Region (ASR) 72 provides for improving the perceived quality of the image 16 by decreasing the effective aperture size through which the light 16' passes into the eye 20, thereby decreasing the impact of aperture-size-related optical aberrations, which increases clarity of the image 16, and which is particularly effective in a near-eye display system 10, 10.2, 10.2', 10.3, 10.3', 10.4, 10.4' that provides for a large field-of-view together with relatively high magnification. Referring to FIGS. 40 through 43, based upon an estimate from the eye-tracking subsystem 42 of the location of the center of the eye pupil 38, the subpupil modulation controller 50 identifies an associated Active Subpupil Region (ASR) 72 that is aligned with the eye pupil 38, and the modulated scanned beam of light 112 of the associated subpupil modulator 30, 30.4 is scanned so as to form—in the region 122 of the curved light-redirecting surface 110—an effective light source 124 and associated modulated subpupil 32' that spans the Active Subpupil Region (ASR) 72; wherein a remaining portion of the curved light-redirecting surface 110 is not illuminated, so as to present the image 16 to the eye 20 via a single exit subpupil 32 that fills the associated Active Subpupil Region (ASR) 72 that is aligned with the eye pupil 38. The location of the Active Subpupil Region (ASR) 72 is continuously updated responsive to the eye-tracking subsystem 42, at a rate of update sufficient to accommodate rotations of the eye 20 by the user 22 so that the associated active-state exit subpupil 32 is maintained within the eye pupil 38. Referring to FIGS. 40 and 41, for the eye 22 of the user 22 rotated for viewing in the first gaze direction 34.1 as illustrated in FIG. 41, and as a result, a detection by the eye-tracking subsystem 42 of the eye pupil 38 being centered on the optical axis 36, the associated Active Subpupil Region (ASR) 72 determined by the subpupil modulation controller 50 is concentric both with the eye pupil 38 and with the optical axis 36, and limited in size so as to not overlap an edge of the eye pupil 38, wherein, as illustrated in FIG. 40, the modulated scanned beam of light 112 of the associated subpupil modulator 30, 30.4 is scanned so as to form—in the region 122 of the curved light-redirecting surface 110—an effective light source 124 and associated modulated subpupil 32' that spans the associated Active Subpupil Region (ASR) 72; and a remaining portion of the curved light-redirecting surface 110 is not illuminated, so as to present the image 16 to the eye 20 via a single exit subpupil 32 that fills the associated Active Subpupil Region (ASR) 72 that is aligned with, but smaller than, the eye pupil 38, as illustrated in FIG. 41, and thereby also provides a benefit from a substantial reduction in electrical power consumption compared with that required by the first-aspect near-eye display system 10, 10.1 to power the entire flat-panel two-dimensional image-display array 52 of light-emitting image-display pixels 54, and, to a lesser extent, compared with that of the first- and second-aspect subpupil modulation schemes 70, 70.1, 70.2. Referring to FIGS. 42 and 43, for the eye 22 of the user 22 rotated up and to the left as illustrated in FIG. 43, and as a result, a detection by the eye-tracking subsystem 42 of an elliptically-shaped eye pupil 38 located up and to the left of the associated optical axis 36, in accordance with the third-aspect subpupil modulation scheme 70, 70.3, the associated Active Subpupil Region (ASR) 72 determined by the subpupil modulation controller 50 is located—for example, centered—within the offset eye pupil 38, wherein, as illustrated in FIG. 42, the modulated scanned beam of light 112 of the associated subpupil modulator 30, 30.4 is scanned so as to form—in the region 122 of the curved light-redirecting surface 110—an effective light source 124 and associated modulated subpupil 32' that spans the Active Subpupil Region (ASR) 72; wherein a remaining portion of the curved light-redirecting surface 110 is not illuminated, so as to present the image 16 to the eye 20 via a single exit subpupil 32 that fills the associated Active Subpupil Region (ASR) 72 that is aligned with, but smaller than, the eye pupil 38, as illustrated in FIG. 43, and thereby also provides a benefit from a substantial reduction in electrical power consumption compared with that required by the first-aspect near-eye display system 10, 10.1 to power the entire flat-panel two-dimensional image-display array 52 of light-emitting image-display pixels 54, and, to a lesser extent, compared with that of the first- and second-aspect subpupil modulation schemes 70, 70.1, 70.2.

Figure 44:
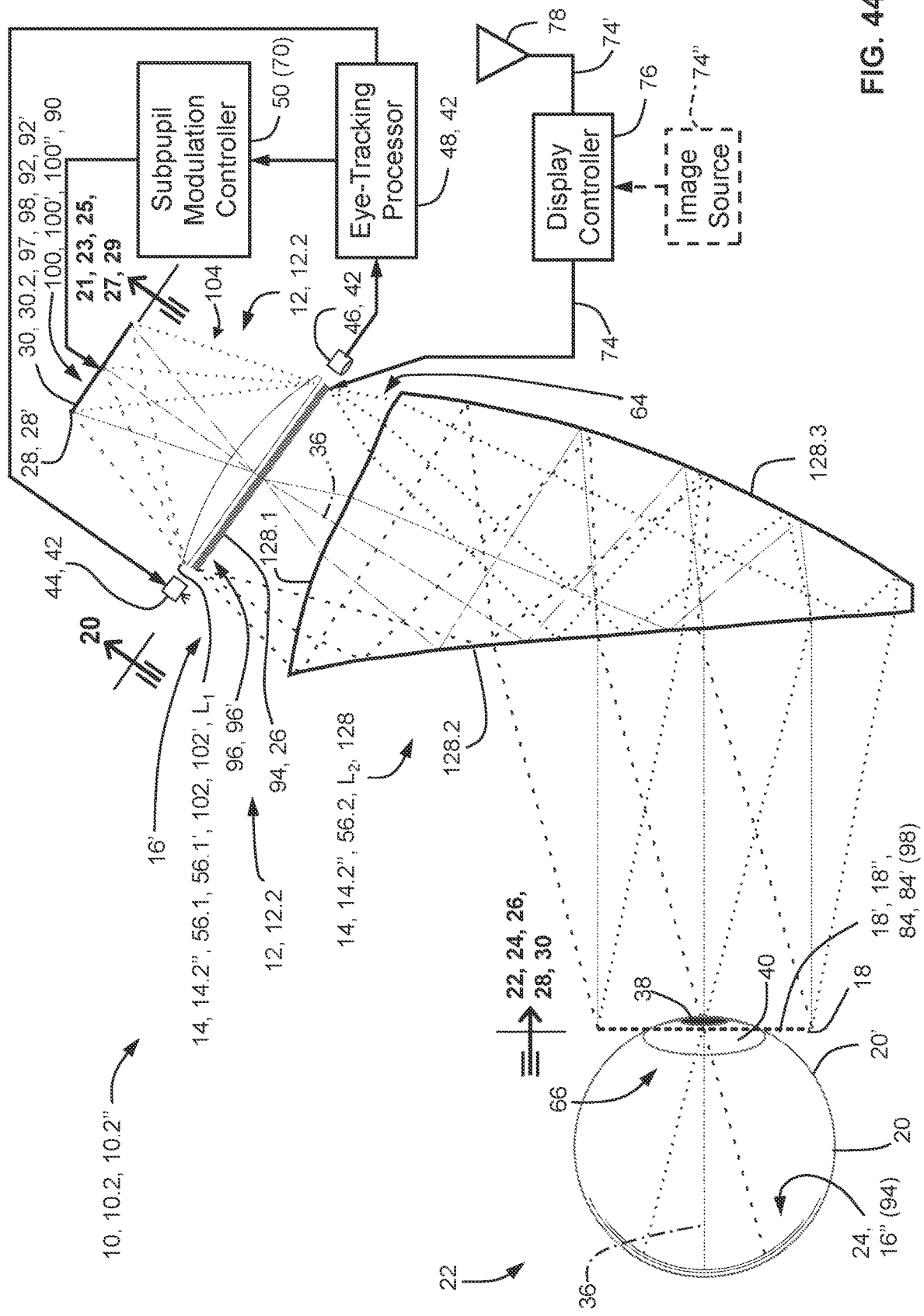
FIG. 44 illustrates a schematic block diagram of a second embodiment of the second aspect of the near-eye display system incorporating a flat-panel two-dimensional array of light sources that define an associated array of modulated subpupils of the second-aspect near-eye display system, in cooperation with a separate flat-panel two-dimensional image-display array of light-modulating image-display pixels, further illustrating a second embodiment of the second aspect of an associated optical subsystem incorporating a free-form-surface/prism lens.
Figure 45:
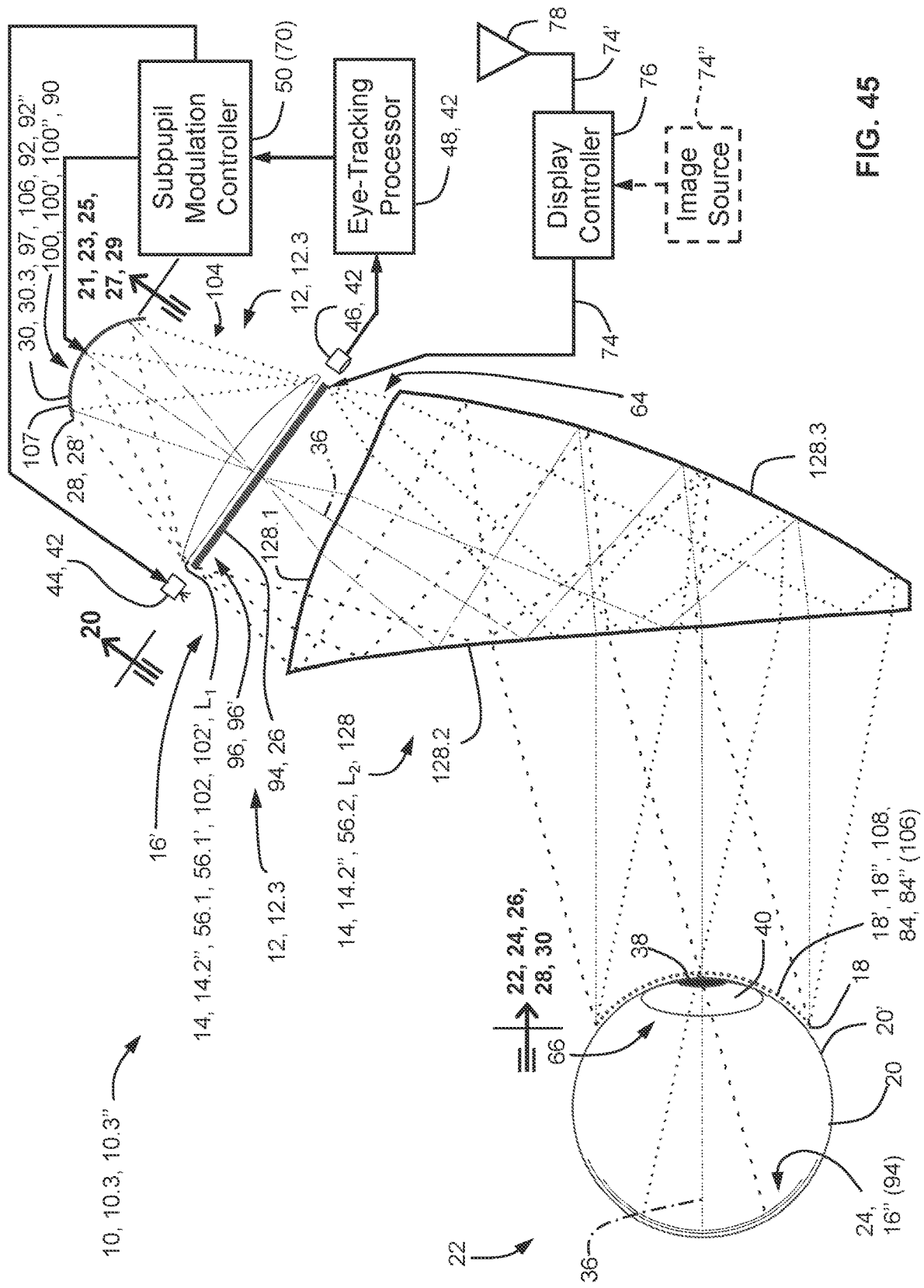
FIG. 45 illustrates a schematic block diagram of a second embodiment of the third aspect of a near-eye display system incorporating a curved two-dimensional light array of light sources that define an associated array of modulated subpupils of the third-aspect near-eye display system, in cooperation with a separate flat-panel array of light-modulating image-display pixels, further illustrating the second embodiment of the second aspect of an associated optical subsystem incorporating a free-form-surface/prism lens.
Figure 46:
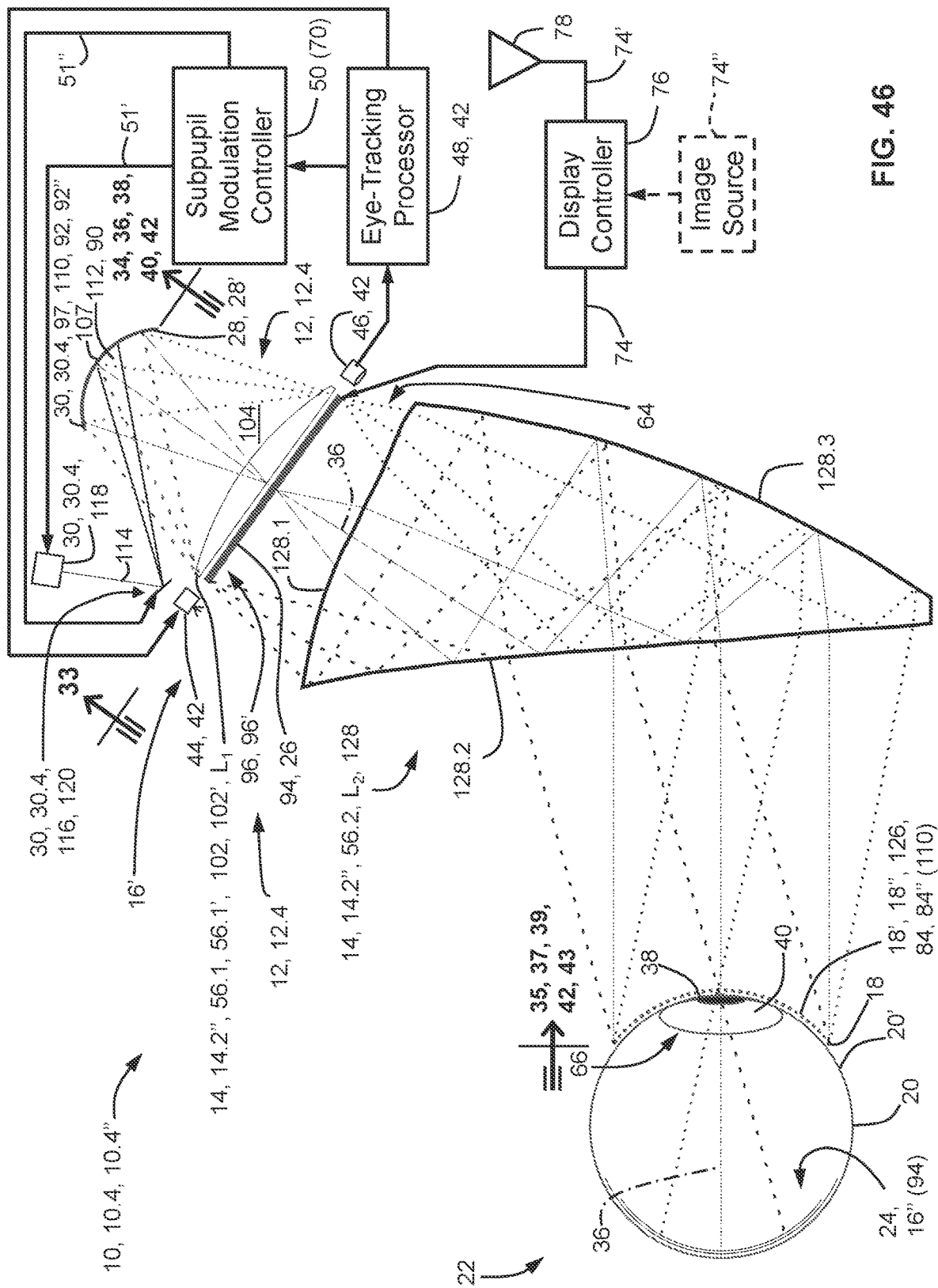
FIG. 46 illustrates a schematic block diagram of a second embodiment of the fourth aspect of a near-eye display system incorporating a scanned beam of light in cooperation with a curved light-redirecting surface that together define an associated modulated subpupil of the fourth-aspect near-eye display system, in cooperation with a separate flat-panel array of light-modulating image-display pixels, further illustrating the second embodiment of the second aspect of an associated optical subsystem incorporating a free-form-surface/prism lens.

Referring to FIGS. 44-46, in accordance with a second embodiment 14.2", the second-aspect optical subsystem 14, 14.2" of each of the second-aspect 10.2, 10.2', third-aspect 10.3, 10.3' and fourth-aspect 10.4, 10.4' near-eye display systems 10, respectively, may be alternatively embodied with a free-form-surface/prism lens 56.2, $L_2$, 128 providing for the associated second dioptric-power optical element 56, 56.2, $L_2$. For example, free-form-surface/prism lenses are described the following technical papers, which are incorporated herein by reference in their entirety: Dewen CHENG, Yongian WANG, Hong HUA and M. M. TALHA, "Design of an optical see-trough head-mounted display with a low f-number and large field of view using a freeform prism", APPLIED OPTICS, Optical Society of America, Vol. 48, No. 14, 10 May 2009, pp. 2655-2668; and Hong HUA, "Sunglass-like displays become a reality with free-form optical technology", 20 Aug. 2012, SPIE Digital Library, 2021, Internet download from: https://spie.org/news/4375-sunglass-like-displays-become-a-reality-with-free-form-optical-technology?SSO=1.

More particularly, referring to FIG. 44, a second embodiment 10.2" of a second-aspect near-eye display system 10, 10.2, 10.2" incorporates the same second-aspect image generator 12, 12.2 as described hereinabove and illustrated in FIG. 17, which provides for generating a corresponding associated beam 64 of light 16' for each associated modulated subpupil 32'. Referring to FIG. 45, a second embodiment 10.3" of a third-aspect near-eye display system 10, 10.3, 10.3" incorporates the same third-aspect image generator 12, 12.3 as described hereinabove and illustrated in FIG. 19, which also provides for generating a corresponding associated beam 64 of light 16' for each associated modulated subpupil 32'. Referring to FIG. 46, a second embodiment 10.4" of a fourth-aspect near-eye display system 10, 10.4, 10.4" incorporates the same fourth-aspect image generator 12, 12.4 as described hereinabove and illustrated in FIG. 32, which also provides for generating a corresponding associated beam 64 of light 16' for each associated modulated subpupil 32'. For each of the embodiments illustrated in FIGS. 44-46, and for each associated modulated subpupil 32', the corresponding associated beam 64 of light 16' enters a free-form refractive first surface 128.1 of the associated free-form-surface/prism lens 56.2, $L_2$, 128, then reflects from a free-form second surface 128.2 due to total internal reflection, then reflects from a free-form third surface 128.3 with a reflective coating, and finally exits the free-form-surface/prism lens 56.2, $L_2$, 128 through the free-form second surface 128.2 into the exit pupil 18 of the associated optical subsystem 14, 14.2" for viewing of the associated virtual image 16''' by the eye 20. Otherwise, each of the second-aspect 10.2, third-aspect 10.3 and fourth-aspect 10.4 near-eye display systems function as described hereinabove in conjunction with FIGS. 16-17, 18-19 and 31-32, respectively.

In one set of embodiments, the infrared illuminator 44 and the infrared-responsive camera 46 of the eye-tracking subsystem 42 are located proximate to the rear focal plane 62 of the second lens 56.2', $L_2$ of the first-aspect near-eye display system 10, 10.1, and proximate to the same plane as the flat-panel two-dimensional image-display modulation array 94 of the second- 10.2, third- 10.3 and fourth- 10.4 aspect near-eye display systems 10.

Generally, the subpupil surface 84, 84', 84" and accordingly, the associated surface 18" of the exit pupil 18, are located sufficiently close to, supra, the eye pupil 38 so that an activated exit subpupil 32 can pass optical rays of the light 16' of the image 16 into the eye pupil 38 so as to provide for viewing the entire image 16. The near-eye display system 10, 10.2, 10.3, 10.4 provides for viewing the image 16 at a comfortable distance so that the associated virtual image 16''' appears to the either corrected (e.g. by eyeglasses or contact lenses) or uncorrected vision of the user 22 to be located at a distance from the user 22 of between 2 meters and an infinity.

Each exit subpupil 32 is an image of its respective modulation element 90 formed by the associated components of the associated optical subsystem 14, 14.1, 14.2, 14.2', 14.2". A simple-single-lens optical imaging system typically forms an inverted image of the associated object. The first-aspect optical subsystem 14, 14.1 effectively acts as two simple-single-lens optical imaging systems in tandem that provide for imaging the flat-panel two-dimensional image-display array 52, wherein a first of the two forms an intermediate, inverted image of the plane where the infrared illuminator 44 and the infrared-responsive camera 46 of the eye-tracking subsystem 42 are located, and the second of the two provides a virtual image 16''' of that intermediate image, whereas the second-aspect optical subsystem 14, 14.2, 14.2', 14.2" instead directly forms the virtual image of the virtual image 16''' of the flat-panel two-dimensional image-display modulation array 94. Accordingly, the resulting virtual images 16''' of the first-aspect 14.1 and second-aspect 14.2, 14.2', 14.2" optical subsystems 14 are relatively inverted with respect to one another, which is accommodated by orienting the image 16 on the associated flat-panel two-dimensional image-display array 52 or flat-panel two-dimensional image-display modulation array 94 so that the image 16 appears to appear correctly oriented to the user 22.

When incorporated as the second dioptric-power optical element 56, 56.2, $L_2$ of a near-eye display system 10, 10.2, 10.3, 10.4, the free-form-surface/prism lens 56.2, $L_2$, 128 can provide for relatively lower cost, weight and design volume thereof so as to provide for a relatively more compact near-eye display system 10, 10.2, 10.3, 10.4, which can also be configured to combine the imagery from an associated flat-panel two-dimensional image-display modulation array 94 with that from the real environment of the user 22.

Figure 47:
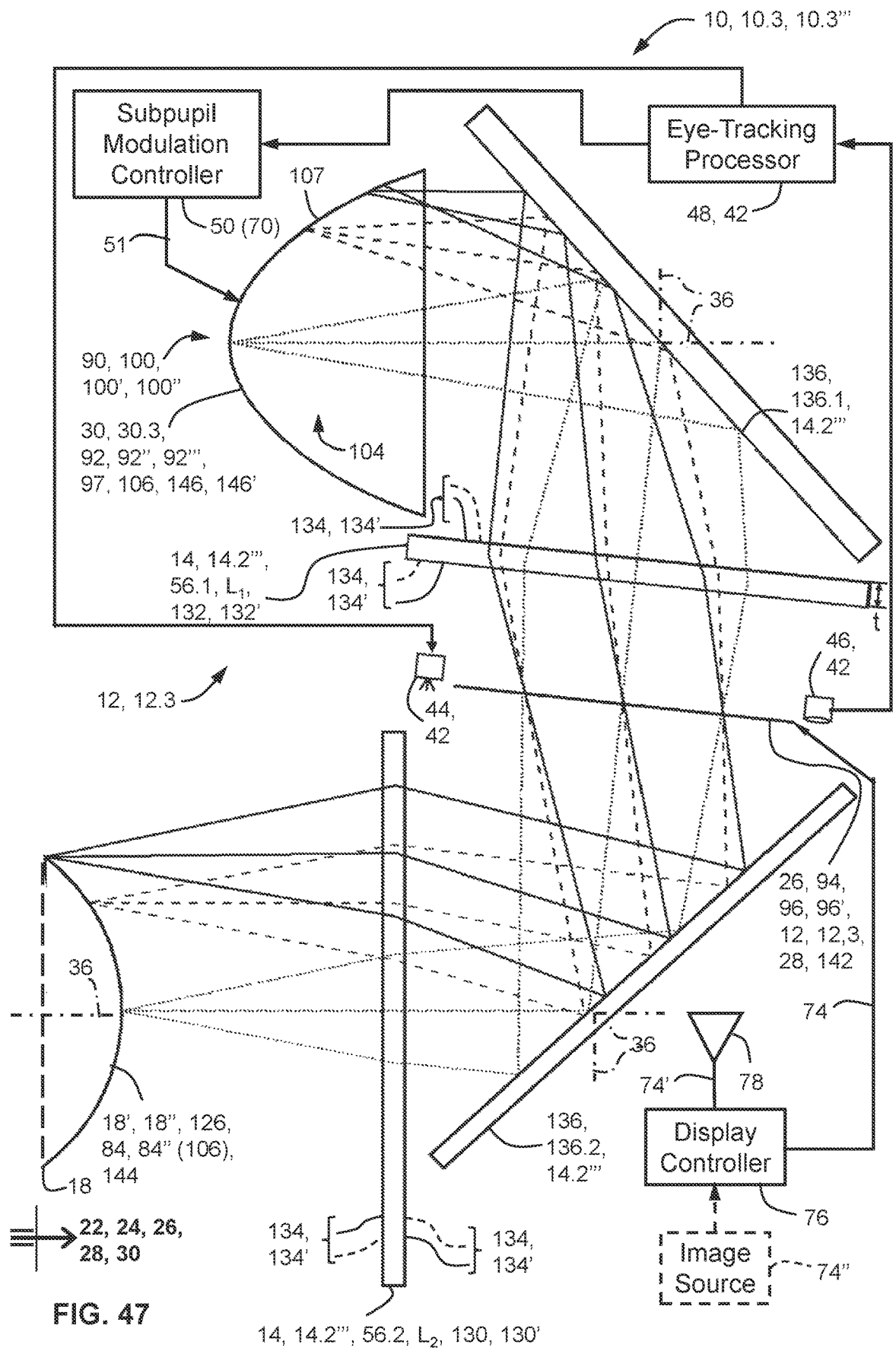
FIG. 47 illustrates a schematic block diagram of a third embodiment of the third aspect of a near-eye display system incorporating a curved two-dimensional light array of light sources that define an associated array of modulated subpupils of the third-aspect near-eye display system, in cooperation with a separate flat-panel array of light-modulating image-display pixels further illustrating an embodiment of a third aspect of an associated optical subsystem incorporating an associated conditioner lens and an associated first embodiment of a magnifier lens, each of which incorporate at least one Fresnel surface.

Referring to FIG. 47, a third embodiment 10.3''' of a third aspect of a near-eye display system 10, 10.3, 10.3''' incorporating a third embodiment 14.2''' of the second-aspect optical subsystem 14, 14.2''', is similar to the first-embodiment third-aspect near-eye display system 10, 10.3, 10.3', supra, except that the second convergent magnifier lens 56.2', $L_2$ is replaced with a Fresnel magnifier lens 130, and the conditioner lens 102, 102', $L_1$ is replaced with a Fresnel conditioner lens 132, wherein each of the Fresnel magnifier 130 and conditioner 132 lenses incorporates at least one Fresnel surface 134, the latter of which, for example, incorporates Fresnel structure 134' incorporating a plurality of annular refractive segments, each incorporating a surface curvature similar to that of a conventional lens, but stepped relative to the adjacent segment so as to reduce the overall thickness thereof to being that of the thickest refractive segment, resulting in a corresponding relatively-thin, macroscopically-flat structure that is relatively-lighter weight than a corresponding conventional lens, and that is relatively easier to package. If the Fresnel magnifier 130 and conditioner 132 lenses were illuminated over the entirety of their surfaces—some of which light is intended to enter the eye pupil 38, the remainder of which would otherwise illuminate the face of the user 22—the Fresnel surfaces 134 thereof would tends to scatter a substantial amount of light from the discontinuities in the associated Fresnel structures 134', some of which scattered light would ultimately enter the eye pupil 38 of the user 22 to cause a noticeable decrease in perceived image contrast. In view of the source of this scattered light including both light 16' through the associated optical subsystem 14 that is intended to reach the eye pupil 38 as well as light 16' that would unnecessarily reach other areas of the user's face, the use of modulated subpupils 32', supra, provides for reducing the amount of otherwise unnecessary light 16', so as to therefore provide for improving the perceived image contrast relative to that which would result from a fully illuminated Fresnel magnifier 130 and conditioner 132 lenses.

The third-embodiment third-aspect near-eye display system 10, 10.3, 10.3''' illustrated in FIG. 47 further incorporates two flat fold mirrors 136—i.e. upper 136.1 and lower 136.2 fold mirrors 136, for example, each at a 45 degree angle relative to the optical axis 36 aligned with the eye 20 of the user 22—that provide for folding the associated light path between the subpupil modulator 30, 30.3 and the Fresnel magnifier lens 130, so as to provide for a relatively-more compact physical assembly. It should be understood that any of the first- 10.1, second- 10.2, or third- 10.3 aspect near-eye display systems 10, supra, could incorporate one or more fold mirrors 136, 136.1, 136.2 so as to provide for a relatively-more compact physical assembly thereof, for which one or both of the upper 136.1 and lower 136.2 fold mirrors 136 incorporated in the third-embodiment third-aspect near-eye display system 10, 10.3, 10.3''' are otherwise optional.

Regardless of the particular aspect 10.1, 10.2, 10.3, 10.4 of the near-eye display system 10, 10.1, 10.2, 10.3, 10.4, for purposes of determining the prescriptions of the underlying dioptric-power optical elements 56, 56.1, 56.2, 56.3, the action of the associated optical subsystem 14, 14.1, 14.2, 14.2', 14.2'', 14.2''' may be decomposed into:

a) the generation of the virtual image 16'''—as viewable by the user 22—of either i) the flat-panel two-dimensional image-display array 52 of the first-aspect near-eye display system 10, 10.1 by the first 56.1', $L_1$, second 56.2', $L_2$, and third 56.3', $L_3$ convergent magnifier lenses thereof, or ii) the flat-panel two-dimensional image-display modulation array 94 by the second convergent magnifier lens 56.2', $L_2$ of the second- 10.2, third- 10.3 or fourth- 10.4 aspect near-eye display system 10, 10.2, 10.3, 10.4; and b) the generation of the exit-pupil image 18'—i.e. a real image—of either i) the subpupil modulator 30, 30.1 by the second 56.2', $L_2$ and third 56.3', $L_3$ convergent magnifier lenses of the first-aspect near-eye display system 10, 10.1, or ii) the subpupil modulator 30, 30.2, 30.3, 30.4 by the conditioner lens 102, 102', $L_1$ in cooperation with the of the second convergent magnifier lens 56.2', $L_2$ of the second- 10.2, third- 10.3 or fourth- 10.4 aspect near-eye display system 10, 10.2, 10.3, 10.4.

Figure 48:
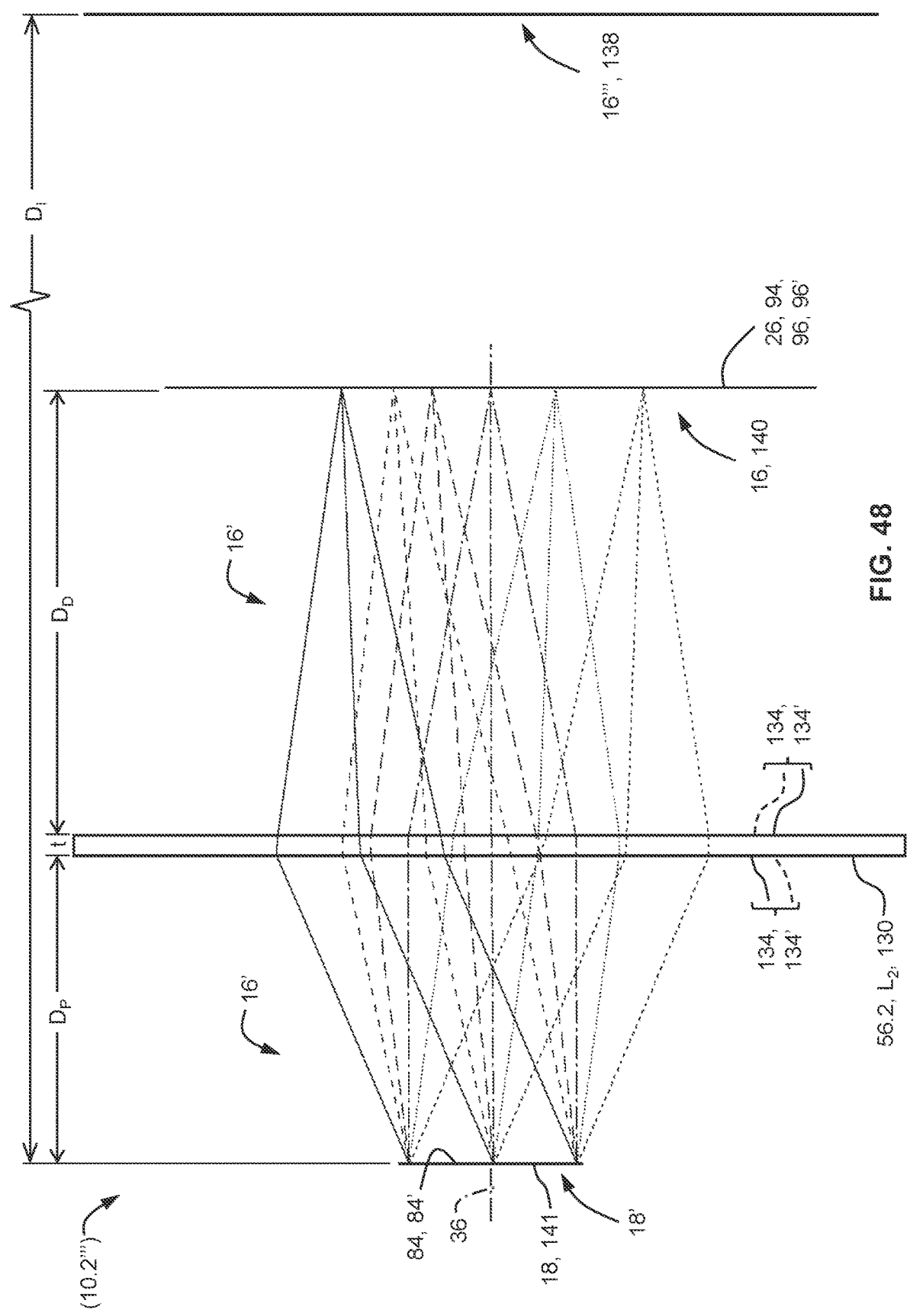
FIG. 48 illustrates a portion of a hypothetical embodiment of a second-aspect near-eye display system, including the associated exit pupil, a Fresnel-surface magnifier lens and the associated flat-panel two-dimensional image-display modulation array, together with a ray-trace simulation of light propagating from the flat-panel two-dimensional image-display modulation array through the magnifier lens to form a virtual image associated with the light entering the exit pupil during the process illustrated in FIG. 49 for determining a prescription of the associated magnifier lens.
Figure 49:
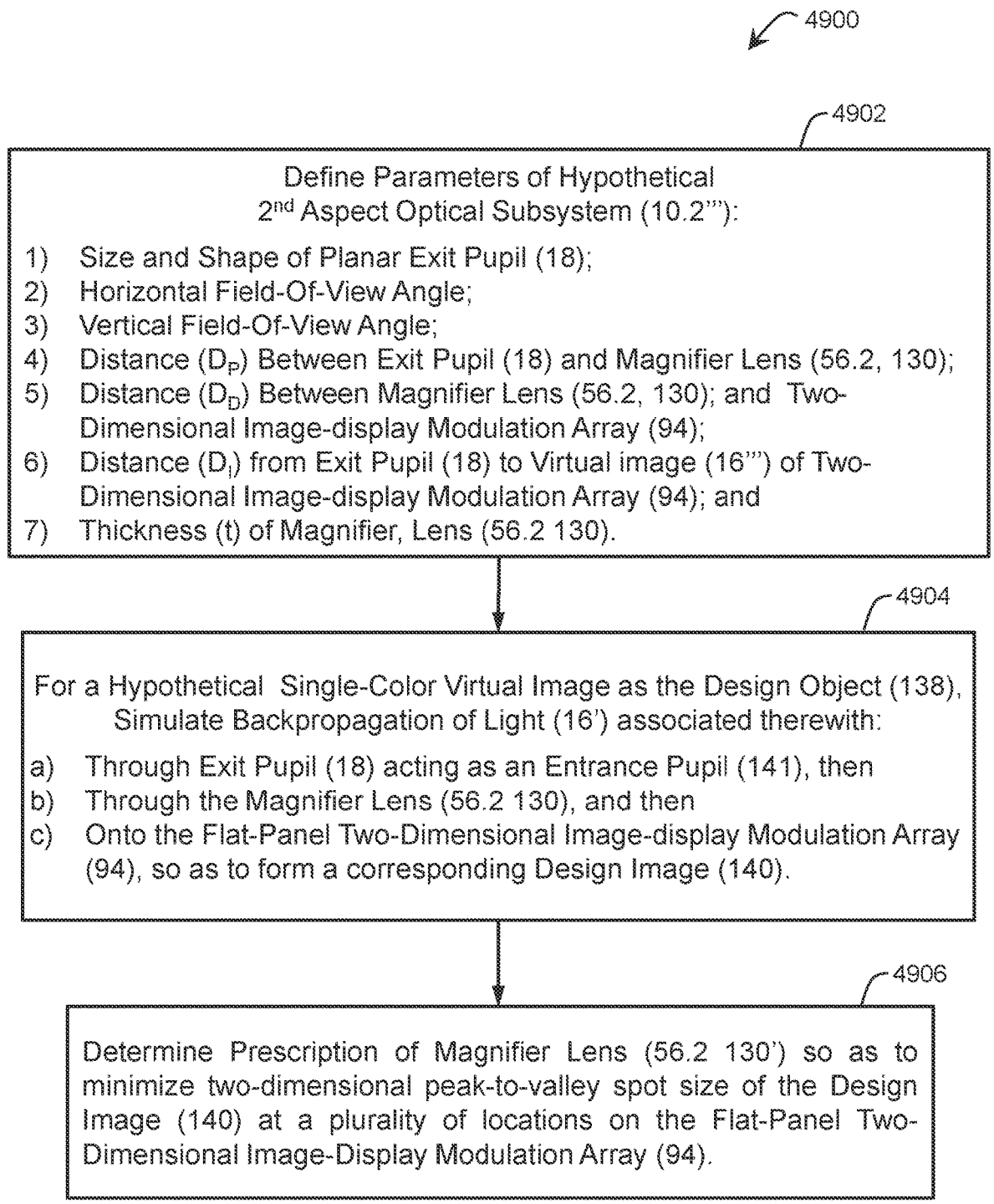
FIG. 49 illustrates an embodiment of a process for determining the prescription of a magnifier lens of a near-eye display system.
Figure 50:
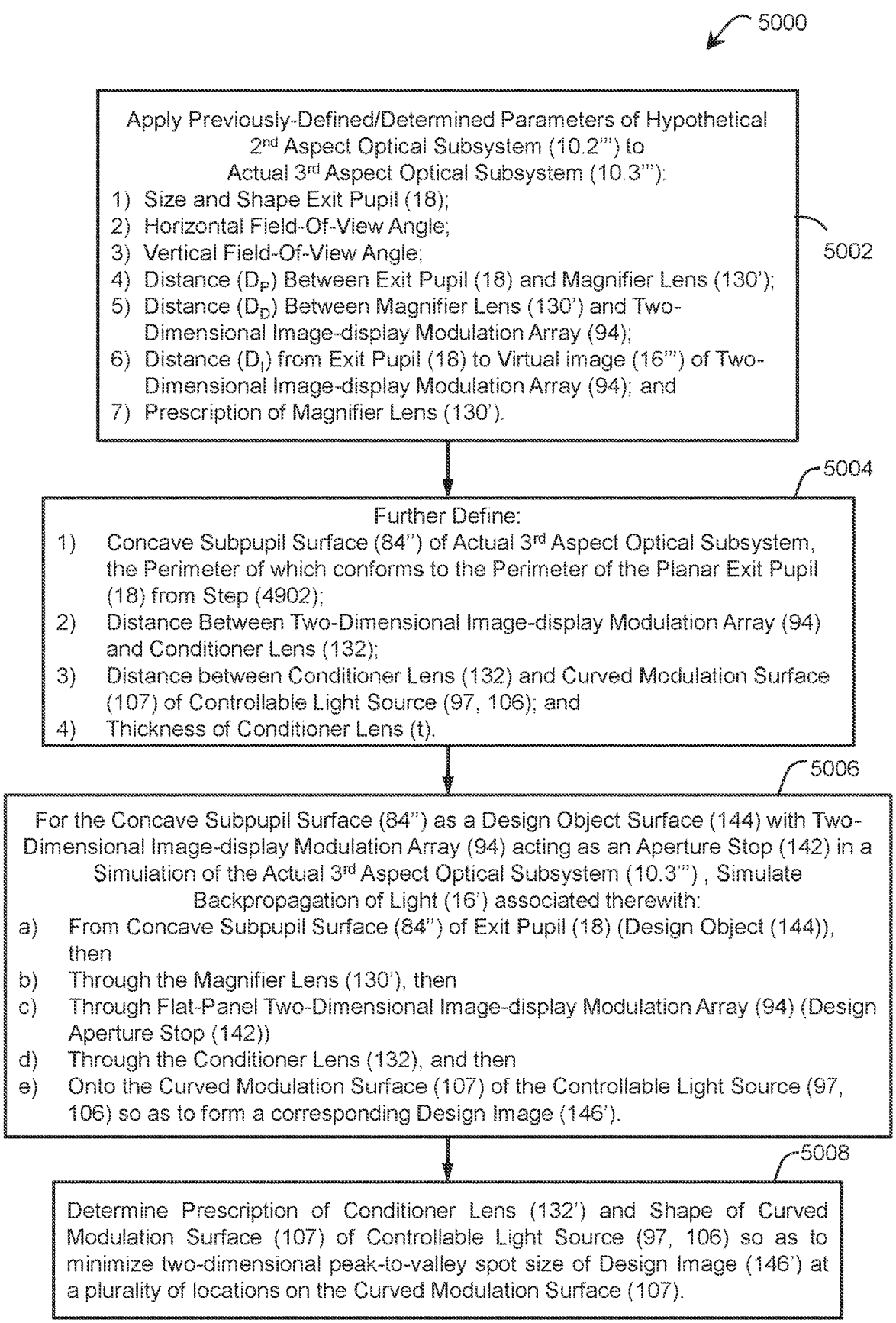
FIG. 50 illustrates an embodiment of a process for determining a prescription of a conditioner lens of a near-eye display system.

More particularly, in respect of the second- 10.2, third- 10.3 or fourth- 10.4 aspect near-eye display system 10, 10.2, 10.3, 10.4, in accordance with one method, the prescription of the associated second convergent magnifier lens 56.2', $L_2$ is first independently determined in the context of a hypothetical embodiment 10.2''' of a second-aspect near-eye display system 10.2, 10.2''' illustrated in FIG. 48 in accordance with a magnifier-lens prescription design process 4900 illustrated in FIG. 49, and then the prescription of the associated the associated conditioner lens 102, 102', $L_1$ is determined in the context of the second- 10.2, third- 10.3 or fourth- 10.4 aspect near-eye display system 10, 10.2, 10.3, 10.4, in accordance with a conditioner-lens prescription design process 5000 illustrated in FIG. 50, with the conditioner lens 102, 102', $L_1$ in cooperation with the second convergent magnifier lens 56.2', $L_2$ prescribed by the magnifier-lens prescription design process 4900, supra.

More particularly, referring to FIG. 48, for purposes of illustration—but otherwise not limiting to a particular aspect of the near-eye display system 10, 10.2, 10.3, 10.4—the hypothetical embodiment 10.2''' of the second-aspect near-eye display system 10.2, 10.2''' comprises a flat-panel two-dimensional image-display modulation array 94 illustrated in cooperation with a Fresnel magnifier lens 56.2, $L_2$, 130. The flat-panel two-dimensional image-display modulation array 94 is illuminated by a flat-panel two-dimensional light-source array 98 (not illustrated), wherein in FIG. 48, six locations of a source image 16 on the flat-panel two-dimensional image-display modulation array 94 are shown, with each being illuminated from three different directions, resulting in three light rays emanating from each of the six locations. Light 16' from the flat-panel two-dimensional light-source array 98 propagates through the Fresnel magnifier lens 56.2, $L_2$, 130 and onto an associated planar exit pupil 18 at three corresponding locations that are responsive to the direction of the corresponding light rays from the corresponding six locations on the flat-panel two-dimensional image-display modulation array 94. Proximate surfaces of the Fresnel magnifier lens 56.2, $L_2$, 130 are located at distances $D_P$ from the exit pupil 18 and $D_D$ from the flat-panel two-dimensional image-display modulation array 94, respectively, with the Fresnel magnifier lens 56.2, $L_2$, 130 located therebetween. Accordingly, the three light rays from each of six locations on the flat-panel two-dimensional image-display modulation array 94 are associated with a corresponding six light rays at each of three locations in the exit pupil 18 associated with a corresponding exit-pupil image 18', the latter of which is in turn associated with a virtual image 16''' of the flat-panel two-dimensional image-display modulation array 94 located at a distance of $D_1$ from the exit pupil 18, responsive to the location of the Fresnel magnifier lens 56.2, $L_2$, 130, i.e. responsive to distances $D_P$ and $D_D$, and to the focal length of the Fresnel magnifier lens 56.2, $L_2$, 130.

Notwithstanding that in actuality, light 16' associated with the virtual image 16''' propagates from the flat-panel two-dimensional image-display modulation array 94 (that displays an associate source image 16) to the exit pupil 18, the magnifier-lens prescription design process 4900 instead follows the light 16' in reverse from the virtual image 16''' to the exit pupil 18, then through the Fresnel magnifier lens 56.2, $L_2$, 130 to the flat-panel two-dimensional image-display modulation array 94, thereby effectively treating the virtual image 16''' as a design object 138 being imaged by the hypothetical embodiment 10.2''' of the second-aspect near-eye display system 10.2, 10.2''', and effectively treating the associated resulting light distribution at the flat-panel two-dimensional image-display modulation array 94 as the design image 140 of that design object 138. In optical design, an object and its image are conjugates of each other, supporting a design option of selecting either as the "object" in the associated a design exercise. By analyzing the propagation of light in reverse from that which would occur in the actual second-aspect near-eye display system 10.2, 10.2''', the field of view and the size and location of the exit pupil 18 can be readily established as fixed parameters in cooperation with the virtual image 16''' being treated as the design object 138, with the operational exit pupil 18 therefore being treated instead as a design entrance pupil 141, which provides for a relatively-more efficient prescription design process than if the locations of the design object 138 and the design image 140 were reversed so as to be in correspondence with the causality of the actual second-aspect near-eye display system 10.2, 10.2'''.

More particularly, referring to FIG. 49, in accordance with one set of embodiments, and in the context of the hypothetical-embodiment second-aspect near-eye display system 10.2, 10.2''', the magnifier-lens prescription design process 4900 commences in step (4902) with the definition of the following parameters of the hypothetical-embodiment second-aspect near-eye display system 10.2, 10.2''': 1) the size and shape of the planar exit pupil 18, i.e. so as to be sufficient to overlay a range of positions of the eye pupil 38 for a range of users 22; 2) the horizontal field-of-view angle subtended in a horizontal direction at the exit pupil 18 by the range of light rays associated with the virtual image 16'''; 3) the vertical field-of-view angle subtended in a vertical direction at the exit pupil 18 by the range of light rays associated with the virtual image 16'''; 4) the distance Dr between the exit pupil 18 and a proximate surface of the Fresnel magnifier lens 56.2, $L_2$, 130; 5) the distance $D_D$ between the Fresnel magnifier lens 56.2, $L_2$, 130 and the flat-panel two-dimensional image-display modulation array 94; 6) the distance $D_1$ from the exit pupil 18 to the virtual image 16''' of the flat-panel two-dimensional image-display modulation array 94; and 7) the thickness t of the Fresnel magnifier lens 56.2, $L_2$, 130. For example, in one embodiment, a 20 millimeter diameter circular exit pupil 18 (the design entrance pupil) is defined, through which pass the optical rays from a rectangular virtual image 16''' (the design object 138) positioned 2 meters ($D_1$) forward of the exit pupil 18, the center of which virtual image 16''' is aligned with the center of the exit pupil 18 along an associated optical axis 36, for which the virtual image 16''' subtends a 76 degree horizontal by 46 degree vertical field of view with respect to the exit pupil 18 and the associated optical axis 36, wherein the combination of the size of the exit pupil 18 and the associated field of view provide for a favorable viewing experience for the user 22. A 1.5 millimeter thick (t) Fresnel magnifier lens 56.2, $L_2$, 130 comprising a generally flat optical acrylic substrate is positioned 22 millimeters forward (Dr) of the exit pupil 18 so as to provide sufficient space for corrective glasses, and a flat flat-panel two-dimensional image-display modulation array 94 (the design image plane) is defined an additional 32 millimeters ($D_D$) beyond the Fresnel magnifier lens 56.2, $L_2$, 130 so as to provide for a relatively compact assembly of an associated third-embodiment third-aspect near-eye display system 10, 10.3, 10.3'''.

The magnifier-lens prescription design process 4900 provides for determining the prescription of the Fresnel magnifier lens 56.2, $L_2$, 130 that will provide for forming an optimal design image 140 of the virtual image 16''' at the location of the flat-panel two-dimensional image-display modulation array 94 based upon the assumption that the virtual image 16''' of the flat-panel two-dimensional image-display modulation array 94 formed by the Fresnel magnifier lens 56.2, $L_2$, 130 will be similarly optimized, wherein as used herein, the term optimized is associated with a configuration associated with an extremum (e.g. minimum) of an associated merit, or objective, function. Accordingly, following the definition in step (4902) of the parameters of the hypothetical-embodiment second-aspect near-eye display system 10.2, 10.2''', in step (4904), the operation of the hypothetical-embodiment second-aspect near-eye display system 10.2, 10.2''' is simulated using optical design software, for example, Zemax optical design software, to as to provide for optimizing—in step (4906)—the optical parameters associated with one or both surfaces of the Fresnel magnifier lens 56.2, $L_2$, 130, for example, under the constraint of limiting the one or both surfaces to vary only in second and higher order aspheric parameters (with the general radius and conic parameters being of minor concern), for example, with the optimization providing for minimizing an optical design merit function given by the two-dimensional peak-to-valley spot size of the design image 140 formed at multiple locations at the flat-panel two-dimensional image-display modulation array 94, generally as a weighted sum of two-dimensional peak-to-valley spot sizes from various different locations. In accordance with one set of embodiments, each of the different locations is weighted equally. For example, during the optical design simulation, a light distribution at the planar subpupil surface 84, 84' of the exit pupil 18 is back-propagated through the Fresnel magnifier lens 56.2, $L_2$, 130 being optimized, and then onto the associated planar surface of the flat-panel two-dimensional image-display modulation array 94 so as to form a corresponding design image 140, from which the associated optical design merit function is evaluated. In accordance with one set of embodiments, during the optimization process, both distortion and lateral chromatic aberration are ignored in favor of a subsequent reliance upon electronic predistortion and electronic chromatic precorrection of the image 16 to be displayed on the flat-panel two-dimensional image-display modulation array 94 of the associated near-eye display system 10, 10.2, 10.2', 10.2", 10.3, 10.3', 10.3", 10.3''', 10.4, 10.4', 10.4".

Accordingly, the simulated propagation of optical rays from the design object 138 (i.e. the virtual image 16''') through the exit pupil 18 acting as an entrance pupil for the simulation, then through the Fresnel magnifier lens 56.2, $L_2$, 130, forms a simulated design image 140 at the location of the flat-panel two-dimensional image-display modulation array 94, with rays generally converging appropriately at multiple representative points as a design image 140 of the rectangular design object 138. As a result of the optimization, the design image 140 at the location of the flat-panel two-dimensional image-display modulation array 94 subtends a diagonal measurement of approximately 39 millimeters. Accordingly, the use of a flat-panel two-dimensional image-display modulation array 94 of that diagonal measurement at the distance $D_D$ from the designed Fresnel magnifier lens 56.2, $L_2$, 130 in the hypothetical-embodiment second-aspect near-eye display system 10.2, 10.2''' will provide for a virtual image 16''' having a diagonal field of view similar to the diagonal field of view associated with the 76 degree horizontal by 46 degree vertical field of view design parameters, subject to the impact of geometric distortion.

In respect of the determination, or optimization, of the prescription of the first 56.1', $L_1$, second 56.2', $L_2$, and third 56.3', $L_3$ convergent magnifier lenses of the first-aspect near-eye display system 10, 10.1, the magnifier-lens prescription design process 4900 can be simultaneously applied to all three convergent magnifier lenses 56.1', $L_1$; 56.2', $L_2$; 56.3', $L_3$ that act collectively as a magnifier lens of the first-aspect near-eye display system 10, 10.1, by searching with respect to a composite of the associated parameters from all three convergent magnifier lenses 56.1', $L_1$; 56.2', $L_2$; 56.3', $L_3$, in view of the associated modulation surface 92, 92' being located within the associated first-aspect optical subsystem 14, 14.1 at an associated aperture stop 28.

Accordingly, the magnifier-lens prescription design process 4900 provides for using common optical design approaches to design/prescribe an optimized Fresnel magnifier lens 56.2, $L_2$, 130, 130' that will provide for forming a virtual image 16'''—having a relatively large field of view—of a relatively small flat-panel two-dimensional image-display modulation array 94 through a relatively-large exit pupil 18, subject to the availability of sufficient light 16' emanating from such flat-panel two-dimensional image-display modulation array 94 that is sufficient to fully illuminate the exit pupil 18.

Referring to FIGS. 47 and 50, the conditioner-lens prescription design process 5000 provides for determining the prescription of the Fresnel conditioner lens 56.1, $L_1$, 132 of the associated third-embodiment second-aspect optical subsystem 14, 14.2''' incorporating the optimized Fresnel magnifier lens 56.2, $L_2$, 130, 130' that resulted from the magnifier-lens prescription design process 4900. More particularly, in step (5002), and referring again to FIG. 47, the associated third-embodiment third-aspect near-eye display system 10, 10.3, 10.3''' is first configured in accordance with the parameters of the hypothetical-embodiment second-aspect near-eye display system 10.2, 10.2''' that were defined during, or determined by, the magnifier-lens prescription design process 4900, supra. Furthermore, in step (5004), additional parameters peculiar to the third-embodiment second-aspect optical subsystem 14, 14.2''', including 1) the curvature and extent of the surface 18" of the exit pupil 18 and the associated concave-curved subpupil surface 84, 84" thereat; 2) the distance $D_C$ (illustrated in FIG. 19) between the flat-panel two-dimensional image-display modulation array 94 and the Fresnel conditioner lens 56.1, $L_1$, 132; 3) and the distance $D_S$ (illustrated in FIG. 19) between the Fresnel conditioner lens 56.1, $L_1$, 132 and the curved modulation surface 92, 92" of the curved two-dimensional light-source array 106 of the associated subpupil modulator 30, 30.3; and 4) the thickness t of the Fresnel conditioner lens 56.1, $L_1$, 132. For example, further to the embodiment used to illustrate the magnifier-lens prescription design process 4900, supra, the 20 millimeter diameter of the perimeter of exit pupil 18 defined in step (4902) forms the perimeter of a concave geometric surface construct 82, 82' that bounds a concave-curved subpupil surface 84, 84" of 12.5 millimeter radius representing a generalized radius of the eyeball of the human eye 20. Furthermore, a 1.5 millimeter thick Fresnel conditioner lens 132 is positioned 8 millimeters ($D_C$) beyond the flat-panel two-dimensional image-display modulation array 94, i.e. by a distance that is sufficient to preclude visibility of the associated Fresnel structure or structures 134' of the Fresnel conditioner lens 56.1, $L_1$, 132 as viewed through the optimized Fresnel magnifier lens 56.2, $L_2$, 130, 130', and sufficient to preclude possible moiré effects between the Fresnel structure or structures 134' of the Fresnel conditioner lens 56.1, $L_1$, 132 and the flat-panel two-dimensional image-display modulation array 94. Yet further, the curved modulation surface 92, 92" of a curved two-dimensional light-source array 106 is located 42 millimeters ($D_S$) beyond the Fresnel conditioner lens 56.1, $L_1$, 132.

Notwithstanding that in actuality light 16' associated with the exit-pupil image 18' propagates from the curved two-dimensional light-source array 106 to the exit pupil 18, the conditioner-lens prescription design process 5000 instead follows the light 16' in reverse from the surface 18" of the exit pupil 18, then through the optimized Fresnel magnifier lens 56.2, $L_2$, 130, 130', then through the flat-panel two-dimensional image-display modulation array 94 acting as a design aperture stop 142, then through the Fresnel conditioner lens 56.1, $L_1$, 132, and finally imaged thereby onto the curved modulation surface 92, 92" of the curved two-dimensional light-source array 106 of the associated subpupil modulator 30, 30.3, thereby effectively treating the concave-curved subpupil surface 84, 84" as a design object surface 144 being imaged by the third-embodiment third-aspect near-eye display system 10, 10.3, 10.3''', with the associated resulting light distribution being imaged at the curved modulation surface 92, 92" that is effectively treated as the associated design image surface 146 of that design object surface 144, wherein the flat-panel two-dimensional image-display modulation array 94 also functions as an associated aperture stop 28 of the associated third-embodiment second-aspect optical subsystem 14, 14.2''' because any subpupil location will pass light 16' from all locations on the flat-panel two-dimensional image-display modulation array 94. Accordingly, based upon the results of the magnifier-lens prescription design process 4900, for this example, the diameter of the aperture stop 28 is approximately 39 millimeters, which corresponds to the diagonal measurement, supra, of the flat-panel two-dimensional image-display modulation array 94.

For example, FIG. 47 illustrates ray tracings of three sets of light rays emanating from three different locations along the design object surface 144 (i.e. the concave-curved subpupil surface 84, 84")—ranging from 0 to 10 millimeters in the vertical direction—through the third-embodiment second-aspect optical subsystem 14, 14.2'''. Although the full 10 millimeter range of the vertical subpupil surface is likely unnecessary to view the entire image because—per the design parameters established in step (4902)—the vertical field of view is smaller than the horizontal field of view, the full vertical extent has been illustrated in order to illustrate the prospective propagation of peripheral light rays through the third-embodiment second-aspect optical subsystem 14, 14.2'''.

The third-embodiment third-aspect near-eye display system 10, 10.3, 10.3''' incorporating the optimized Fresnel magnifier lens 56.2, $L_2$, 130, 130' generates a virtual image 16''' of the flat-panel two-dimensional image-display modulation array 94 through the exit pupil 18 of the associated third-embodiment second-aspect optical subsystem 14, 14.2''' of the same image quality as achieved by the magnifier-lens prescription design process 4900.

The conditioner-lens prescription design process 5000 provides for determining both the prescription of an optimized Fresnel conditioner lens 56.1, $L_1$, 132' and the shape of the associated design image surface 146 (the curved modulation surface 92, 92'') that, in cooperation with the optimized Fresnel magnifier lens 56.2, $L_2$, 130, 130', will provide for forming an optimal real design image 146' of the design object surface 144 (the concave-curved subpupil surface 84, 84'') at the design image surface 146 (the curved modulation surface 92, 92''), based upon the assumption that the exit-pupil image 18'—at the design object surface 144 (the concave-curved subpupil surface 84, 84'')—of the design image surface 146 (the curved modulation surface 92, 92'') by the optimized Fresnel conditioner lens 56.1, $L_1$, 132', in cooperation with the optimized Fresnel magnifier lens 56.2, $L_2$, 130, 130', will be similarly optimized, wherein as used herein, the term optimized is associated with a configuration associated with an extremum (e.g. minimum) of an associated merit, or objective, function, e.g. peak-to-valley spot size. Accordingly, following the definition in steps (5002) and (5004) of the parameters of the third-embodiment second-aspect optical subsystem 14, 14.2''', in step (5006), the operation of the third-embodiment second-aspect optical subsystem 14, 14.2''' is simulated using optical design software, for example, Zemax optical design software, so as to provide for optimizing—in step (5008)—higher order Fresnel prescriptions of both sides of the Fresnel conditioner lens 132, for example, under the constraint of limiting the one or both surfaces to vary only in second and higher order aspheric parameters (with the general radius and conic parameters being of minor concern), and to provide for optimizing—also in step (5008)—the radius and conic constant of the curved modulation surface 92, 92'', using an optimization merit function designed to minimize the spot size of the images formed on the curved modulation surface 92, 92'' from a variety of locations on the design object surface 144 (the concave-curved subpupil surface 84, 84''), for example, with the optimization providing for minimizing an optical design merit function given by the two-dimensional peak-to-valley spot size of the design image 146' formed at multiple locations at the curved modulation surface 92, 92'' of the curved two-dimensional light-source array 106, generally as the weighted sum of the two-dimensional peak-to-valley spot sizes from the different locations. In accordance with one set of embodiments, each of the different locations is weighted equally.

For example, during the optical design simulation, a light distribution at the concave-curved subpupil surface 84, 84'' of the exit pupil 18 acting as the design object surface 144 is back-propagated through the optimized Fresnel magnifier lens 56.2, $L_2$, 130, 130', then through the flat-panel two-dimensional image-display modulation array 94 acting as the design aperture stop 142, then through the Fresnel conditioner lens 56.1, $L_1$, 132 being optimized, and then onto the curved modulation surface 92, 92'' of the curved two-dimensional light-source array 106 acting as the design image surface 146, so as to form a corresponding design image 146', from which the associated optical design merit function is evaluated. Although functioning like a collimator or condenser lens, the optimized Fresnel conditioner lens 56.1, $L_1$, 132' will not necessarily strictly conform to such classical configuration, but instead is configured to best support an imaging relationship between the curved modulation surface 92, 92'' and the concave-curved subpupil surface 84, 84'' of the third-embodiment second-aspect optical subsystem 14, 14.2''', while providing for fully illuminating the associated flat-panel two-dimensional image-display modulation array 94.

The results of the optical design simulation of the conditioner-lens prescription design process 5000 indicate that the central image location provided for a relatively better imaging relationship between the curved modulation surface 92, 92'' and the concave-curved subpupil surface 84, 84'' than did locations that were relatively peripheral thereto. In the context of the third-embodiment third-aspect near-eye display system 10, 10.3, 10.3''', this relatively-higher image quality at the relatively-central locations may result in a sufficiently-high depth-of-field and image clarity so that the associated Fresnel structure or structures 134' becomes visible to the user 22. If so, this can be mitigated by providing for a relatively-lower image quality at relatively-central locations while relatively-more-highly weighting relatively-peripheral locations that are inherently more blurry, relative to the weighting of relatively-central locations. More generally, relatively weighting of various locations is based upon the particular intended imaging performance of the associated near-eye display system 10, 10.2, 10.2', 10.2'', 10.3, 10.3', 10.3'', 10.3''', 10.4, 10.4', 10.4'' being optimized.

When optimizing any optical system one can allow any parameter of that system to vary as a parameter to be optimized. For example, for optical elements for which thickness is not constrained to a fixed value (e.g. other than Fresnel lenses having predetermined thicknesses) a thickness of an optical element at any point on the element can be constrained so as to either, or both, not exceed a maximum value nor be less than a minimum value, while providing the associated optimization process with the flexibility to vary the element thickness within that range. The prescription of a conventional (i.e. non-Fresnel) optical element is actually a variation in thickness as a function of distance from an optical axis. Accordingly, it is common practice to provide that flexibility to the optimization process while constraining the thickness to be within reasonable limits, for example, greater than a predetermined minimum positive thickness, and less than a maximum thickness associated with a lens that would otherwise either be non-manufacturable or excessively heavy or bulky. These parameters with associated limitations are included in the optimization process and associated constraints, along with the general image quality functionality, for example, the spot size calculations that are included in the associated merit function. In practice, a "centroid" image ray is computed for each field (object) location and then the merit function is evaluated for a series of test field locations in proximity to that centroid, wherein how many and how distributed are accordance with one or more parameters of the optical design software. The optical design software then calculates the distance between each test ray arrival location at the image surface and the centroid location to build up a myriad of samples, for example, with ultimately thousands of rays being traced from the various locations.

Referring again to FIG. 47, the shape of the optimized curved modulation surface 92, 92''' resulting from the conditioner-lens prescription design process 5000 is generally a paraboloid. Despite optimization, optical rays from subpupil point locations on the concave-curved subpupil surface 84, 84″ do not fully converge at corresponding point locations on the corresponding associated optimized curved modulation surface 92, 92‴, with decreasing quality toward the periphery thereof. As a consequence, any controllable light source 97 placed relatively more peripherally from the optical axis 36 on the curved modulation surface 92, 92″ will not form an ideal corresponding image as an exit subpupil 32 on the concave-curved subpupil surface 84, 84″. These imperfectly formed exit subpupils 32 would be accounted for in the design of the associated Active Subpupil Region (ASR) 72 of the resulting near-eye display system 10, 10.2, 10.2′, 10.2″, 10.3, 10.3′, 10.3″, 10.3‴, 10.4, 10.4′, 10.4″ because in some cases they might be larger than the eye pupil 38, or they might overlap other exit subpupils 32. However, as is typical with on-axis optical systems generally, the relatively central region of the third-embodiment second-aspect optical subsystem 14, 14.2‴ provides better imaging forming properties than relatively peripheral regions. Accordingly, the Active Subpupil Region (ASR) 72 can be designed to be relatively small in the central region re of the concave-curved subpupil surface 84, 84″ proximate to the optical axis 36, and because this is the region that is primarily occupied by the eye pupil 38 of the user 22 when viewing the virtual image 16‴, the ability to improve spatial clarity by providing an Active Subpupil Region (ASR) 72 smaller than the eye pupil 38 of the user 22 even in this relatively smaller region can be beneficial.

Although generally a Fresnel surface 134 may be applied to one or both of the opposing surfaces of the 1.5 millimeter thick Fresnel magnifier lens 130, the results of the associated optimization processes—i.e. the value(s) of the associated merit function(s)—have been found to substantially better if a high order aspheric Fresnel surface 134 can be applied to both surfaces, rather than just to one, particularly if a relatively high magnification is desired, notwithstanding that two opposing Fresnel surfaces 134—each with a corresponding Fresnel structure 134′,—will produce more scattered extraneous light $16^{iv}$ than a would a single Fresnel surface 134, because the use of modulated subpupils 32′ provides for reducing or minimizing scattered extraneous light $16^{iv}$ that would otherwise be visible through the eye pupil 38.

Alternatively, referring to FIG. 51, in accordance with one set of embodiments, the Fresnel magnifier lens 56.2, $L_2$, 130, 148 may comprise a hybrid lens 148 comprising a conventional convex refractive surface 150 on a front side 148.1 thereof, and a Fresnel surface 134 on the rear side 148.2 thereof, wherein when incorporated in the third-embodiment third-aspect near-eye display system 10, 10.3, 10.3‴, the Fresnel magnifier lens 56.2, $L_2$, 130, 148 is oriented with the front side 148.1 facing the exit pupil 18 so as to mitigate against scattering of extraneous light $16^{iv}$ that would otherwise occur with a front-facing Fresnel surface 134 instead of the front-facing conventional convex refractive surface 150.

In practice, the ideal profile of a Fresnel surface 134 of a Fresnel lens 130, 132 is determined through optical design as a continuous function based upon the propagation of rays that extend to the underlying planar surface of the associated Fresnel surface 134, after which the manufacturer of the Fresnel lens 130, 132 would import that information, along with other parameters, into associated CNC diamond turning software to determine the corresponding associated actual groove structure profile of the Fresnel structure 134′.

The use of Fresnel lenses 130, 132 in the third-embodiment second-aspect optical subsystem 14, 14.2‴ provides for a relatively compact, light-weight, wide field-of-view third-embodiment third-aspect near-eye display system 10, 10.3, 10.3‴ with a relatively-large exit pupil 18, which together with the eye-tracking subsystem 42, the subpupil modulation controller 50, and the curved two-dimensional light-source array 106 arranged to conform to the optimized curved modulation surface 92, 92‴, and the associated control thereof in accordance with an associated subpupil modulation scheme 70, 70.1, 70.2, 70.3, supra, provides for a third-embodiment third-aspect near-eye display system 10, 10.3, 10.3‴ with relatively higher contrast and relatively-higher clarity of the relatively-central region of the image 16, using substantially less illumination power than would a near-eye display system that did not otherwise use a controllable light source 97.

The actual size of the exit subpupils 32 in a near-eye display system 10, 10.1, 10.2, 10.2′, 10.2″, 10.3, 10.3′, 10.3″, 10.3‴, 10.4, 10.4′, 10.4″ will depend upon a plurality of associated design factors and considerations. For example, an exit subpupil 32 made so small as to significantly increase the depth of field of the image through that exit subpupil 32 may reveal structures located relatively distally along the optical axis 36 from the flat-panel two-dimensional image-display modulation array 94—such as the structures of the Fresnel magnifier lens 56.2, $L_2$, 130 or the Fresnel conditioner lens 56.1, $L_1$, 132,—overlayed with the image 16. To the other extreme, an exit subpupil 32 larger than the eye pupil 38 will not provide for the improvement in clarity of the image 16 through that exit subpupil 32 that would otherwise be possible. The actual size of an exit subpupil 32 may be further dependent on the imaging capabilities of the optical subsystem 14, 14.1, 14.2, 14.2′, 14.2″, 14.2‴ to form a proper image of the associated subpupil modulator 30, i.e. either the flat-panel two-dimensional modulation array 58 or the associated controllable light source 97. Indeed the associated light-modulating pixels 60/light source elements 100 of the subpupil modulator 30 themselves will in practice each span a finite size, rather than being point pixel or source elements. Accordingly, while any reduction of light 16′ through the exit pupil 18 of the optical subsystem 14, 14.1, 14.2, 14.2′, 14.2″, 14.2‴ by deactivating at least some of an array of relatively smaller exit subpupils 32 will provide improvements in contrast and power usage, and the degree of such benefits, and the possibility of improved clarity, will be dependent on the actual implementation of the subpupil modulator 30, 30.1, 30.2, 20.3, 30.4.

Each of the second-, third- and fourth-aspect near-eye display systems 10, 10.2, 10.3, 10.4 provide for using a subpupil modulator 30, 30.2, 30.3, 30.4 incorporating a controllable light source 97 that cooperates with an associated modulation surface 92 to provide for generating a plurality of exit subpupils 32 and an associated subpupil surface 84, wherein the modulation 92 and subpupil 84 surfaces are images of each other as provided for by the associated optical subsystem 14, 14.2, 14.2′, 14.2″, 14.2‴, which also provides for the controllable light source 97 to illuminate the entirety of an associated flat-panel two-dimensional image-display modulation array 94 for each of the exit subpupils 32. The associated conditioner lens 102, 102′, $L_1$ provides for gathering light 16′ from the relatively-distant (both with respect to along the optical axis 36 and transverse thereto) controllable light source 97 in order to provide illuminating the entirety of the associated flat-panel two-dimensional image-display modulation array 94 for each of the exit subpupils 32.

Accordingly, the associated volume of space between the controllable light source 97 and the flat-panel two-dimensional image-display modulation array 94 that provides for this functionality can be considerable, and potentially limiting to the prospective compactness of the associated second-, third- or fourth-aspect near-eye display system 10, 10.2, 10.2', 10.2", 10.3, 10.3', 10.3", 10.4, 10.4', 10.4".

Referring to FIGS. 52-53, a waveguide projector 152—modeled as a flat-panel two-dimensional image-display array 52 in cooperation with an ideal paraxial lens 154 located one focal-length F therefrom—provides for generating, per the model illustrated in FIG. 53, what would be a far-field light distribution 156 of light 16' emanating from a flat-panel two-dimensional image-display array 52, i.e. a plurality of sets of collimated rays, each ray of each set emanating from a corresponding light-emitting image-display pixel 54 effective point source of the flat-panel two-dimensional image-display array 52, and propagating at an angle from the optical axis 36 that is responsive to the lateral offset of the corresponding associated light-emitting image-display pixel 54 point source. Accordingly, the far-field light distribution 156 provides a virtual image of the flat-panel two-dimensional image-display array 52 through the exit pupil 158 of the waveguide projector 152. In one set of embodiments, the waveguide projector 152 comprises a conventional optical system placed in front of a flat panel of image-display pixels to project collimated light from those pixels as a virtual image through the exit pupil of that optical system, which light is thereafter directed or "coupled" into an optical waveguide where the light travels through multiple internal reflections until interacting with features within the waveguide which redirect or "decouple" the collimated light out of the waveguide into an expanded exit pupil 158. If the associated exit pupil 158 can be made sufficiently large to fill a flat-panel two-dimensional image-display modulation array 94 of the second- or third-aspect near-eye display system 10, 10.2, 10.2', 10.2", 10.3, 10.3', 10.3", 10.3''', then the light-emitting image-display pixels 54 of the waveguide projector 152 can act as a flat-panel two-dimensional light-source array 98 of a controllable light source 97 of an associated subpupil modulator 30, 30.2 of the second-aspect near-eye display system 10, 10.2, 10.2', 10.2", with the light from each controllable light source 97 emerging substantially collimated as is typical of waveguide projectors 152. For example, U.S. Pat. Nos. 10,732,415 and 10,627,565—each incorporated by reference in its entirety—disclose a substrate-guide optical device, and a waveguide display assembly, respectively, either of which could be used as a waveguide projector 152 in cooperation with a second-aspect optical subsystem 14, 14.2, 14.2', 14.2", 14.2''' of a second- or third-aspect near-eye display system 10, 10.2, 10.2', 10.2", 10.3, 10.3', 10.3", 10.3''' so as to provide for improving the compactness thereof, wherein, for application to a second-aspect near-eye display system 10, 10.2, 10.2', 10.2", the waveguide projector 152 would also supplant the conditioner lens 102, 102', L$_1$, and for application to a third-aspect near-eye display system 10, 10.3, 10.3', 10.3", the waveguide projector 152 would be used in cooperation with the associated conditioner lens 102, 102', L$_1$, the latter of which would provide for conditioning the collimated light from the waveguide projector 152 so as to provide for generating—in cooperation with the associated convergent magnifier lens 56.2', 130, 130', L$_2$—a concave-curved subpupil surface 84, 84" at the exit pupil 18, or an approximation thereto.

Figure 54:
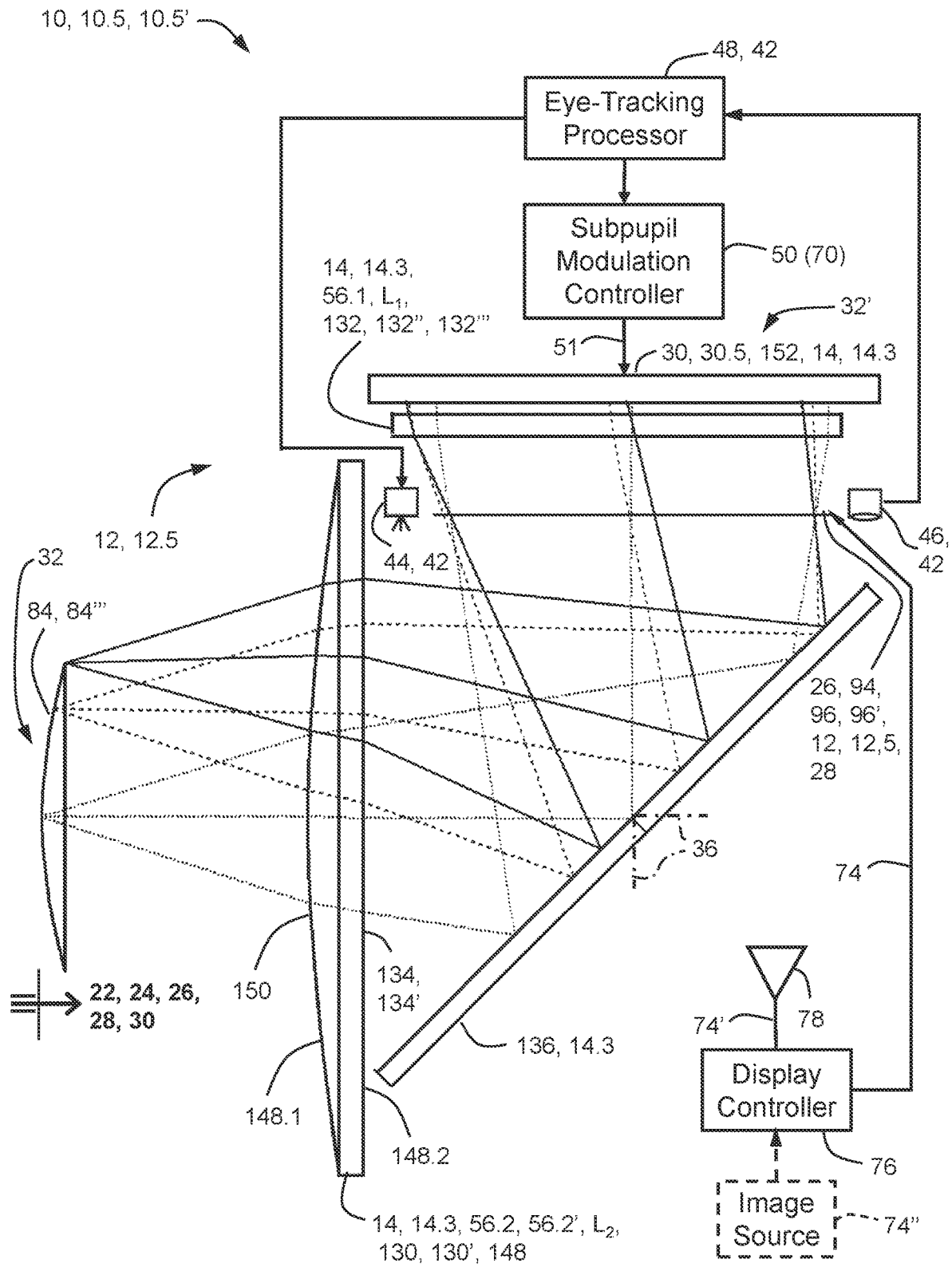
FIG. 54 illustrates a schematic block diagram of a first embodiment of a fifth aspect of a near-eye display system incorporating a waveguide projector light source that defines an array of modulated subpupils thereof, in cooperation with a separate flat-panel array of light-modulating image-display pixels, further illustrating a third aspect of an associated optical subsystem incorporating the optics of the waveguide projector in cooperation with an associated conditioner lens and a magnifier lens, the conditioner and magnifier lenses of which incorporate at least one Fresnel surface, further illustrating an incorporation of the hybrid magnifier lens illustrated in FIG. 51.
Figure 55:
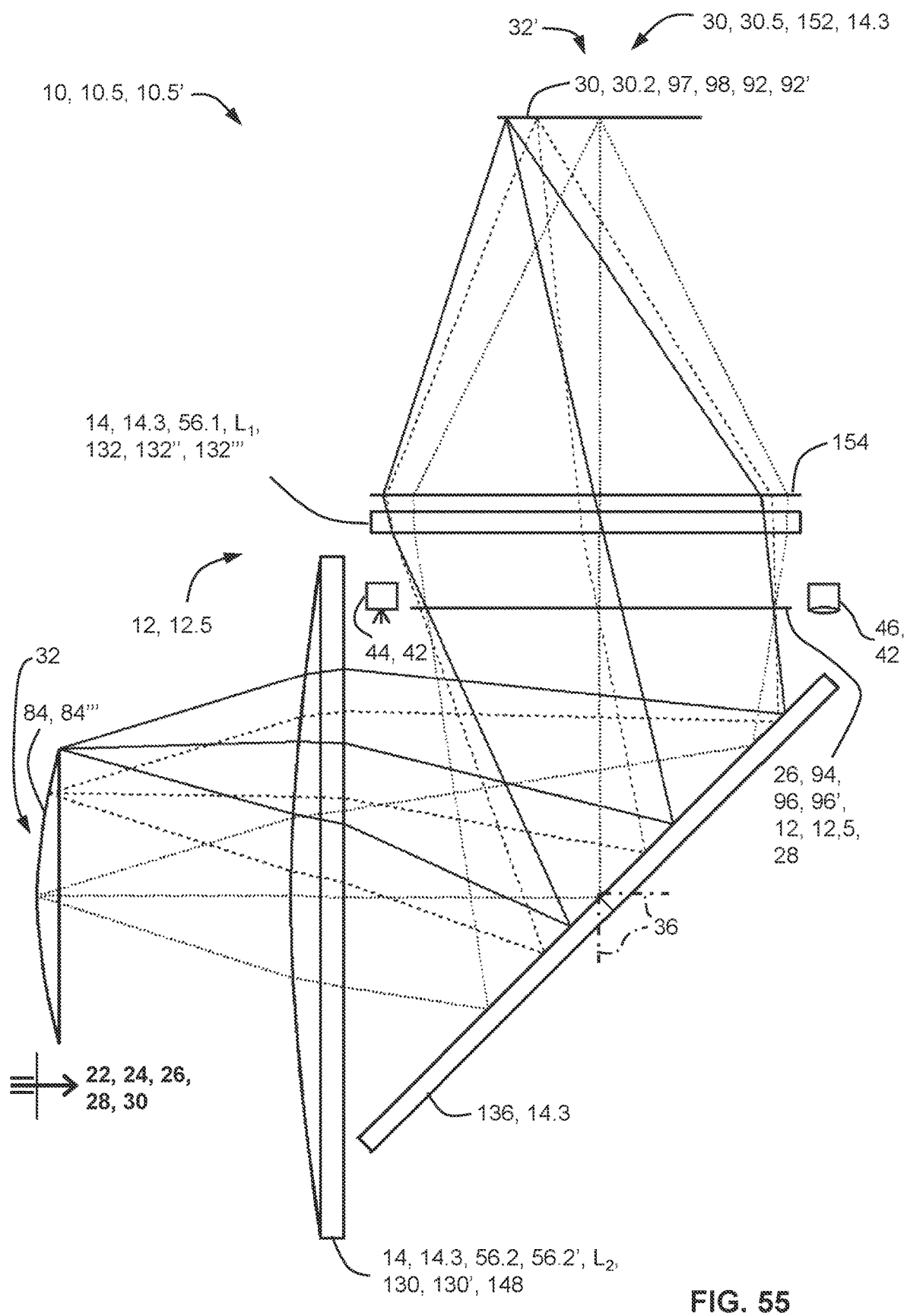
FIG. 55 illustrates a schematic block diagram of the first embodiment of a fifth aspect of a near-eye display system as illustrated in FIG. 54, but with the associated waveguide projector replaced with the model thereof illustrated in FIG. 53.

Referring to FIGS. 54 and 55, a first embodiment 10.5' of a fifth-aspect near-eye display system 10, 10.5, 10.5' is similar to the third-embodiment third-aspect near-eye display system 10, 10.3, 10.3''', supra, except that the curved two-dimensional light-source array 106 and the upper fold mirror 136.1 are replaced with a waveguide projector 152 constituting an associated fifth aspect of a subpupil modulator 30, 30.5. The waveguide projector 152 incorporates a controllable light source 97 that defines an array of modulated subpupils 32', and in cooperation with an alternative Fresnel conditioner lens 56.1, L$_1$, 132" and the associated Fresnel magnifier lens 56.2, L$_2$, 130, 148, collectively constitute an associated third-aspect optical subsystem 14, 14.3, wherein the combination of the waveguide projector 152, Fresnel conditioner lens 56.1, L$_1$, 132, and flat-panel two-dimensional image-display modulation array 94 constitute a fifth-aspect image generator 12, 12.5. The waveguide projector 152 is under control of the subpupil modulation controller 50, responsive to the eye-tracking subsystem 42. The first-embodiment fifth-aspect near-eye display system 10, 10.5, 10.5' further illustrates incorporation of a hybrid Fresnel magnifier lens 56.2, L$_2$, 130, 148 that is illustrated individually in FIG. 51, supra, which provides for reducing possible scattering from the associated Fresnel structure 134' to occurrence from only the rear side 148.2—facing away from the user 22—of the hybrid lens 148 relative to a Fresnel magnifier lens 56.2, L$_2$, 130 incorporating Fresnel surfaces 134 on both sides thereof.

When applying the conditioner-lens prescription design process 5000, supra, to the Fresnel conditioner lens 56.1, L$_1$, 132, the resulting optimized alternative Fresnel conditioner lens 56.1, L$_1$, 132''' resulted in a subpupil surface 84, 84''' that was mildly convex—i.e. a convex subpupil surface 84, 84'''—relative to the eye 20 of the user 22, rather than an ocularly-conforming concave-curved subpupil surface 84, 84".

Notwithstanding that the waveguide projector 152 can produce well-focused exit subpupils 32 on the resulting convex subpupil surface 84, 84''', those exit subpupils 32 form on the convex subpupil surface 84, 84''' from which the associated concentrated light 16' of the image 16 is poorly accessible to the eye pupil 38 over the entire range of normal rotation of the eye 20, so that the associated first-embodiment fifth-aspect near-eye display system 10, 10.5, 10.5' will effectively present relatively-larger exit subpupils 32 to the eye 20 at many associated rotational angles thereof. Accordingly, notwithstanding that the first-embodiment fifth-aspect near-eye display system 10, 10.5, 10.5' can provide for reduced power usage by deactivating—at any given time—exit subpupils 32 that are not visible thereto, and can provide an exceptional imaging relationship between the flat-panel two-dimensional image-display modulation array 94 and the convex subpupil surface 84, 84''', the resulting imaging performance for the user 22 is relatively inferior to what would otherwise result with relatively smaller exit subpupils 32.

Figure 56:
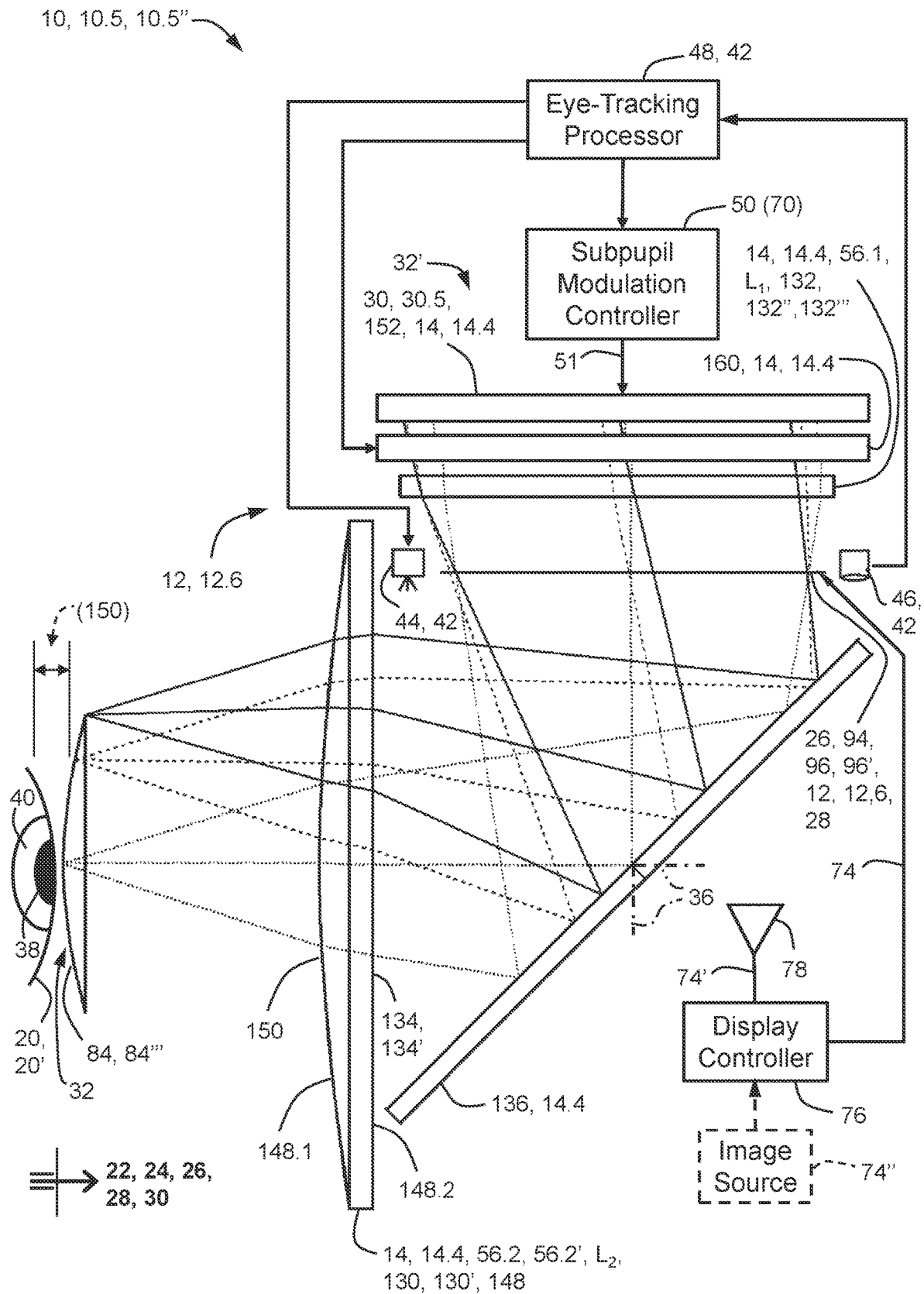
FIG. 56 illustrates a schematic block diagram of a second embodiment of a fifth aspect of a near-eye display system incorporating a waveguide projector light source that defines an array of modulated subpupils thereof, as illustrated in FIG. 54, but further incorporating a varifocal lens between the associated waveguide projector and the associated conditioner lens, further illustrating a fourth aspect of an associated optical subsystem incorporating the optics of the waveguide projector and the varifocal lens in cooperation with an associated conditioner lens and a magnifier lens, the conditioner and magnifier lenses of which incorporate at least one Fresnel surface.

Referring to FIG. 56, a second embodiment 10.5" of a fifth-aspect near-eye display system 10, 10.5, 10.5" is the same as to the first-embodiment fifth-aspect near-eye display system 10, 10.5, 10.5', supra, except for further incorporating in an associated fourth-aspect optical subsystem 14, 14.4, a varifocal lens 160 between the waveguide projector 152 and the Fresnel conditioner lens 56.1, L$_1$, 132", wherein the combination of the waveguide projector 152, varifocal lens 160, Fresnel conditioner lens 56.1, L$_1$, 132, and flat-panel two-dimensional image-display modulation array 94 constitute a sixth-aspect image generator 12, 12.6. For example, U.S. Pat. No. 10,627,565, which is incorporated herein by reference in its entirety, discloses an electronic varifocal lens at the exit of the waveguide of a waveguide display so as to provide for changing the apparent distance of the virtual image exiting the waveguide in order to accommodate, inter alia, user preferences. The varifocal lens 160—under control of the subpupil modulation controller 50 responsive to the eye-tracking subsystem 42—provides for changing the distance between the subpupil surface 84, 84''' and the optimized Fresnel magnifier lens 56.2, $L_2$, 130, 130'. Under typical use of the second-embodiment fifth-aspect near-eye display system 10, 10.5, 10.5'', the distance between the eye 20 of the user 22 and the associated fourth-aspect optical subsystem 14, 14.4 is relatively fixed. Accordingly, the varifocal lens 160 can be used to position a single exit subpupil 32 or small cluster of exit subpupils 32—for example, of the Active Subpupil Region (ASR) 72,—at a controllable distance from the eye 20 of the user 22, for example, so as to continuously position the Active Subpupil Region (ASR) 72 at the location of the eye pupil 38 of the user 22 responsive to the eye-tracking subsystem 42, thereby effectively creating a dynamically changing subpupil surface 84 that effectively conforms to the eye pupil 38 regardless of the orientation thereof. If the second-embodiment fifth-aspect near-eye display system 10, 10.5, 10.5'' were to further provide for detecting the distance between the eye pupil 38 of the user 22 to the flat-panel two-dimensional image-display modulation array 94, then the entire volumetric visual environment (VVE) 80 of the fourth-aspect optical subsystem 14, 14.4 can be accessed with a dynamically positioned exit subpupil 32 wherever the eye pupil 38 of the user 22 is positioned, so as to provide for a compact, lightweight and flexible near-eye display system that can provide for a relatively large field of view and a relatively high image quality, while using substantially less power than would otherwise be required to illuminate the entire exit pupil 18 of the associated optical subsystem.

Figure 16:
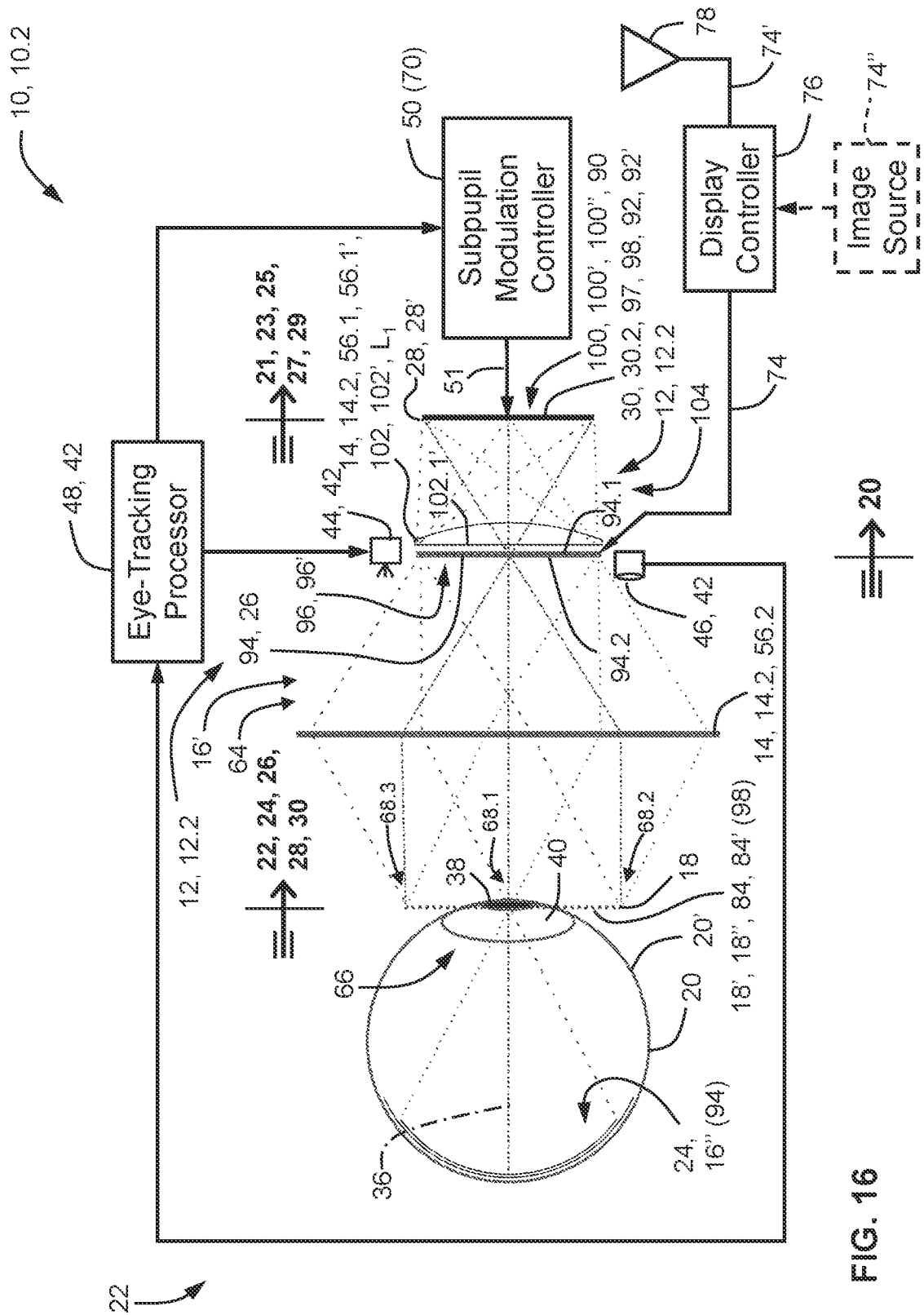
FIG. 16 illustrates a schematic block diagram of a second aspect of a near-eye display system incorporating a flat-panel two-dimensional array of light sources that define an associated array of modulated subpupils of the second-aspect near-eye display system, in cooperation with a separate flat-panel two-dimensional image-display array of light-modulating image-display pixels.
Figure 57:
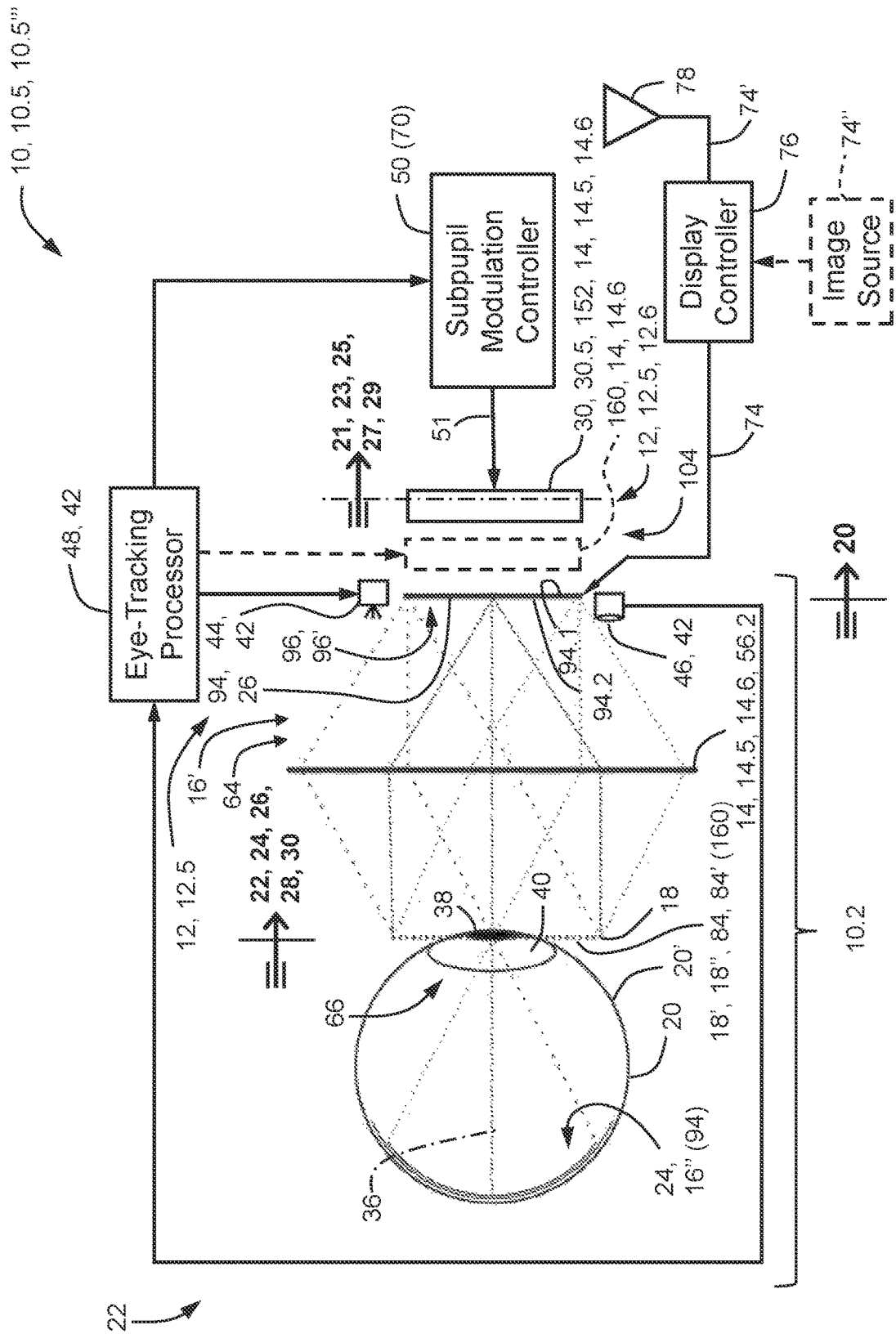
FIG. 57 illustrates a third embodiment of a fifth aspect of a near-eye display system incorporating a waveguide projector light source that defines an array of modulated subpupils thereof, similar to that illustrated in FIGS. 54 and 56, incorporating a fifth aspect of an optical subsystem comprising a modified second-aspect optical subsystem for which the combination of the controllable light source and the conditioner lens thereof is replaced with a waveguide projector, further illustrating an optional varifocal lens of an associated sixth aspect of an optical subsystem.

Referring to FIG. 57, a third embodiment 10.5''' of a fifth-aspect near-eye display system 10, 10.5, 10.5''' is the same as the second-aspect near-eye display system 10, 10.2, supra, illustrated in FIG. 16, except that both the controllable light source 97 provided for by the flat-panel two-dimensional light-source array 98 of associated light-source elements 100, and the associated conditioner lens 102, 102', $L_1$, are replaced with a waveguide projector 152 that ideally functions in accordance with the model illustrated in FIG. 53, supra, and which therefor provides for substantially the same functionality as the controllable light source 97 in cooperation with the conditioner lens 102, 102', $L_1$ of the second-aspect near-eye display system 10, 10.2. Accordingly, each point source of light 16' by an associated illumination pixel within the waveguide projector 152 provides for generating a corresponding beam 64 of light 16' that propagates at an angle relative to the optical axis 36 that is responsive to the lateral offset relative to the optical axis 36 of the associated point source of light within the waveguide projector 152, and which illuminates the entirety of the associated flat-panel two-dimensional image-display modulation array 94—in accordance with an associated fifth-aspect image generator 12, 12.5—which, in cooperation with an associated second dioptric-power optical element 56, 56.2, $L_2$ acting as an associated magnifier lens 56, 56.2, $L_2$ of an associated fifth-aspect optical subsystem 14, 14.5 provides for generating an associated virtual image 16''' of the flat-panel two-dimensional image-display modulation array 94 for each exit subpupil 32 that is projected onto the associated planar subpupil surface 84, 84' at the exit pupil 18, as described hereinabove in respect of the second-aspect near-eye display system 10, 10.2.

The third-embodiment fifth-aspect near-eye display system 10, 10.5, 10.5''' may optionally further include—in an associated sixth-aspect optical subsystem 14, 14.6—a varifocal lens 160 located between the waveguide projector 152 and the flat-panel two-dimensional image-display modulation array 94—of an associated sixth-aspect image generator 12, 12.6—and under control of the associated eye-tracking subsystem 42, so as to provide for controlling the axial location of the planar subpupil surface 84, 84' to be substantially aligned with that of the eye pupil 38 of the user 22 for the exit subpupils 32 of the associated Active Subpupil Region (ASR) 72 being displayed.

Referring to FIG. 58, a fourth embodiment 10.5'''' of a fifth-aspect near-eye display system 10, 10.5, 10.5'''' is the same as the third-embodiment fifth-aspect near-eye display system 10, 10.5, 10.5''', supra, illustrated in FIG. 57, except for optionally further incorporating—in an associated seventh-aspect optical subsystem 14, 14.7—a conditioner lens 102, 102', $L_1$ located between the waveguide projector 152 and the flat-panel two-dimensional image-display modulation array 94, so as to provide for compensating for non-ideal, i.e. realistic, optical elements within the associated seventh-aspect optical subsystem 14, 14.7, the latter of which incorporates at least the magnifier lens 56, 56.2, $L_2$, the flat-panel two-dimensional image-display modulation array 94, and the waveguide projector 152, and which may optionally include one or both of the conditioner lens 102, 102', $L_1$ and a varifocal lens 160. The conditioner lens 102, 102', $L_1$ can further provide for forming a non-planar subpupil surface 84 at the exit pupil 18, wherein the particular configuration of the associated components thereof is not limiting. For example, a real, practically-produced magnifier lens 56, 56.2, $L_2$, may include aberrations that might otherwise preclude an ideal formation of associated images of the controllable light sources 97 of the associated exit subpupils 32. Accordingly, even with an ideal light distribution illuminating the flat-panel two-dimensional image-display modulation array 94, the conditioner lens 102, 102', $L_1$ works in cooperation with the magnifier lens 56, 56.2, $L_2$ to provide for compensating for aberrations in the magnifier lens 56, 56.2, $L_2$ that might otherwise adversely affect either the associated subpupil surface 84, or the image of the associated exit subpupils 32 therein.

A real magnifier lens 56, 56.2, $L_2$—which may be imperfect—may not necessarily generate a sharply focused image of an exit subpupil 32 on the subpupil surface 84 from a corresponding associated beam of collimated light that is incident upon the flat-panel two-dimensional image-display modulation array 94, and that was generated by a corresponding associated controllable light source 97. Generally, a relatively-smaller size of the associated exit subpupils 32 is beneficial to providing for a relatively greater control of light 16' through the eye pupil 38, provided that the exit subpupils 32 are co-located with the eye pupil 38. Although a planar subpupil surface 84, 84' can provide for relatively smaller exit subpupils 32 than a concave-curved subpupil surface 84, 84'', the difference is generally not sufficient to overcome the adverse effects of axial misalignment when the eye pupil 38 rotates away from the planar subpupil surface 84, 84'. However, the varifocal lens 160 can provide for dynamically creating an effective concave-curved subpupil surface 84, 84''—notwithstanding there being a planar subpupil surface 84, 84'—by axially positioning the planar subpupil surface 84, 84' so that the associated exit subpupils 32 thereon of the associated Active Subpupil Region (ASR) 72 are maintained in axial alignment with the eye pupil 38. As a result of the conditioner-lens prescription design process 5000, it has been discovered that under at least some circumstances, that a convex subpupil surface 84, 84''' provides for the relatively-smallest and most-highly-focused exit subpupils 32, which can be accommodated by using the varifocal lens 160 to provide for maintaining an axial alignment of the exit subpupils 32 of the associated Active Subpupil Region (ASR) 72 on the convex subpupil surface 84, 84''' in axial alignment with the eye pupil 38.

It should be understood that the magnifier-lens 4900 and conditioner-lens 5000 prescription design processes can be generally applied to any of the above-described near-eye display systems 10, 10.1, 10.1', 10.2', 10.2'', 10.2''', 10.3, 10.3', 10.3'', 10.3''', 10.4, 10.4', 10.4'', 10.5, 10.5', 10.5'', 10.5''', 10.5'''', notwithstanding detailed illustration thereof in the context of the third-embodiment second-aspect optical subsystem 14, 14.2'''.

In accordance with one set of embodiments, a near-eye display system (10, 10.1, 10.2, 10.3, 10.4) for displaying an image (16) to an eye (20) of a user (22) of the near-eye display system (10, 10.1, 10.2, 10.3, 10.4), incorporates: a) an image generator (12, 12.1, 12.2, 12.3, 12.4), wherein the image generator (12, 12.1, 12.2, 12.3, 12.4) provides for generating light (16') of the image (16) responsive to an electronic image signal (74), and the light (16') of the image (16) is projectable onto a retina (24) of the eye (20) of the user (22) when the near-eye display system (10, 10.1, 10.2, 10.3, 10.4) is used by the user (22); b) an optical subsystem (14, 14.1, 14.2, 14.2', 14.2'', 14.2'''), wherein the optical subsystem (14, 14.1, 14.2, 14.2', 14.2'', 14.2''') operates in cooperation with the image generator (12, 12.1, 12.2, 12.3, 12.4) to provide for projecting the image (16) onto the retina (24) of the eye (20) of the user (22) when the near-eye display system (10, 10.1, 10.2, 10.3, 10.4) is used by the user (22); and a subpupil modulator (30, 30.1, 30.2, 30.3, 30.4), wherein at least a portion of the optical subsystem (14, 14.1, 14.2, 14.2', 14.2'', 14.2''') forms an exit-pupil image (18') of the subpupil modulator (30, 30.1, 30.2, 30.3, 30.4) in an exit pupil (18) of the near-eye display system (10, 10.1, 10.2, 10.3, 10.4), the exit pupil (18) is located proximate to an eye pupil (38) of the eye (20) of the user (22) when the near-eye display system (10, 10.1, 10.2, 10.3, 10.4) is used by the user (22), the subpupil modulator (30, 30.1, 30.2, 30.3, 30.4) provides for controllably forming at least one subpupil (32) within the exit pupil (18), an area of at least one subpupil (32) is less than an area of the exit pupil (18); and when activated, each at least one subpupil (32) incorporates the light (16') from an entirety of the image (16). The near-eye display system (10, 10.1, 10.2, 10.3, 10.4) may further incorporate an eye-tracking subsystem (42), wherein the eye-tracking subsystem (42) incorporates: a) an infrared illuminator (44) positioned and configured so as to provide for illuminating at least the eye pupil (38) of the eye (20) for a range of gaze directions (34) of the eye (20); b) an infrared-responsive camera (46) positioned and configured so as to provide for acquiring an image of at least the eye pupil (38) of the eye (20) for the range of gaze directions (34) of the eye (20); and c) an eye-tracking processor (48), wherein the eye-tracking processor (48) provides for generating at least a measure of a location of the eye pupil (38) of the eye (20), and the eye-tracking processor (48) provides for communicating the at least the measure of the location of the eye pupil (38) of the eye (20), to a subpupil modulation controller (50), wherein the subpupil modulation controller (50) may provide for identifying an Active Subpupil Region (72) within the subpupil modulator (30, 20.1, 30.2, 30.3, 30.4) responsive to at least the measure of the location of the eye pupil (38) of the eye (20) from the eye-tracking subsystem (42), the subpupil modulation controller (50) may provide for activating at least one modulated subpupil (32') within the Active Subpupil Region (72) so as to cause a corresponding at least one subpupil (32) within the exit pupil (18) to become activated, and the subpupil modulation controller (50) may provide for deactivating each remaining modulated subpupil (32') that is not within the Active Subpupil Region (72) so as to cause each remaining at least one subpupil (32) within the exit pupil (18) to become deactivated, wherein the Active Subpupil Region (72) may surround a location corresponding to the location of the eye pupil (38) of the eye (20); a size of the Active Subpupil Region (72) may be independent of the location of the eye pupil (38) of the eye (20); the Active Subpupil Region (72) may be circularly shaped; the eye-tracking subsystem (42) may further provide for determining and communicating to the subpupil modulation controller (50) at least one measure selected from the group consisting of a measure of a shape of the eye pupil (38) of the eye (20), and a measure of a size of the eye pupil (38) of the eye (20), and the Active Subpupil Region (72) is shaped similarly to the shape of the eye pupil (38) of the eye (20); and the Active Subpupil Region (72) may be located entirely within the eye pupil (38) of the eye (20).

In accordance with one set of embodiments of first 10.1 and second 10.2 aspects of the near-eye display system (10, 10.1, 10.2), the subpupil modulator (30, 30.1, 30.2) incorporates at least one modulation element (90) located on or in cooperation with an associated modulation surface (92, 92'), the associated modulation surface (92, 92') is substantially planar, and the exit-pupil image (18') of the associated modulation surface (92, 92') is located on a corresponding substantially planar subpupil surface (84, 84').

In accordance with one set of embodiments of the first aspect 10.1 of the near-eye display system (10, 10.1): a) the image generator (12, 12.1) comprises a flat-panel two-dimensional image-display array (26, 52) of light-emitting image-display pixels (54), b) the optical subsystem (14, 14.1) comprises a first dioptric-power optical element (56, 56.1, 56.1', $L_1$) located between the flat-panel two-dimensional image-display array (26, 52) of light-emitting image-display pixels (54) and a flat-panel two-dimensional modulation array (58) of light-modulating pixels (60), the first dioptric-power optical element (56, 56.1, 56.1', $L_1$) is located substantially one focal length from each of the flat-panel two-dimensional image-display array (26, 52) of the light-emitting image-display pixels (54) and a first side (58.1) of the flat-panel two-dimensional modulation array (58) of the light-modulating pixels (60), c) the optical subsystem (14, 14.1) further comprises a second dioptric-power optical element (56, 56.2, 56.2', $L_2$) located between the flat-panel two-dimensional modulation array (58) and the exit pupil (18), the second dioptric-power optical element (56, 56.2, 56.2', $L_2$) is located substantially one focal length from a second side (58.2) of the flat-panel two-dimensional modulation array (58), the first (58.1) and second (58.2) sides of the flat-panel two-dimensional modulation array (58) oppose one another, d) the optical subsystem (14, 14.1) further comprises a third dioptric-power optical element (56, 56.3, 56.3', $L_3$) located between the second dioptric-power optical element (56, 56.2, 56.2', $L_2$) and the exit pupil (18), the second dioptric-power optical element (56, 56.2, 56.2', $L_2$) is located substantially one focal length from each of a remaining focal plane (62) of the second dioptric-power optical element (56, 56.2, 56.2', $L_2$) and the exit pupil (18), e) the subpupil modulator (30, 30.1) comprises the flat-panel two-dimensional modulation array (58) of the light-modulating pixels (60), a transmissibility of the light (16') through each light-modulating pixel (60) of the flat-panel two-dimensional modulation array (58) of the light-modulating pixels (60) is individually controllable responsive to a corresponding associated subpupil modulation control signal (51) from a subpupil modulation controller (50), each the light-modulating pixel (60) of the flat-panel two-dimensional modulation array (58) of the light-modulating pixels (60) is associated with a corresponding at least one subpupil (32) within the exit pupil (18), and the exit pupil (18) is formed as the exit-pupil image (18') responsive to a cooperation of the first (56, 56.1, 56.1', L$_1$), second (56, 56.2, 56.2', L$_2$) and third (56, 56.3, 56.3', L$_3$) dioptric-power optical elements, and the exit pupil (18) is substantially planar. The first dioptric-power optical element (56, 56.1, 56.1', L$_1$) may incorporate a first convergent magnifier lens (56.1', L$_1$), the second dioptric-power optical element (56, 56.2, 56.2', L$_2$) may incorporate a second convergent magnifier lens (56.2', L$_2$), and the third dioptric-power optical element (56, 56.3, 56.3', L$_3$) may incorporate a third convergent magnifier lens (56.3', L$_3$), and each light-emitting image-display pixel (54) of the flat-panel two-dimensional image-display array (26, 52) of light-emitting image-display pixels (54) may incorporate either a light-emitting diode element or a backlit liquid-crystal-display element.

In accordance with one set of embodiments of second 10.2, third 10.3, fourth 10.4 aspects of the near-eye display system (10, 10.2, 10.3, 10.4): a) the image generator (12, 12.2, 12.3, 12.4) incorporates a flat-panel two-dimensional image-display modulation array (94) of light-modulating image-display pixels (96, 96') in cooperation with a controllable light source (97) of the subpupil modulator (30, 30.2, 30.3, 30.4), b) the optical subsystem (14, 14.2, 14.2', 14.2", 14.2') incorporates a first dioptric-power optical element (56, 56.1, 56.1', L$_1$, 102, 102') located between a first side (94.1) of the flat-panel two-dimensional image-display modulation array (94) of the light-modulating image-display pixels (96, 96') and the controllable light source (97) of the subpupil modulator (30, 30.2, 30.3, 30.4), wherein the first dioptric-power optical element (56, 56.1, 56.1', L$_1$, 102, 102') is located substantially one focal length from the controllable light source (97) of the subpupil modulator (30, 30.2, 30.3, 30.4), and the first dioptric-power optical element (56, 56.1, 56.1', L$_1$, 102, 102') is proximate to the first side of the flat-panel two-dimensional image-display modulation array (94) of the light-modulating image-display pixels (96, 96'), c) the optical subsystem (14, 14.2, 14.2', 14.2", 14.2''') further incorporates a second dioptric-power optical element (56, 56.2, 56.2', L$_2$) located between the flat-panel two-dimensional image-display modulation array (94) and the exit pupil (18), wherein the second dioptric-power optical element (56, 56.2, 56.2', L$_2$) is located substantially one focal length from each of a second side (94.2) of the flat-panel two-dimensional image-display modulation array (94) and the exit pupil (18), and the first (94.1) and second (94.2) sides of the flat-panel two-dimensional image-display modulation array (94) oppose one another, and d) the controllable light source (97) of the subpupil modulator (30, 30.2, 30.3, 30.4) provides for separately and controllably illuminating or not illuminating each at least one subpupil (32) within the exit pupil (18) responsive to a corresponding associated subpupil modulation control signal (51) from a subpupil modulation controller (50). Each light-modulating image-display pixel (96, 96') of the flat-panel two-dimensional image-display modulation array (94) of the light-modulating image-display pixels (96, 96') may incorporate a liquid-crystal image-display pixel (96'). The first dioptric-power optical element (56, 56.1, 56.1', L$_1$, 102, 102') may incorporate a plano-convex conditioner lens (102', L$_1$), and a planar surface (102.1') of the plano-convex conditioner lens (102', L$_1$) is proximate to the first side (94.1) of the flat-panel two-dimensional image-display modulation array (94). The second dioptric-power optical element (56, 56.2, 56.2', L$_2$) may incorporate a second convergent magnifier lens (56.2', L$_2$). The second dioptric-power optical element (56, 56.2, 56.2', L$_2$) comprises a free-form-surface/prism lens (56.2, L$_2$, 128).

In accordance with one set of embodiments of the second aspect 10.2 of the near-eye display system (10, 10.2), the controllable light source (97) may incorporate a flat-panel two-dimensional light light-source array (98) of light-source elements (100, 100', 100"), wherein the exit pupil (18) is formed as the exit-pupil image (18') by the second dioptric-power optical element (56, 56.2, 56.2', L$_2$), and the exit pupil (18) is substantially planar, wherein each light-source element (100, 100', 100") of the flat-panel two-dimensional light light-source array (98) of the light-source elements (100, 100', 100") may incorporate a light-emitting-diode element (100').

In accordance with one set of embodiments of the third aspect 10.3 of the near-eye display system (10, 10.3), the controllable light source (97) incorporates a curved two-dimensional light light-source array (106) of light-source elements (100, 100', 100"), the exit pupil (18) is formed as the exit-pupil image (18') by the second dioptric-power optical element (56, 56.2, 56.2', L$_2$), and the exit pupil (18) is curved, wherein each light-source element (100, 100', 100") of the curved two-dimensional light light-source array (106) of the light-source elements (100, 100', 100") may incorporate either a light-emitting-diode element (100') located on an underlying concave-curved surface (107), or a first end of a corresponding fiber-optic light pipe supported from an underlying concave-curved surface (107), with each second end of the corresponding fiber-optic light pipe is illuminated by a corresponding light-emitting-diode element, wherein the corresponding light-emitting-diode element may be incorporated in a flat-panel light-source array. In one set of embodiments, a curvature of the exit pupil (18) substantially conforms to a curvature of a front surface (20') of the eye (20).

In accordance with one set of embodiments of the fourth aspect 10.4 of the near-eye display system (10, 10.4), the controllable light source (97) incorporates a curved light-redirecting surface (110) in cooperation with a modulated scanned beam of light (112), the exit pupil (18) is formed as the exit-pupil image (18') by the second dioptric-power optical element (56, 56.2, 56.2', L$_2$), and the exit pupil (18) is curved, wherein the curved light-redirecting surface (110) may incorporate at least one optical surface selected from the group consisting of a light-scattering surface, a holographic surface, and a diffractive surface. The fourth aspect 10.4 of the near-eye display system (10, 10.4) may further incorporate: a) light-beam source (118), wherein the light-beam source (118) provides for generating the beam of light (114), and provides for modulating an intensity thereof responsive to an light-beam-magnitude subpupil modulation control signal (51'); b) a light-beam-directing element (120), wherein the light-beam-directing element (120) provides for directing the beam of light (114) onto the curved light-redirecting surface (110) at a location thereon responsive to an angular orientation of the light-beam-directing element (120); and c) a light-beam scanner (116), wherein the light-beam scanner (116) provides for controlling the angular orientation of the light-beam-directing element (120), the light-beam scanner (116) and the light-beam source (118) are controlled over time responsive to a light-beam-position subpupil modulation control signal (51") from a subpupil modulation controller (50) so as to provide for generating the modulated scanned beam of light (112), and so as to provide for scanning the modulated scanned beam of light (112) over a region (122) of the curved light-redirecting surface (110) so as to form a corresponding at least one subpupil (32), wherein the light-beam-directing element (120) may incorporate at least one optical element selected from the group consisting of a mirror, a holographic element, and a diffractive element. The fourth aspect 10.4 of the near-eye display system (10, 10.4) may further incorporate: a) an eye-tracking subsystem (42), wherein the eye-tracking subsystem (42) provides at least a measure of a location of an eye pupil (38) of the eye (20); and b) the subpupil modulation controller (50), wherein the subpupil modulation controller (50) provides for controlling an activation state of each of at least one subpupil (32) of the subpupil modulator (30, 30.4) responsive at least to the measure of the location of the eye pupil (38) of the eye (20). In one set of embodiments, a curvature of the exit pupil (18) substantially conforms to a curvature of a front surface (20') of the eye (20).

In accordance with one set of embodiments of third 10.3 and fourth 10.4 aspects of the near-eye display system (10, 10.3, 10.4), the subpupil modulator (30, 30.3, 30.4) incorporates at least one modulation element (90) located on or in cooperation with an associated modulation surface (92, 92"), the associated modulation surface (92, 92") is curved, and an associated curved subpupil image 126 of the associated modulation surface (92, 92") is located on a corresponding curved subpupil surface (84, 84"), wherein a curvature of the curved subpupil surface (84, 84") may substantially conform to a curvature of a front surface (20') of the eye (20).

Generally, in accordance with one set of embodiments, a near-eye display system (10, 10.1, 10.2, 10.3, 10.4) for providing an image (16''') of an object (52, 94, 16) for viewing by an eye (20) of a user (22) incorporates a) a geometric surface (18", 84, 84', 84") having one or more first locations at which rays of light (16') from an entirely of an image (16) intersect; b) a physical surface (92, 92', 92") having one or more second locations at which the rays of light (16') from an entirely of the image (16) intersect; c) a light-limiting means (30; 30.1 58; 30.2, 98; 30.3, 106; 30.4, 110, 112, 114, 116, 118) for independently limiting the rays of light (16') emitted from or passing through the one or more second locations; and d) an optical system (14, 14.1, 14.2, 14.2', 14.2", 14.2''') the provides for forming the geometric surface (18", 84, 84', 84") as a real image of the physical surface (92, 92', 92"). The near-eye display system (10, 10.1, 10.2, 10.3, 10.4) may also incorporate a) a means (42, 44, 46, 48) for detecting at least the location of an eye pupil (38) of the eye (20) with respect to the geometric surface (18", 84, 84', 84"); and b) a control system (50) for electronically controlling the light-limiting means (30; 30.1 58; 30.2, 98; 30.3, 106; 30.4, 110, 112, 114, 116, 118) so that the light (16') passing through at least some of the first locations is as least partially limited. The physical surface (92, 92', 92") may be either substantially planar (92') or curved (92").

Referring again to FIGS. 16, 17, 44, and 53, in one set of embodiments of the second- 10.2 and fifth- 10.5 aspect near-eye display systems 10, the associated flat-panel two-dimensional light-source array 98 is implemented with a two-dimensional array 26 of associated light-source elements 100 similar to that used as the image generator 12, 12.1 of the first-aspect near-eye display system 10, 10.1, but with each associated light-source element 100—for example, with each light-source element 100, 100'/light-emitting image-display pixel 54 comprising an associated set of red (R), green (G) and blue (B) light-emitting-diodes—operated in a white-light mode of operation, so as to provide for effectively acting as white-light light-source elements 100. Similarly, referring to FIGS. 18, 19, 45 and 47, in one set of embodiments of the third-aspect near-eye display system 10, 10.3, each associated light-source element 100, 100' comprises an associated set of red (R), green (G) and blue (B) light-emitting-diodes, similarly operated in a white-light mode of operation. For example, in accordance with a first white-light mode of operation, if the flat-panel two-dimensional light-source array 98 comprises an array of spatially separate color component light-modulating pixels, for example red (R), green (G) and blue (B), in clusters—for example, with each pixel having a color filter to generate its respective color—then the separate color component light-modulating pixels would be operated simultaneously at associated relative intensities sufficient to effectively generate what is perceived to be white light. As a second example, in accordance with a second white-light mode of operation, if the flat-panel two-dimensional light-source array 98 comprises an array of light-modulating pixels that operate in a field-sequential mode where full images of fields of single color components of an image are displayed so that the eye perceives the composite image in full color due to persistence, then each associated light-source element 100, 100' would generate individual colors sequentially at associated relative intensities sufficient to so as to be perceived to be white light. Similarly, referring again to FIGS. 18, 19, 45 and 47, in one set of embodiments of the third-aspect near-eye display system 10, 10.3, each associated light-source element 100, 100' comprises an associated set of red (R), green (G) and blue (B) light-emitting-diodes, similarly operated in a white-light mode of operation, supra.

The associated optical subsystems 14, 14.1, 14.2, 14.3, 14.4, 14.5, 14.6, 14.7 provide for a one-to-one correspondence between modulated subpupils 32' of the associated subpupil modulator 30, 30.1, 30.2, 30.3, 30.4, 30.5 within the associated aperture stop 28 of the associated optical subsystems 14, 14.1, 14.2, 14.3, 14.4, 14.5, 14.6, 14.7 and corresponding exit subpupils 32 within the exit pupil 18. Each point on the aperture stop 28 is imaged to a corresponding point in the exit pupil 18, i.e. with a one-to-one relationship between points in "object space" of the aperture stop 28/subpupil modulator 30, 30.1, 30.2, 30.3, 30.4, 30.5, to corresponding points in "image space" of the surface 18" of the exit pupil 18, and for each of the associated exit subpupils 32 associated with corresponding modulated subpupils 32' that are formed by the subpupil modulator 30.

Figure 59:
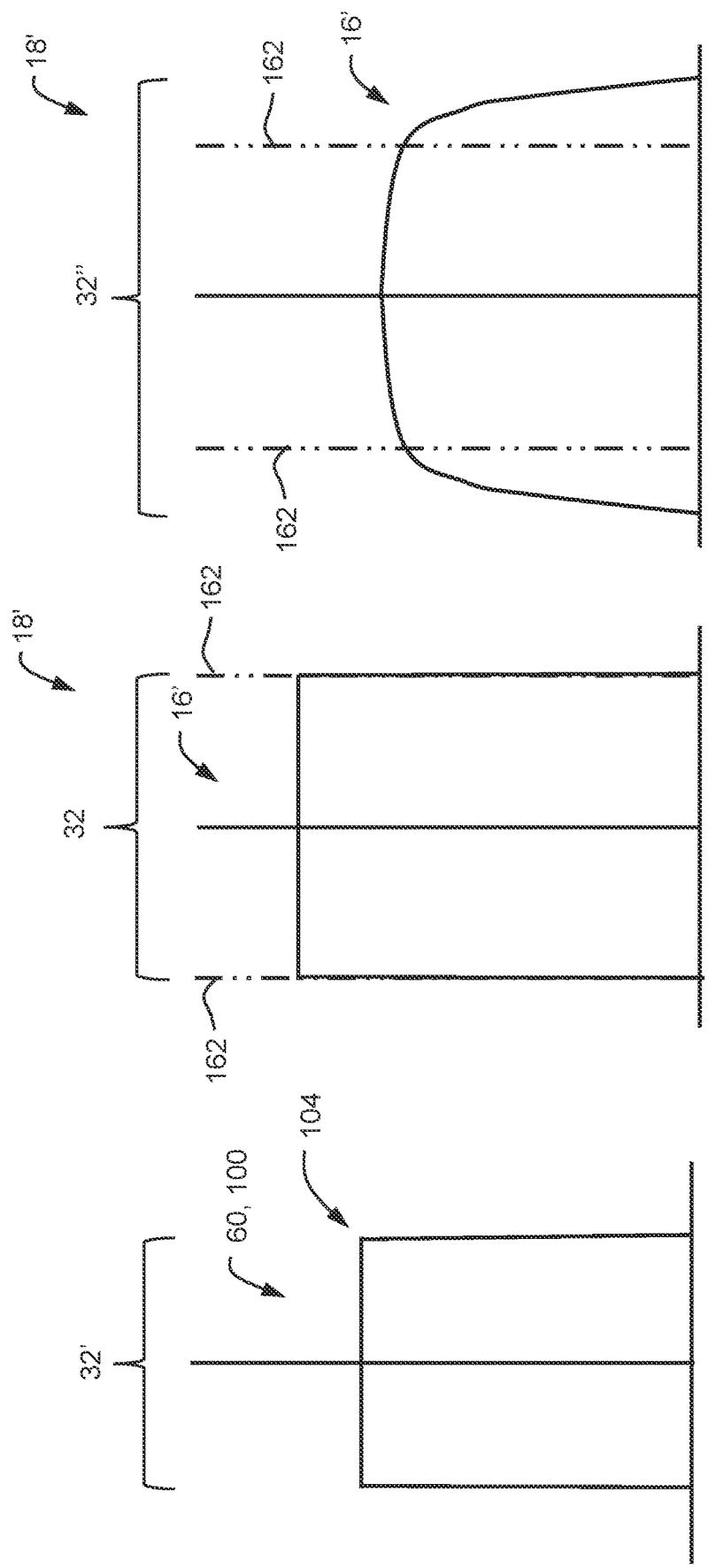
FIG. 59a illustrates an example of a hypothetical intensity profile of an active modulated subpupil illustrated in any of FIGS. 4, 6, 10, 12, 14, 21, 23, 25, 27, 29, 34, 36, 38, 40, and 42 in respect of any of the first- through fifth-aspect near-eye display systems incorporating idealized components operating under an idealized mode of operation.
FIG. 59b illustrates an example of a hypothetical intensity profile of an active subpupil in an exit pupil image illustrated in in any of FIGS. 5, 7, 11, 13, 15, 22, 24, 26, 28, 30, 35, 37, 39, 41, and 43 in respect of any of the first- through fifth-aspect near-eye display systems incorporating idealized components operating under an idealized mode of operation.
FIG. 59c illustrates an example of a hypothetical intensity profile of an active subpupil in an exit pupil image illustrated in FIG. 60 in respect of any of the first- through fifth-aspect near-eye display systems incorporating realistic components subject to realistic constraints and operating under a more realistic configuration and mode of operation relative to the configuration associated with FIG. 59b.

Referring to FIGS. 59a and 59b, under associated ideal conditions and configurations, the associated optical subsystems 14, 14.1, 14.2, 14.3, 14.4, 14.5, 14.6, 14.7, also provide for a one-to-one correspondence between modulated subpupils 32' of the associated subpupil modulator 30, 30.1, 30.2, 30.3, 30.4, 30.5 and corresponding regions within the exit pupil 18, i.e. so that the resulting exit subpupils 32 are distinct and separated from one another, i.e. non-overlapping within the exit pupil 18. For example, referring to FIG. 59a, the hypothetical intensity profile of light 104 through the center of an activated modulated subpupil 32'—e.g. a light-modulating pixel 60 of a flat-panel two-dimensional modulation array 58 of the first-aspect near-eye display system 10, 10.1, or a light-source element 100 of the second- 10.2 through fifth- 10.5 aspect near-eye display systems 10—of the subpupil modulator 30, 30.1, 30.2, 30.3, 30.4, 30.5 within the associated aperture stop 28 of an associated optical subsystem 14, 14.1, 14.2, 14.3, 14.4, 14.5, 14.6, 14.7 comprises a uniform non-zero level across the lateral extent thereof, and a zero level outside the lateral extent thereof.

Referring to FIG. 59b, the optical subsystem 14, 14.1, 14.2, 14.3, 14.4, 14.5, 14.6, 14.7 collects the light 16' of the modulated subpupil 32' and forms therefrom an associated exit subpupil 32 within the associated exit pupil 18.

In accordance with one set of embodiments, the optical subsystem 14, 14.1, 14.2, 14.3, 14.4, 14.5, 14.6, 14.7 forms on the surface 18" of the exit pupil 18 a real image of the subpupil modulator 30, 30.1, 30.2, 30.3, 30.4, 30.5, with the boundary of the exit pupil 18 corresponding to the corresponding boundary of the aperture stop 28 of the optical subsystem 14, 14.1, 14.2, 14.3, 14.4, 14.5, 14.6, 14.7. With the exit pupil 18 located proximate to the outer surface, i.e. the front surface 20', of the eye 20, this a) provides for enabling the user 22 to see—without vignetting—the full extent of the virtual image 16''' from either the flat-panel two-dimensional image-display array 52 or the flat-panel two-dimensional image-display modulation array 94 over a full range of rotation of the eye 20, and b) provides for minimizing the size of the associated exit subpupils 32.

For the first-aspect near-eye display system 10, 10.1, each modulated subpupil 32' of the subpupil modulator 30, 30.1 receives light from the entirety of the flat-panel two-dimensional image-display array 52, and for the second- 10.2 through fifth- 10.5 aspect near-eye display systems 10, light 16' from each light-source element 100 of the associated subpupil modulator 30, 30.2, 30.3, 30.4, 30.5 illuminates the entirety of the associated flat-panel two-dimensional image-display modulation array 94. Accordingly, in both cases, each associated modulated subpupil 32' contains light 16' of the entirety of the associated virtual image 16''', and the associated optical subsystem 14, 14.1, 14.2, 14.3, 14.4, 14.5, 14.6, 14.7 generally provides for collecting the light 16' of the virtual image 16''' propagating from the aperture stop 28 of the optical subsystem 14, 14.1, 14.2, 14.3, 14.4, 14.5, 14.6, 14.7 onto the associated exit pupil 18 on a surface 18" proximate to an outer surface 20' of the eye 20, and, as a result of the source 52, 94 of the virtual image 16''' being flat, with each resulting exit subpupil 32 presenting substantially the same virtual image 16'''.

During operation of the near-eye display system 10, only a subset of the modulated subpupils 32' of the subpupil modulator 30 are activated at any given time, so that at any given time, the aperture stop 28 is not fully illuminated. The maximum extent (i.e. the size) of the exit pupil 18 will depend upon the manner by which the optical subsystem 14, 14.1, 14.2, 14.3, 14.4, 14.5, 14.6, 14.7 forms the associated exit-pupil image 18', i.e. the degree to which the exit-pupil image 18' is a focused real image of the subpupil modulator 30 within the associated aperture stop 28. However, with the aperture stop 28 not fully illuminated at any given time, the outer boundary of the resulting associated exit-pupil image 18' will not correspond to that of the aperture stop 28. Accordingly, the outer boundary of the exit pupil 18/exit-pupil image 18' is delineated with phantom lines in FIGS. 5, 7, 11, 13, 15, 22, 24, 26, 28, 30, 35, 37, 39, 41, and 43 so as to illustrate that the effective aperture of the optical subsystem 14, 14.1, 14.2, 14.3, 14.4, 14.5, 14.6, 14.7 is defined/limited by the associated subpupil modulator 30, either as a physical "sub-aperture" defined either by the light-restricting, "hard" boundaries of "open" light-modulating pixels 60 (acting as "shutters") of a flat-panel two-dimensional modulation array 58 of a first-aspect subpupil modulator 30, 30.1, or by light-limiting "soft" boundaries of activated light-source elements 100 of a controllable light source 97 of a remaining-aspect subpupil modulator 30, 30.2, 30.3, 30.4, 30.5. Furthermore, for the spatially-discrete nature of the modulated subpupils 32' of the subpupil modulator 30, 30.1 30.2, 30.3, 30.4, 30.5, i.e. with permanently-deactivated gaps between the modulated subpupils 32', the resulting structure will typically be unnoticeable (much like viewing a distant image through a window screen positioned relatively close to the eye), but a perception of this structure can otherwise be mitigated by use of depixelation optics if the associated modulation structure is not otherwise blurred by inherent realistic limitations of the associated optical subsystem 14, 14.1, 14.2, 14.3, 14.4, 14.5, 14.6, 14.7.

Accordingly, the optical subsystem 14, 14.1, 14.2, 14.3, 14.4, 14.5, 14.6, 14.7 provides for projecting light 16' of a virtual image 16'' the eye 20 of a user 22, wherein modulated subpupils 32' located on a physical modulation surface 92 of a subpupil modulator 30 within the optical subsystem 14, 14.1, 14.2, 14.3, 14.4, 14.5, 14.6, 14.7 at least either partially block a portion of that light 16', or prevent that portion of light 16' from being generated, so as to prevent that portion of light 16' from entering the eye pupil 38 of the eye 20 of the user 22. In accordance with one set of embodiments, which provide for the relatively smallest associated exit subpupils 32, the exit-pupil image 18' is formed proximate to the front surface 20' of the eye 20 as a real image of the modulation surface 92. Alternatively, the exit-pupil image 18' formed proximate to the front surface 20' of the eye 20 may be an image of the modulation surface 92, albeit a poorly-formed image, while still providing for collecting the light 16' from the modulation surface 92 into the exit pupil 18. Accordingly, as used herein, an image of the modulation surface 92 is defined as the spatial distribution of light 16' that has passed through, or has emanated from, that modulation surface 92 and has exited the optical subsystem 14, 14.1, 14.2, 14.3, 14.4, 14.5, 14.6, 14.7 to form a surface 18"—also referred to herein as an exit pupil 18—within the volumetric visual environment (VVE) 80 of the optical subsystem 14, 14.1, 14.2, 14.3, 14.4, 14.5, 14.6, 14.7, wherein the portion of that light 16' passing through, or emanating from, any particular location on that modulation surface 92 passes through less than the entirety of that exit pupil 18.

Figure 60:
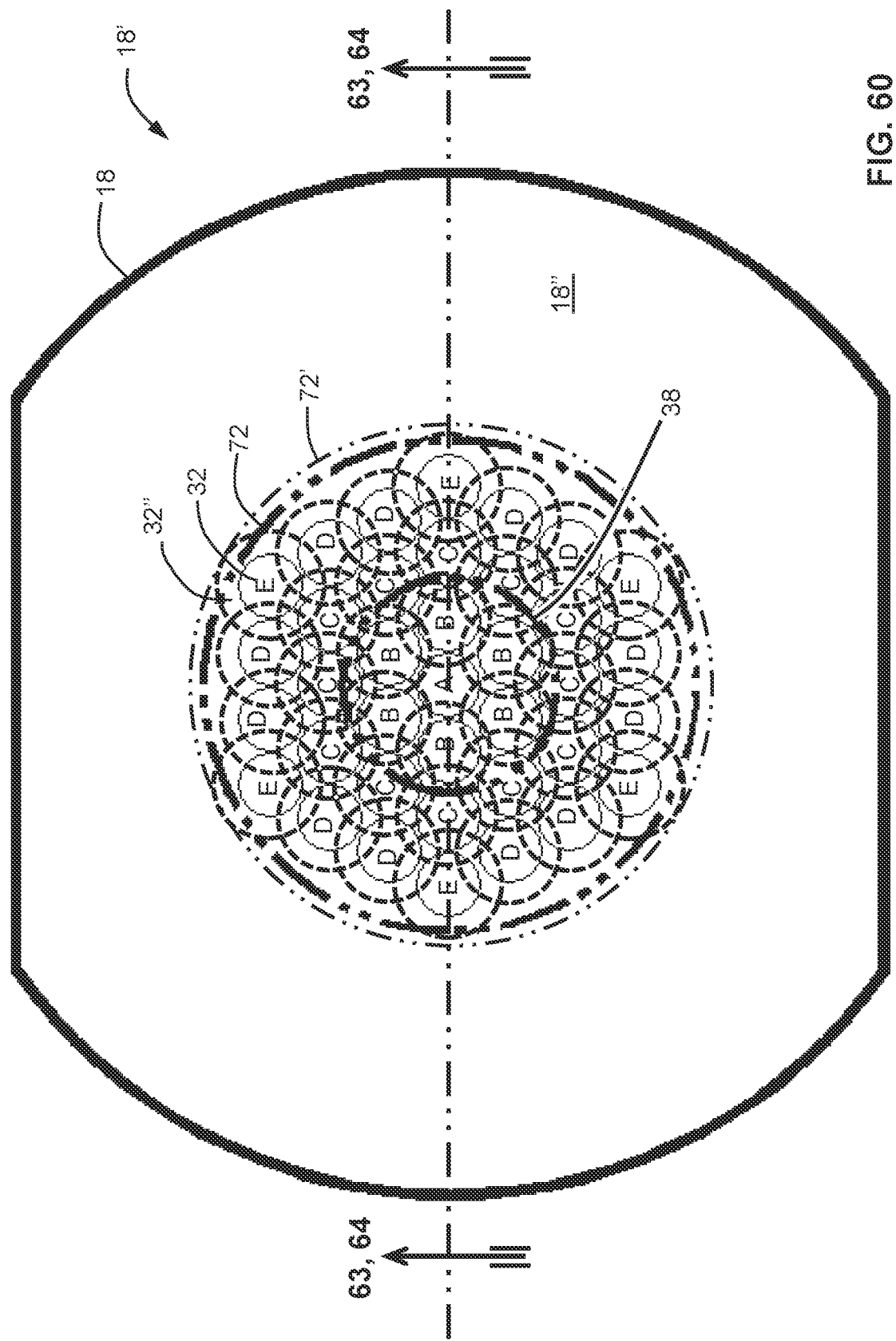
FIG. 60 illustrates a plan view of an exit pupil and associated active exit subpupils associated with the aperture stop and the two-dimensional modulation array of any of the first-, second-, third-, or fifth-aspect near-eye display systems illustrated in FIGS. 1, 2, 16, 17, 18, 19, 44, 45, 47, and 54 through 58, for the active subpupil region (ASR) illustrated in either of FIGS. 4 and 21.

Referring to FIGS. 59c and 60, in accordance with a non-ideal optical subsystem 14, 14.1, 14.2, 14.3, 14.4, 14.5, 14.6, 14.7, for example, one subject to practical constraints on the nature, construction and imaging properties of the associated dioptric-power optical elements 56, 56.1, 56.2, 56.3, and associated constraints on the layout of an associated practical, commercially-viable near-eye display system 10—wherein the associated imaging properties of the associated dioptric-power optical elements 56, 56.1, 56.2, 56.3 might be relaxed in favor of either relatively-simpler optics or a relatively-more-compact optical subsystem 14, 14.1, 14.2, 14.3, 14.4, 14.5, 14.6, 14.7,—a resulting corresponding intensity distribution of an associated resulting realized exit subpupil 32" might become laterally expanded beyond the nominal ideal boundaries 162 of a corresponding idealized exit subpupil 32, so that an ensemble of realized exit subpupils 32" might then overlap one another within the exit pupil 18, resulting in a prospective violation of one-to-one correspondence between regions within the exit pupil 18 and corresponding modulated subpupils 32', notwithstanding the resulting exit subpupils 32, 32" within the exit pupil 18 remaining in one-to-one correspondence with corresponding modulated subpupils 32' of the subpupil modulator 30. Furthermore, relative to a counterpart idealized exit subpupil 32, in addition to overlapping with other realized exit subpupils 32", a corresponding realized exit subpupil 32" might prospectively be relatively blurry and of non-uniform size or shape. For example, an expansion in the lateral extent of the realized exit subpupil 32" relative to that of an idealized exit subpupil 32 can be caused by a lack of concentricity of the eye pupil 38 and the associated front surface 20' of the eye 20 with respect to the surface 18" of the exit pupil 18, or a misalignment of the near-eye display system 10 with respect to the eye 20 of the user 22. Accordingly, for any particular point on the eye pupil 38, there is a prospect for that point to receive light 16' from a plurality of different modulated subpupils 32'.

For example, FIG. 60 illustrates a plan view of an exit pupil 18 of a near-eye display system 10, the latter of which incorporates an optical subsystem 14, 14.2, 14.3, 14.4, 14.5, 14.6, 14.7 that provides for forming a virtual image 16''' of a flat-panel two-dimensional image-display modulation array 94 illuminated by a subpupil modulator 30 comprising a controllable light source 97 incorporating a plurality of associated light-source elements 100, and that provides for collecting at least a portion of the light 16' that propagates from each light-source element 100 through the flat-panel two-dimensional image-display modulation array 94, with light 16' from each light-source element 100 forming an associated realized exit subpupil 32" on the surface 18" of the exit pupil 18, wherein as a result of the nature of the optical subsystem 14, 14.2, 14.3, 14.4, 14.5, 14.6, 14.7 and the shape and location of the surface 18" of the exit pupil 18 in relation to that of the front surface 20' of the eye 20, the lateral extent of at least some of the realized exit subpupils 32" are expanded relative to what would have been corresponding idealized exit subpupils 32, so that at least some adjacent realized exit subpupils 32" overlap one another by at least twenty (20) percent. Accordingly, the resulting plurality of realized exit subpupils 32" create, and when activated, fill, the associated exit pupil 18 with an array of similar but spatially-distinct, incompletely-overlapping realized exit subpupils 32". Accordingly, each realized exit subpupil 32", although generated by, is not necessarily a well-formed image of, a corresponding light-source element 100, and the controllable light source 97/subpupil modulator 30 is not necessarily a corresponding well-formed entrance pupil 28' of the optical subsystem 14, 14.2, 14.3, 14.4, 14.5, 14.6, 14.7.

Responsive to the determination by the eye-tracking subsystem 42 of a location and extent of the eye pupil 38, the subpupil modulation controller 50 provides for deactivating modulated subpupils 32' associated with exit subpupils 32 that are either outside the associated Active Subpupil Region (ASR) 72, or that do not even partially overlap the eye pupil 38, which provides for reducing the reflection of extraneous light 16$^{iv}$ from the front surface 20' of the eye 20, and which, for a near-eye display system 10, 10.2, 10.3, 10.4, 10.5 incorporating a controllable light source 97, provides for reducing power consumed by the controllable light source 97. However, for relatively-expanded realized exit subpupils 32", relatively to counterpart idealized exit subpupils 32, a relatively-higher number of realized exit subpupils 32" would prospectively at least-partially overlap the eye pupil 38, thereby expanding the associated corresponding effective Active Subpupil Region (ASR) 72', so that under this relatively-simple subpupil control strategy,—i.e. in accordance with either the first-aspect 70.1 or second-aspect 70.2 subpupil modulation scheme 70, supra—relatively-fewer associated modulated subpupils 32' could be deactivated without impacting perception of the virtual image 16''' being viewed by the user 22.

Figure 61:
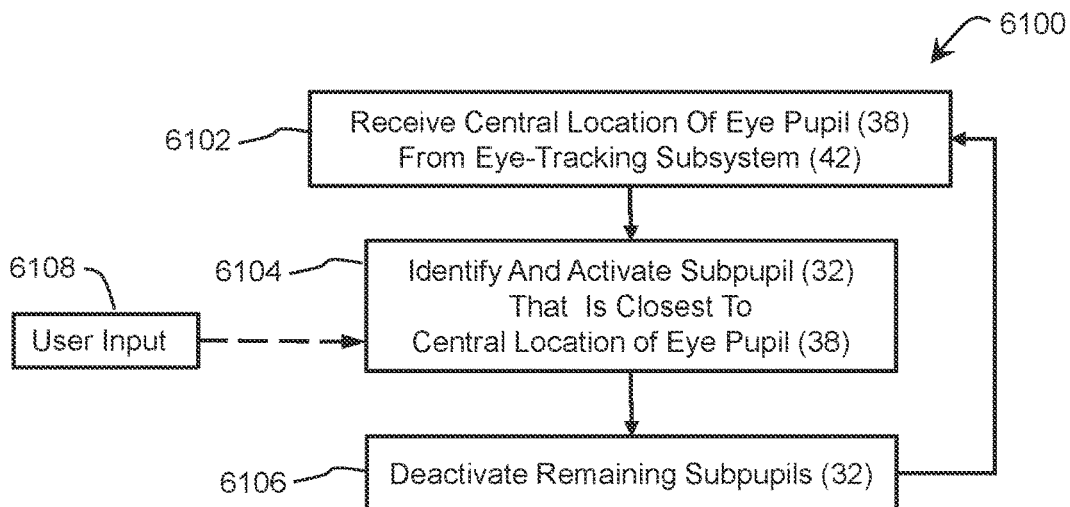
FIG. 61 illustrates a first aspect of a process for controlling a subpupil modulator, which provides for activating a single subpupil located closest to a central location an eye pupil of an eye being illuminated by a near-eye display system.

Referring to FIG. 61, a first aspect of a subpupil modulation control process 6100 for controlling a subpupil modulator 30 provides for activating a single modulated subpupil 32' most closely associated with a central location of an eye pupil 38 of an eye 20 at a viewing location proximate to the exit pupil 18 within the volumetric visual environment (VVE) 80, wherein, in step (6102), the subpupil modulation controller 50 receives from the eye-tracking subsystem 42 a measure of a central location—for example, the center-of-area—of the eye pupil 38. Then, in step (6104), the subpupil modulation controller 50 identifies the exit subpupil 32 that is closest to that central location of the eye pupil 32, and identifies the associated modulated subpupil 32' that corresponds to that eye pupil 32, or alternatively, directly from a table lookup of a two-dimensional table that provides the identity of the corresponding modulated subpupil 32' as a function of transverse X- and Y-locations within the exit pupil 18 of boundaries of regions illuminated by the corresponding exit subpupils 32, 32", responsive to the measure from the eye-tracking subsystem 42 of the central location of the eye pupil 38. The subpupil modulation controller 50 then activates the resulting identified modulated subpupil 32', and, in step (6106), deactivates the remaining modulated subpupils 32'. In accordance with one aspect, optional step (6108) provides for the intensity of the single light-source element 100, 90 associated with the single active modulated subpupil 32' to be adjusted responsive to input from the user 22 so as to provide for adjusting the level of brightness of the associated virtual image 16''' to the preference of the user 22. For exit subpupils 32 that are smaller in diameter than the opening of the eye pupil 38, the first-aspect subpupil modulation control process 6100 provides for implementing an embodiment of the third-aspect subpupil modulation scheme 70, 70.3, supra.

Notwithstanding the prospect of activating and viewing only a single exit subpupil 32, 32" at a time, and the associated benefit of minimal power usage and lack of, or mitigation against, vignetting, a simultaneous activation of more than one exit subpupil 32, 32" also can be beneficial for the following three reasons. First, a single light-source element 100 might be naturally limited in intensity, whereas multiple light-source elements 100 can share the burden and assure that the overall perceived image brightness is relatively constant, independent of gaze direction 34. Second, it may be challenging to track the eye pupil 38 sufficiently accurately, or sufficiently fast, to provide for activating the light-source element 100 from which light 16' generated thereby would pass through the eye pupil 38, whereas a plurality of simultaneously-activated exit subpupils 32, 32" associated with a relatively-larger Active Subpupil Region (ASR) 72 could help assure that the overall perceived image brightness is relatively constant, independent of gaze direction 34. Third, and finally, a single light-source element 100, especially if very small, results in a relatively-large depth of focus, which not only can reveal structures or contaminants of the optical subsystem 14, 14.2, 14.3, 14.4, 14.5, 14.6, 14.7 located away from the flat-panel two-dimensional image-display modulation array 94, but, if sufficiently small, could provide for revealing adverse effects of diffraction or interference that might otherwise detract from a desired naturally appearing virtual image 16''' of the flat-panel two-dimensional image-display modulation array 94.

Notwithstanding the benefit of relatively small, non-overlapping idealized exit subpupils 32 in order to provide for prospectively deactivating the most possible associated light-source elements 100, and thereby minimizing associated power usage, it should be understood that the exit subpupils 32 need not necessarily be of similar size or shape, nor non-overlapping with respect to one another, nor necessarily well-formed images of the corresponding light-source elements 100/modulated subpupils 32', which provides for significantly relaxing the requirements of the design of the associated optical subsystem 14, 14.2, 14.3, 14.4, 14.5, 14.6, 14.7. Instead, for a realized exit subpupil 32" of arbitrary size, shape and image quality, in accordance with second through fourth aspects of associated subpupil modulation control processes, infra, the subpupil modulation controller 50 in cooperation with the eye-tracking subsystem 42 provides for further controlling the modulated subpupils 32' for which the corresponding associated realized exit subpupils 32" at least partially overlap the eye pupil 38, so as to provide for reducing power usage and possibly the reflection of extraneous light 16$^{iv}$ from the front surface 20' of the eye 20. In accordance with one aspect, this is provided for by first establishing a predetermined mapping—for each light-source element 100/modulated subpupil 32'—of the location, lateral extent (e.g. shape and size), and intensity profile of each corresponding realized exit subpupil 32". In view of the intensity of the light 16' passing through each exit subpupil 32, 32" not likely being uniform thereacross, the intensity profile of the associated exit subpupil 32, 32" can be used to adjust/optimize the intensities of the active exit subpupils 32, 32" so as to provide for a beneficial/optimal overall intensity profile within the associated Active Subpupil Region (ASR) 72, so as to not only maintain a uniform perceived brightness as the eye pupil 38 scans through different gaze directions 34, but also, to the extent possible, to concentrate the light 16' through the center of the eye pupil for best perceived quality of the virtual image 16'''.

Figure 62:
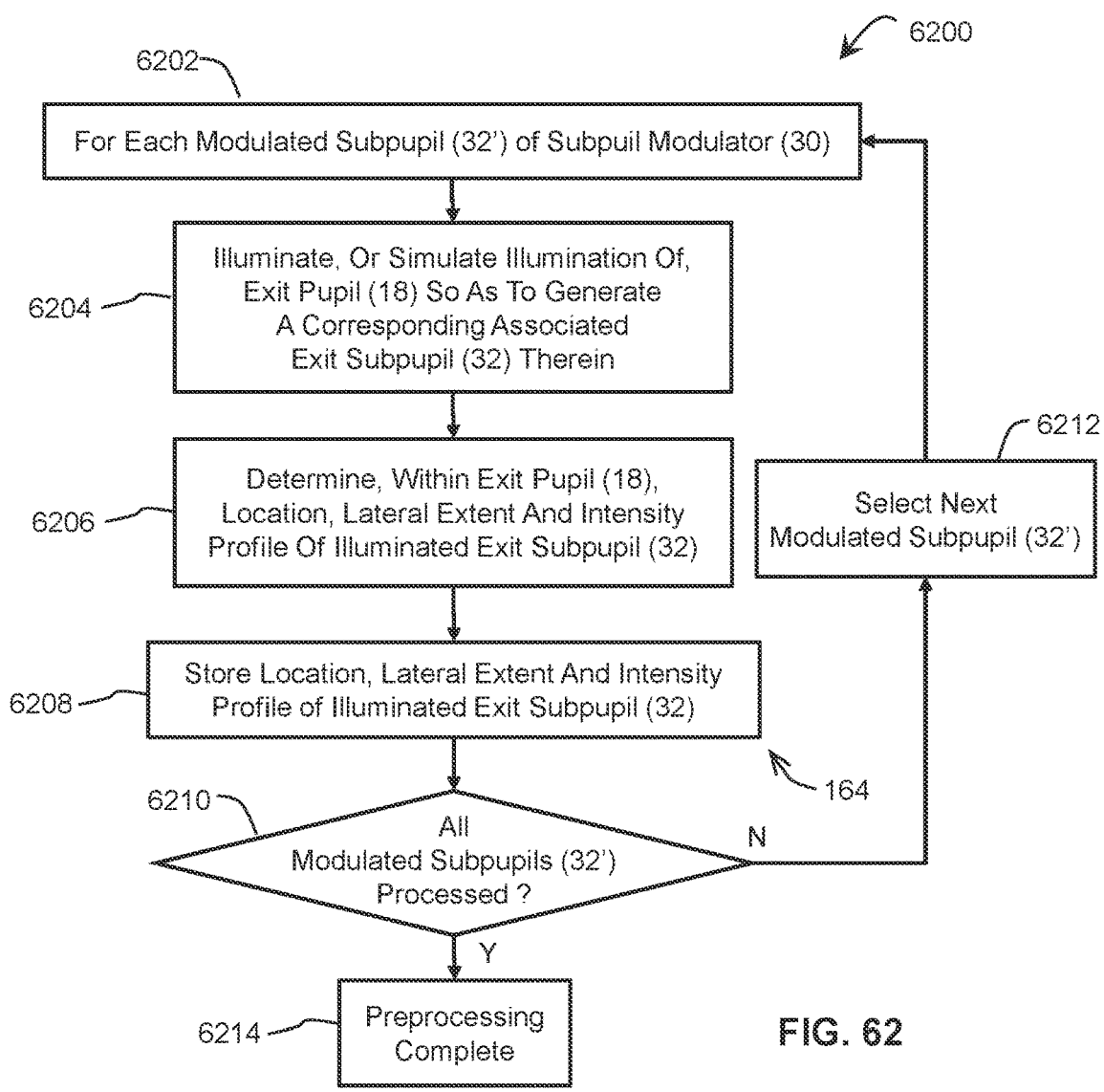
FIG. 62 illustrates a process for mapping locations, lateral extents and intensity profiles of each of a plurality of subpupils for use by one or more processes to control a subpupil modulator.

More particularly, referring to FIG. 62, an associated subpupil mapping process 6200 commences, in step (6202), with the selection of a modulated subpupil 32'/light-source element 100 of the of the plurality of modulated subpupils 32'/light-source elements 100 of the subpupil modulator 30. Then, in step (6204), the selected modulated subpupil 32'/light-source element 100 is activated—either actually in cooperation with the hardware of an associated near-eye display system 10, or by simulation—to provide for illuminating, or simulating the illumination of, an associated exit pupil 18, so as to generate an associated exit subpupil 32, 32" therewithin. Then, the location, lateral extent (e.g. size and shape), and intensity profile of the illuminated exit subpupil 32, 32" are determined in step (6206), and, in step (6208), stored for future use, for example, in an exit-subpupil characterization table 164, after which, from step (6210), the next modulated subpupil 32'/light-source element 100 is selected in step (6212), and the process of steps (6202) through (6212) is repeated until all of the modulated subpupils 32'/light-source element 100 have been processed, after which, from step (6210), the mapping process is complete in step (6214), with the locations, lateral extents, and intensity profiles of all the exit subpupils 32, 32" having been determined and stored for future use. Accordingly, for a particular viewing direction and opening of the eye pupil 38, and a resulting particular area within the exit pupil 18 occupied by the eye pupil 38, the exit-subpupil characterization table 164 provides for identifying those exit subpupils 32, 32" that overlap with that area; and for each such exit subpupil 32, 32", the relative amount of light within that overlapping area, relative to the total amount of light of that exit subpupil 32, 32", and the identity of the corresponding associated modulated subpupil 32'/light-source element 100.

Figure 63:
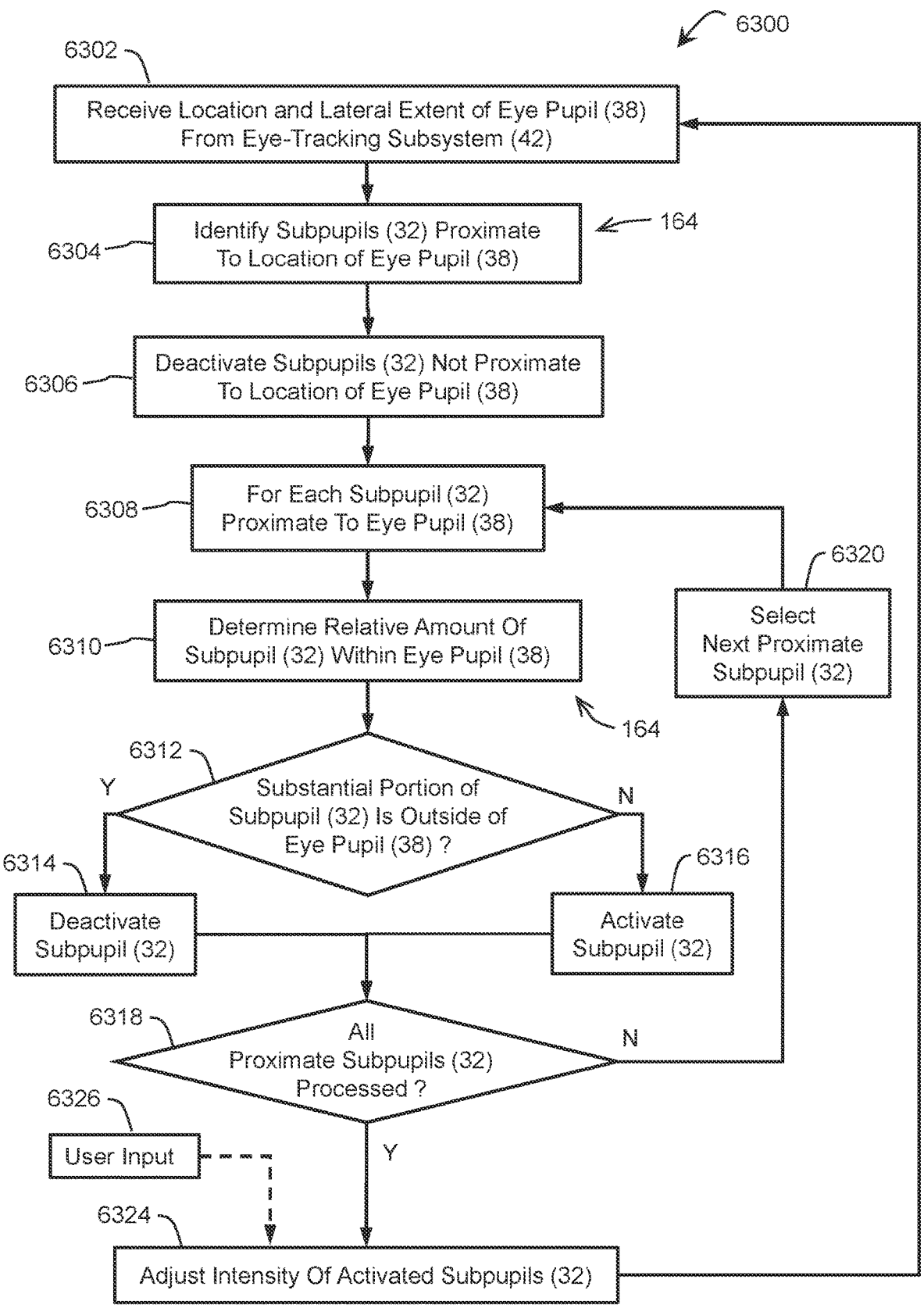
FIG. 63 illustrates a second aspect of a process for controlling a subpupil modulator that provides for deactivating subpupils for which a substantial portion thereof is located outside of an eye pupil of an eye being illuminated by a near-eye display system.

Referring to FIG. 63, a second aspect of a subpupil modulation control process 6300 for controlling a subpupil modulator 30 that provides for controlling activation of exit subpupils 32, 32" responsive to the degree of overlap thereof with an eye pupil 38, commences, in step (6302), with receipt—from the eye-tracking processor 48 of the eye-tracking subsystem 42—of measures of the location and lateral extent (e.g. size and shape) of the eye pupil 38. Then, in step (6304), using the exit-subpupil characterization table 164 determined by the subpupil mapping process 6200, supra, the subpupil modulator 30 identifies the subset of exit subpupils 32, 32" that are proximate to the location of the eye pupil 38, for example exit subpupils 32, 32" either that are within, or that at least in part overlap, the eye pupil 38.

For example, referring to FIGS. 60 and 64,—the latter representing an intensity profile of the former through the center of the eye pupil 38,—the set of exit subpupils 32, 32" labeled as "A", "B", or "C" are identified as being proximate to the eye pupil 38 as a result of each of these exit subpupils 32, 32" either being entirely within (i.e. "A"), or intersecting (i.e. "B" and "C") the boundary of the eye pupil 38. Each of the exit subpupils 32, 32", except for the central exit subpupil 32 labeled as "A", is illustrated in FIG. 60 with a pair of inner and outer concentric circles, with the inner circle representing the extent of a corresponding idealized exit subpupil 32, and the outer circle representing the extent of the corresponding realized exit subpupil 32". The Active Subpupil Region (ASR) 72 associated with the idealized exit subpupils 32 entirely encircles all of the exit subpupils 32 labeled as "A", "B", "C", "D", or "E", whereas a relatively-expanded Active Subpupil Region (ASR) 72' is needed to encircle the corresponding associated realized exit subpupil 32", thereby involving a relative larger proportion of the area of the exit pupil 18.

Returning to FIG. 63, in step (6306), the remaining exit subpupils 32, 32" that are not proximate to the eye pupil 38—for example, entirely outside the boundary of the eye pupil 38—are deactivated to conserve power and reduce the reflection of extraneous light 16$^{iv}$. For example, as illustrated in FIG. 64, the exit subpupils 32, 32" labeled "D" or "E" are deactivated. Then, beginning with step (6308), for each exit subpupil 32, 32" that was identified from step (6304) as being proximate to the eye pupil 38, in step (6310), using the exit-subpupil characterization table 164 determined by the subpupil mapping process 6200, supra, the subpupil modulator 30 determines the relative amount of the exit subpupil 32, 32" that is within the eye pupil 38, for example, either the relative area or, based upon the associated intensity profile, the relative amount of light. Then, in step (6312), if a substantial portion of the exit subpupil 32, 32" is located outside the eye pupil 38, for example, at least 80 percent, then, in step (6314), the modulated subpupil 32' associated with that exit subpupil 32, 32" is deactivated. Otherwise, from step (6312), if a substantial portion of the exit subpupil 32, 32" is not located outside the eye pupil 38, then, in step (6316), the modulated subpupil 32' associated with that exit subpupil 32, 32" is activated. Then, following either of steps (6314) or (6316), if all of the exit subpupils 32, 32" identified in step (6304) as being proximate to the eye pupil 38 have not been processed, then steps (6308) through (6314)/(6316) are repeated for the next exit subpupil 32, 32" that is selected in step (6320). Then, from step (6318), after all of the relatively-proximate exit subpupils 32, 32" have been processed, in step (6324), the intensities of the light-source elements 100 of the modulated subpupils 32' associated with the exit subpupils 32, 32" that had been activated in step (6316) are adjusted, possibly with input, in step (6326), from the user 22 in respect of the overall brightness of the perceived associated virtual image 16'''. Following step (6324), the subpupil modulation control process 6300 repeats beginning with step (6302), so as to provide for continuously tracking and responding to the location and extent of the eye pupil 38.

For example, referring also to FIG. 65, as a result of a substantial portion of the exit subpupils 32, 32" labeled "C" in FIGS. 60 and 64 being outside the eye pupil 38, in step (6314), the "C"-labeled exit subpupils 32, 32" are deactivated, and, in step (6324), the intensity of modulated subpupils 32'/light-source elements 100 associated with the "B"-labeled exit subpupils 32, 32" is increased so as to maintain the overall brightness of the virtual image 16'''. Alternatively, or additionally, the overall brightness of the virtual image 16''' could be maintained by increasing the intensity of the modulated subpupil 32'/light-source element 100 associated with the "A"-labeled exit subpupils 32, 32" to the extent possible. Absent the intensity adjustment in step (6324), the overall brightness of the virtual image 16''' would otherwise be lowered relative to that of the virtual image 16''' prior to the deactivation of the "C"-labeled exit subpupils 32, 32" in step (6314). The deactivation, in step (6314), of exit subpupils 32, 32" in cooperation the adjustment, in step (6324), of the intensity of remaining, activated exit subpupils 32, 32" provides for more efficient power usage than without the actions of steps (6314) and (6324), with the added benefit of a reduction in reflected extraneous light 16$^{iv}$.

In accordance with the first-aspect near-eye display system 10, 10.1, each point on the subpupil modulator 30, 30.1/flat-panel two-dimensional modulation array 58, and therefore, each associated modulated subpupil 32', is illuminated by the entirety of the associated flat-panel two-dimensional image-display array 52. In accordance with the second- 10.2 through fifth- 10.5 aspect near-eye display systems 10, 10.2, 10.3, 10.4, 10.5, light 104 from each modulated subpupil 32' generated by the associated controllable light source 97 of an associated subpupil modulator 30, 30.2, 30.3, 30.4, 30.5 illuminates the entirety of the associated flat-panel two-dimensional image-display modulation array 94. Accordingly, each exit subpupil 32, 32" that is generated by a corresponding associated modulated subpupil 32' contains the entirety of the image content of the virtual image 16''', so that the full image content of the virtual image 16''' is viewable by the user 22 with any activated exit subpupil 32, 32", regardless of the gaze direction 34 of the eye pupil 38. Accordingly, although a deactivation of one or more exit subpupils 32, 32" overlapping the eye pupil 38, absent a change in intensity of the remaining exit subpupils 32, 32", would simply cause the virtual image 16''' to be dimmer, the apparent brightness of the virtual image 16''' can be maintained by the subpupil modulation controller 50 by maintaining the composite intensity of the remaining, activated exit subpupils 32, 32".

Figure 66:
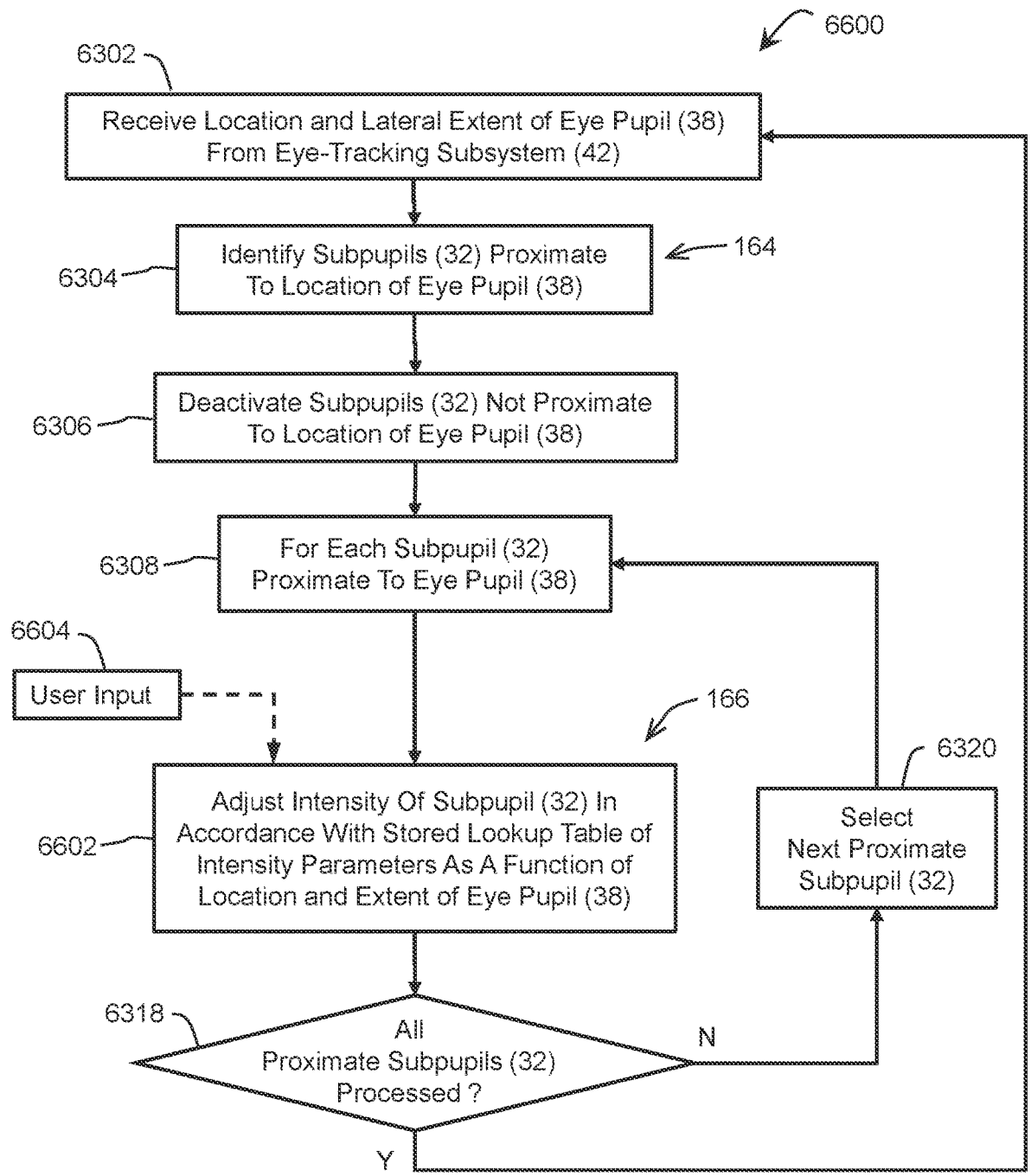
FIG. 66 illustrates a third aspect of a process for controlling a subpupil modulator that provides for deactivating subpupils that are not proximate to a location of an eye pupil of an eye being illuminated by a near-eye display system, and for controlling an intensity of remaining subpupils responsive to a location and extent of the eye pupil.

Referring to FIG. 66, a third aspect of a subpupil modulation control process 6600 for controlling a subpupil modulator 30 also provides for controlling activation of exit subpupils 32, 32" responsive to the degree of overlap thereof with an eye pupil 38, and is the same as the second-aspect subpupil modulation control process 6300, supra, except that steps (6310) through (6316), (6324) and (6326) are replaced by steps (6602) and (6604), wherein, following step (6308), for each exit subpupil 32, 32" proximate to the eye pupil 38, in step (6602), the subpupil modulation controller 50 adjusts the intensity thereof—e.g. by adjusting the intensity of the corresponding associated modulated subpupil 32'/light-source element 100—in accordance with a predetermined, stored exit-subpupil intensity-control table 166 that provides the intensity of the associated modulated subpupil 32'/light-source element 100 as a function of the measures from step (6302) of location and extent of eye pupil 38, so as to provide for a prospective optimal level of intensity of the modulated subpupil 32'/light-source element 100 to the satisfaction of most users 22. For example, in accordance with one aspect, the exit-subpupil intensity-control table 166 is predetermined by simulating the second-aspect subpupil modulation control process 6300, supra, for a range of possible locations and extents of the eye pupil 38, and recording, as a function of the locations and extents of the eye pupil 38, the resulting intensity levels of the associated modulated subpupils 32'/light-source elements 100 that are determined thereby responsive to the associated exit-subpupil characterization table 164. In accordance with one set of embodiments, the exit-subpupil intensity-control table 166 contains a set of intensity factors that are used to multiply a corresponding predetermined, stored nominal intensity levels modulated subpupils 32'/light-source elements 100. Similar to the second-aspect subpupil modulation control process 6300, supra, the intensities of the modulated subpupils 32'/light-source elements 100 from the associated exit-subpupil intensity-control table 166 may be adjusted responsive to input from a particular user 22 in step (6604) so as to provide for a desired level of overall brightness of the perceived associated virtual image 16'''.

Figure 67:
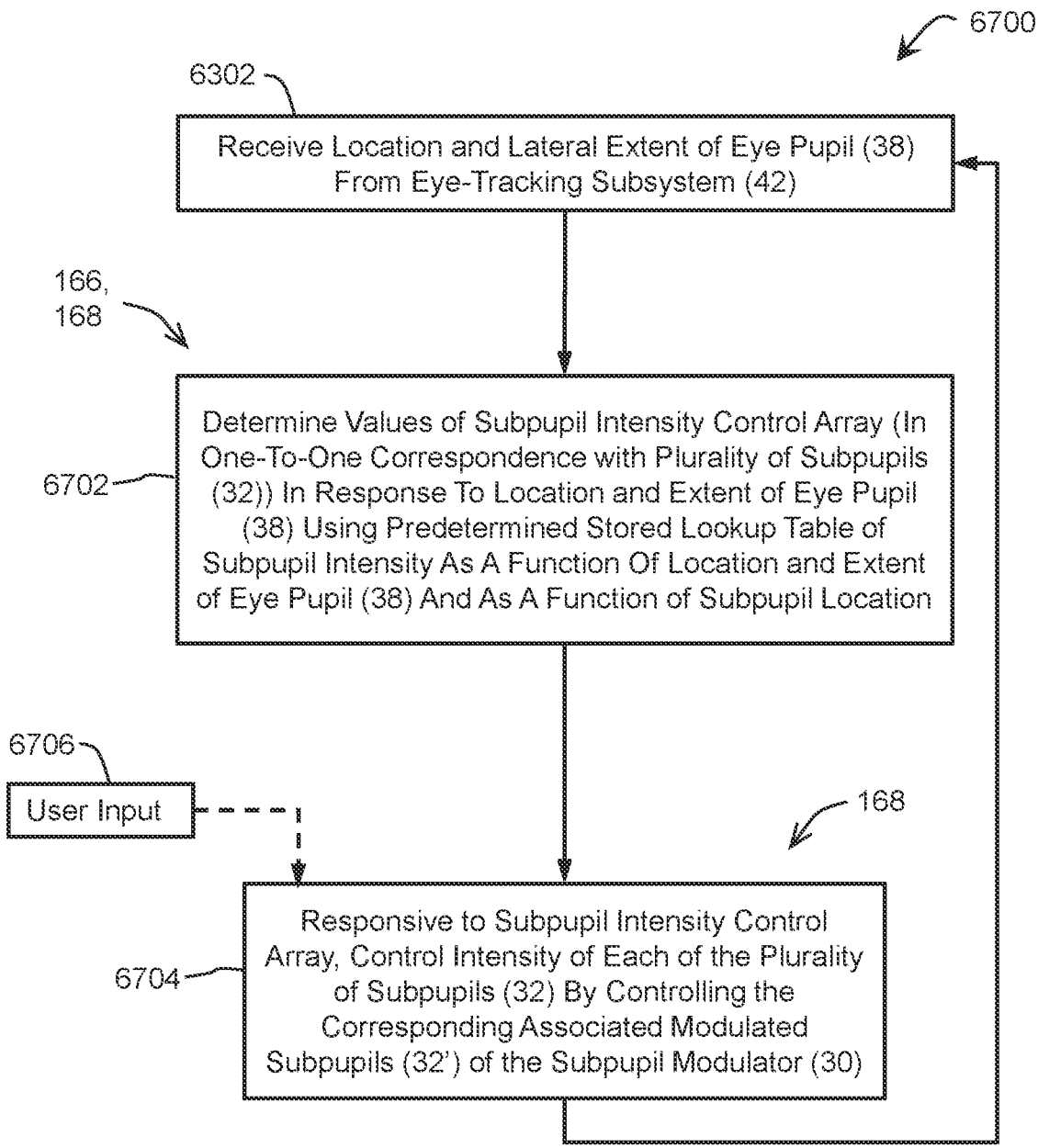
FIG. 67 illustrates a fourth aspect of a process for controlling a subpupil modulator that provides for controlling the intensities of light through each of a plurality of subpupils responsive to a predetermined stored lookup table of subpupil intensity as a function of the location of the subpupil, and as a function of the location and extent of an eye pupil of an eye being illuminated by a near-eye display system.

Referring to FIG. 67, a fourth aspect of a subpupil modulation control process 6700 for controlling a subpupil modulator 30 also provides for controlling activation of exit subpupils 32, 32" responsive to the degree of overlap thereof with an eye pupil 38, and is the same as the third-aspect subpupil modulation control process 6600, supra, except that steps (6304) through (6320), (6602) and (6604) are replaced by steps (6702) through and (6706), wherein, following step (6302), for a particular set of measures of the location and lateral extent of the eye pupil 38 from the eye-tracking subsystem 42, in step (6702), the subpupil modulation controller 50 determines the intensity control values of each element of a global subpupil intensity control array 168, the elements of which are in one-to-one correspondence with the modulated subpupils 32'/light-source elements 100, 90 of the associated subpupil modulator 30, 30.2, 30.3, 30.4, 30.5, the values of which can range from OFF or zero for a corresponding deactivated exit subpupil 32, 32" to a maximum level corresponding to a maximum level of intensity of the associated modulated subpupil 32'/light-source element 100, 90, and include levels therebetween (either continuous or discrete) less than the maximum level of intensity so as to provide for intermediate levels of intensity of the associated modulated subpupil 32'/light-source element 100, 90. For example, in accordance with one set of embodiments, the levels of intensity of the elements of the global subpupil intensity control array 168 are the same, or at least substantially the same, as what would be provided for by either the second- or third-aspect subpupil modulation control processes 6300, 6600, supra, possibly limited to the determination for the exit subpupil 32, 32" within the associated Active Subpupil Region (ASR) 72, with the remaining exit subpupils 32, 32" deactivated, thereby precluding the need to determine in real time which exit subpupils 32, 32" are outside of the Active Subpupil Region (ASR) 72 unless the Active Subpupil Region (ASR) 72 is being modified in real time, for example, when compensating for rapid eye movements. In accordance with one set of embodiments, the predetermined intensity values of the exit-subpupil intensity-control table 166 provide for a consistent perceived brightness of the virtual image 16''' while maximizing power efficiency, for example, by maximizing the number of modulated subpupils 32' that are deactivated.

In accordance with one aspect, the values of the elements of the global subpupil intensity control array 168 are determined responsive to the measures of the location and lateral extent of the eye pupil 38 from the eye-tracking subsystem 42, provided from step (6302), for example, using the third-aspect subpupil modulation control process 6600, with the associated values of the exit-subpupil intensity-control table 166 predetermined—either by simulation or measurement—for a range of possible values of the measures of the location and lateral extent of the eye pupil 38, for each of the possible exit subpupils 32, 32" within the exit pupil 18, and associated with the complete set of modulated subpupils 32' of the subpupil modulator 30, 30.2, 30.3, 30.4, 30.5. In accordance with one aspect in cooperation with a predetermined exit-subpupil intensity-control table 166 covering the range of possible conditions of the eye pupil 38, the intensity values of the elements of the global subpupil intensity control array 168 are provided for by a table-lookup process by which the intensity value of each exit subpupil 32, 32"—ranging from deactivated to maximum intensity, and intensity levels therebetween—is determined for each of the exit subpupils 32, 32" by a table lookup of the exit-subpupil intensity-control table 166 responsive to the location and extent of the eye pupil 38. Following the determination in step (6702) of the intensity control levels of the global subpupil intensity control array 168, in step (6704), each of the corresponding associated modulated subpupils 32' of the subpupil modulator 30, 30.2, 30.3, 30.4, 30.5 is controlled responsive thereto, and possibly further responsive to input from a particular user 22 in step (6706) so as to provide for a desired level of overall brightness of the perceived associated virtual image 16'''.

Notwithstanding the prospective reduction in power as a result of the modulation of variable-intensity light-source elements 100 associated with realized exit subpupil 32", it is possible that one or more regions of activated exit subpupils 32, 32" might be larger than the eye pupil 38, and therefore, not as susceptible to benefit from intensity modulation as would be sufficiently smaller exit subpupils 32, 32" of a relatively-more-ideal associated optical subsystem 14, 14.2, 14.3, 14.4, 14.5, 14.6, 14.7 for which all of the light 16' from a single light-source element 100 might pass entirely through the eye pupil 38, so as to provide for deactivating other exit subpupils 32, 32". However, from an analysis of one set of embodiments, operating in cooperation with typical locations and extents (diameters) of an eye pupil 38, even without optimizing the use of variable-intensity light-source elements 100, it was found that approximately 60 to 80 percent of the light-source elements 100 could be deactivated at any given time, demonstrating the prospect of a relatively-wide field-of-view near-eye display system 10 incorporating relatively simple and realistic components in a relatively-compact arrangement, particularly if the optical path between the light-source elements 100 and the exit pupil 18 is folded with one or more reflective surfaces, infra.

The diameter of a typical eye pupil 38 is in the range of 2 to 8 millimeters, and is responsive to the overall intensity of the virtual image 16''', wherein the diameter/size of the eye pupil 38 is inversely related to the brightness of the virtual image 16''', as would be the diameter/size of the associated Active Subpupil Region (ASR) 72, the latter of which provides for deactivating relatively-more exit subpupils 32, 32" in association with a relatively-brighter virtual image 16''' than for a relatively-dimmer virtual image 16'''.

Each exit subpupil 32, 32" is a collection of light 16' from, and in one-to-one correspondence with, a corresponding modulated subpupil 32', for example, but not limited to, a real image of the modulated subpupil 32'. For the first-aspect near-eye display system 10, 10.1, the modulated subpupil 32' corresponds to a light-modulating pixel 60 of an associated flat-panel two-dimensional modulation array 58. For a second- 10.2, or third- 10.3 aspect near-eye display system 10, 10.2, 10.3 the modulated subpupil 32' corresponds to a light-source element 100 of an associated controllable light source 97. For the fourth-aspect near-eye display system 10, 10.4, the modulated subpupil 32' corresponds to a modulation element 90 of an associated controllable light source 97. For the fifth-aspect near-eye display system 10, 10.5, the modulated subpupil 32' corresponds to a light-emitting pixel 54 of an associated waveguide projector 152.

The size, shape, and intensity profile of each exit subpupil 32, 32" depends upon a) the size, shape, and intensity profile the associated source of light 104 at the associated modulated subpupil 32'; b) the ability of the associated optical subsystem 14, 14.1, 14.2, 14.3, 14.4, 14.5, 14.6, 14.7 to form an image of the modulated subpupil 32'; and c) the transverse location of the modulated subpupil 32' relative to the optical axis 36 of the optical subsystem 14, 14.1, 14.2, 14.3, 14.4, 14.5, 14.6, 14.7, i.e. the degree to which the modulated subpupil 32' is on- or off-axis relative to the optical axis 36, wherein an on-axis exit subpupil 32, 32" would likely have better image quality than an off-axis exit subpupil 32, 32".

For relatively-smaller exit subpupils 32, 32"—even if relatively blurred by either an imperfect optical subsystem 14, 14.1, 14.2, 14.3, 14.4, 14.5, 14.6, 14.7 or a misalignment between user 22 and the near-eye display system 10—relatively more exit subpupils 32, 32" would likely be outside the Active Subpupil Region (ASR) 72 and therefore subject to deactivation, so as to provide for a relatively greater power savings. Although generally, relatively-smaller exit subpupils 32, 32" are beneficial, practical limits either on a) the density of associated pixels 60, 54 or light-source elements 100, or b) the performance of the associated optical subsystem 14, 14.1, 14.2, 14.3, 14.4, 14.5, 14.6, 14.7, or an associated user-caused misalignment thereof, can limit the lower bound on the size of the exit subpupils 32, 32". For example, in one set of embodiments, a diameter of exit subpupils 32, 32" in the range of 0.5 to 2.0 millimeters is beneficial because: a) a larger diameter would imply greater overlap of adjacent exit subpupils 32, 32" and thereby involve relatively more complex mapping and intensity control of any of the second- through fourth-aspect subpupil modulation control process 6300, 6600, 6700; b) a diameter in the range of 0.5 to 2.0 millimeters would be sufficiently smaller than the eye pupil 38 so as to provide for utilizing an Active Subpupil Region (ASR) 72 with a single exit subpupil 32, 32" located within the eye pupil 38 so as to provide for maximum power savings; and c) for a smaller diameter, maintenance of a proper image of a point light source would be challenging to implement, and likely not cost effective, even with a relatively good optical subsystem 14, 14.1, 14.2, 14.3, 14.4, 14.5, 14.6, 14.7, particularly when subject to an associated user-caused misalignment thereof.

Referring again to FIGS. 59a and 59b, an ideal optical subsystem 14 forms a real image of each modulated subpupil 32' as a corresponding idealized exit subpupil 32, possibly with magnification, that is focused on the surface 18" of the exit pupil 18, i.e. the subpupil surface 84, which in turn is aligned with the eye pupil 38 and which conforms to the front surface 20' of the eye 20. However, referring again to FIG. 59c, for an optical subsystem 14 with imperfect optical components, or for a subpupil surface 84 that is either misaligned with respect to the eye pupil 38 or that does not conform to the front surface 20' of the eye 20, the resulting realized exit subpupil 32", to first order, might be an effectively blurred image of the associated modulated subpupil 32', for which adjacent realized exit subpupils 32" of an array of realized exit subpupils 32" associated with a corresponding array of modulated subpupils 32' of an associated subpupil modulator 30 might overlap with one another, particularly given the typically minimal practical separation between adjacent modulated subpupils 32', for example, adjacent light-source elements 100. If such blurring and overlapping is relatively consistent across the subpupil surface 84, then the user 22 will not see significant differences in intensity as the eye pupil 38 is rotated and directed at different locations of the virtual image 16''' provided that no light 16' from a deactivated exit subpupil 32, 32" would have reached the eye pupil 38 if activated or, in other words, provided that the Active Subpupil Region (ASR) 72 is sufficiently large to prevent such a condition. However, the larger the size of the exit subpupil 32, 32", the greater the likelihood of more exit subpupils 32, 32" overlapping the eye pupil 38, and therefore the larger the size of the Active Subpupil Region (ASR) 72 would need to be in order to preclude that condition from occurring. If the region occupied by the exit subpupil 32, 32" was entirely outside the eye pupil 38, then the deactivation thereof would not have an impact on the perceived brightness of the virtual image 16'''. Accordingly, one method of mitigating against a prospective perceived reduction in brightness of the virtual image 16''' responsive to a prospective deactivation of exit subpupils 32, 32"—absent a modification of the brightness of activated exit subpupils 32, 32", infra—would be to increase the size of the Active Subpupil Region (ASR) 72 so that only those exit subpupils 32, 32" that do not overlap with the eye pupil 38 would be subject to deactivation. Furthermore, as the size of the Active Subpupil Region (ASR) 72 is increased, a relatively lesser proportion of the exit subpupils 32, 32" are outside thereof and susceptible to automatic deactivation to reduce power usage. Generally, exit subpupils 32, 32" having a diameter between 0.5 and 2.0 millimeters are beneficial because the size of the Active Subpupil Region (ASR) 72 would then need to be only slightly larger than that of eye pupil 38 under the relatively simplest implementation, for example, in accordance with the first-aspect subpupil modulation scheme 70, 70.1, supra, while also alternatively providing for a relatively smaller Active Subpupil Region (ASR) 72 in accordance either the third-aspect subpupil modulation scheme 70, 70.3, supra, or any of the first- through fourth-aspect subpupil modulation control processes 6100, 6300, 6600, 6700, supra.

In an extreme case, the exit subpupils 32, 32" are not only blurred images of their corresponding associated modulated subpupils 32', but also vary in size, shape and intensity profile (i.e. the profile of propagated optical ray density through each given point within the subpupil) relative to one another as a result of passage through different portions of the optical subsystem 14. For example, it is anticipated that exit subpupils 32, 32" formed from rays that propagate from a modulated subpupil 32' that is relatively distal to the optical axis 36 of the optical subsystem 14 will be formed sub-optimally, resulting in a corresponding relatively-larger exit subpupil 32, 32" with a relatively non-uniform intensity profile relative to an exit subpupil 32, 32" associated with a modulated subpupil 32' that is relatively proximal to the optical axis 36. Under the first-aspect subpupil modulation scheme 70, 70.1, supra, if the Active Subpupil Region (ASR) 72 is sufficiently large to encompass the entirety of such sub-optimally-formed exit subpupils 32, 32" that could overlap the eye pupil 38 by even a small amount, then the corresponding associated modulated subpupils 32' would remain activated.

Figure 68:
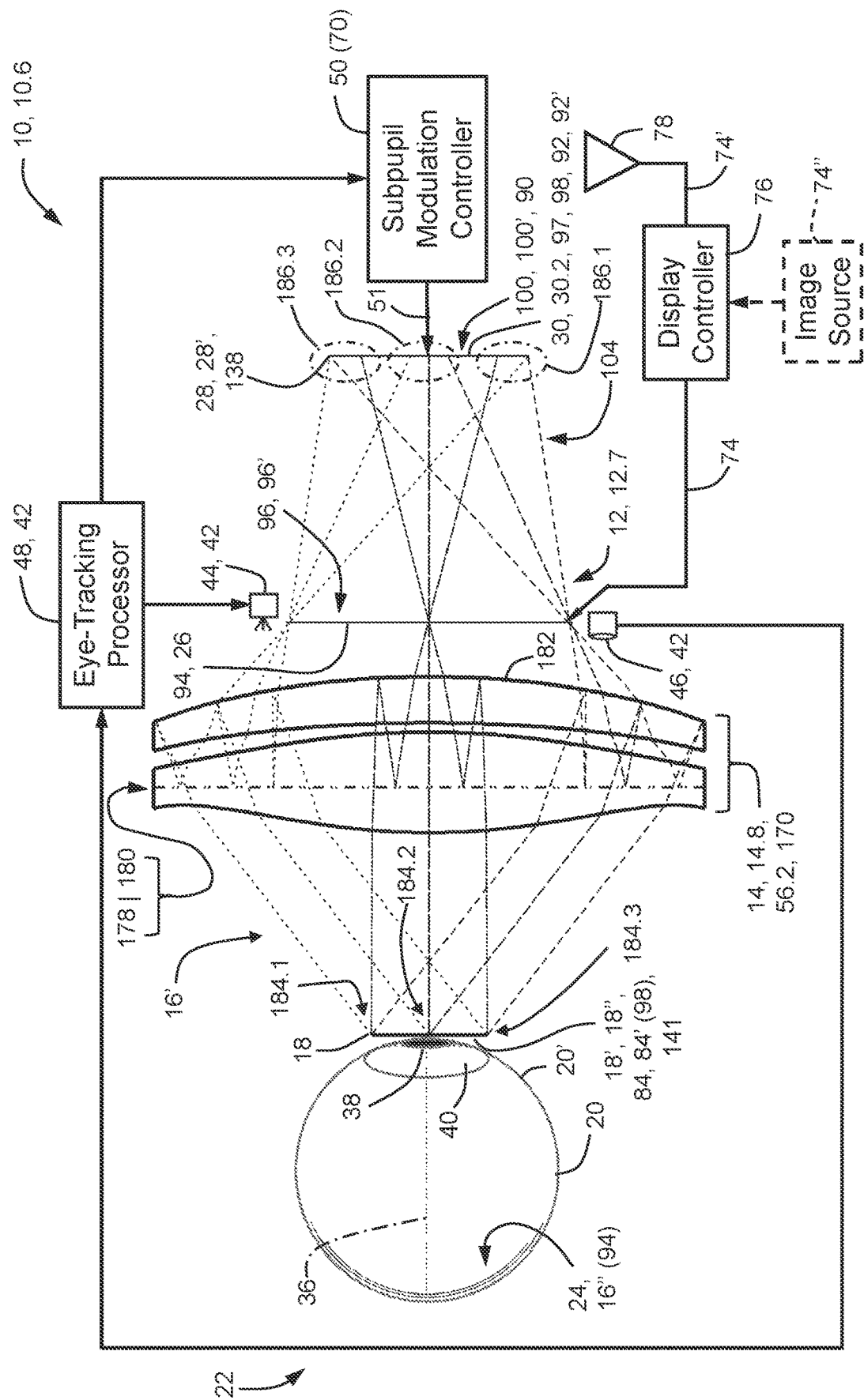
FIG. 68 illustrates a side view of a sixth aspect of a near-eye display system incorporating a catadioptric magnifier, showing optical ray traces from three regions of an associated light-generating subpupil modulator associated with the central and lateral extreme portions of the subpupil modulator.
Figure 69:
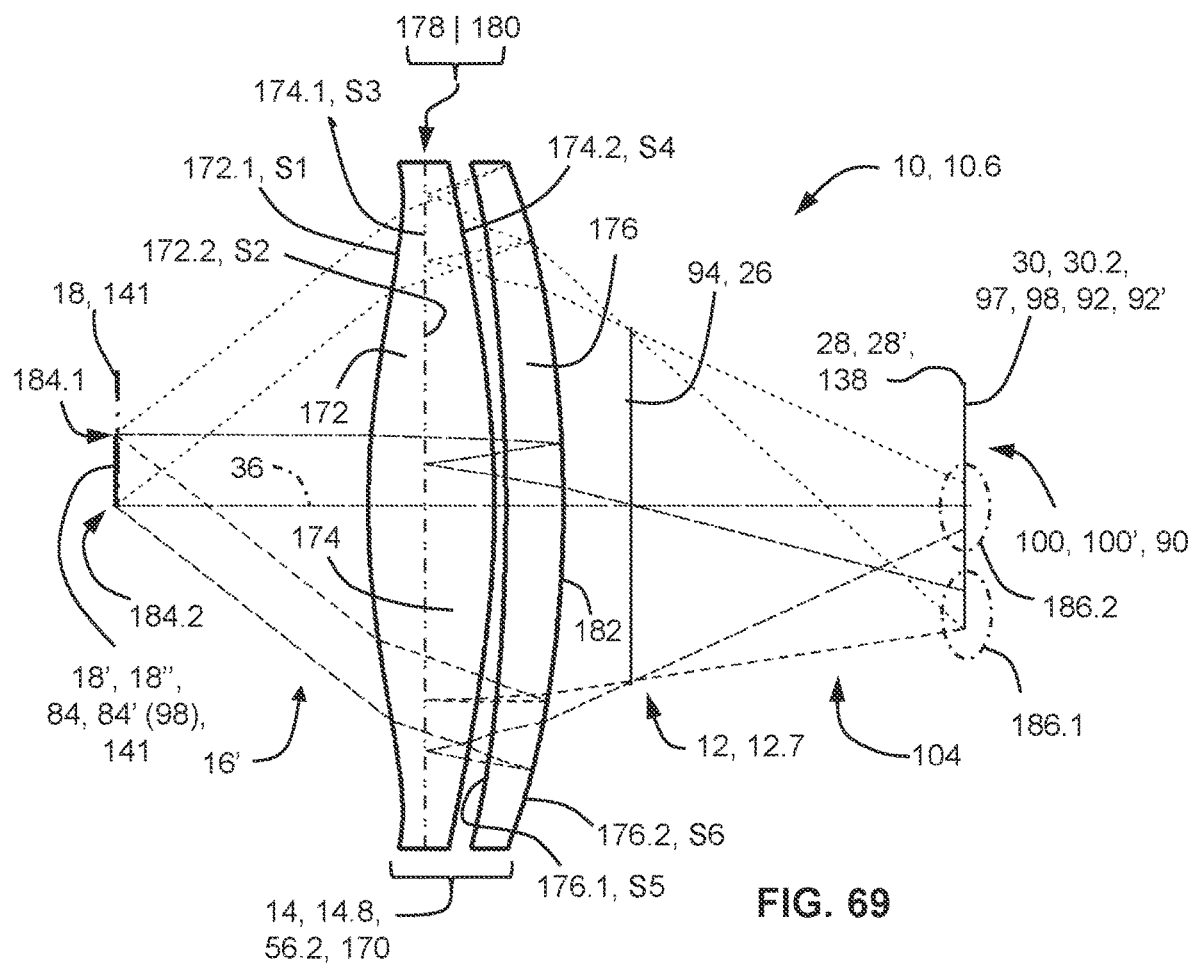
FIG. 69 illustrates a side view of a sixth aspect of the near-eye display system illustrated in FIG. 68, but showing optical ray traces from only two regions of the associated light-generating subpupil modulator associated with the central and one of the lateral extreme portions of the subpupil modulator.

Referring to FIGS. 68 and 69, a sixth-aspect near-eye display system 10, 10.6 is the same as the second-aspect near-eye display system 10, 10.2, supra, except that the sixth-aspect near-eye display system 10, 10.6 does not incorporate a first dioptric-power optical element 56, 56.1, 56.1', $L_1$, and, instead of a second dioptric-power optical element 56, 56.2, 56.2', $L_2$, the sixth-aspect near-eye display system 10, 10.6 incorporates at the same relative location— i.e. between the flat-panel two-dimensional image-display modulation array 94 and the associated exit pupil 18—a catadioptric magnifier 170 as the associated eighth-aspect optical subsystem 14, 14.8. Accordingly, the associated flat-panel two-dimensional image-display modulation array 94 cooperates directly with the controllable light source 97/flat-panel two-dimensional light-source array 98 as the associated seventh-aspect image generator 12, 12.7 that provides for generating the light 16' of the virtual image 16''' by modulating the light 104 from the controllable light source 97. The catadioptric magnifier 170—also referred to as a "pancake lens"—incorporates an internally-folded optical path in a compact form that provides for relatively-high image quality and a relatively-large field-of-view in a relatively-compact arrangement of refractive, reflective and polarization components, for example, as described in the following references, each of which is incorporated by reference in its entirety: "Folded optics with birefringent reflective polarizers" by Timothy L. Wong, Zhisheng Yn, Gregg Ambur and Jo Etter, Porc. SPIE 10335, Digital Optical Technologies 2017, 103350E (26 Jun. 2017); doi; 10.1117/12.2270266; and U.S. Pat. No. 3,940,203 to Joseph Anthony La Russa, issued on 24 Feb. 1976.

More particularly, referring to FIG. 69, the catadioptric magnifier 170 incorporates first 172, second 174, and third 176 dioptric elements, oriented with a first surface 172.1 (also designated as the S1 surface) of the first dioptric element 172 facing the exit pupil 18, a second surface 172.2 (also designated as the S2 surface) of the first dioptric element 172 facing a first surface 174.1 (also designated as the S3 surface) of the second dioptric element 174, a second surface 174.2 (also designated as the S4 surface) of the second dioptric element 174 facing a first surface 176.1 of the third dioptric element 176, and a second surface 176.2 (also designated as the S6 surface) of the third dioptric element 176 facing the flat-panel two-dimensional image-display modulation array 94. A reflective linear polarizer 178 and a quarter-wave plate 180 are located between the first 172 and second 174 dioptric elements and abutting one another, with the reflective linear polarizer 178 also abutting the second surface 172.2 of the first dioptric element 172, and the quarter-wave plate 180 also abutting the first surface 174.1 of the second dioptric element 174. The reflective linear polarizer 178 provides for reflecting light of a first direction of linear polarization, and provides for transmitting light of a second direction of linear polarization that is relatively orthogonal to the first direction of linear polarization. The quarter-wave plate 180 provides for converting linearly-polarized light to circularly-polarized light, and can provide for converting circularly-polarized light to linearly-polarized light, as described in U.S. Pat. No. 3,940,203. The second surface 176.2 of the third dioptric element contains a reflective coating 182 (e.g. half silvered), for example, in one set of embodiments, that provides for reflecting about half of the light incident thereupon. In cooperation with the illustrated catadioptric magnifier 170, the sixth-aspect near-eye display system 10, 10.6 is configured so that light 16' entering the catadioptric magnifier 170 from the flat-panel two-dimensional image-display modulation array 94 is preconditioned to be circularly polarized. In one set of embodiments, the first 172, second 174, and third 176 dioptric elements are made of injection-moldable acrylic, for example, for the second 174, and third 176 dioptric elements, with minimum birefringence.

In operation of the sixth-aspect near-eye display system 10, 10.6, half of the circularly-polarized light 16' from the flat-panel two-dimensional image-display modulation array 94 incident upon the S6 surface is reflected and lost. The remaining light 16' is transmitted through the S6 surface and subsequently refracted at the S5 surface and then refracted at the S4 surface, and then subsequent transmitted through the S3 surface and the quarter-wave plate 180 in abutment therewith, which converts the circularly-polarized light 16' to linearly-polarized light 16' having the first direction of linear polarization, which is then reflected by the reflective linear polarizer 178 in abutment with the quarter-wave plate 180. The reflected linearly-polarized light 16' is then again transmitted a second time through the quarter-wave plate 180 and converted thereby to circularly-polarized light 16', which is then refracted by the S4 surface and then refracted by the S5 surface, after which, half of that circularly-polarized light 16' is internally reflected by the reflective coating 182 on the S6 surface, with the remainder of that light 16' being transmitted through the S6 surface and lost. The internally reflected light 16'—circularly polarized, but of opposite handedness to the light 16' that was initially incident upon the catadioptric magnifier 170—is then refracted by the S5 surface and then refracted by the S4 surface, and then transmitted through the S3 surface and then transmitted a third time through the quarter-wave plate 180 and converted thereby to linearly-polarized light 16', but having the second direction linear polarization, so as to provide for that light 16' to be transmitted through the reflective linear polarizer 178, then transmitted through the S2 surface, and finally refracted by the S1 surface for propagation to the exit pupil 18, after having been transmitted three times through each of the S4 and S5 surfaces.

It should be understood that the particular configuration of the catadioptric magnifier 170 illustrated in FIGS. 68 and 69,—and described hereinabove to provide a general description of how refractive, reflective and polarization elements can work in a multi-pass catadioptric arrangement as a catadioptric magnifier 170,—is not limiting, and that other polarization implementations, assignments of polarization and reflective surfaces and types and numbers of elements may be applied to effectively create other embodiments of a catadioptric magnifier 170 in accordance with the sixth-aspect near-eye display system 10, 10.6.

In accordance with a first stage of an associated design process, the catadioptric magnifier 170 illustrated in FIGS. 68 and 69 was designed using a similar optical design process as described hereinabove for other lenses of the near-eye display system 10, with associated design parameters of virtual image field of view, apparent distance to that virtual image, design entrance pupil (i.e. ultimately the exit pupil of the optical system), and the distance from exit pupil to the magnifier, and, to support moldability, using an acrylic material for the first 172, second 174 and third 176 dioptric elements, with a space provided for between the second 174 and third 176 dioptric elements, with the S2 and S3 surfaces each constrained to be a flat surface that was common to both so as to better support the application of a reflective polarization surface between the first 172 and second 174 dioptric elements as a bonded doublet, and with a flat surface representing the flat-panel two-dimensional image-display modulation array 94. For design purposes, the exit pupil 18 was treated as a design entrance pupil 141 for the optical simulation of light rays traveling forward therefrom, to and through the first 172, second 174 and third 176 dioptric elements, and onto the flat surface representing the flat-panel two-dimensional image-display modulation array 94. The S6 surface was modeled as a mirror for the first pass of light traveling forward from the design entrance pupil 141 through the first 172, second 174 and third 176 dioptric elements, and the common, flat S2/S3 surface was modeled as a mirror for the second pass. Effectively the design process therefore includes passing light from the exit pupil 18/design entrance pupil 141, through all each of the first 172, second 174 and third 176 dioptric elements, then reflecting from the S6 surface to pass again but in reverse back successively through the third 176 and second 174 dioptric elements, then reflecting from the flat S2/S3 surface to pass again in a forward direction successively through the second 174 and third 176 dioptric elements to form an image at the location of the flat-panel two-dimensional image-display modulation array 94, with the goal of forming a best image of the virtual image thereat. The optical design therefore involves seven total elements for design purposes, wherein the various surfaces are constrained to represent common elements as the light interacts therewith.

In a second stage of the optical design process, the optical subsystem 14, 14.8 may then be modeled in combination with additional optical elements to account for passage of light rays through the flat-panel two-dimensional image-display modulation array 94 and back to the controllable light source 97 of the flat-panel two-dimensional light-source array 98, using the entrance pupil 28' as the design object 138, and utilizing a process similar to the conditioner-lens prescription design process 5000 to determine an optimum image of the entrance pupil 28' as a modulation surface 92 of the controllable light source 97 of the flat-panel two-dimensional light-source array 98.

As an alternative to the first stage of the design process, the light rays through the flat-panel two-dimensional image-display modulation array 94 from the first stage of the design process may be continued therethrough to a new geometric surface and aperture 28 which can be modeled as a retroreflective surface (i.e. a phase conjugation surface) wherefrom the optical rays retroreflect back to the flat-panel two-dimensional image-display modulation array 94. In other words, any ray striking that surface is exactly reversed, and the final geometric image at the flat-panel two-dimensional image-display modulation array 94 is exactly that of the first intermediate image passing through the flat-panel two-dimensional image-display modulation array 94. These retroreflected rays for purposes of the design would be identical to the rays from the flat-panel two-dimensional image-display modulation array 94 to the controllable light sources 97.

The optical subsystem 14, 14.8 can therefore be optimized for best image quality using the final surface as the image location (which similarly results in the intermediate image being optimized) while also possessing a surface within that optical subsystem where the lighting surface can be located. Appropriate parameters such as the distance from the flat-panel two-dimensional image-display modulation array 94 to the modulation surface 92 of the flat-panel two-dimensional light-source array 98 can then be varied to reach an optimized overall solution identifying the best location of that modulation surface 92 of the flat-panel two-dimensional light-source array 98.

With the merit function of the design used to provide for a best image of the virtual image, additional operands in the merit function can provide a preference for a smallest size of that retroreflecting aperture while allowing the distance from the flat-panel two-dimensional image-display modulation array 94 to that aperture 28 to vary, with optimization thereof to provide for the smallest, and therefore most economical and compact, two-dimensional array 26 of controllable light sources 97 within that aperture 28. One can further adjust the relative weights of the quality of the image formed at the flat-panel two-dimensional image-display modulation array 94 with the size and spacing of the two-dimensional array 26 of controllable light sources 97 within the associated aperture 28 so as to provide for the most compact design. Notwithstanding that such an approach may not result in a high-quality image of the two-dimensional array 26 of controllable light sources 97 at the desired exit pupil 18, it nonetheless provides at least some ability to reduce intensities of those controllable light sources 97 so as to provide for reducing power consumption while best exploiting the advantages of a multi-pass catadioptric magnifier 170.

Referring to FIG. 68, optical rays from three different points 184.1, 184.2, 184.3 on the surface 18" of the exit pupil 18 are traced back to corresponding respective regions 186.1, 186.2, 186.3 on the modulation surface 92 of the flat-panel two-dimensional light-source array 98. Whereas these regions 186.1, 186.2, 186.3 do not represent high-quality images of the corresponding respective points 184.1, 184.2, 184.3 on the surface 18" of the exit pupil 18, they can provide for control of the exit subpupils 32, 32" to provide for reducing power consumption and reflection of extraneous light 16$^{iv}$ as described hereinabove, without need for an additional conditioner lens 102, 102', 132, $L_1$ to otherwise create such bounding regions within the associated modulation surface 92. Accordingly, the ray traces illustrate the feasibility of a modulation surface 92 of associated controllable light sources 97, each of which fully illuminates the entirety of the flat-panel two-dimensional image-display modulation array 94 while also collectively filling the exit pupil 18.

Furthermore, referring to FIG. 69, a relatively-smaller region in the exit pupil 18 bounded by the first 184.1 and second 184.2 points therein correspond to a corresponding relatively-smaller region—bounded by the corresponding first 186.1 and second 186.2 regions therein—within the modulation surface 92 of associated controllable light sources 97. Accordingly, for a given position of the eye pupil 38, each light-source element 100 not having rays that reach the eye pupil 38 can be deactivated, together with activation of the remaining light-source elements 100 that have at least some rays that reach to the eye pupil 38. Furthermore, in cooperation with an advanced mapping of the optical subsystem 14, 14.8 to account for the effect of location and extent of the eye pupil 38, light-source elements 100 for which a relatively-low percentage of light rays therefrom would pass through the eye pupil 38, can be either dimmed or deactivated, while also relatively increasing the intensity of light-source elements 100 for which a relatively-high percentage of light rays therefrom would pass through the eye pupil 38, wherein each light-source element 100 is itself illuminating the entirety of the flat-panel two-dimensional image-display modulation array 94 so that the virtual image 16''' viewed by the user would be a composite of the components of the virtual image 16''' illuminated by each of the active light-source elements 100.

Referring to FIGS. 18, 19, 31, 32, and 45 through 47, it should be understood that the associated curved two-dimensional light-source array 106 of the third-aspect near-eye display system 10, 10.3, and the curved light-redirecting surface 110 of the fourth-aspect near-eye display system 10, 10.4 are beneficial independent of the cooperation thereof with the associated subpupil modulator 30 and associated subpupil modulation processes, i.e. beneficial for illumination of an associated flat-panel two-dimensional image-display modulation array 94 to generate a corresponding virtual image 16''' and illuminate an exit pupil 18 therewith, by virtue of providing for the formation of exit pupil 18 having a concave-curved surface 18" that better conforms to the front surface 20' of the eye 20, so as to provide for maintaining focus independent of the rotational position of the eye pupil 38.

Furthermore, in respect of the third-aspect near-eye display system 10, 10.3 illustrated in FIGS. 18, 19, 45 and 47, when the curved two-dimensional light-source array 106 incorporates non-isotropic light-source elements 100, for example, light-emitting-diode elements 100' that typically exhibit directivity, the curvature of the underlying concave-curved surface 107 provides for light 104 from each light-emitting-diode element 100' to emanate in a direction that is normal to the underlying concave-curved surface 107, so as to provide for a relatively-higher degree of uniformity of the illumination of the virtual image 16''' relative to that which would otherwise be provided for by a flat-panel two-dimensional light-source array 98.

Figure 17:
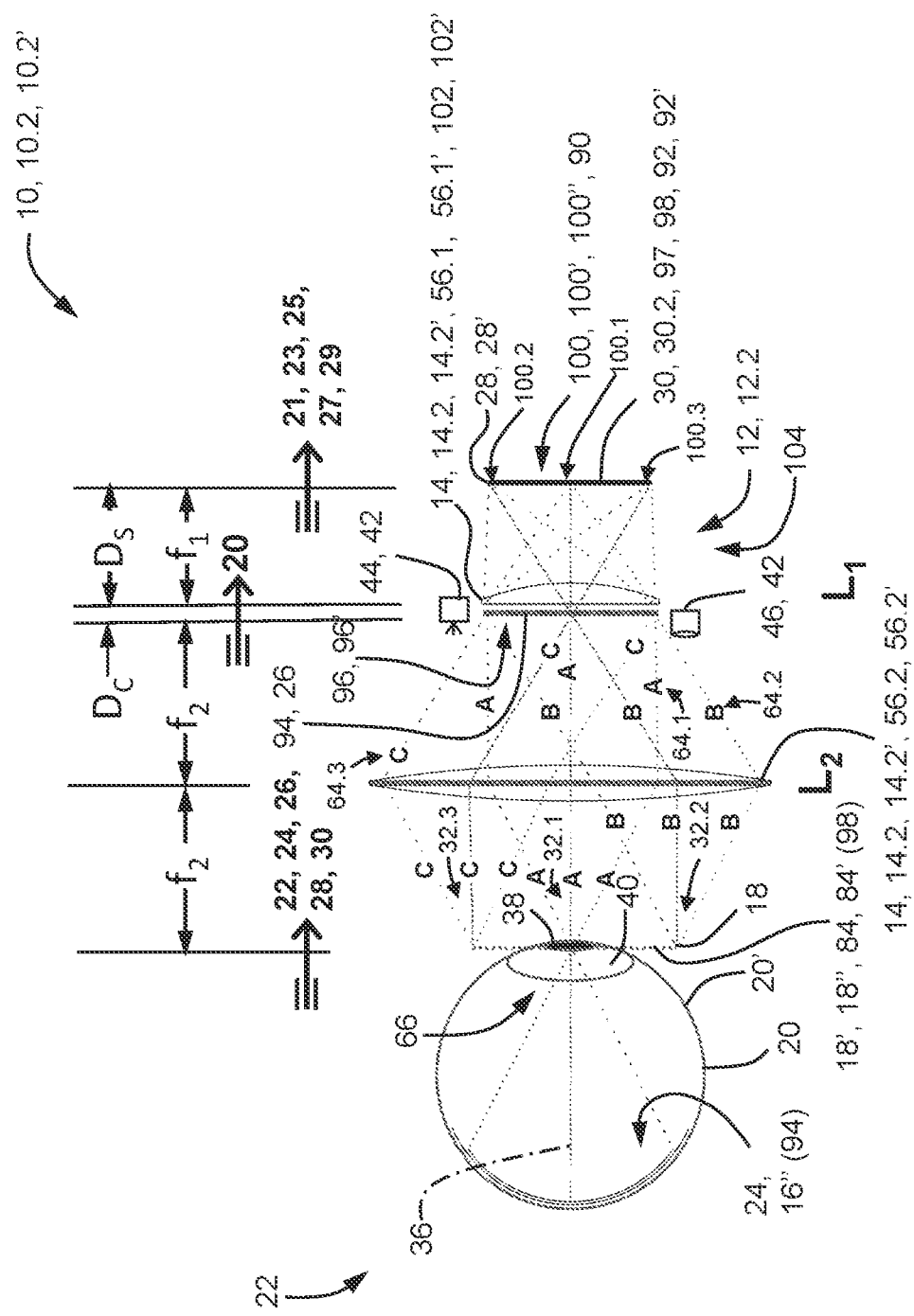
FIG. 17 illustrates a schematic diagram of a portion of a first embodiment of the second aspect of the near-eye display system illustrated in FIG. 16, illustrating a first embodiment of a second aspect of an associated optical subsystem incorporating a plurality of lenses, absent the associated processor and controller elements.
Figure 18:
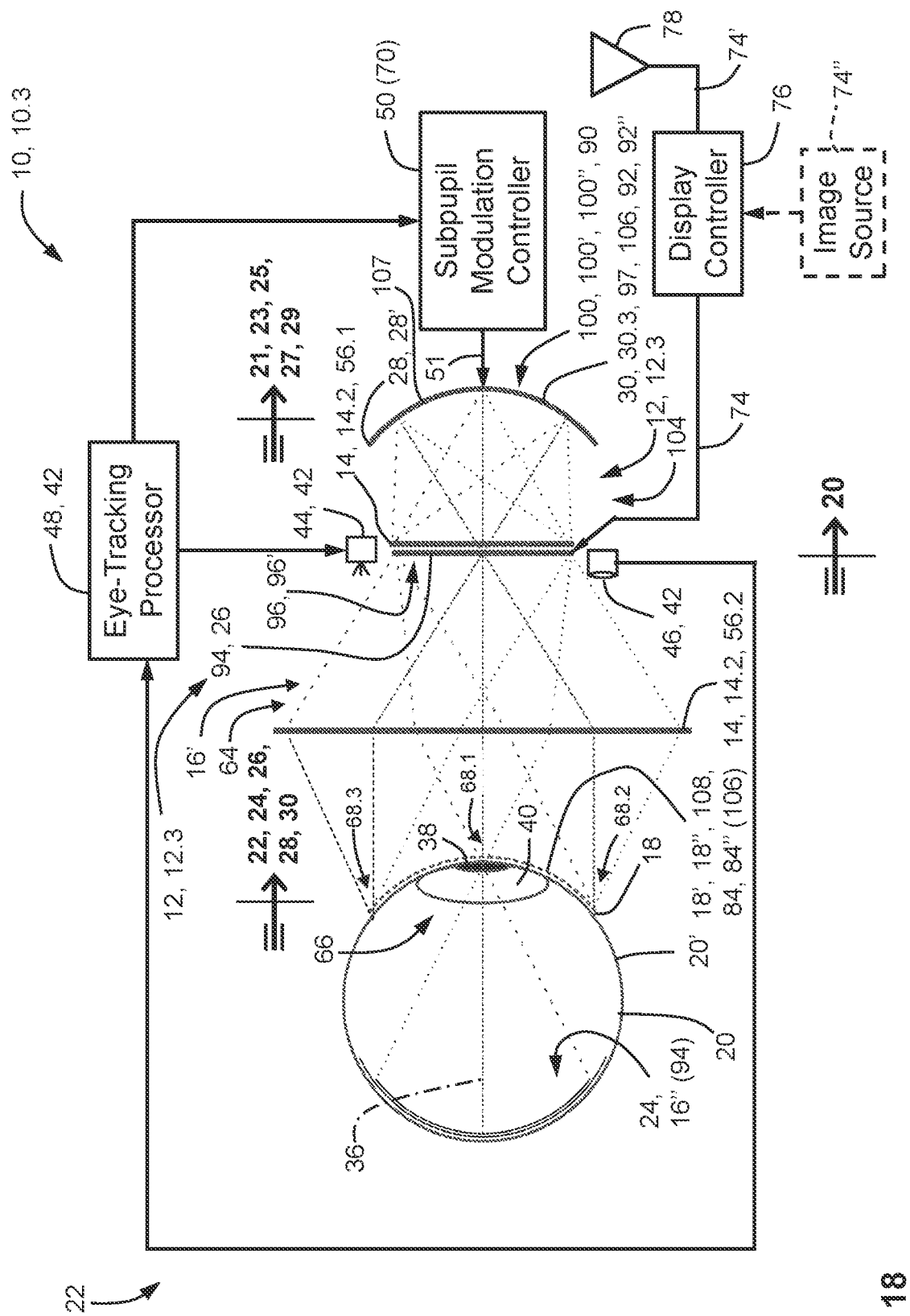
FIG. 18 illustrates a schematic block diagram of a third aspect of a near-eye display system incorporating a curved two-dimensional light array of light sources that define an associated array of modulated subpupils of the third-aspect near-eye display system, in cooperation with a separate flat-panel array of light-modulating image-display pixels.
Figure 70:
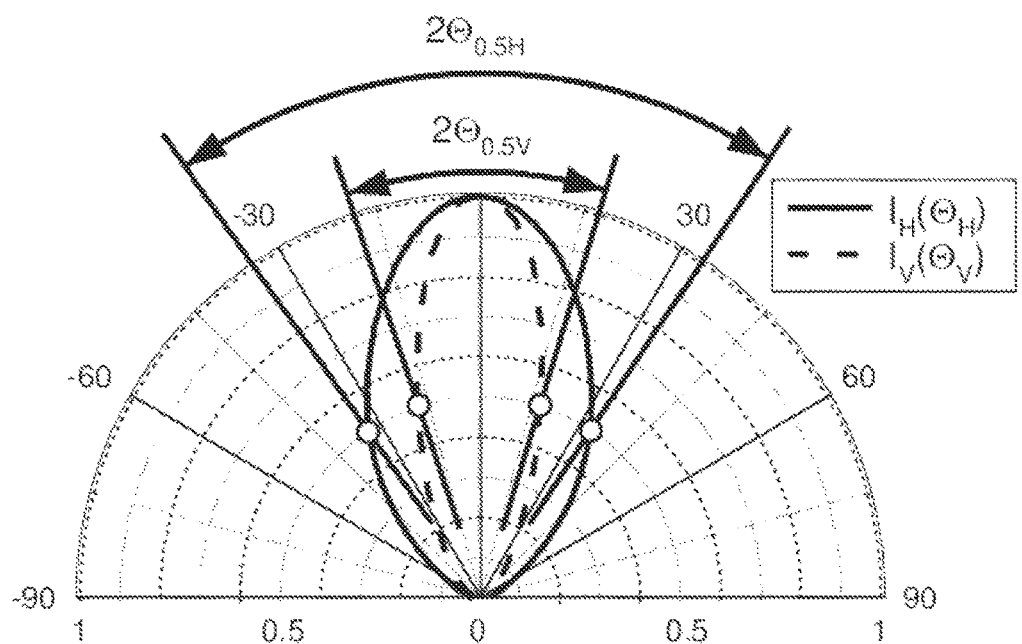
FIG. 70 illustrates a typical luminous intensity distribution of a light-emitting diode.

For example, referring to FIG. 70, illustrating a typical luminous intensity distribution of a light-emitting diode for both horizontal (H) and vertical (V) directions of illumination, a light-emitting-diode element 100' has sufficiently high directivity that if used in a flat-panel two-dimensional light-source array 98, for example, as illustrated in FIG. 17 for the second-aspect near-eye display system 10, 10.2, the angle, relative to the surface normal, of the relatively central optical ray from each light-emitting-diode element 100' that passes through the center of the flat-panel two-dimensional image-display modulation array 94 increases with increasing distance of the light-emitting-diode element 100' from the optical axis 36, resulting in a corresponding reduction in brightness of that portion of the virtual image 16''' with increasing distance of the corresponding modulated subpupil 32' from the optical axis 36, causing a variation in the perceived brightness uniformity of the virtual image 16''' as a function of the location of the exit subpupil 32, 32". In other words, if illuminated by a flat-panel two-dimensional image-display modulation array 94 of relatively-highly directive associated light-source elements 100, 100', the brightness of the virtual image 16''' will be higher in a particular area of the virtual image 16''', gradually fading to a lower brightness around that relatively higher brightness area, with the location of that area of relatively higher brightness changing as the eye pupil 38 is directed at different image locations.

However, locating the relatively-highly directive light-source elements 100, 100' on an underlying concave-curved surface 107 provides for significantly less deviation of the central optical ray from the surface normal, at any point across the entire curved two-dimensional light-source array 106. Accordingly, as the eye pupil 38 receives light from different areas of the concave lighting surface for different gaze directions 34, the center of the perceived virtual image 16''' is still receiving light from that concave lighting surface which is substantially normal to that surface. Notwithstanding there still may be an area of the virtual image 16''' of relatively-higher brightness due to a reduction in intensity from a light-source element 100, 100' as a function of angle from the surface normal, that area of relatively-higher brightness will remain relatively fixed as the eye 20 rotates and therefore, if desired, can be compensated for by conventional means such as an overall intensity spatial profile adjustment of the virtual image 16''' shown on the flat-panel two-dimensional image-display modulation array 94, or the inclusion of a gradient filter. In addition to providing for greater uniformity in perceived intensity responsive to rotation of the eye 20, the curved two-dimensional light-source array 106 also provides for a more efficient utilization of the light 104 generated by the light-source elements 100, 100'.

Generally, the angular-dependent output of light-source elements 100, 100' can cause a "hot spot" of relatively higher perceived image brightness at the flat-panel two-dimensional image-display modulation array 94 through which the primary axis of the light-source element 100, 100' passes. Accordingly, whereas the entire virtual image 16''' will be seen through the eye pupil 38 regardless of the gaze direction 34, this "hot spot" of higher brightness will move around in the virtual image 16''' if these intersections of primary axes of different light-source elements 100, 100' with the corresponding flat-panel two-dimensional image-display modulation array 94 locations, vary with gaze direction 34. But if all those intersections are at the same spot, for example, generally the center of the flat-panel two-dimensional image-display modulation array 94, then the "hot spot" will be in the same location regardless of gaze direction 34. An appropriate curvature of the underlying concave-curved surface 107 provides for these normal directions to align with those intersections. This curvature may not necessarily be the best for forming a concave-curved subpupil surface 84, 84" matching that of the front surface 20' of the eye 20, but there is certainly a synergy in providing a concave curvature for at least some benefit towards both goals.

It should be understood, that any reference herein to the term "or" is intended to mean an "inclusive or" or what is also known as a "logical OR", wherein when used as a logic statement, the expression "A or B" is true if either A or B is true, or if both A and B are true, and when used as a list of elements, the expression "A, B or C" is intended to include all combinations of the elements recited in the expression, for example, any of the elements selected from the group consisting of A, B, C, (A, B), (A, C), (B, C), and (A, B, C); and so on if additional elements are listed. Furthermore, it should also be understood that the indefinite articles "a" or "an", and the corresponding associated definite articles "the" or "said", are each intended to mean one or more unless otherwise stated, implied, or physically impossible. Yet further, it should be understood that the expressions "at least one of A and B, etc.", "at least one of A or B, etc.", "selected from A and B, etc." and "selected from A or B, etc." are each intended to mean either any recited element individually or any combination of two or more elements, for example, any of the elements from the group consisting of "A", "B", and "A AND B together", etc. Yet further, it should be understood that the expressions "one of A and B, etc." and "one of A or B, etc." are each intended to mean any of the recited elements individually alone, for example, either A alone or B alone, etc., but not A AND B together. Furthermore, it should also be understood that unless indicated otherwise or unless physically impossible, that the above-described embodiments and aspects can be used in combination with one another and are not mutually exclusive. Accordingly, the particular arrangements disclosed are meant to be illustrative only and not limiting as to the scope of the invention, which is to be given the full breadth of the appended claims, and any and all equivalents thereof.

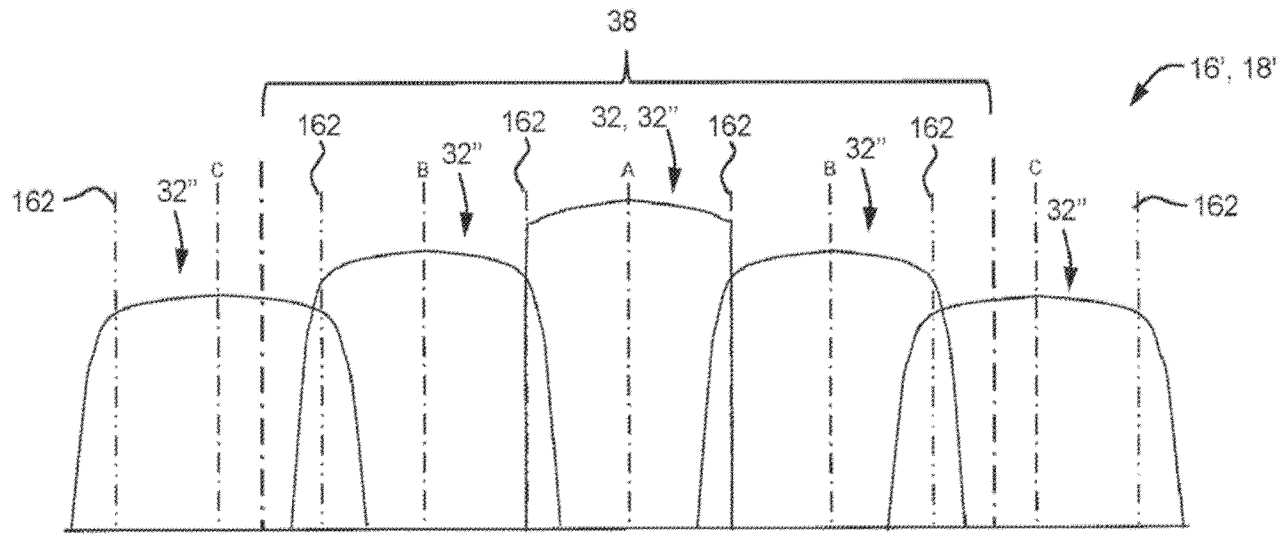

What is claimed is:
1. A near-eye display system, comprising:
a. an optical subsystem comprising a magnifier, wherein said optical subsystem provides for projecting light of a virtual image of image content to an eye location, and said optical subsystem provides for collecting said light of said virtual image propagating from an aperture of said optical subsystem onto an exit pupil on a surface proximate to an outer surface of an eye when said eye is at said eye location; and
b. a subpupil modulator within said aperture, wherein said subpupil modulator in cooperation with said optical subsystem provides for forming at least one subpupil at a plurality of fixed or controllably-positioned subpupil locations within said exit pupil, each said at least one subpupil is associated with a corresponding portion of said light of said virtual image that is less than all possible said light of said virtual image, and said subpupil modulator provides for individually and independently controlling an intensity of said light associated with at least one activated subpupil of said at least one subpupil at at least one of said plurality of fixed or controllably-positioned subpupil locations when activated to be different from an intensity of said light associated with at least one other activated subpupil of said at least one subpupil at at least one other of said plurality of fixed or controllably-positioned subpupil locations when activated.

2. A near-eye display system as recited in claim 1, wherein said light of said virtual image is generated by a controllable light source of said subpupil modulator, said controllable light source of said subpupil modulator provides for separately and controllably illuminating or not illuminating each said at least one subpupil at each said at least one of said plurality of fixed or controllably-positioned subpupil locations, said virtual image is generated by a flat-panel two-dimensional image-display modulation array of light-modulating image-display pixels that is illuminated by said controllable light source, wherein said controllable light source comprises a curved light-redirecting surface in cooperation with a modulated scanned beam of light, said exit pupil is formed by said magnifier, and said exit pupil is curved.

3. A near-eye display system as recited in claim 1, wherein said light of said virtual image is generated by a controllable light source of said subpupil modulator, said controllable light source of said subpupil modulator provides for separately and controllably illuminating or not illuminating each said at least one subpupil, said virtual image is generated by a flat-panel two-dimensional image-display modulation array of light-modulating image-display pixels that is illuminated by said controllable light source, and said optical subsystem comprises a catadioptric magnifier located between said flat-panel two-dimensional image-display modulation array and said exit pupil, wherein said catadioptric magnifier provides for collecting said light of said virtual image propagating from said subpupil modulator onto said surface of said exit pupil, wherein said controllable light source comprises a flat-panel two-dimensional light source array of light-emitters.

4. A near-eye display system as recited in claim 1, wherein said controllable light source comprises a waveguide projector.

5. A near-eye display system as recited in claim 1, wherein each said at least one subpupil is formed on a curved surface.

6. A near-eye display system as recited in claim 1, wherein said at least one subpupil at at least two of said plurality of fixed or controllably-positioned subpupil locations overlap one another by at least 20 percent within said exit pupil.

7. A near-eye display system as recited in claim 2, wherein said optical subsystem comprises a first dioptric-power optical element located between a first side of said flat-panel two-dimensional image-display modulation array of light-modulating image-display pixels and said controllable light source, wherein said first dioptric-power optical element is located substantially one focal length from said controllable light source.

8. A near-eye display system as recited in claim 2, wherein said optical subsystem further comprises a second dioptric-power optical element located between said flat-panel two-dimensional image-display modulation array and said exit pupil, wherein said second dioptric-power optical element is located substantially one focal length from each of a second side of said flat-panel two-dimensional image-display modulation array and said exit pupil, and said first and second sides of said flat-panel two-dimensional image-display modulation array oppose one another.

9. A near-eye display system as recited in claim 2, further comprising:
   a. a light-beam source, wherein said light-beam source provides for generating a beam of light, and provides for modulating an intensity thereof responsive to an intensity modulation signal;
   b. a light-beam-directing element, wherein said light-beam-directing element provides for directing said beam of light onto said curved light-redirecting surface at a location thereon responsive to an angular orientation of said light-beam-directing element; and
   c. a light-beam scanner, wherein said light-beam scanner provides for controlling said angular orientation of said light-beam-directing element, and said light-beam scanner and said light-beam source are controlled over time responsive to a signal from a subpupil modulation controller so as to provide for generating said modulated scanned beam of light, and so as to provide for scanning said modulated scanned beam of light over a region of said curved light-redirecting surface so as to form a corresponding said at least one subpupil.

10. A near-eye display system as recited in claim 1, further comprising a subpupil modulation controller, wherein said subpupil modulation controller provides for controlling an activation state of each said at least one subpupil at said plurality of fixed or controllably-positioned subpupil locations formed by said subpupil modulator responsive at least to a measure of a location of an eye pupil of said eye when said eye is located at said eye location.

11. A near-eye display system as recited in claim 10, further comprising an eye-tracking subsystem, wherein said eye-tracking subsystem provides for generating said measure of said location of said eye pupil of said eye, and said eye-tracking subsystem comprises:
   a. an infrared light source positioned and configured so as to provide for illuminating at least said eye pupil of said eye over a range of gaze angles of said eye;
   b. an infrared-responsive camera positioned and configured so as to provide for generating an image of at least said eye pupil of said eye over said range of gaze angles of said eye; and
   c. an eye-tracking processor, wherein said eye-tracking processor provides for generating at least one eye-pupil measure selected from the group consisting of said measure of said location of said eye pupil of said eye, a measure of a lateral extent of said eye pupil of said eye, and a shape of said eye pupil of said eye, and said eye-tracking processor provides for communicating said at least one eye-pupil measure to said subpupil modulation controller, wherein said subpupil modulation controller provides for controlling said activation state of at least one said at least one subpupil at at least one said plurality of fixed or controllably-positioned subpupil locations formed by said subpupil modulator responsive to said at least one eye-pupil measure when said eye is located at said eye location.

12. A near-eye display system as recited in claim 1, wherein said light of said virtual image is generated by a controllable light source of said subpupil modulator, said controllable light source comprises a plurality of independently-controllable light sources, and each independently-controllable light source of said plurality of independently-controllable light sources provides for illuminating or not illuminating a corresponding subpupil of said at least one subpupil at one of said plurality of fixed or controllably-positioned subpupil locations within said exit pupil.

13. A near-eye display system as recited in claim 12, wherein only one said corresponding subpupil of said at least one subpupil at only one of said plurality of fixed or controllably-positioned subpupil locations within said exit pupil is activated at a given time by illumination from a corresponding one of said plurality of independently-controllable light sources.

14. A near-eye display system as recited in claim 13, wherein said only one of said plurality of fixed or controllably-positioned subpupil locations within said exit pupil is most proximate to a center of an eye pupil of said eye when said eye is located at said eye location.

15. A near-eye display system as recited in claim 1, wherein a lateral extent of at least one said subpupil is less than a lateral extent of said exit pupil.

16. A near-eye display system as recited in claim 1, wherein said magnifier comprises a catadioptric magnifier.

17. A near-eye display system as recited in claim 1, wherein said at least one subpupil comprises a plurality of subpupils.

18. A method of projecting an image with a near-eye display system, comprising:
   a. projecting light of a virtual image of image content towards an eye location;
   b. collecting said light of said virtual image propagating from an aperture of an optical subsystem onto an exit pupil on a surface proximate to an outer surface of an eye when said eye is at said eye location;
   c. providing for forming at least one subpupil at a plurality of fixed or controllably-positioned subpupil locations within said exit pupil, wherein each said at least one subpupil is associated with a corresponding portion of said light of said virtual image that is less than all possible said light of said virtual image;
   d. over a period of time, activating said at least one subpupil at two or more less than all of said plurality of fixed or controllably-positioned subpupil locations by projecting to said eye location said corresponding portion of said light of said virtual image that is less than said all possible said light of said virtual image associated with said at least one subpupil at said two or more less than all of said plurality of fixed or controllably-positioned subpupil locations; and e. controlling an intensity of said light associated with at least one activated subpupil of said at least one subpupil at at least one of said plurality of fixed or controllably-positioned subpupil locations when activated to be different from an intensity of said light associated with at least one other activated subpupil of said at least one subpupil at at least one other of said plurality of fixed or controllably-positioned subpupil locations when activated, wherein the operation of controlling said intensity is responsive to a condition of an eye pupil of said eye when said eye is at said eye location.

19. A method of projecting an image with a near-eye display system as recited in claim 18, further comprising:
a. generating said light of said virtual image with a source of light, and
b. illuminating a two-dimensional image-display modulation array with said light from said source of light and modulating said light with said two-dimensional image-display modulation array so as to provide for generating said virtual image, wherein said source of light comprises a plurality of light-source-emission locations, each light-source-emission location of said plurality of light-source-emission locations is associated with a corresponding subpupil location of said plurality of fixed or controllably-positioned subpupil locations, and said source of light associated with each light-source-emission location of said plurality of light-source-emission locations is independently controllable so as to provide for controlling said light associated with each said corresponding subpupil location.

20. A method of projecting an image with a near-eye display system as recited in claim 19, further comprising controlling an intensity of said light emitted from at least one light-source-emission location of said plurality of light-source-emission locations to be different from an intensity of said light emitted from at least one other light-source-emission location of said plurality of light-source-emission locations.

21. A method of projecting an image with a near-eye display system as recited in claim 19, further comprising imaging said light from said two-dimensional image-display modulation array with at least one magnifier lens so as to generate said virtual image, wherein the operation of projecting said light of said virtual image towards said eye location, and the operation of collecting said light of said virtual image propagating from said aperture of said optical subsystem onto said exit pupil, collectively comprise redirecting and redistributing said light from at least one light-redirecting-and-redistributing surface located between said source of light and said exit pupil, further comprising passing said light of said virtual image at least three times through at least one surface of said at least one magnifier lens.

22. A method of projecting an image with a near-eye display system as recited in claim 19, further comprising passing light from said source of light through a varifocal lens located between said source of light and said two-dimensional image-display modulation array and adjusting a focal length of said varifocal lens, wherein said light from said source of light is associated with said light of said virtual image.

23. A method of projecting an image with a near-eye display system as recited in claim 18, further comprising:
a. tracking at least one eye-pupil measure selected from the group consisting of a location of an eye pupil of said eye, a lateral extent of said eye pupil of said eye, and a shape of said eye pupil of said eye, when said eye is located at said eye location; and
b. controlling said source of light responsive to the operation of tracking said at least one eye-pupil measure, so as to provide for activating said at least one subpupil at a subset less than all of said plurality of fixed or controllably-positioned subpupil locations associated with an Active Subpupil Region associated with said eye pupil, and so as to provide for deactivating said at least one subpupil at a remainder of said plurality of fixed or controllably-positioned subpupil locations.

24. A method of projecting an image with a near-eye display system as recited in claim 19, wherein said source of light comprises a plurality of light emitters, said light from each light emitter of said plurality of light emitters illuminates an entirety of said two-dimensional image-display modulation array, and each said light emitter of said plurality of light emitters in cooperation with said optical subsystem provides for illuminating a corresponding said at least one subpupil at said corresponding subpupil location of said plurality of fixed or controllably-positioned subpupil locations, further comprising for each said light emitter of said plurality of light emitters, individually controlling an intensity of said light emitted by said light emitter.

25. A method of projecting an image with a near-eye display system as recited in claim 19, wherein said source of light comprises a plurality of light emitters, said light from each light emitter of said plurality of light emitters illuminates an entirety of said two-dimensional image-display modulation array, and each said light emitter of said plurality of light emitters in cooperation with said optical subsystem provides for illuminating a corresponding said at least one subpupil at said corresponding subpupil location of said plurality of fixed or controllably-positioned subpupil locations, further comprising using a waveguide projector to generate said light with said plurality of light emitters.

26. A method of projecting an image with a near-eye display system as recited in claimer, wherein said at least one subpupil at at least two of said plurality of fixed or controllably-positioned subpupil locations overlap one another by at least 20 percent within said exit pupil.

27. A method of projecting an image with a near-eye display system as recited in claim 18, wherein only one said at least one subpupil at only one of said plurality of fixed or controllably-positioned subpupil locations within said exit pupil is activated at a given time by illumination of said light of said virtual image.

28. A method of projecting an image with a near-eye display system as recited in claim 27, wherein said only one said at least one subpupil at only one of said plurality of fixed or controllably-positioned subpupil locations within said exit pupil is most proximate to a center of said eye pupil of said eye when said eye is located at said eye location.

29. A method of projecting an image with a near-eye display system as recited in claim 18, wherein a lateral extent of at least one said subpupil is less than a lateral extent of said exit pupil.

30. A method of projecting an image with a near-eye display system as recited in claim 18, wherein the operation of projecting light of said virtual image of said image content towards said eye location is responsive to a catadioptric magnifier, and the operation of collecting said light of said virtual image propagating from said aperture of said optical subsystem onto said exit pupil on said surface proximate to said outer surface of said eye is responsive to said catadioptric magnifier.

31. A method of projecting an image with a near-eye display system as recited in claim 18, wherein said at least one subpupil comprises a plurality of subpupils.

32. A method of projecting an image with a near-eye display system as recited in claim 18, wherein the operation of controlling said intensity of said light associated with said at least one activated subpupil of said at least one subpupil at said at least one of said plurality of fixed or controllably-positioned subpupil locations when activated to be different from said intensity of said light associated with said at least one other activated subpupil of said at least one subpupil at said at least one other of said plurality of fixed or controllably-positioned subpupil locations when activated provides for substantially uniform perceived brightness of said image by said eye substantially independent of a gaze direction of said eye.

33. A near-eye display system, comprising:
a. a means for projecting light of a virtual image of image content to an eye location, and for collecting said light of said virtual image propagating from an aperture onto an exit pupil on a surface proximate to an outer surface of an eye when said eye is at said eye location; and
b. a means for forming at least one subpupil at a plurality of fixed or controllably-positioned subpupil locations within said exit pupil, each said at least one subpupil is associated with a corresponding portion of said light of said virtual image that is less than all possible said light of said virtual image, and said means for forming said at least one subpupil provides for individually and independently controlling an intensity of said light associated with at least one activated subpupil of said at least one subpupil at at least one of said plurality of fixed or controllably-positioned subpupil locations when activated to be different from an intensity of said light associated with at least one other activated subpupil of said at least one subpupil at at least one other of said plurality of fixed or controllably-positioned subpupil locations when activated.

* * * * *

UNITED STATES PATENT AND TRADEMARK OFFICE
CERTIFICATE OF CORRECTION

PATENT NO. : 12,007,575 B2
APPLICATION NO. : 18/092282
DATED : June 11, 2024
INVENTOR(S) : Shawn L. Kelly It is certified that error appears in the above-identified patent and that said Letters Patent is hereby corrected as shown below:

On the Title Page

Delete the title page and substitute therefore with the attached title page consisting of the corrected illustrative figure(s).

OTHER PUBLICATIONS:
"US 10,261,323 B2 04/2019, Hua et al." is moved to U.S. PATENT DOCUMENTS.

Page 2, U.S. PATENT DOCUMENTS:
For 7,401,920, "Kranz" is replaced with --Kranz et al.--;
For 10,241,328, "Urey" is replaced with --Urey et al.--;
For 2012/0280956, "Yamamoto" is replaced with --Yamamoto et al.--.

Page 3, 1st Column, OTHER PUBLICATIONS:
"US 10,261,326 B2 04/2019, Hua et al." is moved to U.S. PATENT DOCUMENTS;
"US 10,935,795 B2 03/2021, Hua et al." is moved to U.S. PATENT DOCUMENTS;
On Line 2 of "Wong, Timothy …", "birrefringent" is replaced with --birefringent--.

Page 3, 2nd Column, OTHER PUBLICATIONS:
On Line 1 of "Ling et al", "Volume" is replaced with --Volume--;
On Line 4 of "Ling et al", "simple- magnifier" is replaced with --simple-magnifier--;
Lines 5-9 associated with the 1st occurrence of "Greivenkamp, John E." are deleted;
On Line 3 of "Lin, Tiegang …", "vol. 26" is replaced with --vol. 28, no. 26--;
On Line 2 of 2nd occurrence of "Greivenkamp, John E.", "[Geometical and Intstrumental]" is deleted;
and Lines 23-28 and 25-40 associated with the 1st and 3rd occurrences of "USPTO Notice of Allowance in U.S. Appl. No. 17/805,863" are deleted.

Signed and Sealed this
Sixth Day of August, 2024

Katherine Kelly Vidal
*Director of the United States Patent and Trademark Office*

CERTIFICATE OF CORRECTION (continued)
U.S. Pat. No. 12,007,575 B2

In the Specification

Column 28 at Line 43, "$16'''$" is replaced with --$16^{iv}$--;
Column 39 at Lines 1, 54 and 62, "$D_1$" is replaced with --$D_I$--;
Column 39 at Line 50; and Column 40 at Line 5: "$D_r$" is replaced with --$D_p$--; and
Column 53 at Line 30, "$14.2'''$" is replaced with --$14.2''''$--.

In the Claims

Column 77 at Line 21 in Claim 19: "light," is replaced with --light;--; and
Column 78 at Line 44 in Claim 26: "claimer" is replaced with --claim 18--.

(12) United States Patent
Kelly

(10) Patent No.: US 12,007,575 B2
(45) Date of Patent: Jun. 11, 2024

(54) NEAR-EYE DISPLAY SYSTEM

(71) Applicant: PANAMORPH, INC., Colorado Springs, CO (US)

(72) Inventor: Shawn L. Kelly, Colorado Springs, CO (US)

(73) Assignee: PANAMORPH, INC., Colorado Springs, CO (US)

( * ) Notice: Subject to any disclaimer, the term of this patent is extended or adjusted under 35 U.S.C. 154(b) by 53 days.

(21) Appl. No.: 18/092,282

(22) Filed: Dec. 31, 2022

(65) Prior Publication Data
US 2023/0141961 A1  May 11, 2023

Related U.S. Application Data

(63) Continuation of application No. PCT/US2022/032576, filed on Jun. 7, 2022.
(Continued)

(51) Int. Cl.
*G02B 27/01* (2006.01)
*F21V 8/00* (2006.01)
(Continued)

(52) U.S. Cl.
CPC ....... *G02B 27/0179* (2013.01); *G02B 6/0055* (2013.01); *G02B 17/0856* (2013.01);
(Continued)

(58) Field of Classification Search
CPC ............ G02B 27/0179; G02B 27/0093; G02B 27/0172; G02B 6/0055; G02B 17/0856;
(Continued)

(56) References Cited

U.S. PATENT DOCUMENTS 3,781,091 A  12/1973  Ferguson
3,940,203 A  2/1976  La Russa
(Continued)

FOREIGN PATENT DOCUMENTS

CN  108107579 B  2/2021
CN  108319015 B  2/2023
(Continued)

OTHER PUBLICATIONS

US 10,261,323 B2, 04/2019, Hua et al. (withdrawn)
(Continued)

*Primary Examiner* — William R Alexander
(74) *Attorney, Agent, or Firm* — Kurt L. VanVoorhies

(57) ABSTRACT

An optical subsystem of a near-eye display system provides for projecting light of a virtual image of image content to an eye location, and provides for collecting light of the virtual image onto an exit pupil on a surface proximate to an outer surface of an eye when at the eye location. A subpupil modulator within an aperture in cooperation with the optical subsystem provides for forming a plurality of subpupils within the exit pupil, provides for less than all of the light of the virtual image associated with one or more less than all of the plurality of subpupils to be projected to the eye location, and provides for individually and independently controlling an intensity of the light through each activated subpupil to a level less than a maximum level of intensity.

33 Claims, 38 Drawing Sheets